United States Patent [19]

Philipp et al.

[11] Patent Number: 5,740,352
[45] Date of Patent: Apr. 14, 1998

[54] LIQUID-CRYSTAL DISPLAY TEST SYSTEM AND METHOD

[75] Inventors: Richard L. Philipp, Mound; Richard L. Murphy-Newman, Richmond; Michael S. Louden, Mound, all of Minn.

[73] Assignee: B-Tree Verification Systems, Inc., Minnetonka, Minn.

[21] Appl. No.: 534,603

[22] Filed: Sep. 27, 1995

[51] Int. Cl.$^6$ .................................................. G06F 11/00
[52] U.S. Cl. ........................................................ 395/183.16
[58] Field of Search ......................... 395/183.16, 183.01, 395/183.08, 183.13; 348/180, 185; 324/770, 500, 754, 755, 763; 345/50; 128/661.04

[56] References Cited

U.S. PATENT DOCUMENTS

| | | | |
|---|---|---|---|
| 4,044,244 | 8/1977 | Foreman et al. | 235/153 AC |
| 4,055,801 | 10/1977 | Pike et al. | 324/73 R |
| 4,317,199 | 2/1982 | Winslow | 371/16 |
| 4,364,080 | 12/1982 | Vidovic | 358/10 |
| 4,471,348 | 9/1984 | London et al. | 340/722 |
| 4,513,318 | 4/1985 | Wilensky et al. | 358/139 |
| 4,646,299 | 2/1987 | Schinabeck et al. | 371/20 |
| 4,649,515 | 3/1987 | Thompson et al. | 364/900 |
| 4,713,758 | 12/1987 | De Kelaita et al. | 364/200 |
| 4,723,158 | 2/1988 | White | 358/29 |
| 4,780,755 | 10/1988 | Knierim | 358/10 |
| 4,937,740 | 6/1990 | Agarwal et al. | 364/200 |
| 4,947,106 | 8/1990 | Chism | 324/73.1 |
| 5,041,976 | 8/1991 | Marko et al. | 364/424.3 |
| 5,043,984 | 8/1991 | Tomisawa et al. | 371/16 |
| 5,055,928 | 10/1991 | Klingelhofer | 358/139 |
| 5,289,116 | 2/1994 | Kurita et al. | 324/158 R |
| 5,335,342 | 8/1994 | Pope et al. | 395/575 |
| 5,404,318 | 4/1995 | Hoffert et al. | 364/551.01 |
| 5,459,410 | 10/1995 | Henley | 324/770 |
| 5,508,721 | 4/1996 | Hattori | 345/185 |
| 5,526,043 | 6/1996 | Wen | 348/190 |

OTHER PUBLICATIONS

Troutman et al., "Characterization of TFT/LCD Arrays", IEEE Display Research Conference, Conference Record of the 1991 Intl. Oct. 1991, pp. 231–234.

*Primary Examiner*—Hoa T. Nguyen
*Assistant Examiner*—Stephen C. Elmore
*Attorney, Agent, or Firm*—Schwegman, Lundberg, Woessner & Kluth, P.A.

[57] ABSTRACT

Methods and apparatus for a non-invasive test tool for testing and monitoring the interactions between an embedded microprocessor and its programs, various input analog and discrete electrical signals, and an LCD output display screen. The test tool uses a physical probe, preferably coupled in a non-invasive manner to the pins of the LCD display screen, and specialized hardware to capture the LCD output of the software-under-test as an event interaction between the microprocessor and various inputs. The captured LCD output is converted to a standard pixel format and stored for testing. The standard pixel format comprises a color and/or intensity value for each pixel position of interest, stored into a data structure. One embodiment uses a conversion which includes adding the time-modulated pixel data of a plurality of frames to generate a single composite frame having a color and/or intensity value for each pixel position of interest.

21 Claims, 33 Drawing Sheets

IN-CONTROL LCD GRAPHICS ACPTURE CONNECTIONS

| INCONTROL NAME | SIGNAL NAME | ENHANCED GRAPHICS ISOLATOR CONN. P1 | ENHANCED GRAPHICS SIGNAL NAME |
|---|---|---|---|
| J1-6 | S | P1-26 | TFLM |
|  | GND | P1-25 | TGND |
| J1-4 | CP1 | P1-24 | TLCLK |
|  | GND | P1-23 | TGND |
| J1-2 | CP2 | P1-22 | TPCLK |
|  | GND | P1-21 | TGND |
| J2-1 | POWER | P1-20 | T5V |
|  | GND | P1-19 | TGND |
| J1-3 | GND | P1-18 | TGND |
|  | GND | P1-17 | TGND |
| J1-10 | DU0 | P1-16 | TUD0 |
| J1-13 | DL0 | P1-15 | TLD0 |
| J1-9 | DU1 | P1-14 | TUD1 |
| J1-14 | DL1 | P1-13 | TLD1 |
| J1-8 | DU2 | P1-12 | TUD2 |
| J1-12 | DL2 | P1-11 | TLD2 |
| J1-7 | DU3 | P1-10 | TUD3 |
| J1-11 | DL3 | P1-9 | TLD3 |
|  |  | P1-8 | TUD3 |
|  |  | P1-7 | TLD4 |
|  |  | P1-6 | TUD5 |
|  |  | P1-5 | TLD5 |
|  |  | P1-4 | TUD6 |
|  |  | P1-3 | TLD6 |
|  |  | P1-2 | TUD7 |
|  |  | P1-1 | TLD7 |
|  |  |  |  |
|  |  |  |  |
| NOTES: |  | 1.P1 IS AMP PART NO. 102387-6 |  |

FIG. 6G

LIQUID-CRYSTAL DISPLAY TEST SYSTEM AND METHOD

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyrights whatsoever.

FIELD OF THE INVENTION

The present invention relates to methods and apparatus for testing computers, and more specifically to in-situ testing of computers having liquid-crystal graphics displays in order to determine whether specific displays of text and/or graphics result from specific input stimuli.

BACKGROUND OF THE INVENTION

Computer systems which output text and/or graphics to liquid-crystal display ("LCD") graphics displays must be tested. Such testing can be assisted by test tools called software verification and validation ("V&V") or computer-aided software testing ("CAST") tools.

Particularly crucial is the testing of medical devices (e.g., blood hematology cell count instruments, chemistry analyzers, and/or coagulation analyzers) having embedded controllers which output to color LCD screens such as are commonly used as visual output screens for lap-top computers. It is generally not sufficient to test such devices by testing the computer as connected to a cathode-ray tube (CRT) display device (i.e., checking the bit pattern as captured by a frame grabber which samples, for example, the scan-line output of a video-graphics adaptor (VGA) card), since regulating agencies frequently require testing of the actual complete systems in the configuration which they will be used, and the colors or graphical effects of LCD display screens generally differ from those produced on a CRT display screen. One of the main functions being verified in such tests is that the embedded software operates correctly and in response to a particular input stimulus properly outputs a particular image, color, and/or text to the LCD display screen.

Embedded microcomputers are computers which perform control and monitoring functions within some other device. Many embedded controllers are now having displays such as color LCD screens attached. Often, there is no computer-type interface (such as a alpha-numeric typewriter-style keyboard) for such computers. Examples of devices having such embedded microcomputers are electro-cardiac graphics (EGG) monitors, household appliances having "smart" controllers, and automobile engine controllers.

Because such embedded computers often do not have the keyboard typical of other computers; specialized equipment and methods must be used to test the programs which run in these computers. Although particularly suited for testing what are typically defined as embedded computers, such testing equipment can also be used to test other types of computers as well.

Some computers include analog subsystems which interface the microcomputer to and from various analog signals. Some computers include discrete subsystems which interface the microcomputer to and from various discrete electrical signals.

In the prior art are test systems which attach to the pins of a microprocessor while the microprocessor is attached to a circuit (thus being part of, for instance, a personal computer), and wherein the test system provides "character-based" stimulus-response testing and monitoring of the programs running on the microprocessor. For instance, the test system could simulate a keyboard subsystem and test the responses to various combinations of keyboard input without having to have a human press the various key combinations. Other "character-based" prior-art test systems have included testing computer character-display subsystems, and logic-state analyzers which monitor the addresses, data and instructions which come across the pins of the microprocessor being monitored. Such systems which test signals at the pins of the microprocessor-under-test, rather than at the pins of the LCD display cannot see effects which may be caused by the LCD controller electronics or from the interaction of the microprocessor with such electronics, and thus while the signals leaving the microprocessor may look correct, the actual display may not be correct. Other prior-art systems are capable of monitoring and analyzing signals driven by CRT adaptor circuits (e.g., such commonly available circuits as the standard VGA adaptor circuit which generates video-type signals to drive a VGA display CRT).

While certain individual types and combinations of LCD-display controllers and LCD display panels (or "LCD display screens") may be susceptible of having their drive signals captured and analyzed by much the same circuitry and programming as can be used to capture and analyze the signals driving a standard CRT (i.e., because such LCD systems emulate or utilize the signals between a VGA adaptor card and a VGA display CRT), many, if not most, LCD-display controller/LCD-display panel combinations utilize unique signals which are quite different in format, timing, and protocol than those of a standard VGA.

What has been lacking in the prior art are test systems which provide easy, accurate, adequate or comprehensive testing of LCD displays connected to computers and embedded microcomputers in particular.

What is needed are reliable, accurate and repeatable test systems and methods for testing display outputs of computers which drive LCD graphics and textual displays.

SUMMARY OF THE INVENTION

The present invention provides a method and apparatus for a non-invasive test tool for testing and monitoring the interactions between an embedded microprocessor and its programs, various input analog and discrete electrical signals, and an LCD output display screen. The test tool uses a physical probe, preferably coupled in a non-invasive manner to the pins of the LCD display screen or elsewhere along the electronic path to the screen from the computer, and specialized hardware to capture the LCD output of the software-under-test as an event interaction between the microprocessor and various inputs. The LCD output signal for a particular pixel generally varies over time as a function of the desired intensity or color for that pixel, even for "static" displays of data. This time-varying signal is analyzed and converted into an intensity or color value (representing the intensity or color as perceived by a human observing the display) for each pixel of interest on the display, and inserted into a common data structure representing the entire display. The set of values in the common data structure are then compared to an expected set of values to determine whether portion of the software-under-test is functioning properly.

BRIEF DESCRIPTION OF THE DRAWINGS

FIG. 6A–6G show a schematic of the hardware implementation of one embodiment of preprocessing circuit (PPC) 210.

FIG. 8A–8M show a schematic of the hardware implementation of one embodiment of graphics capture circuit (GCC) 220.

DESCRIPTION OF THE PREFERRED EMBODIMENT

In the following detailed description of the preferred embodiments, reference is made to the accompanying drawings which form a part hereof, and in which are shown, by way of illustration, specific embodiments in which the invention may be practiced. It is to be understood that other embodiments may be utilized and structural changes may be made without departing from the scope of the present invention.

In this specification, the term "flat panel display" is defined to include both liquid-crystal displays, as well as other flat-panel displays using other technologies, such as field-emissive devices ("FED") as described on page 52 of the October 1995 issue of *Windows Sources*, in which each individual pixel may be driven by a time-varying sequence of signals in order to achieve more levels of optical intensity than might be possible were the pixel to be driven by the same signal level each time that pixel is driven. While embodiments of the present invention utilizing LCD display devices are described in detail, identical or similar embodiments tailored for other flat panel display technologies, wherein individual pixels are driven by a time-varying sequence of signals in order to achieve more levels of optical intensity, are specifically contemplated.

Conventional test systems may test a CRT output screen by connecting a probe to the signal input to a video-graphics adaptor (VGA) RAMDAC (Random Access Memory, Digital-to-Analog Converter), and from there drive a frame grabber circuit to capture each pixel (each pixel may be represented by an 8-bit data value, for example, which is synchronized with a RAMDAC clock signal) which is driven to a CRT display screen, and wherein each pixel of the CRT screen has a plurality of bits (all associated with that one pixel) simultaneously available for capture. Such CRT systems generally provide the same multi-bit value for a given pixel over time in order to provide a particular color and intensity for that pixel. Unlike those systems, LCD display systems such as device-under-test 100 of FIG. 1 drive individual pixels with different signals at various times in order that the modulation of the LCD pixels produces a perception of a particular color and/or a particular intensity at a particular pixel. Also unlike CRT systems in which the pixel clock generally runs continuously and in which the synchronization (sync) pulses are part of or synchronous with the pixel clock, the pixel clock for LCD systems often starts and stops at various points in the frame time period, and the sync pulses are independent of the pixel clock.

It is desirable to test such systems "non-invasively," that is, without disturbing any electrical or programming function or timing of the system-under-test. Thus, stimulation and sensing of responses to the stimulation are externally applied to the system-under-test, and are designed to insignificantly disturb that system.

Figure 1:
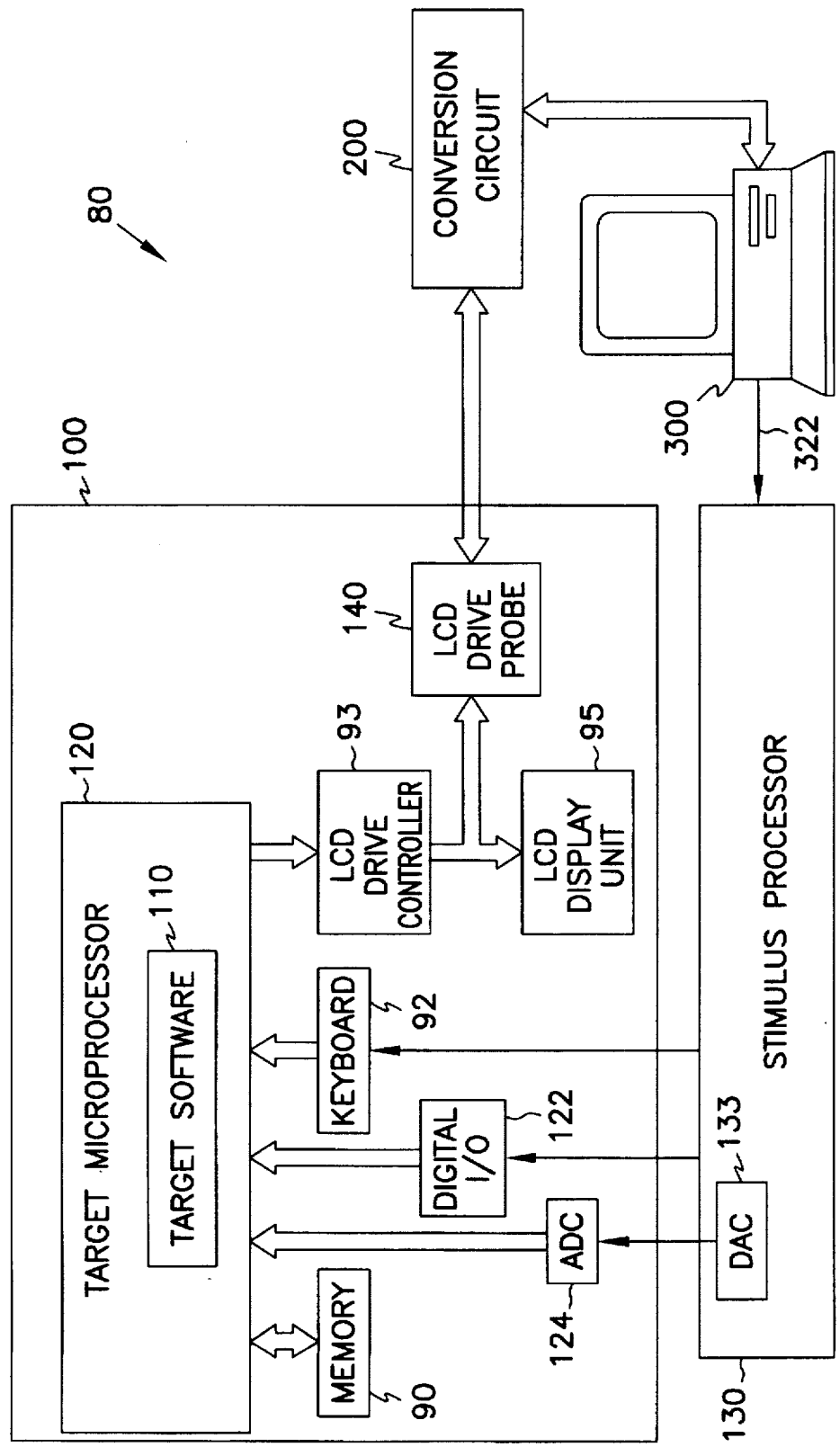
FIG. 1 is an exemplary generalized test system 80 for a device-under-test 100 according to the present invention for testing outputs to an LCD display screen from a computer.
Figure 1A:
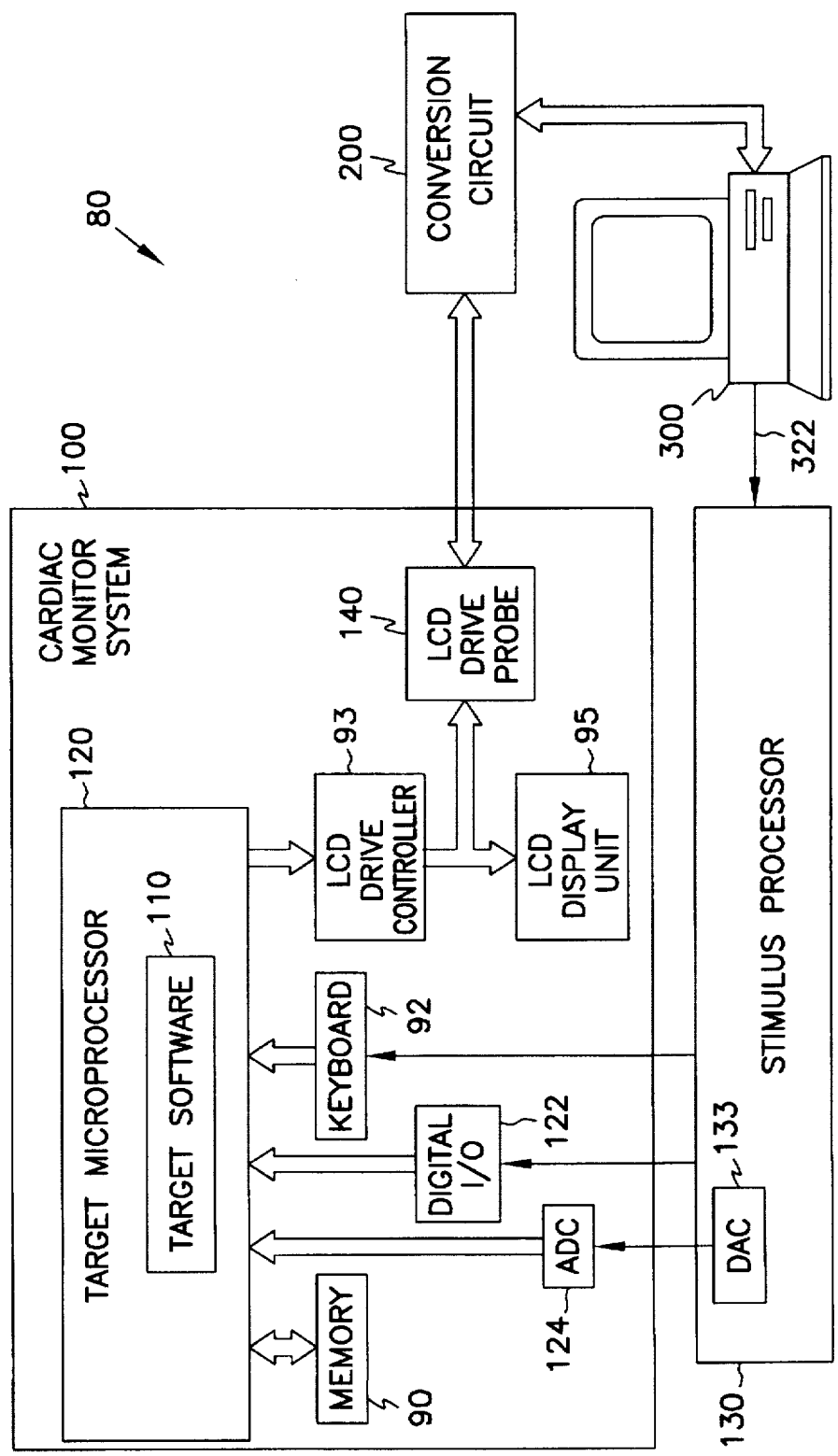
FIG. 1A shows one embodiment of the present invention, wherein device-under-test 100 is a cardiac monitor system.

FIG. 1 shows an exemplary generalized test system 80, according to the present invention, for testing outputs to an LCD display screen from a computer. Device-under-test (DUT) 100 includes target microprocessor 120, memory 90, LCD display controller 93 and LCD display unit (or "LCD display panel") 95. One embodiment of DUT 100 also includes keyboard interface 92, digital input/output (I/O) 122, and analog-to-digital convertor (ADC) 124. In one embodiment, device 100 could be any device controlled by an embedded microprocessor and having an LCD display screen, such as cardiac monitors, household appliances having "smart" controllers, and automobile engine controllers. In real operation (as opposed to in a test environment), target software 110 running on target microprocessor 120 executes instructions which control LCD drive signals through LCD display controller 93 (which in turn control LCD display device 95) in response to stimulus from, e.g., discrete input electrical signals through keyboard interface 92 or digital I/O 122 or from analog input electrical signals through ADC 124. In one embodiment, keyboard interface 92 comprises the cable between a keyboard for manual input and target microprocessor 120. In one embodiment, digital I/O 122 is an Intel 8255 Programmable Peripheral Interface ("PPI") chip which is programmable by software instructions to output or input discrete signals on various of its pins.

The present invention couples to the sync, clock, data, power and ground signals of device 100, detects and separately captures the sync, clock, and data signals through opto-isolators.

In order to test device 100, in one embodiment, LCD drive probe 140 is attached to many or all of the pins of the cable or connector connecting LCD display controller 93 to LCD display device 95 (as a parallel load and/or driver to the normal connections for the data, address and/or control signals). In one embodiment, a cable provides a portion of the connection between LCD display controller 93 and LCD display device 95, and LCD drive probe 140 is physically and electrically inserted between one of the connector sockets and this cable. In such an embodiment, CPU digital probe 130 is not actually part of device 100, but is connected to it for testing purposes, as shown in FIG. 1. Opto-isolator coupler 190 provides a degree of electrical isolation and couples LCD drive probe 140 the rest of conversion circuit 200.

In one embodiment, conversion circuit 200 captures, organizes, and arranges up to eight (8) bits of image information per pixel. In one embodiment, this image information is stored into successive bytes of frame storage 240. Various manufacturers of the electronics for LCD display controller 93 organize and time the data which produces a particular color at a particular pixel differently. For instance, one manufacturer may place into the first byte of a frame data four pixels in the upper half of the frame and four pixels in the lower half of the frame in the following bit-significant order for a monochrome ("mono") LCD display (where "cartesian pairs" indicate the location of a pixel on the display of LCD display unit 95, and wherein generally the upper-most left-most pixel location is (0,0), and X coordinates increase toward the right and Y coordinates increase towards the lower edge of the screen):

first byte: (0,243),(0,242),(0,241),(0,240),(0,3),(0,2), (0,1),(0,0), second byte: (0,247),(0,246),(0,245),(0,244),(0,7),(0,6), (0,5),(0,4), third byte: (0,251),(0,250),(0,249),(0,248),(0,11),(0,10), (0,9),(0,8), etc.

Such an arrangement of data within bytes is sometimes termed "dual-scan". In addition, during successive frames (each frame comprising a set of pixel data including one value for each pixel of the display), different values may be sent on successive frames for each same pixel location, in order to modulate the intensity or color differently for each of the twenty-four example pixels controlled by these three bytes, and indeed for the entire screen. In this manner, various shades of grey are achieved by various modulation patterns or duty cycles.

For a color LCD display, each pixel can comprise blue, green, and red components, (the term "pixlettes" is defined to mean each of the plurality of individual portions which collectively comprise a pixel; in order to distinguish the term "pixel" which is the combination of the individual pixlettes). (For other display-controller/display combinations, various other color combinations may be used, depending on whether the display is reflective, absorbancy, or emissive.) The data values for the blue (B), green (G), and red (R) pixlettes are generally packed next to one another in a byte. In such a system having one data bit for each of the three pixlettes, there are three color bits packed into eight bits per byte and because data for the upper half of the screen is interspersed with data for the lower half of the screen, the pattern is more complex than for monochrome LCD displays, and the following order may be used:

byte 0: G(0,2),R(0,2),B(0,1),G(0,1),R(0,1),B(0,0), G(0,0),R(0,0), byte 1: G(0,242),R(0,242),B(0,241),G(0,241),R(0,241),B (0,240),G(0,240),R(0,240), byte 2: R(0,5),B(0,4),G(0,4),R(0,4),B(0,3),G(0,3),R(0,3), B(0,2), byte 3: R(0,245),B(0,244),G(0,244),R(0,244),B(0,243),G (0,243),R(0,243),B(0,242), etc.

In this encoding system, each pixel has three color bits, one each for the red, green, and blue pixlettes, for a total of up to eight colors. The even-numbered bytes contain data for the upper-half screen, and the odd-numbered bytes contain data for the lower-half screen. The bits for successive pixels must be gathered from different bit positions with each successive byte until the patterns repeat. Various manufacturers place the color bits in various patterns, and use various modulation patterns to achieve perceptions of particular colors from the LCD displays.

For example, one manufacturer may send from the LCD display controller 93 to the LCD display unit 95 a repeating pattern of three frames, in which "bright" pixels are driven with the same three-bit pattern for all three frames, and "normal" pixels are driven with two frames having the desired three-bit pattern followed by a third frame having all bits "off"; thus there are said to be sixteen colors available: eight bright colors and eight normal colors. (This may result in only fifteen different "colors" since the bright pattern with all bits "off" and the normal pattern with all bits "off" each result in three frames each having all bits "off" for that pixel.)

The patterns sent by a particular manufacturer's LCD controller electronics must match the pattern recognized by the LCD display unit made by another (generally a different) manufacturer. The temporally modulated pattern of bits sent to a particular triplet of color pixels (for example the red, green, and blue pixels at display pixel coordinate (0,0)) must be combined and then converted into a value representing the color of that display pixel. In one embodiment, the pixel is represented by an eight-bit value representing the color and intensity (or hue and saturation) of that pixel. In another embodiment, the pixel is represented by a 24-bit value corresponding to eight bits each of red, green and blue intensity.

In addition, various manufacturers may place a particular number of non-displayed scan-line times in each frame, for example sending 482 scan lines wherein the first 480 are displayed in a 640-by-480 pixel display, and the last 2 are not, or, in a different design, sending 500 scan lines wherein the last 480 are displayed in a 640-by-480 pixel display and the first 20 are not.

Certain electronics for LCD display controller 93 may be adaptable to drive differently to each of a plurality of different LCD display devices 95. A particular LCD display device 95 may work optimally with one particular LCD drive controller, but may also function, albeit with different color or intensity results, with other LCD display controllers 93. The electronics for conversion circuit 200 or the software used to control the conversion process, or both, must therefore be set up to some extent uniquely for each particular LCD display controller 93 and/or LCD display device 95 combination.

In one embodiment, the signal converter 260, which includes conversion circuit 200 or the software used to control the conversion process, or both, includes a bit-masked change filter 248. One such embodiment is shown in FIG. 2A.

In one embodiment, the number of throw-away lines, depending on the panel used for LCD display device 95, is set into conversion circuit 200, in order to control how many scan lines are thrown away before the scan lines of interest are saved. In one such embodiment, the number of throw-away lines is a parameter which is loaded into conversion circuit 200 by test software 350, which controls the tests running in test-control computer 300. In another such embodiment, the logic in conversion circuit 200 is permanently programmed or configured to control the number of throw-away lines and other functions of conversion circuit 200. In one embodiment, the number of throw-away lines which should be discarded is determined empirically, by programming DUT 100 to display a blank screen (i.e., a first test pattern), observing the LCD signals with probe 140, then programming DUT 100 to display different data (i.e., a second test pattern) at specified pixels on the screen, and comparing where the resultant LCD signals change. In one embodiment, other characteristics of LCD display controller 93—LCD display unit 95 combinations are also derived empirically; software routine query conversion circuit 200 in order to obtain a value for the number of frames captured (i.e., the number of frames which must now be combined, a value for the horizontal resolution (i.e., the number of pixels per scan line), a value for the vertical resolution (i.e., the number of scan lines per frame), and a value for starting address of the first frame; in one such embodiment, frame storage 240 is searched for the first non-zero/non-pad character in order to determine the starting address of the first data in the first frame, which is sometimes useful in order to debug the software 350 and the hardware of GCC 220 and PPC 210.

Figure 2:
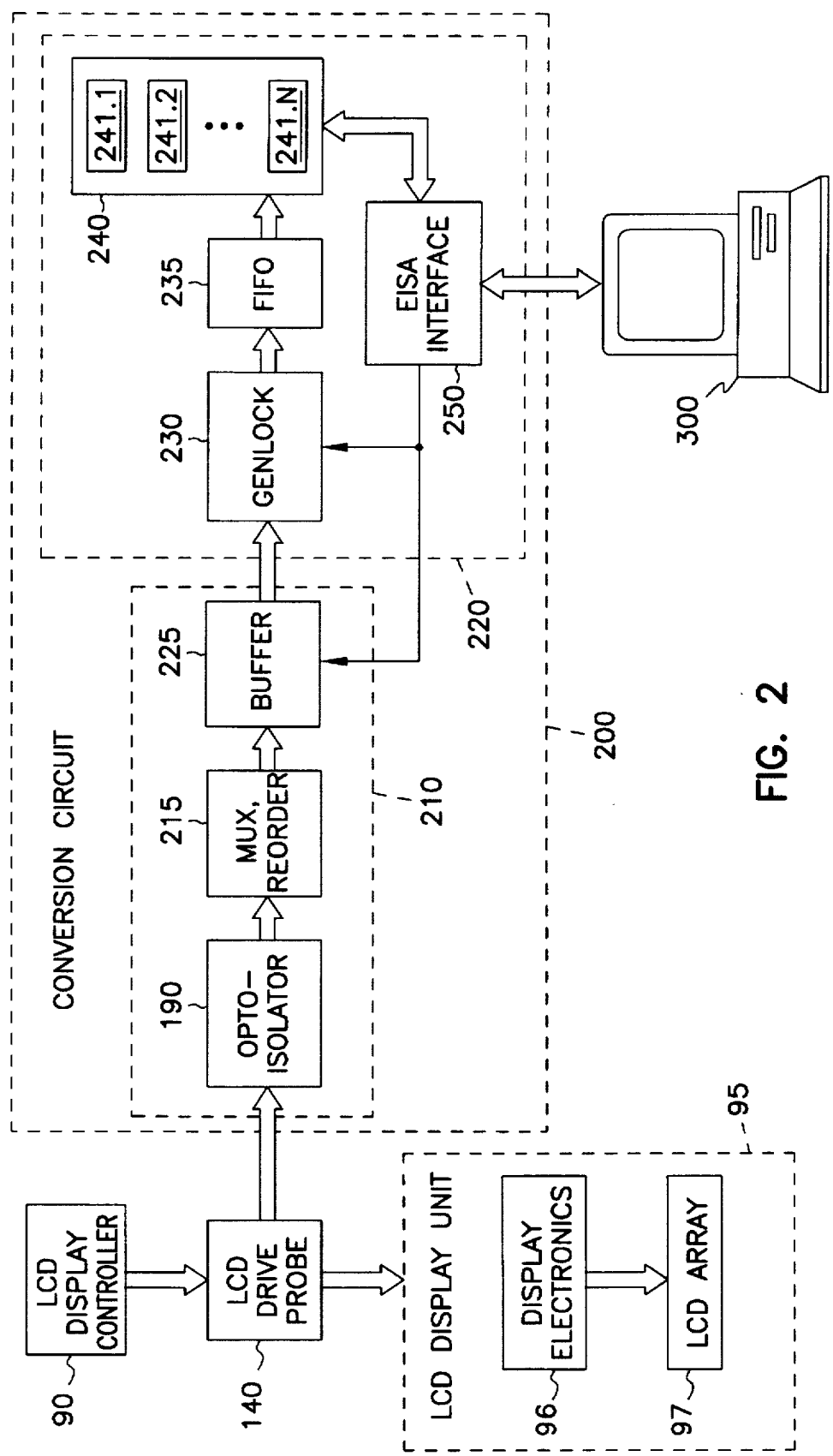
FIG. 2 shows details of some of the functions provided by LCD signal capture and conversion circuit 200.
Figure 2A:
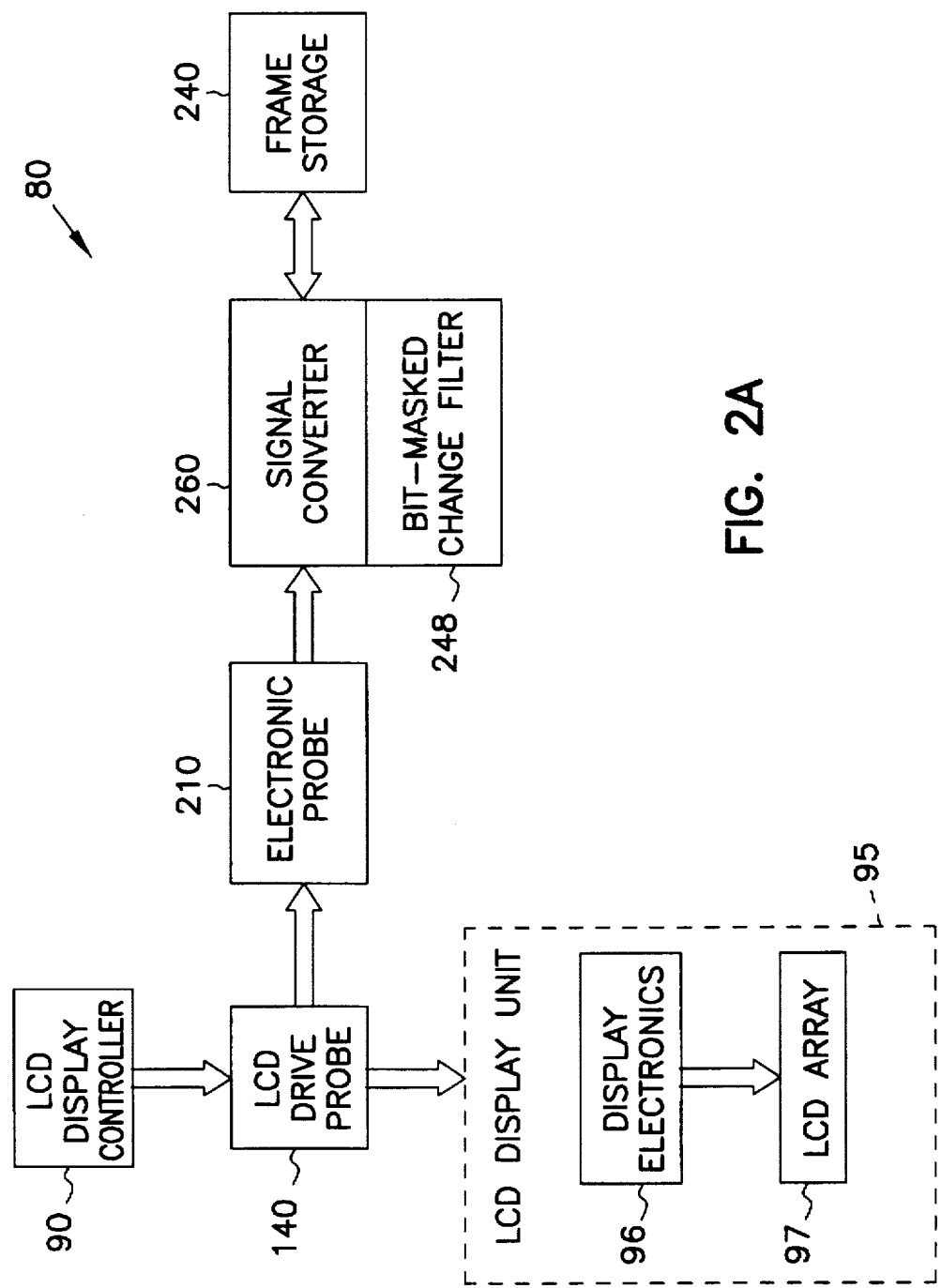
FIG. 2A shows one embodiment of the present invention, wherein signal converter 260, which includes conversion circuit 200 or the software used to control the conversion process, or both, includes a bit-masked change filter 248.

FIG. 2 shows a block diagram of one embodiment of conversion circuit 200 including opto-isolator coupler 190, preprocessing circuit (PPC) 210 and graphics capture circuit (GCC) 220. In the embodiment shown in FIG. 2, LCD drive probe 140 is interposed (e.g., the cable from LCD display controller 93 plugs into LCD drive probe 140, which in turn plugs onto LCD display unit 95) into the signal path between LCD display controller 93 and LCD display unit 95; in another embodiment, as shown in FIG. 1, LCD drive probe 140 couples to the cable between LCD display controller 93 and LCD display unit 95. In one embodiment, test-control computer 300 comprises a high-performance IBM-compatible personal computer having an EISA (Extended Industry-Standard Architecture) bus to EISA interface circuit 250 of GCC 220 of conversion circuit 200. In one embodiment, test-control computer 300 also comprises a visual output display for displaying test results, magnetic storage devices for storing the test results, and runs a WINDOWS-brand software operating system, available from Microsoft Corporation. PPC 210 comprises opto-isolator coupler 190, mux/reorder (multiplexor/reorder) circuit 215, and buffer 225. In one embodiment, test-control computer 300 must identify the EISA (Extended Industry Standard Architecture) slot in which the GCC 220 resides, in order to be able to send and receive data and/or commands between test-control computer 300 and GCC 220. In one embodiment, test-control computer 300 is coupled to and control more than one GCC 220, each of which is coupled to an EISA bus (one embodiment uses a separate EISA address for each GCC 220 in order to distinguish data and commands for each respective GCC 220). The function of PPC 210 is to extract a data bit stream from the signals passing from LCD display controller 93 to LCD display unit 95, and to start to format the data from that data bit stream. In one embodiment, GCC 220 comprises genlock circuit 230, FIFO (first-in, first-out buffer) 235, frame storage 240 (sometimes called "graphics-card memory"), and EISA interface 250. In one embodiment, frame storage 240 comprises 4 megabytes of 32-bit wide storage for a set of frames, including a plurality of frames 241.1 through 241.N. In one embodiment, GCC 220 also places, into frame storage 240, data which is indicative of one or more of the following values: the total number of bytes captured, the horizontal resolution in pixels, the vertical resolution in pixels, and/or the address offset of the first non-pad character of frame data.

In operation, for one embodiment of the present invention, test-control computer 300 sends a command across the EISA bus to EISA interface 250 in order to command GCC 220 to capture (or "grab") one frame 241.1, or alternatively one set of frames 241.1–241.N, of the signals creating the image on LCD display device 95. GCC 220 then sends a command to PPC 210 to grab one frame set (comprising one or more frames 241.1–241.N) of the image of LCD display device 95, wherein one frame set is defined as the combination of N frames 241.1–241.N, wherein each frame 241 comprises a set of frame pixel data, and wherein N depends on how many frames 241 form one cycle of a modulation sequence (which corresponds to the frame set) for the particular electronics used for LCD display controller 93. The data thus captured is raw or partially formatted data representative of the signals between LCD display controller 93 and LCD display unit 95.

For example, an LCD having a 2-level monochromatic ("mono") grey scale might be fully represented by a frame set having a single frame (e.g., 241.1), and wherein a pixel being "on" represents a "dark" grey-level, and that pixel being "off" represents a "white" grey-level. Successive frames (i.e., frame data sent in successive time periods) to such an LCD would have identical data for any given pixel, which is thus constantly driven either "on" or "off." For a different example, LCDs having a 16-level mono grey scale might utilize a time-multiplexed scheme wherein a single cycle of the modulation sequence (which corresponds to the frame set) comprises sixteen frames 241.1–241.N (where N is 16), and wherein a pixel being "on" for all sixteen frames represents a "black" or "dark" grey-level, and that pixel being "off" for all sixteen frames represents a "white" grey-level, and wherein a pixel being "on" for every other of the sixteen frames represents a "50% dark" grey-level, and wherein a pixel being "on" for every fourth of the sixteen frames represents a "25% dark" grey-level, and wherein a pixel being "on" for fifteen of the sixteen frames represents a "94% dark" grey-level, and so on. The raw or partially formatted data placed in frame storage 240 comprises a frame set which includes one or more frames.

GCC 220 synchronizes to the start of the frame set as indicated by PPC 210 which monitors signals from LCD display controller 93 to the LCD display unit 95. For a conventional CRT frame grabber, the synchronization is determined by reference off of the vertical sync ("vsync") pulse, and the first scan line of pixel data is the scan line next-following the vsync pulse. In contrast, the start of an LCD frame is indicated by either a vsync pulse signal, the first scan line signal, or a first line mark signal, depending on the particular electronics used in LCD display controller 93. In addition, the first scan line of pixel data generally coincides with the vsync pulse.

In one embodiment, GCC 220 for a particular combination (of LCD display device 95 and LCD display controller 93) is customized in order to capture the proper number of frames (to determine temporal modulation), and is based on the size of each frame (i.e., the horizontal and vertical resolution, and number of bits per pixel), the bit and byte order reorganization required (e.g., big-endian versus little-endian), the number of lines, if any, to be thrown away and whether these are at the start or end of the frame. Manufacturer data sheets for a combination of LCD display unit 95 and LCD display controller 93 provide some of the parameters needed. Since some manufacturers may not publish each of the parameters for their particular combination of LCD display device 95 and LCD display controller 93, these parameters are determined empirically by observing the signals between LCD display controller 93 and LCD display device 95.

TABLE 1

| Combination | Type | Scale | Resolution | Bits/Pixel | Scan Mode |
|---|---|---|---|---|---|
| 1 X2 | Color | 16 | 640x480 | 3 | Single |
| 2 X5 | Mono | 16 | 640x480 | 1 | Dual (Post offset) |
| 3 X4 | Mono | 16 | 640x480 | 4 | Single |
| 4 X6 | Mono | 16 | 640x480 | 1 | Dual (Pre offset) |
| 5 X7 | Mono | 2 | 640x480 | 1 | Single |
| 6 X8 | Color | 256 | 640x480 | 16 | Single |

One embodiment of Combination 1 uses a program code version denominated CARDX2 and shown in Appendix C, and is designed to analyze signals from an LCD display controller 93 which comprises a custom logic design of TOA Corporation, coupled to an LCD display unit 95 comprising a custom-designed panel. "Appendix B, GCC-8U11.pds for CARDX2" shows the PALASM (Programmable Array Logic Assembler language) programming for PLD 8U11 of an exemplary LCD genlock circuit 230 as shown in Combination 1 of Table 1.

One embodiment of Combination 2 uses a program code version denominated CARDX5 and shown in Appendix C, and is designed to analyze signals from an LCD display controller 93 which comprises a Cirrus Logic CL-GD6440 type chip, coupled to an LCD display unit 95 comprising a WACOM PL-100V type panel. This combination is a dual-scan display having a post-offset (i.e., blank scan lines are sent after the end of each frame, and are discarded or ignored by test-control computer 300 and/or conversion circuit 200). "Appendix B, GCC-8U11.pds for CARDX5" shows the PALASM programming for PLD 8U11 of an exemplary LCD genlock circuit 230 as shown in Combination 2 of Table 1.

One embodiment of Combination 4 uses a program code version denominated CARDX4 and shown in Appendix C, and is designed to analyze signals from an LCD display controller 93 which comprises a Cirrus Logic CL-GD6410 type chip, coupled to an LCD display unit 95 comprising a PLANAR EL640.480-A type panel. "Appendix B, GCC-8U11.pds for CARDX4" shows the PALASM programming for PLD 8U11 of an exemplary LCD genlock circuit 230 as shown in Combination 4 of Table 1.

One embodiment of Combination 5 uses a program code version denominated CARDX6 and shown in Appendix C, and is designed to analyze signals from an LCD display controller 93 which comprises a Cirrus Logic CL-GD6410 type chip, coupled to an LCD display unit 95 comprising a custom-designed panel. This combination is a dual-scan display having a pre-offset (i.e., blank scan lines are sent before the start of each frame, and are discarded or ignored by test-control computer 300 and/or conversion circuit 200). "Appendix B, GCC-8U11.pds for CARDX6" shows the PALASM programming for PLD 8U11 of an exemplary LCD genlock circuit 230 as shown in Combination 5 of Table 1.

One embodiment of Combination 6 uses a program code version denominated CARDX7, and is designed to analyze signals from an LCD display controller 93 which comprises a custom logic design of Intermedics Corp., coupled to an LCD display unit 95 comprising a FINLUX MD640.480 type panel. "Appendix B, GCC-8U11.pds for CARDX7" shows the PALASM programming for PLD 8U11 of an exemplary LCD genlock circuit 230 as shown in Combination 6 of Table 1.

One embodiment of Combination 7 uses a program code version denominated CARDX8, and is designed to analyze signals from an LCD display controller 93 which comprises a Chips & Technologies OC65540/545 type chip coupled to an LCD display unit 95 comprising a HOSIDEN HLD1026-011000 SE type panel. "Appendix B, GCC-8U11.pds for CARDX8" shows the PALASM programming for PLD 8U11 of an exemplary LCD genlock circuit 230 as shown in Combination 7 of Table 1.

In some embodiments of device under test 100, certain keyboard stimuli from keyboard interface 92 cause a specified output to LCD display device 95 in response. For instance, one keystroke (i.e., the activation of a certain key by, e.g., a user manually depressing the key) might cause a pop-up window of a specified color and size to appear at a specified location on LCD display device 95. To test whether this function worked correctly, the test-control software 350 would cause a simulated keystroke at keyboard interface 92, then detect changes in the signals to LCD display, and compare those changes to a set of expected changes. This test is greatly facilitated by operation of the present invention which converts all display data signals, regardless of the type of display-under-test 100, into a standard format comprising an array of values representing the display image, wherein each element of the array includes a plurality of bits representing the color, intensity, or both, for one pixel of the display. This standard format allows verification of a variety of different displays, including LCD displays, made by different manufacturers which implement different techniques of modulation to generate a particular perceived color.

Figure 3:
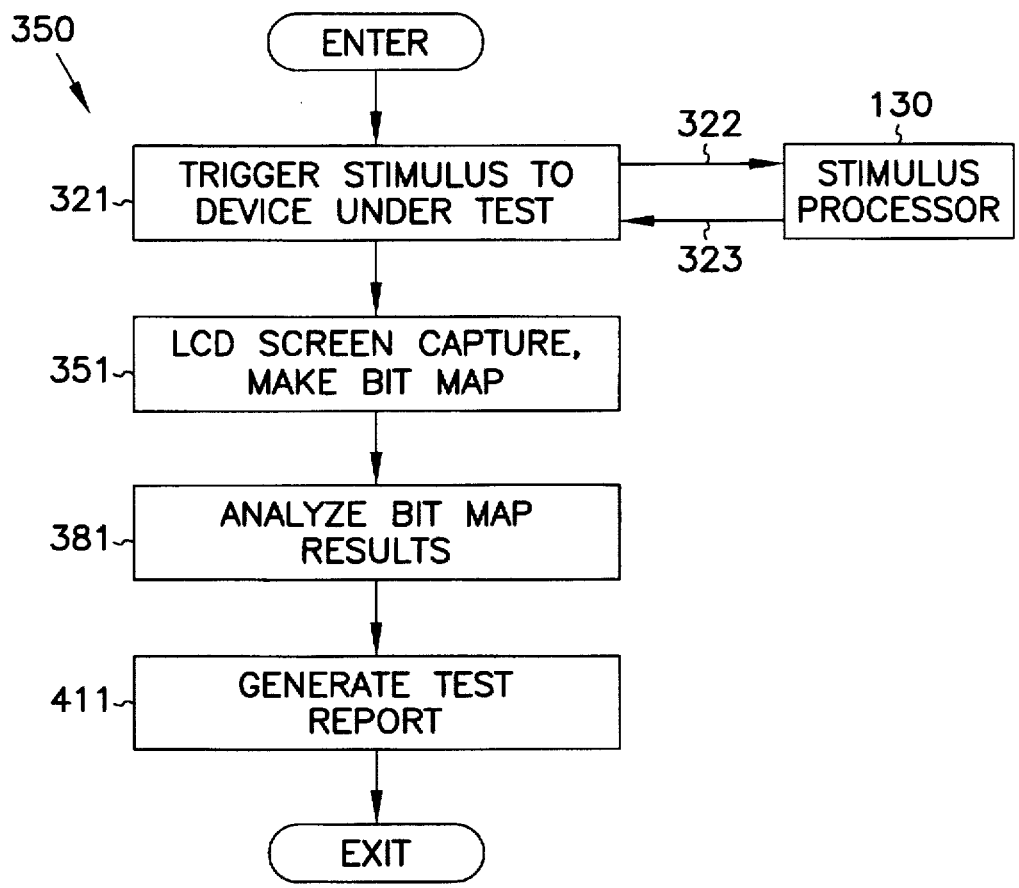
FIG. 3 shows an overview of the functions provided, in one embodiment, by test software 350 running in test-control computer 300.

FIG. 3 shows an overview of the functions provided, in one embodiment, by software 350 running a test in test-control computer 300. In one embodiment, software 350 is implemented in the C-language, and uses a PASCAL calling protocol for certain variables. After software 350 is entered, control passes to block 321. The program code of block 321 triggers a stimulus signal 322 to stimulus processor 130, which in turn cause a stimulus (for example, one or more of the following: an analog signal from DAC (digital-to-analog converter) 133 to ADC (analog-to-digital converter) 124, a digital signal to digital I/O 122, and/or a digital signal to keyboard interface 92) to device-under-test 100. In one embodiment, a completion signal 323 indicates to the software in block 321 when the stimulus has been completed. In another embodiment, a timer is used instead to indicate when the stimulus should have completed in order that block 321 can be exited. Control then passes to the make-bit-map software of block 351. The program code of block 351 (shown in more detail in FIG. 4) causes a capture of the frame set of the LCD screen and makes a bit map, storing the results into a standard-bit-map structure. Control then passes to block 381. The program code of block 381 analyzes the bit map results, and in one embodiment compares the results to a predetermined set of expected results. Control then passes to block 411. The program code of block 411 generates a report of test results which indicates to a user whether or not the test passed.

Figure 4:
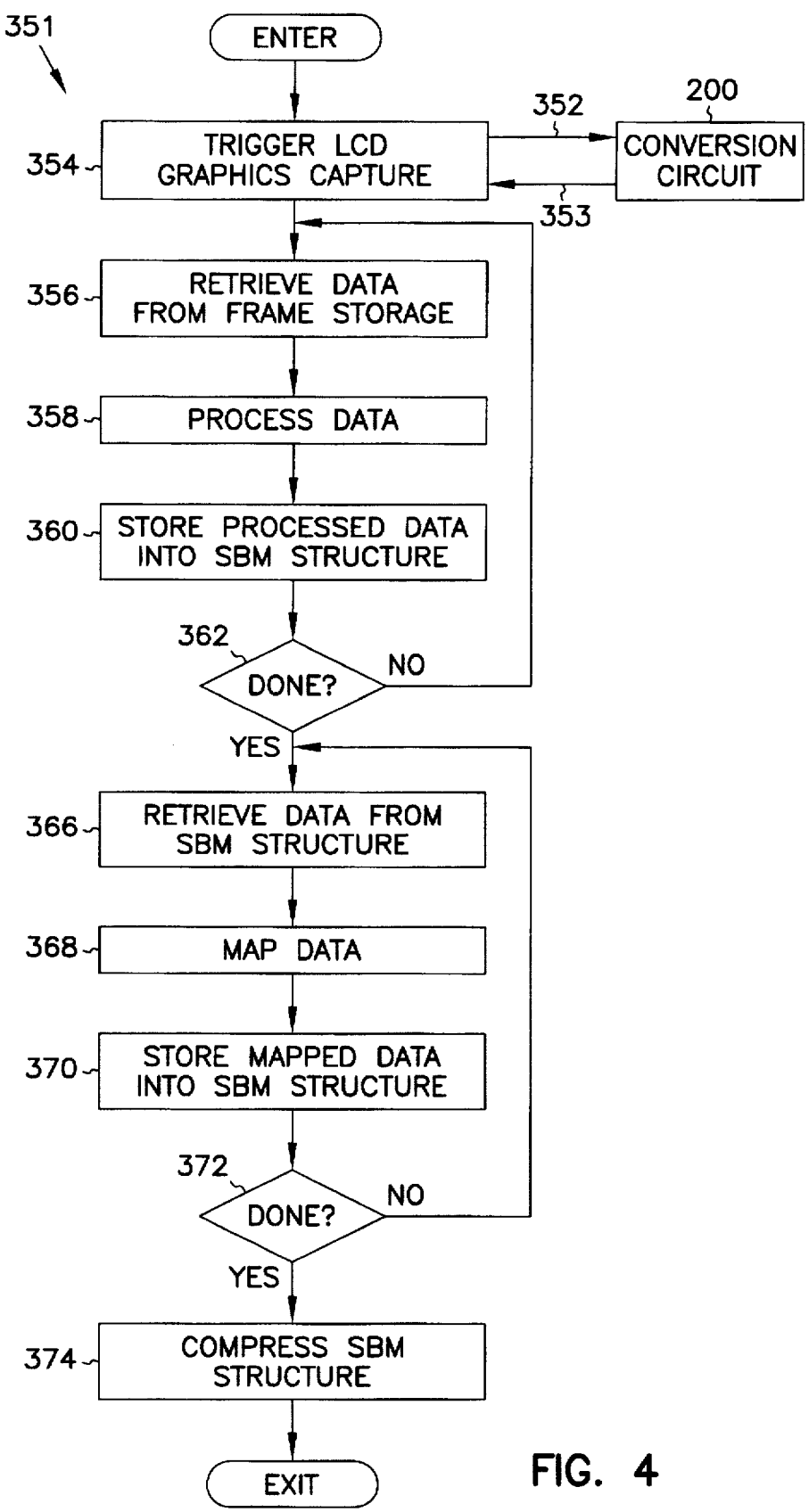
FIG. 4 shows a more detailed flow diagram of one embodiment of the make-bit-map software routine 351 according to the present
Figure 4A:
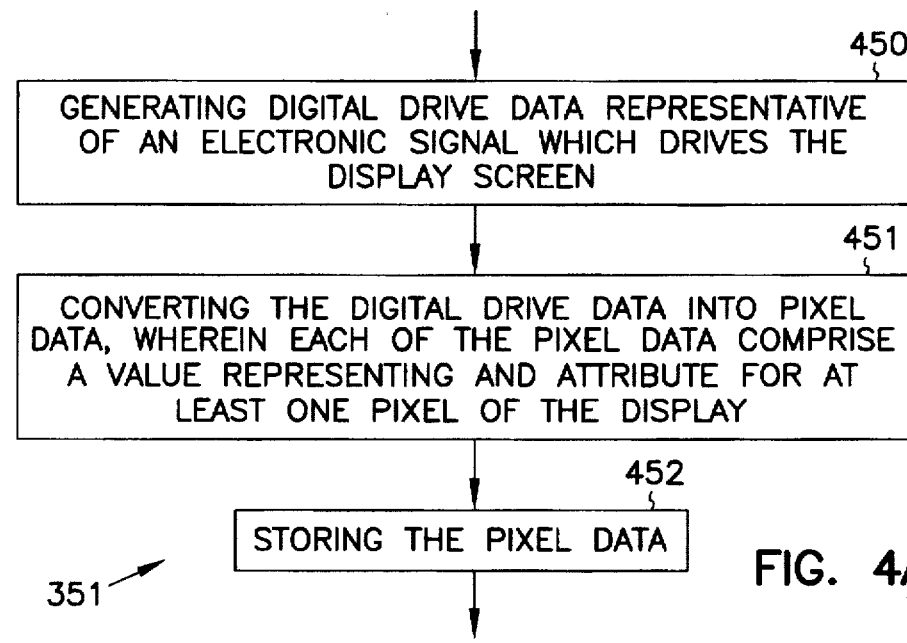
FIG. 4A shows a more detailed flow diagram of one embodiment of the make-bit-map software routine 351 according to the present invention.

FIG. 4A shows a more detailed flow diagram of one embodiment of the make-bit-map software routine 351 according to the present invention. In this embodiment, block 450 shows the step of Generating digital drive data representative of an electronic signal which drives the display screen, block 451 shows the step of Converting the digital drive data into pixel data, wherein each of the pixel data comprise a value representing an attribute for at least one pixel of the display, and block 452 shows the step of storing the pixel data.

Figure 4B:
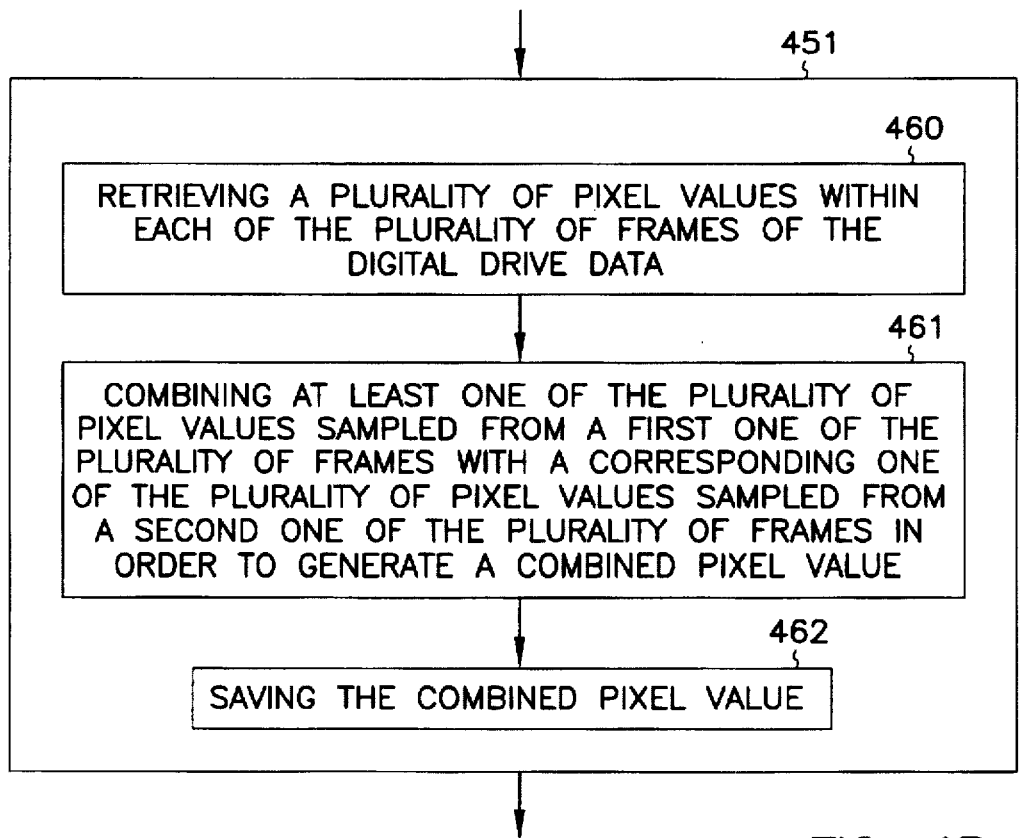
FIG. 4B shows a more detailed flow diagram of one embodiment of the converting step 451 according to the present invention.

FIG. 4B shows a more detailed flow diagram of one embodiment of the converting step 451 according to the present invention. In this embodiment, block 460 shows the step of Retrieving a plurality of pixel values within each of a plurality of frames of the digital drive data, block 461 shows the step of Combining at least one of the plurality of pixel values sampled from a first one of the plurality of frames with a corresponding one of the plurality of pixel values sampled from a second one of the plurality of frames in order to generate a combined pixel value, and block 462 shows the step of Saving the combined pixel value.

Figure 4C:
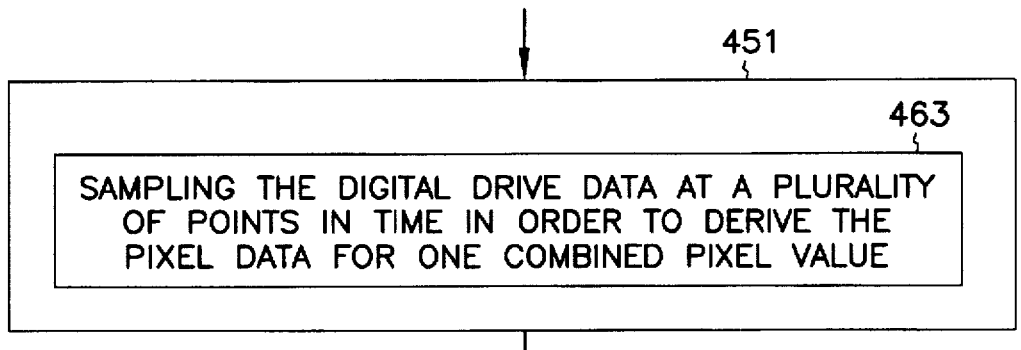
FIG. 4C shows a more detailed flow diagram of another embodiment of the converting step 451 according to the present invention.

FIG. 4C shows a more detailed flow diagram of another embodiment of the converting step 451 according to the present invention. In this embodiment, block 463 shows the step of Sampling the digital drive data at a plurality of points in time in order to derive the pixel data for one combined pixel value.

Figure 4D:
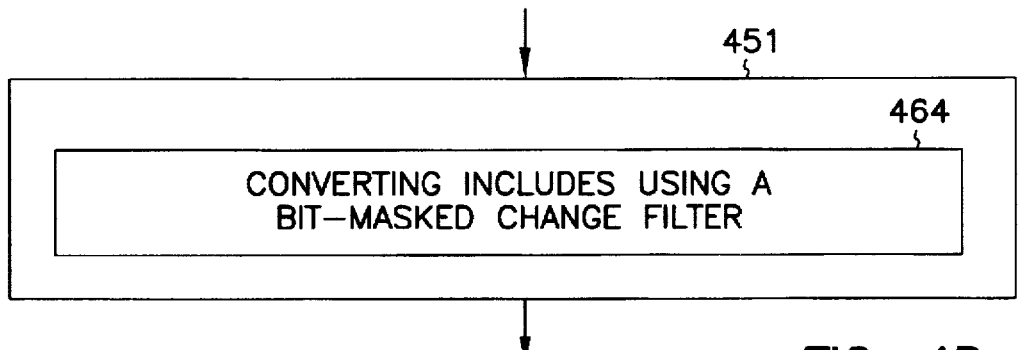
FIG. 4D shows a more detailed flow diagram of yet another embodiment of the converting step 451 according to the present invention.
Figure 4E:
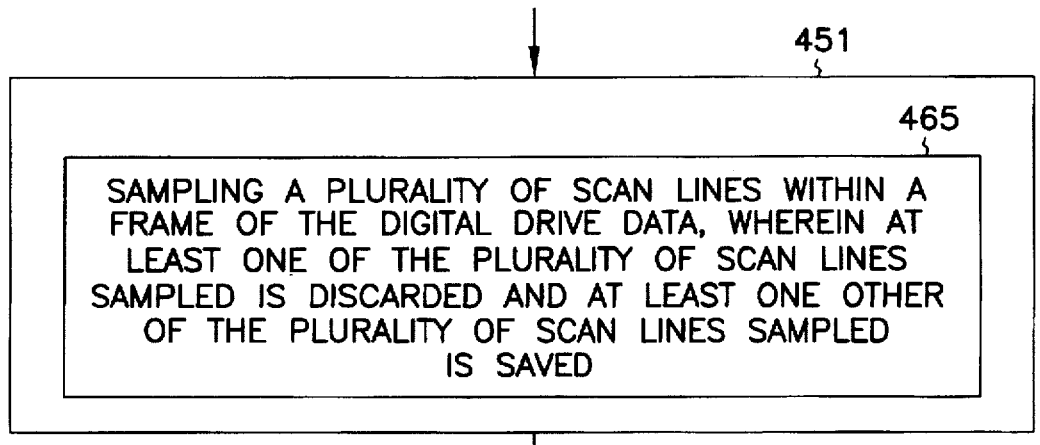
FIG. 4E shows a more detailed flow diagram of still another embodiment of the converting step 451 according to the present invention. invention.

FIG. 4D shows a more detailed flow diagram of yet another embodiment of the converting step 451 according to the present invention. In this embodiment, block 464 shows the step of Converting includes using a bit-masked change filter FIG. 4E shows a more detailed flow diagram of still another embodiment of the converting step 451 according to the present invention. In this embodiment, block 465 shows the step of Sampling a plurality of scan lines within a frame of the digital drive data, wherein at least one of the plurality of scan lines sampled is discarded and at least one other of the plurality of scan lines sampled is saved.

FIG. 4 shows a more detailed flow diagram of one embodiment of the make-bit-map software routine 351 according to the present invention. After software 351 is entered, control passes to block 354. In one embodiment, the program code of block 354 zeros all portions of frame storage 240 which are to be filled with the raw data from the LCD data capture. The program code of block 354 also triggers a signal 352 which, in one embodiment, is coupled as a capture command on the EISA bus to EISA interface 250 of conversion circuit 200. In one embodiment, the capture command causes genlock circuit 230 to generate a lock at the beginning of a frame (e.g., at the start of the next whole frame detected), which results in a specified number of frames being stored in frame storage 240. (In one embodiment, an empirically-derived number of frames is determined, and the programmable logic of GCC 220 is permanently configured to store that predetermined number of flames whenever it is triggered.) In one embodiment, conversion circuit 200 generates a signal 353 which is coupled as an interrupt to the software of block 354 after a specified amount of frame data has been captured (in one embodiment, after a complete frame set has been captured and stored). In another embodiment, a timer is used to alert the software of block 354 when a sufficient amount of time has passed to capture the desired data. In one embodiment, up to five retries of the frame-set capture are performed, and if all five retries fail, an error message is displayed. Control then passes to block 356. The program code of block 356 calculates the address in frame storage 240 of a particular pixel, retrieves the data for that pixel. Control then passes to block 358. The program code of block 358 processes the pixel data (in one embodiment, an SBM (standard bit map) structure 420 is initially setup with zeros for every pixel in the bit map, every pixel value from the first frame is added to the corresponding pixel (initially zero) in the bit map by passing through blocks 356, 358, 360, and 362 for every pixel of the first frame, then the second through Nth frames are similarly added, so that N corresponding pixel values from N frames are added to calculate the corresponding pixel value in the bit map). Control then passes to block 360. The program code of block 360 stores the processed data into SBM structure 420, and block 362 determines whether all pixels of all frames have been processed, and if not, loops back to block 356. In one embodiment, the "top" scan line data is captured last (or, equivalently (since each scan line is added to the corresponding scan line from every other frame captured), the top scan line from every frame is stored as the last scan line of the previous frame), so blocks 356–362 move this "top" line from last position in each frame in frame storage 240 to first position in SBM structure 420, moving every other scan line down one position; since the corresponding scan lines are combined by block 358 by addition of the corresponding scan lines of every frame, it doesn't matter what order the addition is performed, the resultant value will be correct. In some embodiments, some or all of blocks 356–362 are coded in assembly code to achieve better performance. In one embodiment, the resultant pixel data array 429 comprises a one-byte pixel color value for every pixel of a 640-by-480 pixel display. Control then passes to block 366. The program code of block 366—block 372 are used in one embodiment to map values the processed SBM structure data resulting from the processing of blocks 356–362 into more-convenient or useful values. For example, in one embodiment, it is desired to have similar tests performed on both of two different LCD display controller 93—LCD display unit 95 combinations, each of which generate different numerical pixel values for the same colors, or to have similar tests used to test and compare an LCD-display implementation of DUT 100 with a CRT-display implementation of DUT 100. In one embodiment, block 366 calculates the address of the first (or next) pixel, and retrieves a one-byte pixel value from that address in the array in SBM structure 420, block 368 maps that value into a "standard" color value using a 256-entry table lookup, block 370 stores the resultant mapped byte value back into the SBM structure, and block 372 determines whether all pixels have been processed, and loops back to block 366 if not. The program code of block 374 is used in one embodiment to perform a run-length compression of the processed array of SBM structure 420 in order to save storage in test-control computer 300. Control then passes to the exit of make-bit-map software 351.

Figure 7:
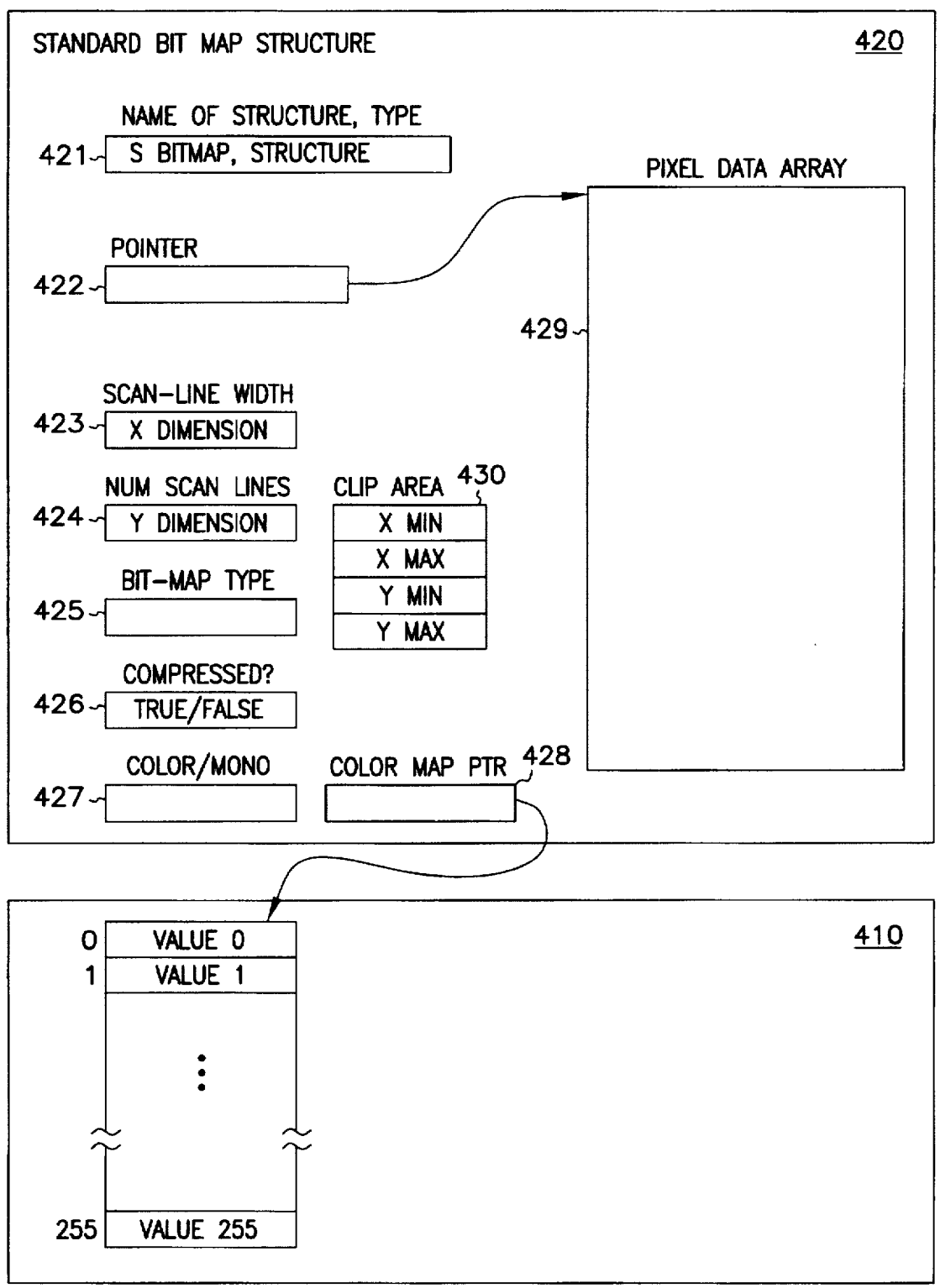
FIG. 7 shows details of one embodiment of a data structure used to hold a standard bit map usable to hold the results of the LCD capture and conversion process, according to the present invention.

In one embodiment as shown in FIG. 7, the standard bit map (SBM) structure 420 includes the name of the structure (sBitMap) and its type (structure) 421, a pointer 422 that points to the pixel data array 429, and the pixel data array 429. Also included are parameters which characterize the data in the array, including scan-line width 423 (i.e., the x-dimension of the array), the number of scan lines 424 (i.e., the y-dimension of the array), the bit-map type 425, a compressed indicator 426 that shows whether the array data is compressed, a color/mono indicator 427, a color map pointer 428 that points to a color map 410, and a clip area indicator 430, that in one embodiment indicates X-MIN, X-MAX, Y-MIN, and Y-MAX of the clip area.

Figure 5:
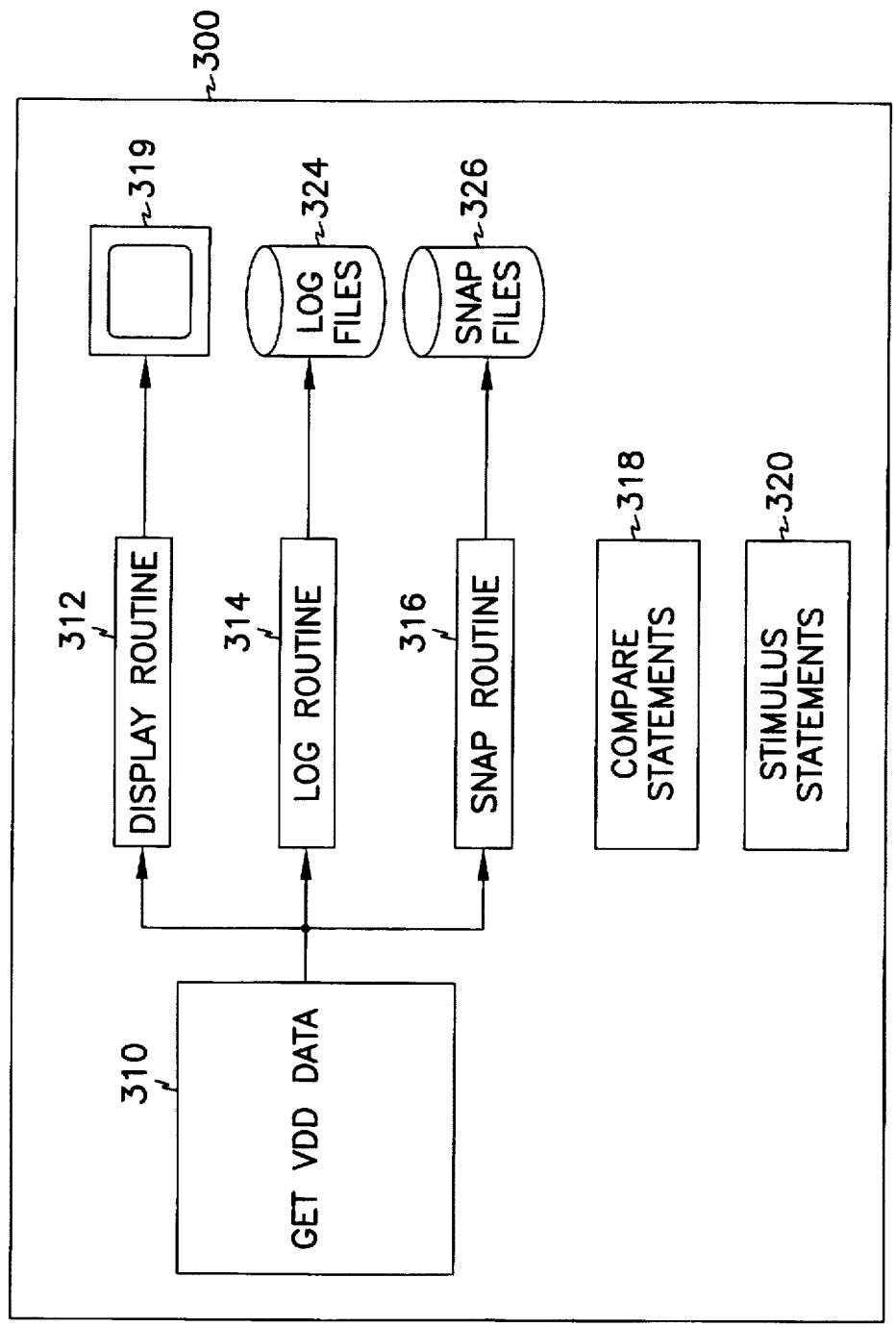
FIG. 5 shows some details of the data flow and functions provided by the software and hardware of test-control computer 300 as used to capture outputs to an LCD display screen from target microprocessor 120.

FIG. 5 shows some details of the data flow and functions provided by the software and hardware of test-control computer 300 as used to capture outputs to an LCD display screen from target microprocessor 120.

Figure 6:
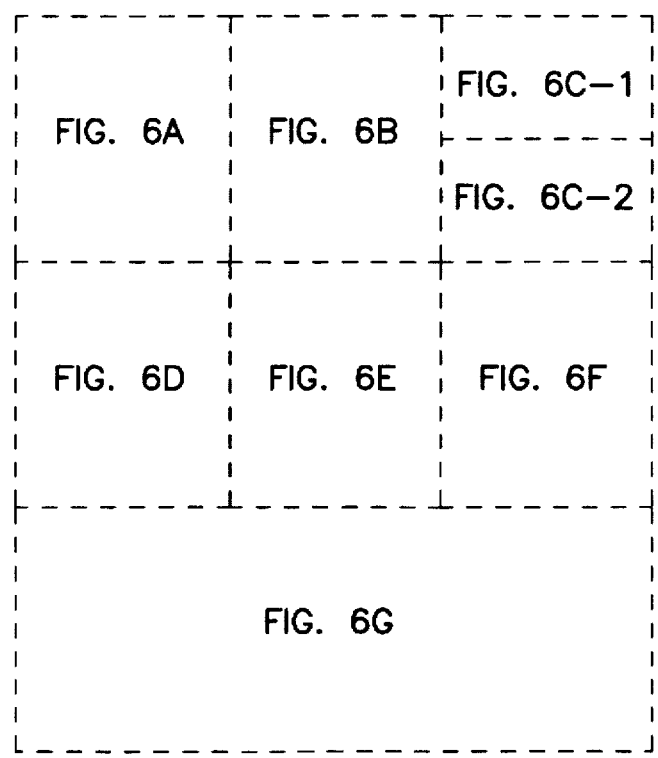
FIG. 6 is a key drawing showing the association of FIGS. 6A–6G.
Figure 6A:
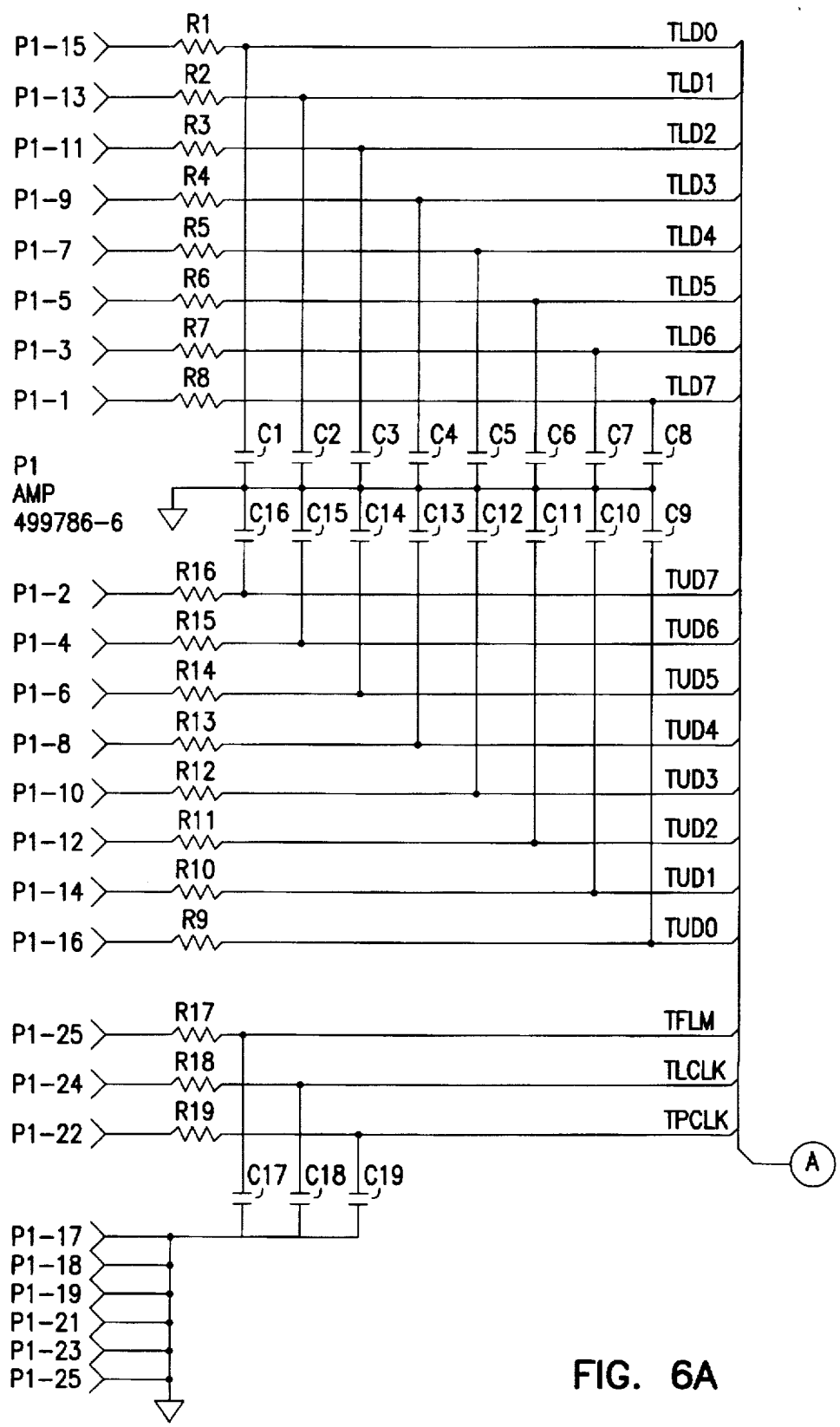

FIGS. 6A–6G show a schematic of the hardware implementation of one exemplary embodiment of preprocessing circuit (PPC) 210. FIGS. 6A–6F can be placed next to one another to form a single large schematic, with points "A" connected to one another. FIG. 6G shows pin connections for LCD probe 140. On FIG. 6A, input signals PI-1 through PI-26 are coupled to LCD drive probe 140 through an AMP brand type 499786-6 connector to capture up to as many signals as: an upper data byte, a lower data byte (since some color LCD controller chips 93 send 16 data bits per clock), and three clock/control signals. In one embodiment, low-pass filters, comprising resistor-capacitor pairs R1–C1 through R19–C19 are used to condition the input signals to reduce ringing and produce conditioned test signals TUD0 through TUD7, TLD0 through TLD7, TPCLK, TLCLK, and TFLM. In another embodiment, RC pairs R1–C1 through R19–C19 are omitted, replacing the resistors with zero-ohm conductors.

Figure 6B:
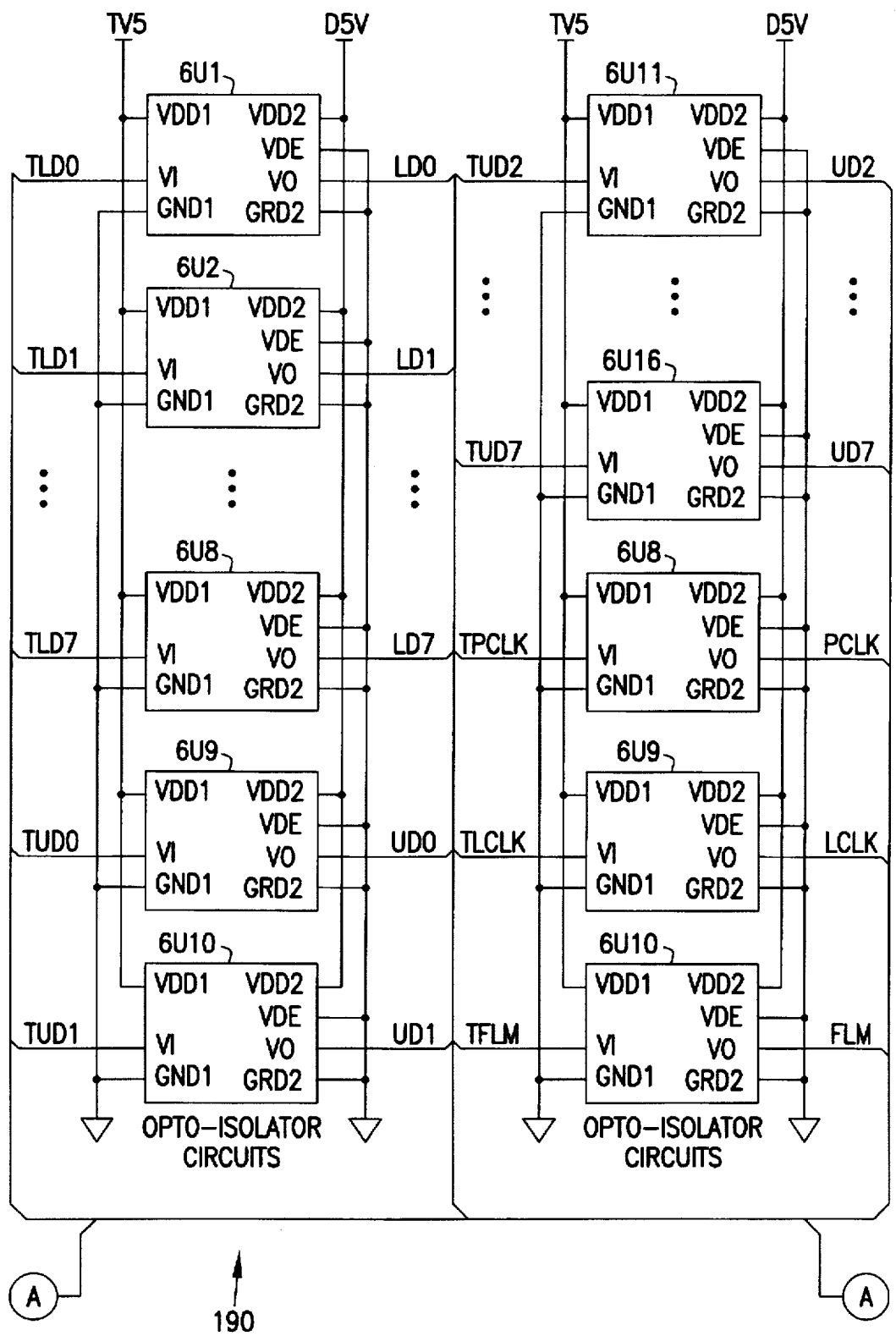
Figures 1, 6C:
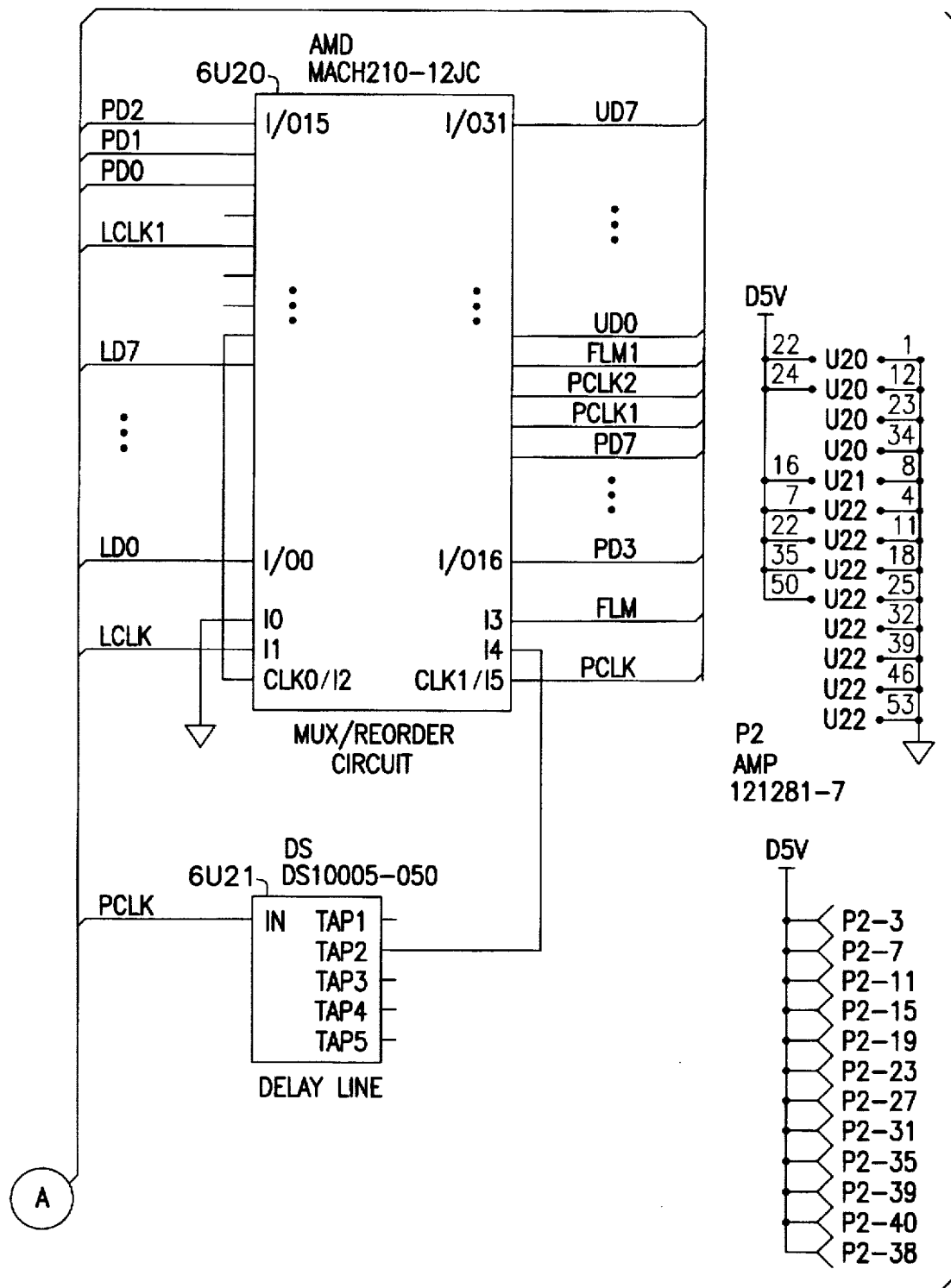
Figures 2, 6C:
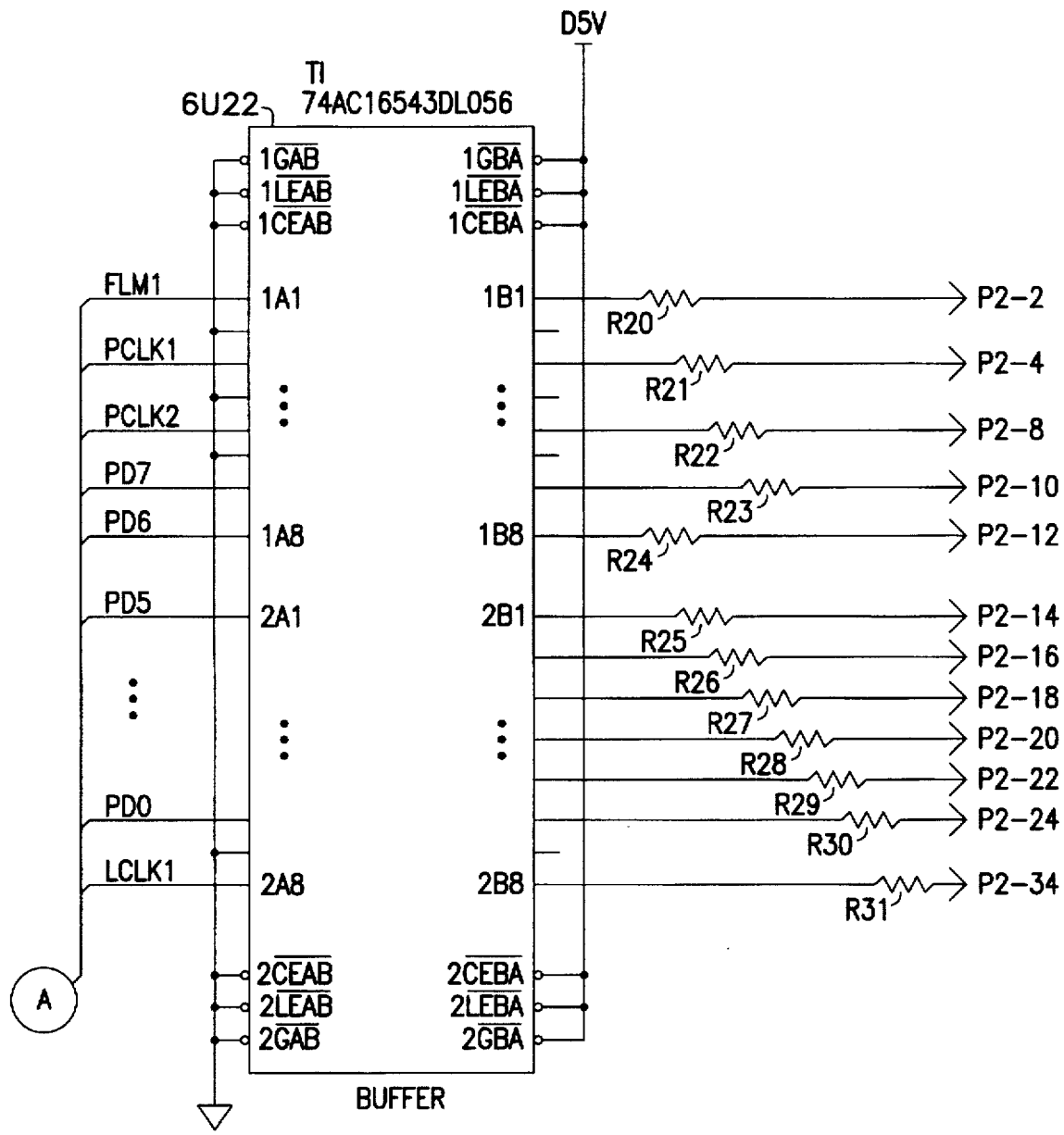
Figure 6D:
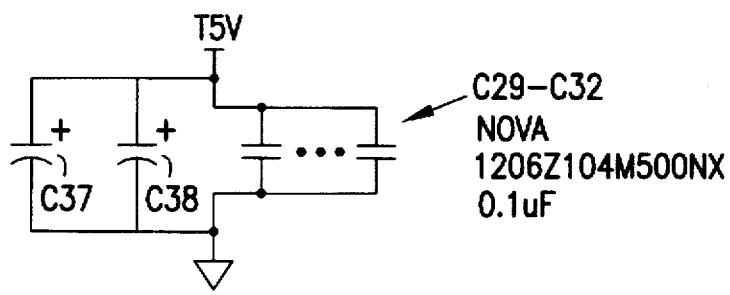
Figure 6E:
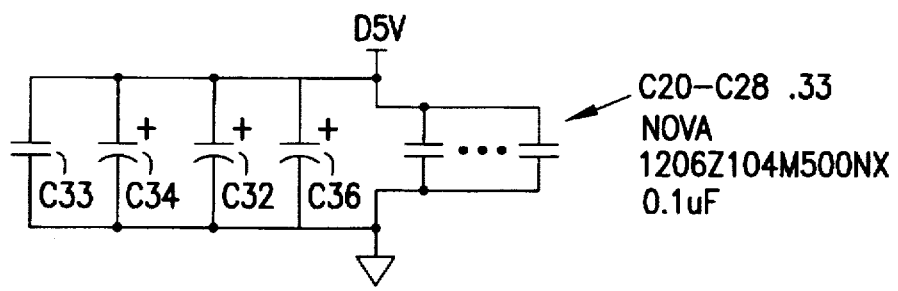
Figure 6F:
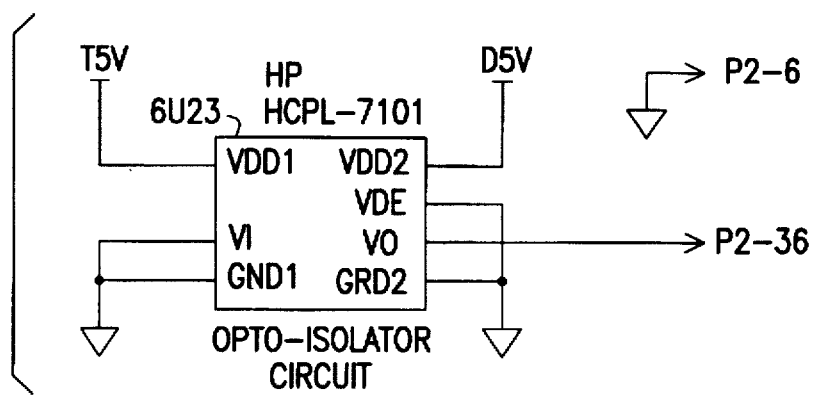

Referring to FIG. 6B, the sixteen data signals and three clock/control signals are optically isolated and coupled by opto-isolator circuits 6U1 through 6U19 (opto-isolator circuits 6U23 of FIG. 6F is used in one embodiment, to provide a reference ground signal), each of which, in one embodiment, are HP HCPL-7101 type parts available from Hewlett-Packard Corp, and which collectively form opto-isolator coupler 190. Separate voltage supplies T5V and D5V, and separate grounds T and D, are used for the two sides of the isolators.

Referring to FIG. 6C, the isolated sixteen data signals, UD0 through UD7 and LD0 through LD7, and three clock/control signals, PCLK (pixel clock), LCLK (line clock, or horizontal sync) and FLM (first line marker, or vertical sync), are coupled to programmable logic device 6U20, which in one embodiment is a MACH210-12JC programmable logic device available from AMD Corp, and which forms mux/reorder circuit 215. The upper and lower bytes of data, 6UD0 through UD7 and LD0 through LD7 respectively, are multiplexed onto signals P0 through P7 by programmable logic device 6U20. Clock signal PCLK is also coupled through delay line 6U21, which is as DS10005-050 type part available from Dallas Semiconductors Inc., 4401 South Builtwood Parkway, Dallas, Tex. 75244, and then coupled to programmable logic device 6U20. Programmable logic device 6U20 also conditions PCLK, the delayed PCLK, LCLK, and FLM, and produces PCLK1 (pixel clock for the first demultiplexed byte), PCLK2 (pixel clock for the second demultiplexed byte), LCLK1 and FLM1, respectively, therefrom, to be used as pixel clocks, vertical sync, and horizontal sync by GCC 220. Buffer 6U22, which in one embodiment is a 74AC16543DL056 type device available from Texas Instruments (TI) Corp. is used to buffer signals P0 through P7, PCLK1, PCLK2, LCLK1 and FLM1 to drive the signals through resistors R20 through R31 to GCC 220. FIGS. 6D and 6E show decoupling capacitors used on the T5V and D5V voltage supply connections to the various parts of preprocessing circuit (PPC) 210.

FIGS. 8A–8M show a schematic of the hardware implementation of one embodiment of graphics capture circuit (GCC) 220. FIGS. 8A–8M can be placed next to one another to form a single large schematic for the following discussion.

Figure 8:
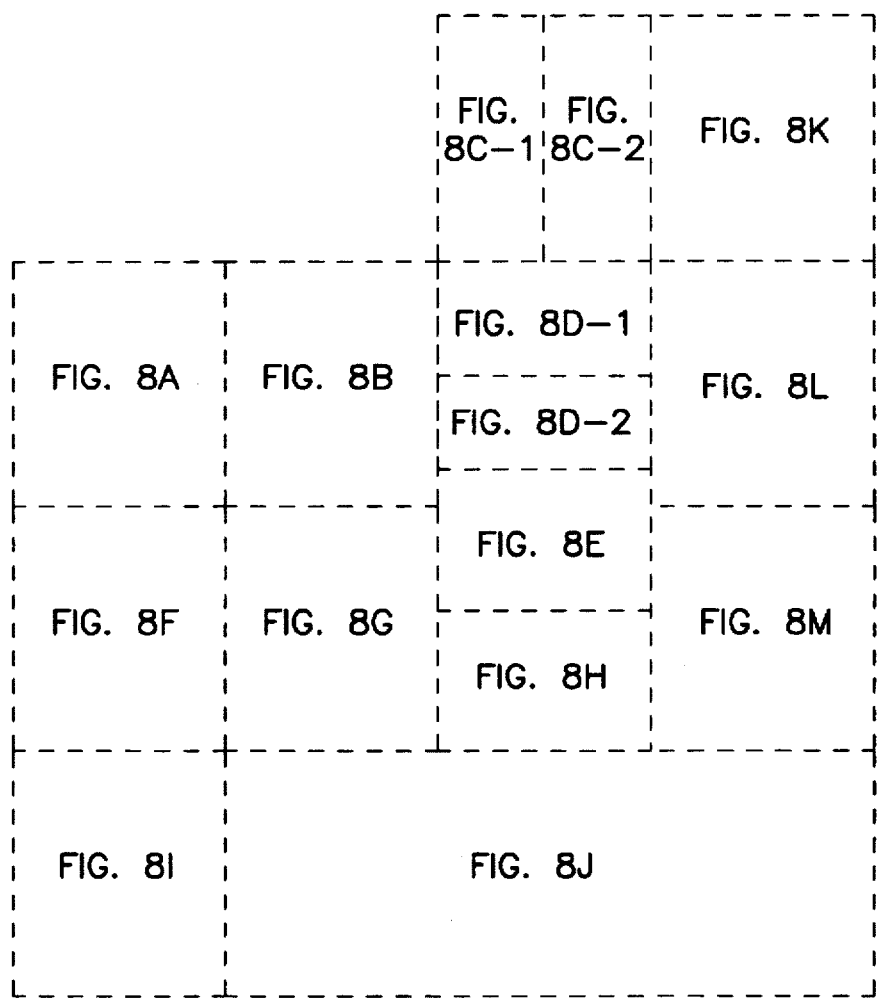
FIG. 8 is a key drawing showing the association of FIGS. 8A–8M.
Figure 8A:
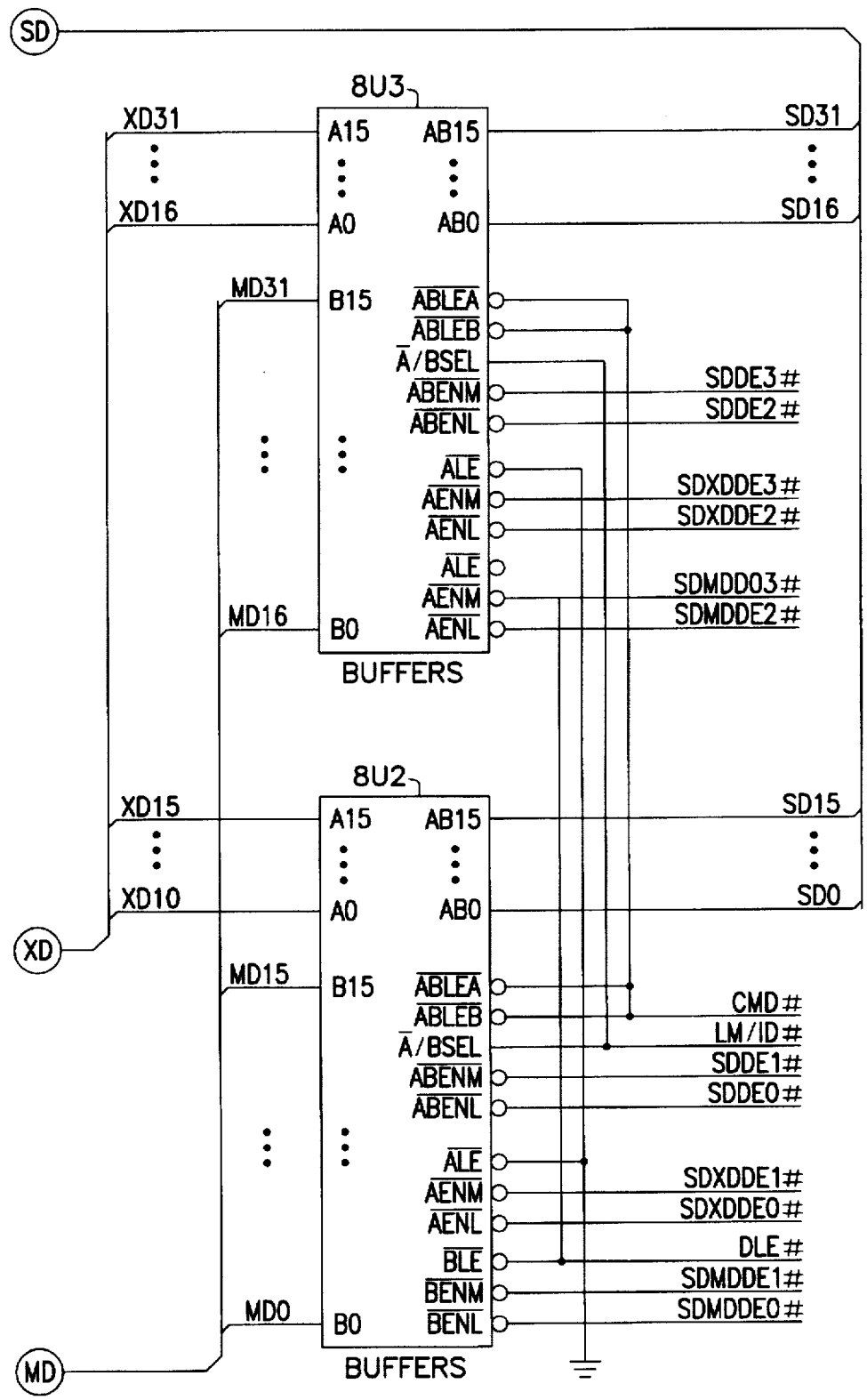
Figure 8B:
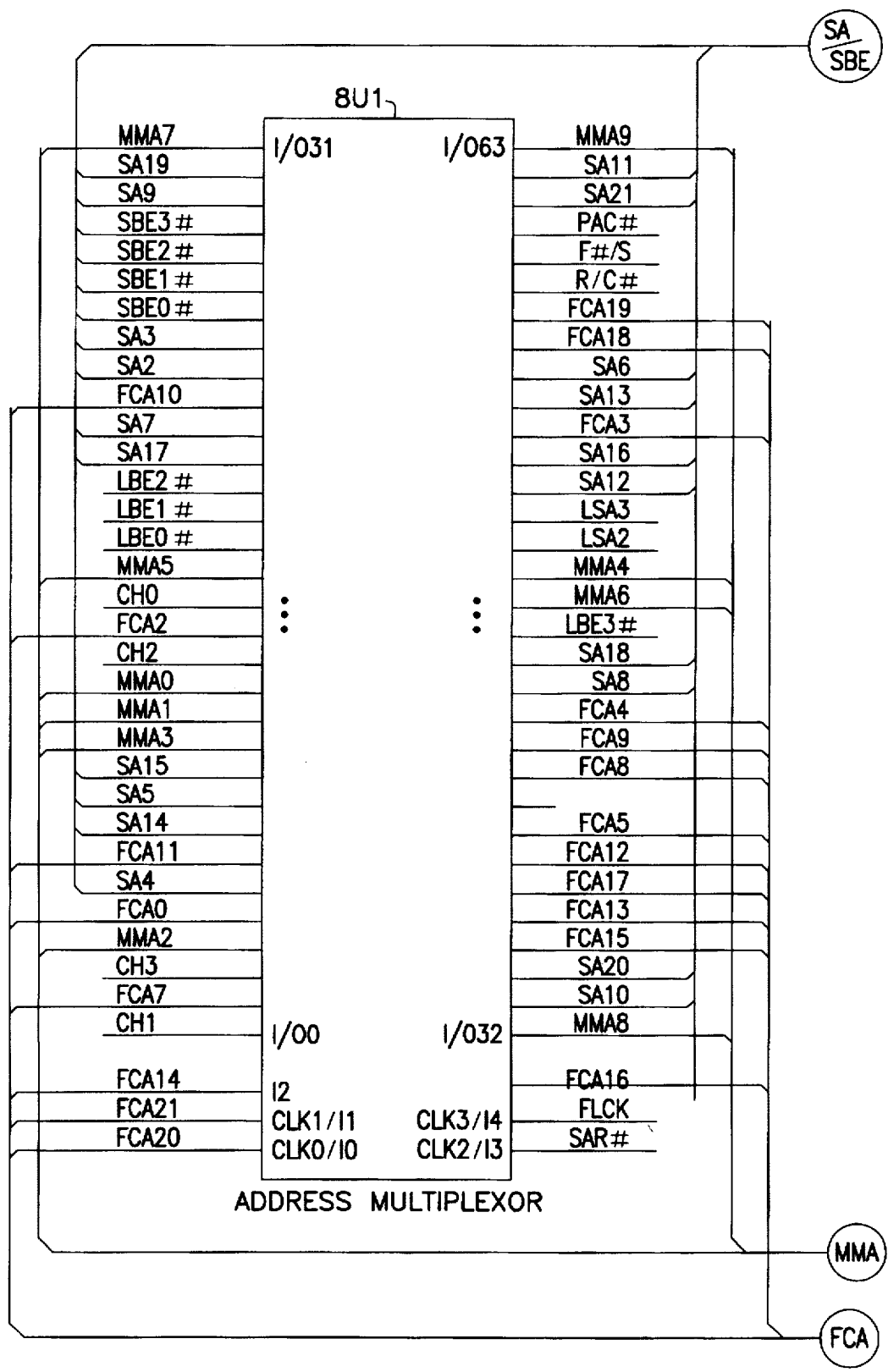

Programmable logic device 8U1 shown in FIG. 8B, which in one embodiment is a MACH230-12JC type programmable logic device available from AMD Corp, forms an address multiplexor for the address to frame storage 240, and drives this address from either the EISA interface 250 or the counter of the frame capture function. Appendix D shows the PALASM programming for an exemplary PLD 8U1, which is labeled GCC-8U1.pds.

Buffers 8U2 and 8U3 shown in FIG. 8A, each of which in one embodiment is a 74BCT2424AFN type part, available from Texas Instruments (TI) Corp, form a driver for the data paths between frame storage 240 and the input/output (I/O), i.e., frame capture from FIFO 235, and reads/writes from EISA interface 250.

Figures 1, 8C:
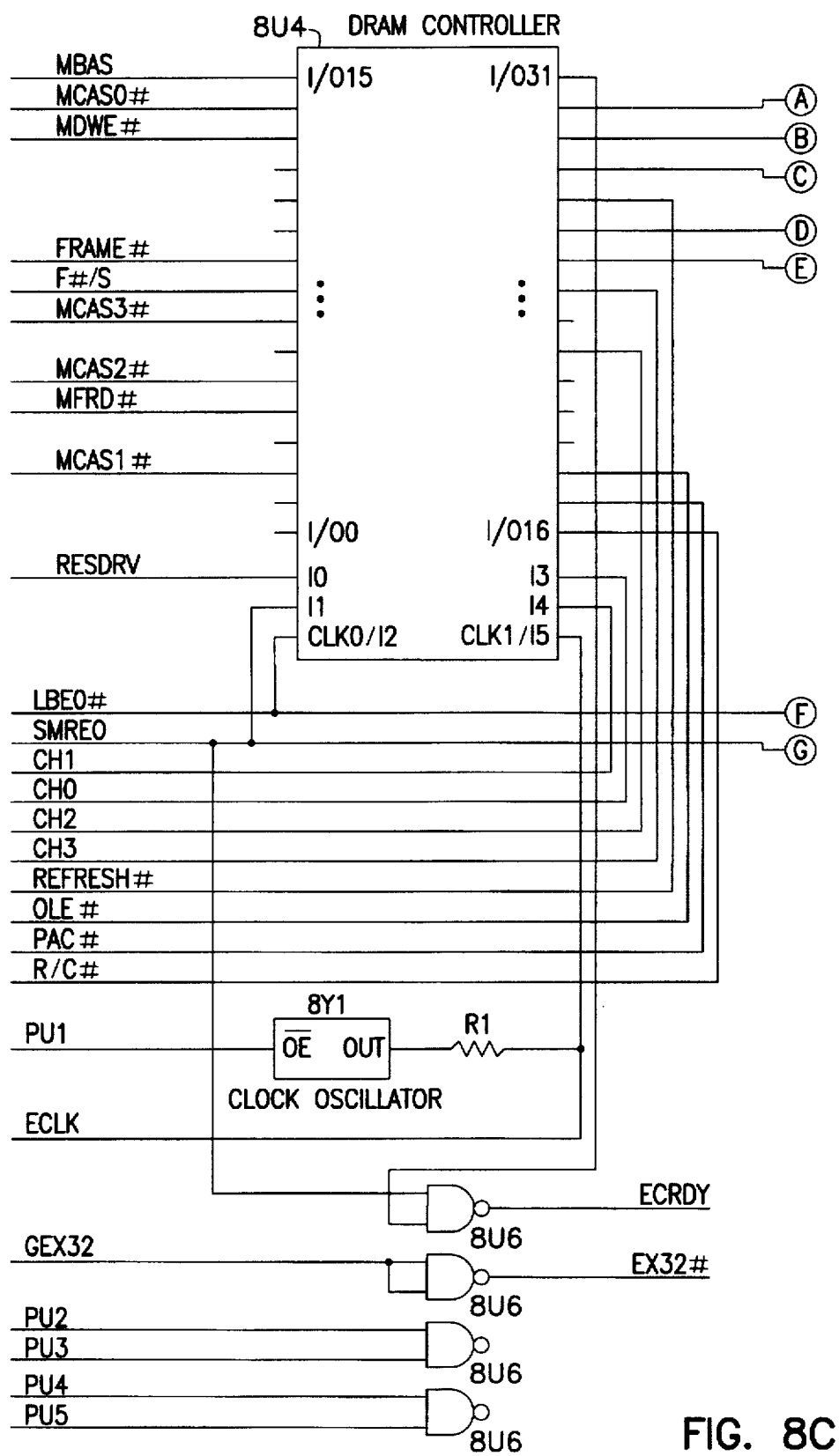
Figures 2, 8C:
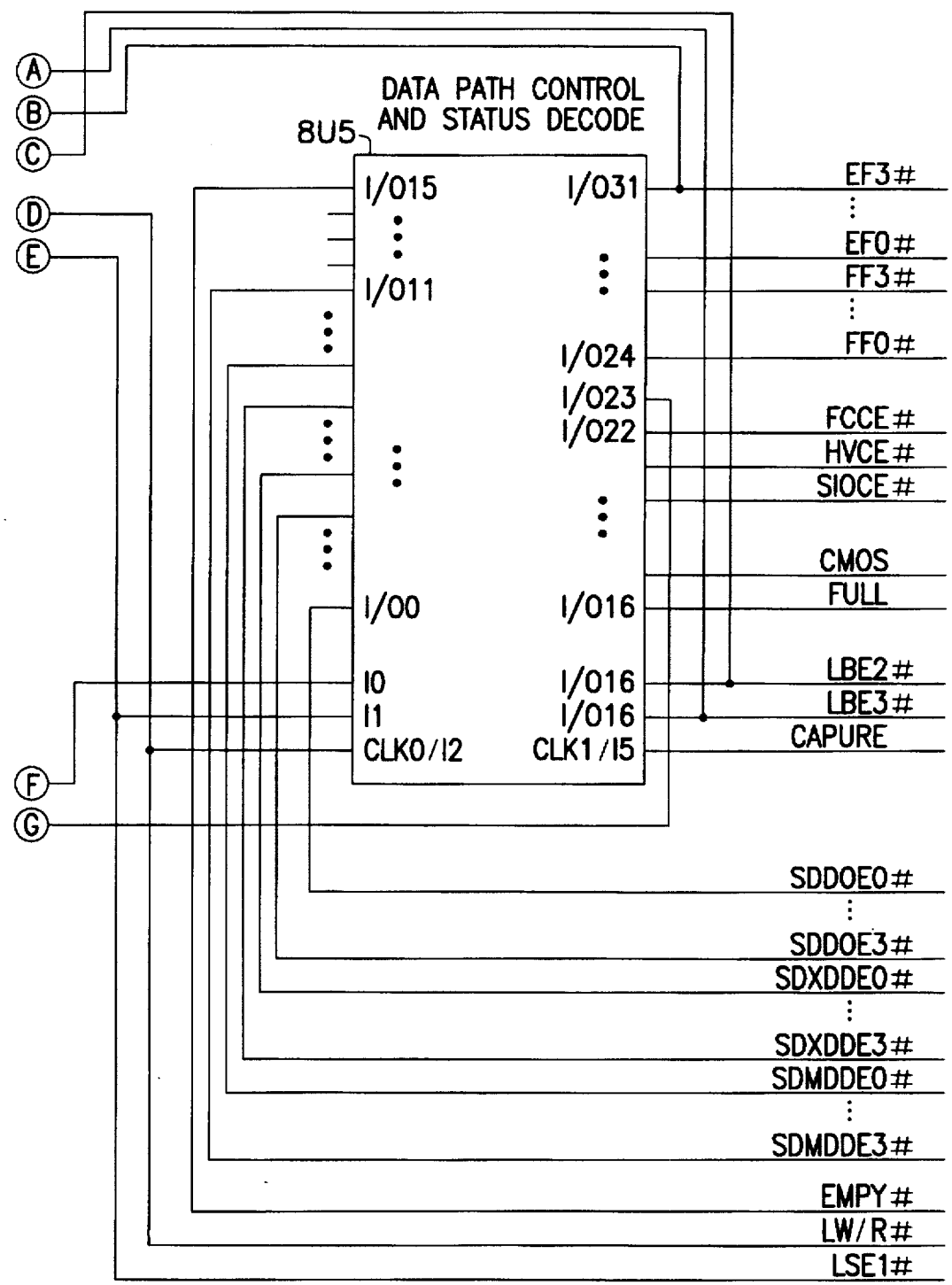

Programmable logic device 8U4 shown in FIG. 8C, which in one embodiment is a MACH210-12JC type programmable logic device available from AMD Corp, forms a DRAM controller for controlling the memory cycles of frame storage 240, and thus controls refresh, frame capture from FIFO 235, and reads/writes from EISA interface 250. Appendix D shows the PALASM programming for an exemplary PLD 8U4, which is labeled GCC-8U4.pds.

Programmable logic device 8U5 shown in FIG. 8C, which in one embodiment is a MACH210-12JC type programmable logic device available from AMD Corp, forms the data path control and the status decode for FIFO 235. Appendix D shows the PALASM programming for an exemplary PLD 8U5, which is labeled GCC-8U5.pds.

Programmable logic device 8Y1 shown in FIG. 8C, which in one embodiment is a CTS MX045 clock oscillator type device by CTS, available from Digikey, 701 Brooks Av. S., Thief River Falls 56701, forms a timing clock signal for the DRAM controller of device 8U4 and the frame address counter of device 8U8.

NAND (not-AND logic) gates 8U6 shown in FIG. 8C, which in one embodiment is a 74AC00 type device available from TI Corp, generates a data-ready signal EXRDY for EISA interface 250, and generates a 32-bit access signal EX32#.

Figures 1, 8D:
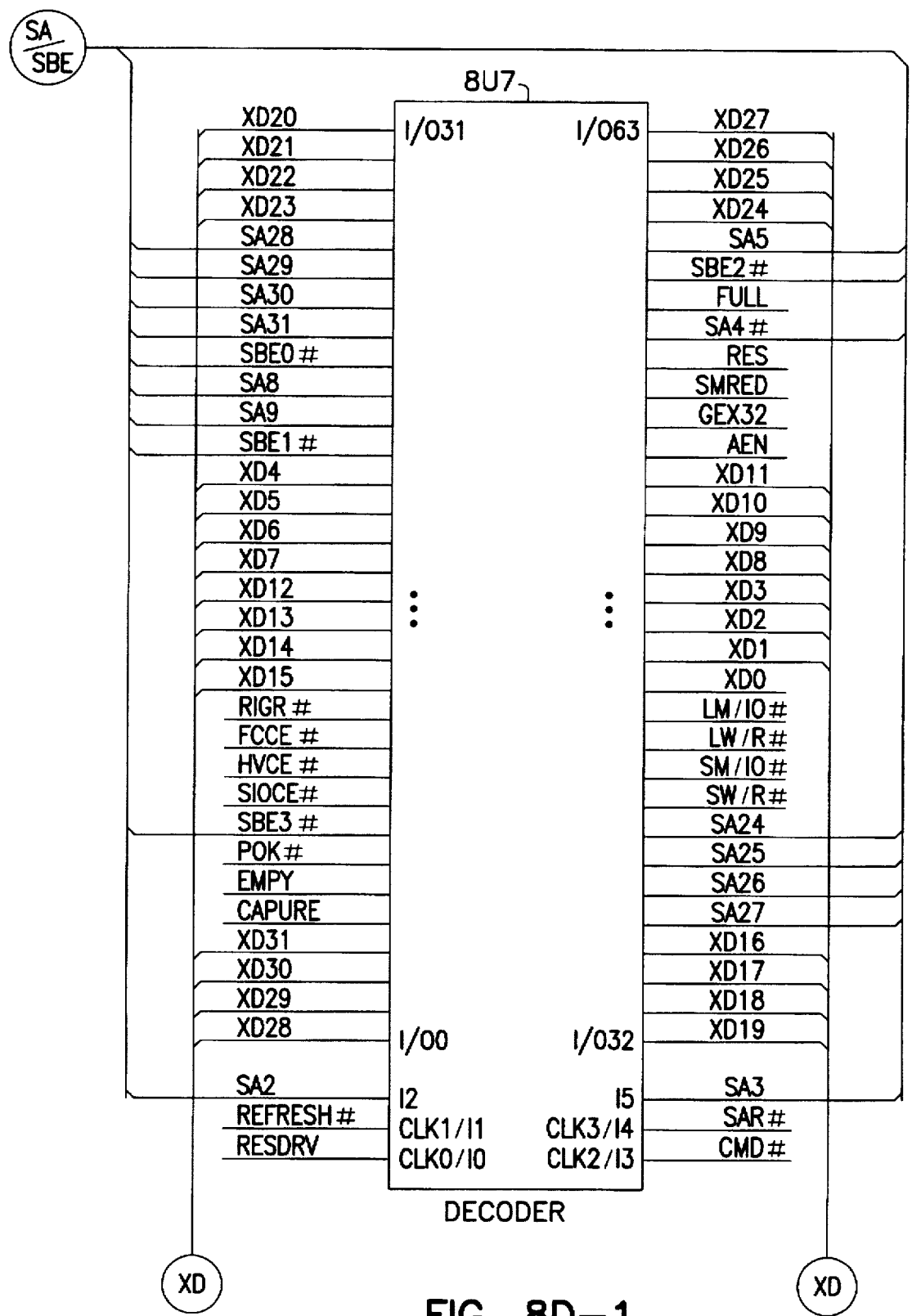
Figures 2, 8D:
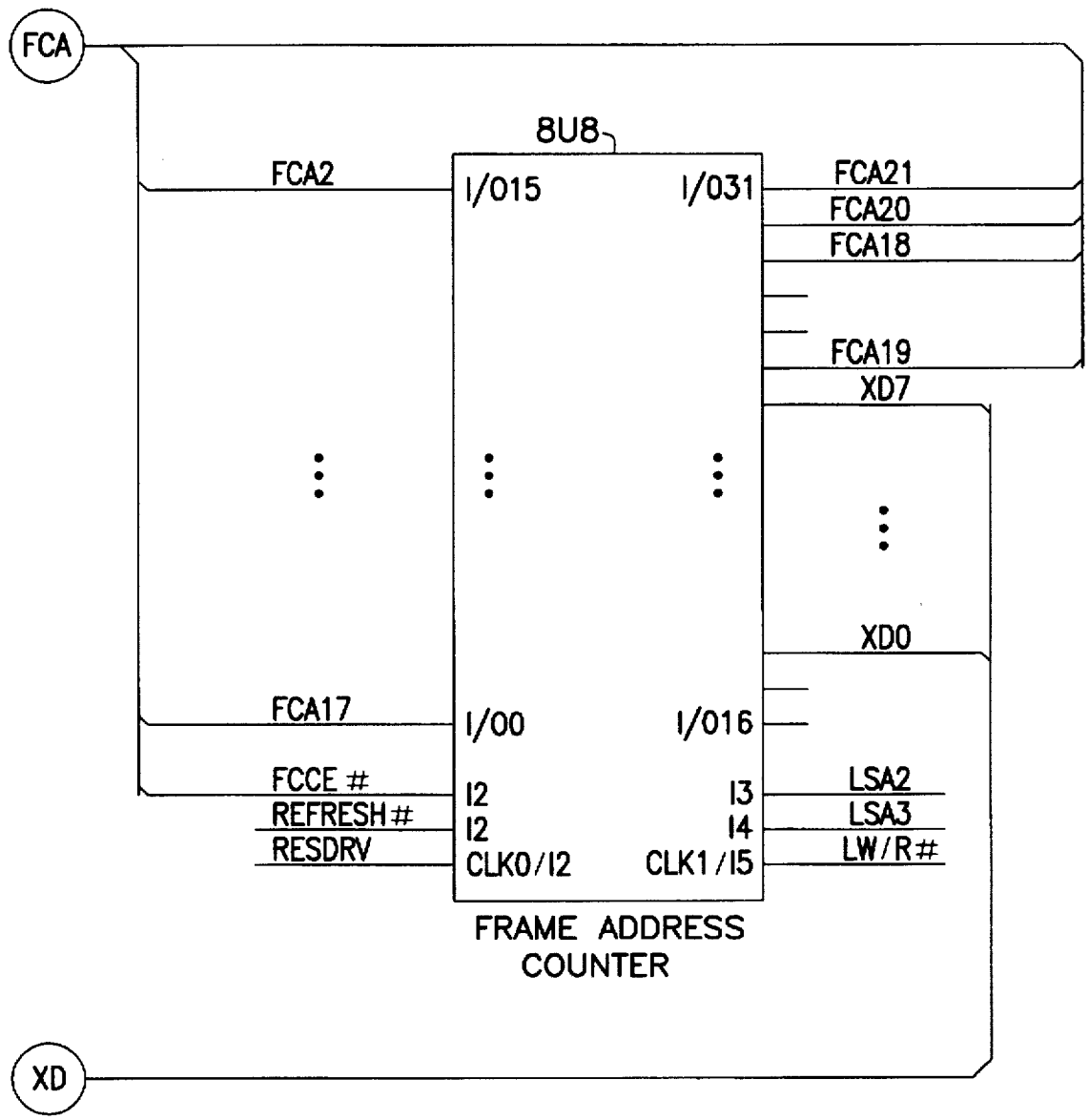

Programmable logic device 8U7 shown in FIG. 8D, which in one embodiment is a MACH230-12JC type programmable logic device available from AMD Corp, forms part of EISA interface 250 as an EISA decoder, providing chip selects, an EISA identifier, memory mapping, and a frame capture trigger signal which is sent from EISA interface 250 to genlock circuit 230. Appendix D shows the PALASM programming for an exemplary PLD 8U7, which is labeled GCC-8U7.pds.

Programmable logic device 8U8 shown in FIG. 8D, which in one embodiment is a MACH210-12JC type programmable logic device available from AMD Corp, forms a frame address counter, which specifies the location in frame storage 240 into which the next data from a frame capture is to be stored. Appendix D shows the PALASM programming for an exemplary PLD 8U8, which is labeled GCC-8U8.pds.

Figure 8E:
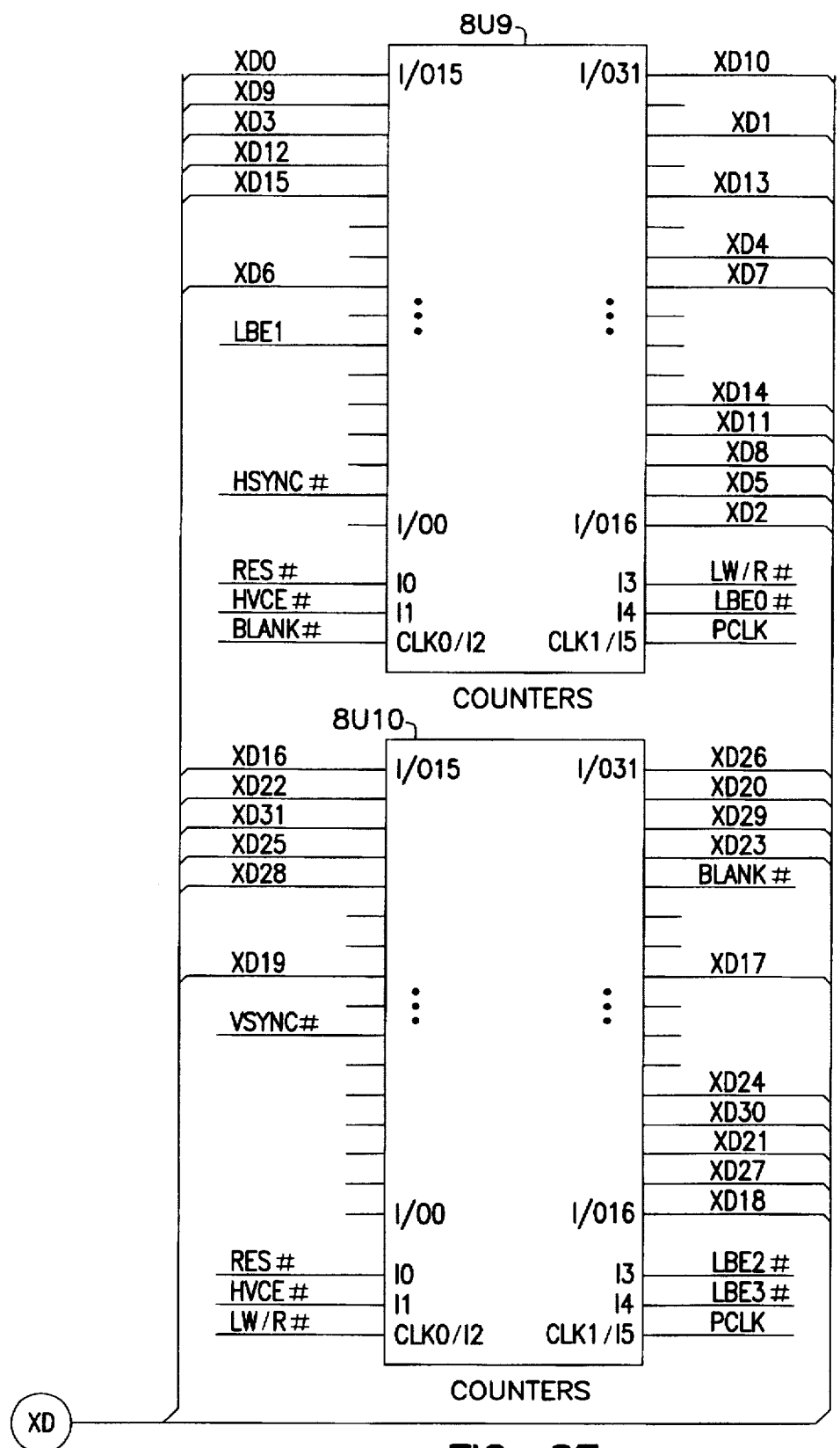

Programmable logic device 8U9 shown in FIG. 8E, which in one embodiment is a MACH210-12JC type programmable logic device available from AMD Corp, forms a horizontal resolution counter, which counts the number of pixels between horizontal sync signals, thus making available to software 350 the number of pixels per horizontal scan line. Appendix D shows the PALASM programming for an exemplary PLD 8U9, which is labeled GCC-8U9.pds.

Programmable logic device 8U10 shown in FIG. 8E, which in one embodiment is a MACH210-12JC type programmable logic device available from AMD Corp, forms a vertical resolution counter, which counts the number of scan lines between vertical sync signals, thus making available to software 350 the number of horizontal scan lines per frame. Appendix D shows the PALASM programming for an exemplary PLD 8U10, which is labeled GCC-8U10.pds.

Figure 8F:
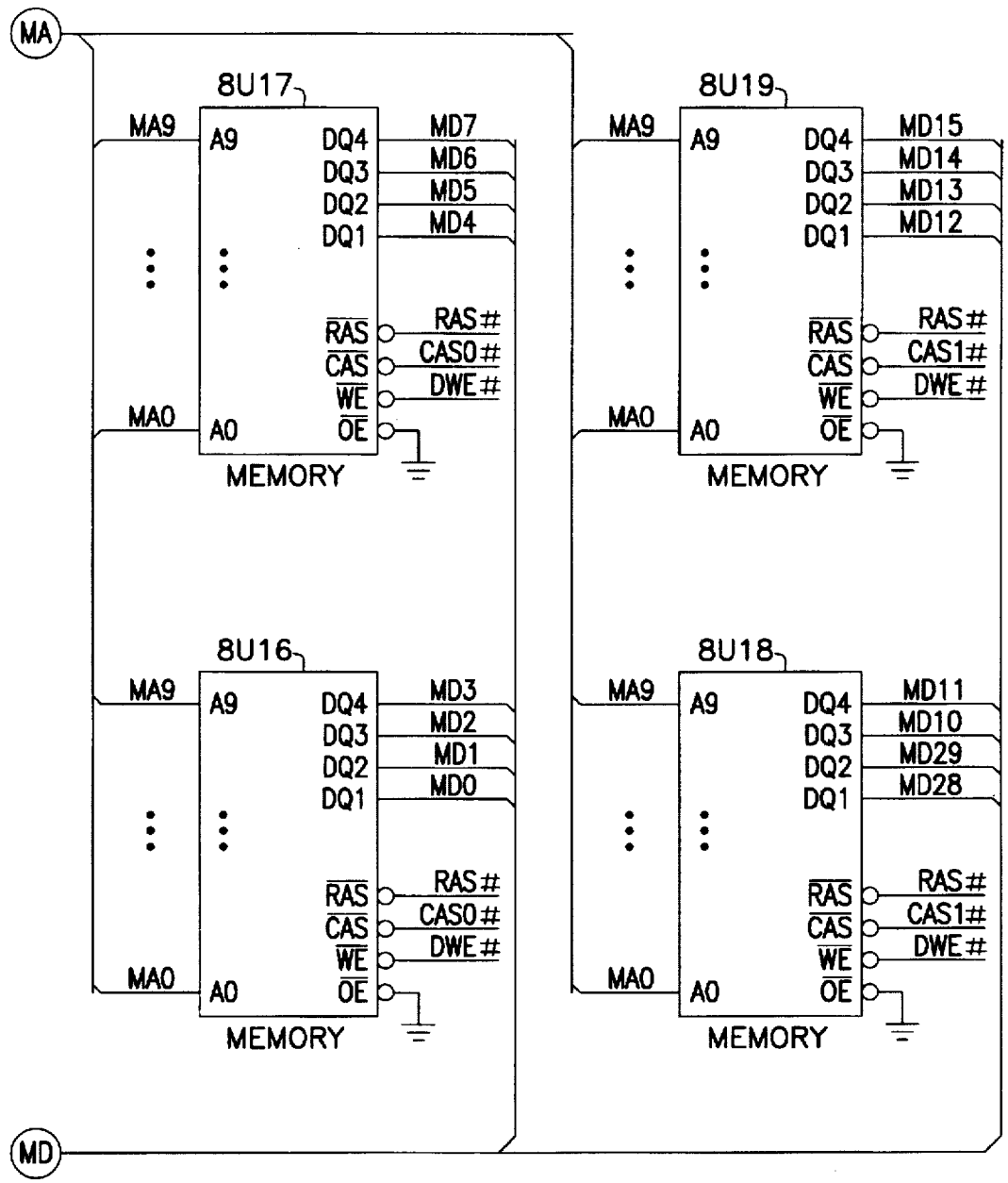
Figure 8G:
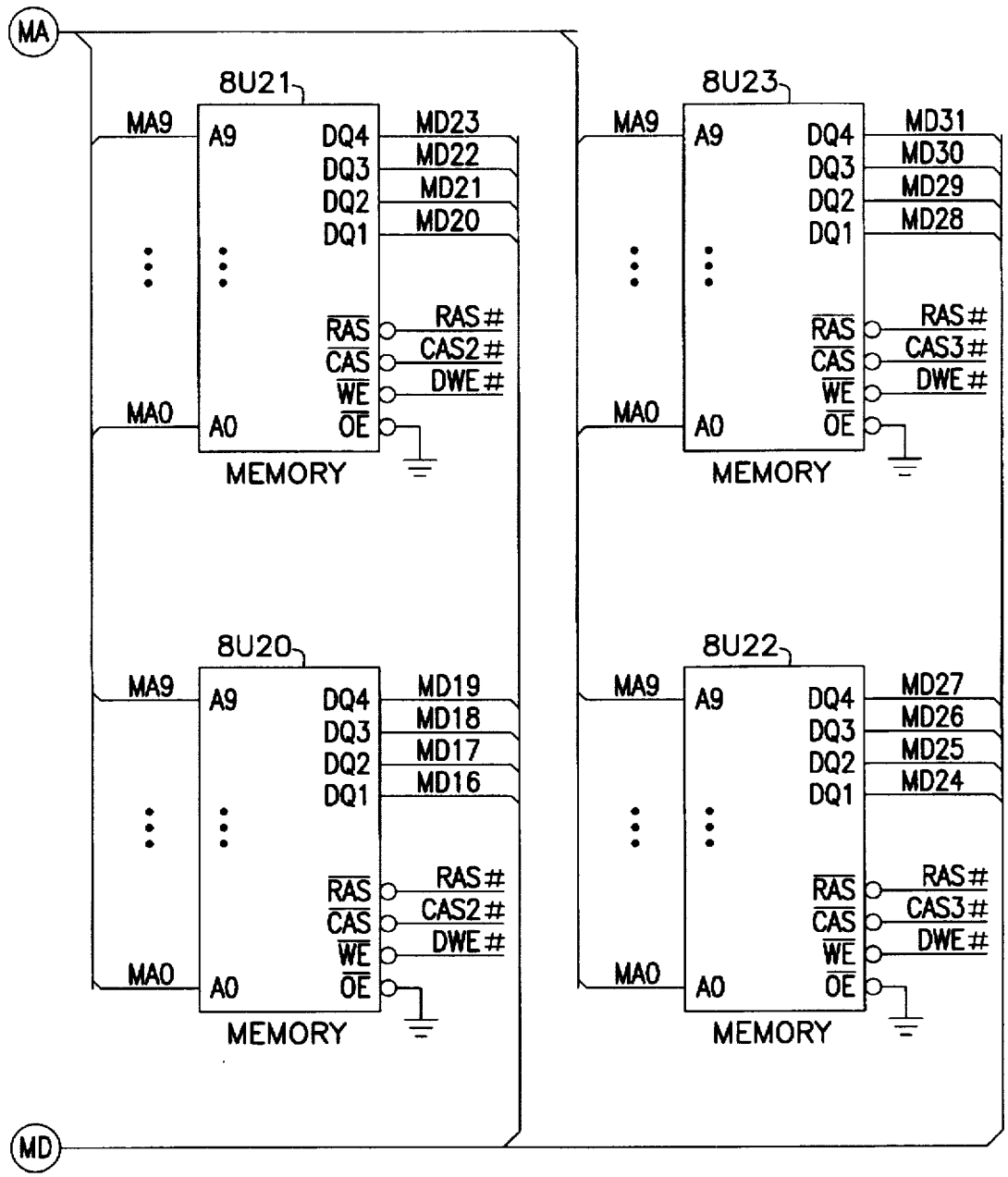

Memory chips 8U16–8U23 shown in FIGS. 8F and 8G, each of which in one embodiment is a MT4C4001Z-70 type 1M-by 4-bit DRAM memory chip device available from Micron Technology Corp, together form a four-megabyte memory used for frame storage 240.

Figure 8H:
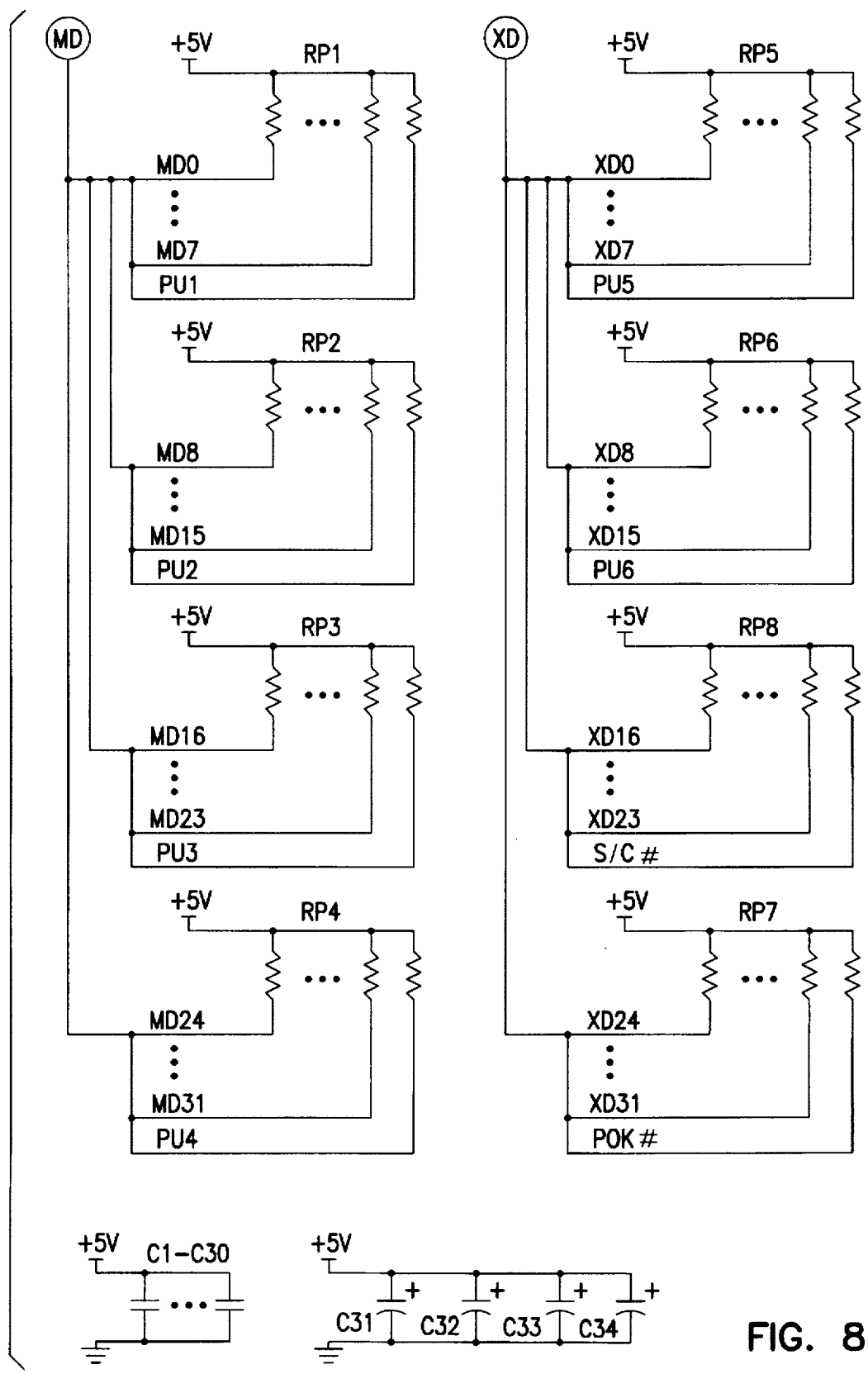
Figure 81:
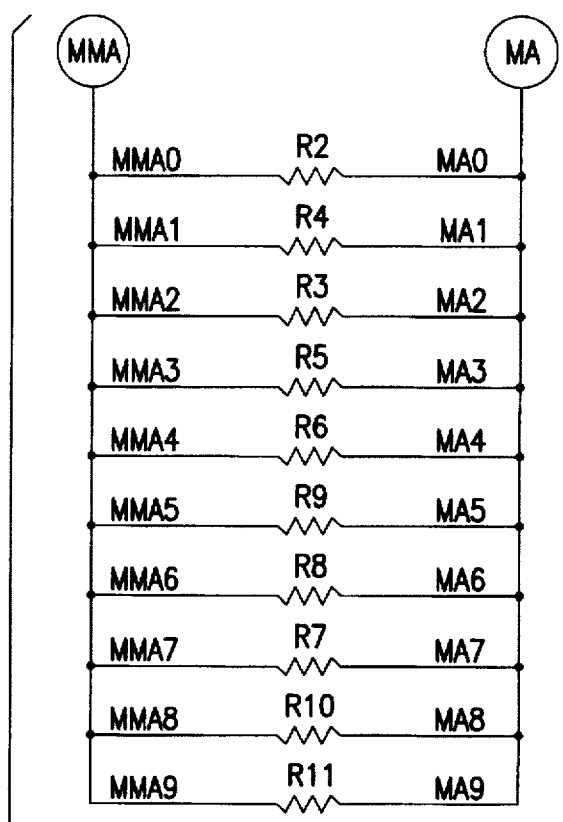

FIG. 8H shows pull-up resistors and decoupling capacitors for the indicated signals.

FIG. 8I shows termination resistors for the indicated signals.

Figure 8J:
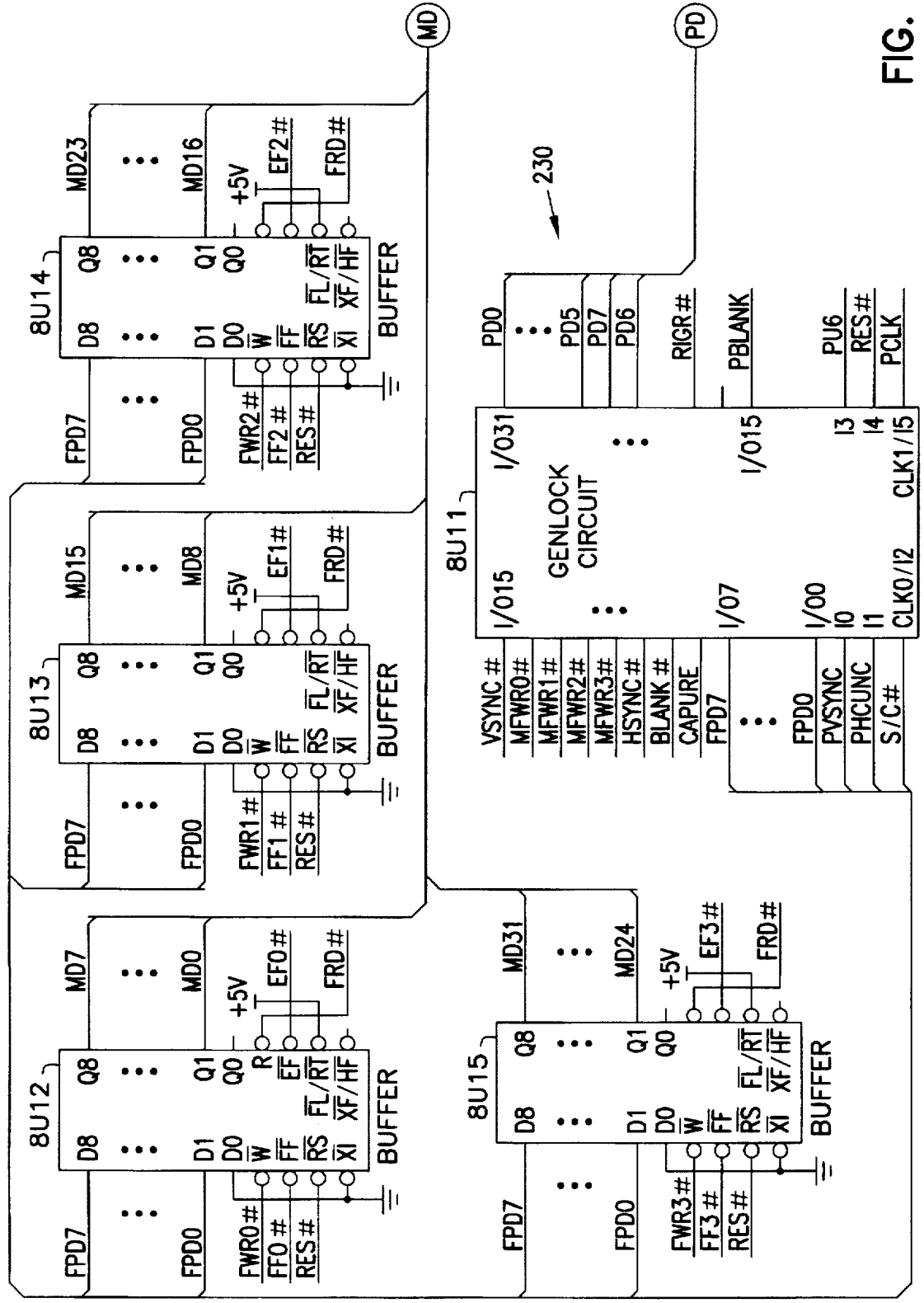

FIG. 8J shows Programmable logic device ("PLD") 8U11, which forms genlock circuit 230, and buffers 8U12–8U15.

Programmable logic device ("PLD") 8U11, which in one embodiment is a MACH210-12JC type programmable logic device available from AMD Corp, forms genlock circuit 230. The genlock circuit 230 is generally customized for each combination of LCD display device 95 and LCD display controller 93 in order to properly couple the clock signals to the vertical sync, horizontal sync, pixel clock, and blanking functions of GCC 220. Appendix A shows the PALASM programming for PLD 8U11 of an exemplary prior-art genlock circuit 230 used to capture CRT frame data from the data signals driving a RAMDAC. Appendix D shows the PALASM programming for PLD 8U11 of several exemplary LCD genlock circuits 230, according to the present invention, explained further at TABLE 1, these are as follows:

1. "Appendix D, GCC-8U11.pds for CARDX2" shows the PALASM programming for PLD 8U11 of an exemplary LCD genlock circuits 230 as shown in Combination 1 of Table 1.

2. "Appendix D, GCC-8U11.pds for CARDX5" shows the PALASM programming for PLD 8U11 of an exemplary LCD genlock circuits 230 as shown in Combination 2 of Table 1.

3. "Appendix D, GCC-8U11.pds for CARDX4" shows the PALASM programming for PLD 8U11 of an exemplary LCD genlock circuits 230 as shown in Combination 3 of Table 1.

4. "Appendix D, GCC-8U11 .pds for CARDX6" shows the PALASM programming for PLD 8U11 of an exemplary LCD genlock circuits 230 as shown in Combination 4 of Table 1.

5. "Appendix D, GCC-8U11.pds for CARDX7" shows the PALASM programming for PLD 8U11 of an exemplary LCD genlock circuits 230 as shown in Combination 5 of Table 1.

6. "Appendix D, GCC-8U11.pds for CARDX8" shows the PALASM programming for PLD 8U11 of an exemplary LCD genlock circuits 230 as shown in Combination 6 of Table 1.

Buffers 8U12, 8U13, 8U14, and 8U15, each of which in one embodiment is a IDT7203j-15 type 2 k-by-9, 15 nanosecond (ns) asynchronous buffer, available from Integrated Device Technologies Inc. of 9275 Stender Way, Santa Clara, Calif. 95054, form the memory for FIFO 235.

Figure 8K:
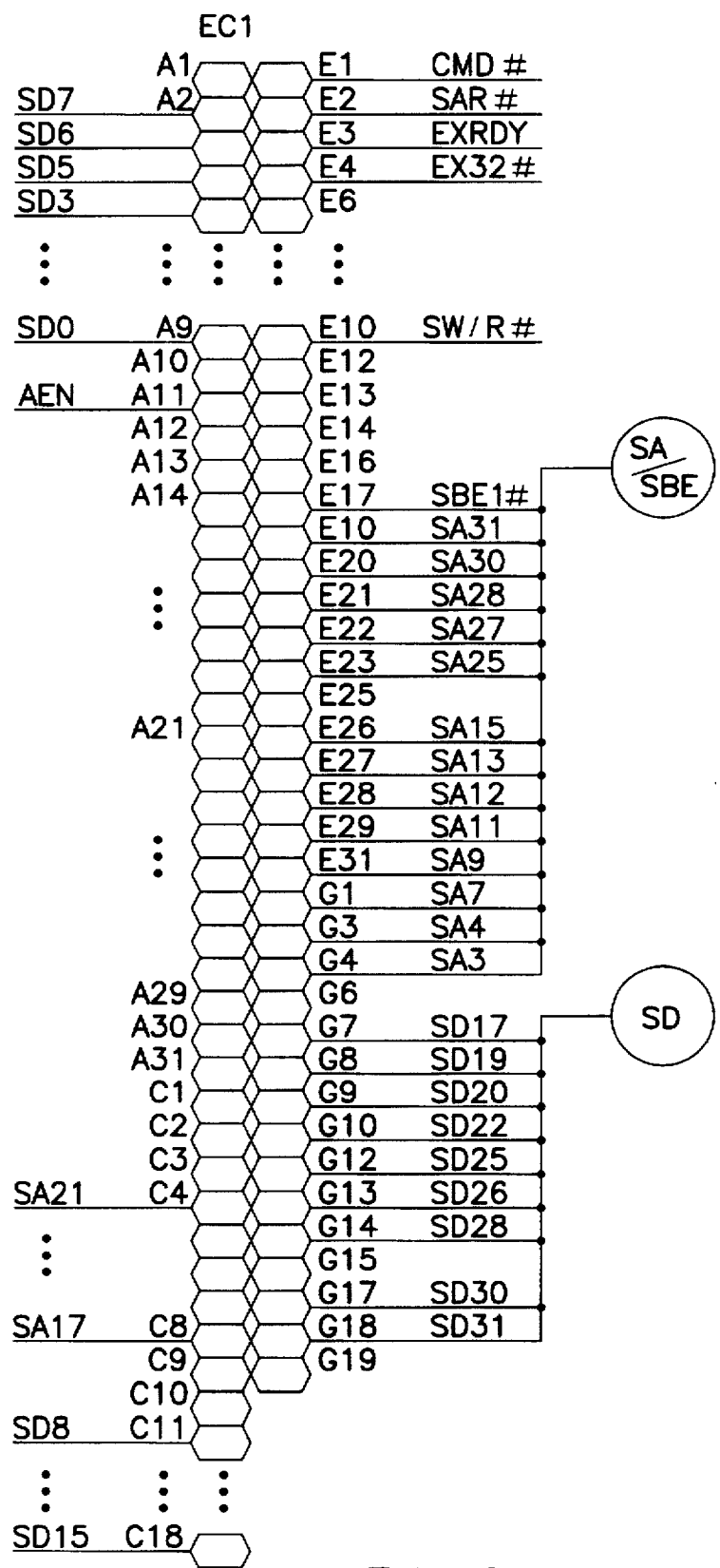
Figure 8L:
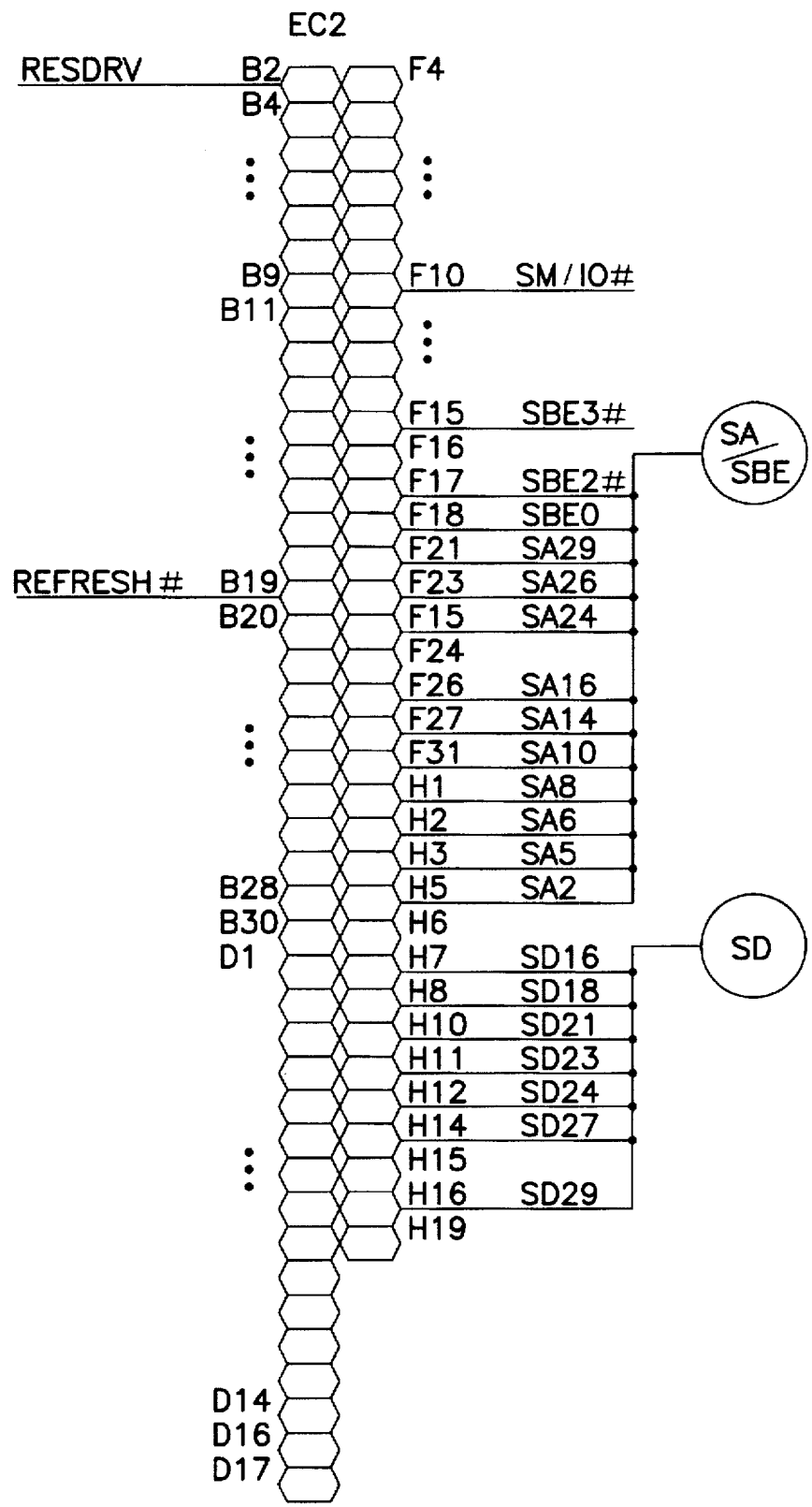
Figure 8M:
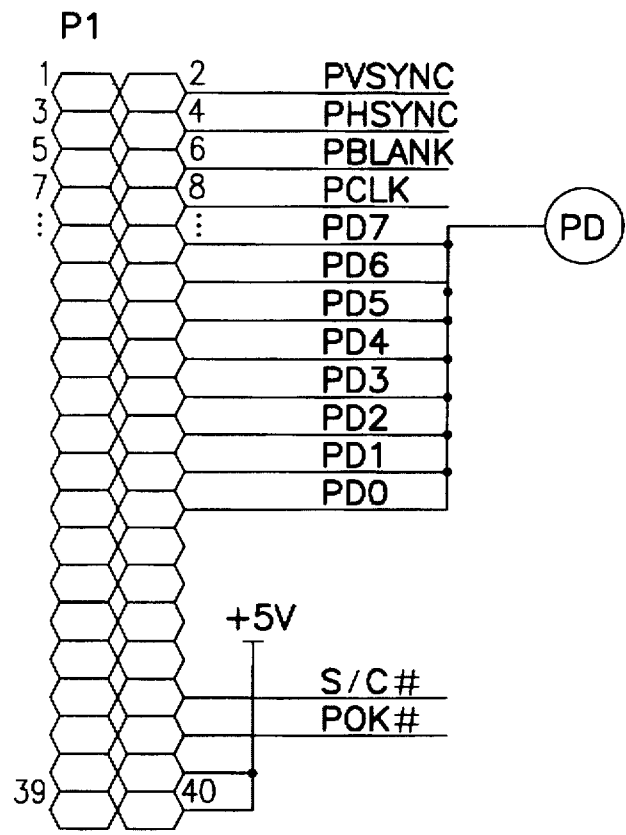

FIGS. 8K, 8L, and 8M show external connector coupling for GCC 220 for the indicated signals.

Appendix C shows C-language coding for make-bit-map software 351 for various embodiments of the present invention corresponding to the combinations shown in TABLE 1. Appendix C also includes routines used by software 350 to manipulate the standard-bit-map structure 420, as well as a structure definition called BIT_MAP in the header GRPHDLL.H (see in the middle of page 4 in "Appendix C: GRPHDLL.C, GRPHDLL.H"), of one embodiment of the standard-bit-map structure 420.

In one embodiment, test-control software 350 is driven by table 410 (shown in FIG. 7), in which are provided values for the table-lookup transformation of captured pixel data for a single combination of LCD display device 95 and LCD display controller 93. In another embodiment, table 410 comprises data for a plurality of combinations of LCD display devices 95 and LCD display controllers 93.

In one embodiment, the make-bit-map software 351 causes a trigger signal to initiate an LCD graphics capture which places one or more frames of LCD data into the frame storage 240 of GCC 220. Make-bit-map software 351 then retrieves data from the frame storage 240. In one embodiment a transformation (e.g., a table-lookup replacement of pixel values) is performed on the data. In another embodiment a summation on the data of one frame with data of the corresponding pixel of other frames is performed, and the result stored into standard-bit-map structure 420. In one embodiment, a second transformation (e.g., a table-lookup replacement of pixel values) is performed on the data to convert the summed pixel values into pixel standard color and/or intensity values.

In one embodiment used for Combination 7 of TABLE 1, it is desired to compute the address in frame storage 240 that the bit sequence starts in, as well as the bit position in the byte at that address, that the sequence starts in. In general, a number which is the smallest number which is evenly divisible by the both the number of bits per memory request (generally one byte, i.e., eight bits) and the number of bits per pixel (generally one, three, or five bits). Twenty-four (24) bits is the smallest value factorable by both 8 and 3, so the bit position re-synchronizes to bit position 0 of a byte every 3 bytes. Therefore, address of the three-byte sequence is found, and positions are then computed based from there. Since this particular algorithm (corresponding to a particular LCD display controller 93—LCD display unit 95 combination) is only interested in 3 consecutive bits, the 3-bit sequence will be either within a single byte, or will span one byte boundary, but will never span more than one byte boundary which implies that an integer pointer can be used. In one such embodiment, a switch statement is used, and an individual computation is performed for each possible pixel location in the 3-byte sequence since there are only eight possible pixel values (i.e., pixel values can assume values in the range of 000 to 111 binary). It is believed this should be the fastest way, since no more than the minimum amount appropriate for each location need be shifted. In order to handle 16-bit data, one embodiment of GCC 220 has been designed so odd bytes (i.e., bytes located at odd-numbered addresses) contain upper-half-screen data and even bytes (i.e., bytes located at even-numbered addresses) contain lower-half-screen data. As long as scan lines do not have odd lengths (i.e., an odd length is where the pixels for a scan line do not start and/or end on byte boundaries), this will hold true for the iX value passed as well. The start of a 3-byte sequence is obtained, and the pixel data is extracted from the byte stream, taking into account that upper-screen and lower-screen data resides in odd and even bytes, respectively.

In one embodiment, a clipping function is provided in order to isolate and analyze a portion of the LCD screen while ignoring the remainder of the screen. In one such embodiment, a rectangle subset of a 640-by-480 pixel screen as defined by an X-MIN, an X-MAX, a Y-MIN, and a Y-MAX value (each of which is specified in the SBM structure 420 in clip area field 430) is clipped and saved, while data from the remainder of the screen is ignored for certain operations. In one such embodiment, values of (0,0,0,0) in clip field 430 specifies to the searching code to use or search the entire bit map. The clipping function is useful when a specified stimulus is supposed to modify a specified section of the screen, but whether or not other areas of the screen change or do not change is a "don't care" condition, or when a search for specific text or graphics objects is to be concentrated in one area of the screen to save time.

In one embodiment, log routine 314 and snap routine 316 (see FIG. 5) associate header text with a set of filtered data. This header text includes information identifying the test procedure used to acquire the data, and parameters which are useful in analyzing the data, and/or repeating the test. Compare statements 318 provide the specifications and/or parameters for the compares to be performed in the collection and testing of the test data. In one embodiment, these compare statements 318 include: (a) the parameters which are loaded into conversion circuit 200 in order to program it to collect the data of interest, either before or as the testing is performed, or (b) programs or control parameters for testing the filtered signal data stored in log files 324 and snap files 326, or (c) both (a) and (b). Stimulus statements 320 provide the specifications and/or parameters for the stimuli to be provided in order to drive signals which enable controlled testing of device 100, thus stimulating device 100 in a controlled and timed manner to enable the collection and testing of the test data. In one embodiment, program code of block 321 triggers a stimulus signal 322 to stimulus processor 130 by calling a specified subroutine in stimulus statements 320. By correlating the stimulus provided and the response detected, the test system can provide comprehensive and repeatable tests.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

Appendix A Listing: PALASM programming for PLD 8U11 of an exemplary prior-art genlock circuit 230 used to capture CRT frame data from the data signals driving a RAMDAC, 3 Pages.

Appendix B Listing: programming for programmable logic devices:

Appendix B, GCC-8U11.pds for CARDX2, 3 Pages, for PLD 8U11.

Appendix B, PPC-6U20.pds for CARDX2, 2 Pages, for PLD 6U20.

Appendix B, GCC-8U11.pds for CARDX4, 3 Pages, for PLD 8U11.

Appendix B, PPC-6U20.pds for CARDX4, 2 Pages, for PLD 6U20.

Appendix B, GCC-8U11.pds for CARDX5, 4 Pages, for PLD 8U11.

Appendix B, PPC-6U20.pds for CARDX5, 2 Pages, for PLD 6U20.

Appendix B, GCC-8U11.pds for CARDX6, 4 Pages, for PLD 8U11.

Appendix B, PPC-6U20.pds for CARDX6, 2 Pages, for PLD 6U20.

Appendix B, GCC-8U11.pds for CARDX7, 2 Pages, for PLD 8U11.

Appendix B, PPC-6U20.pds for CARDX7, 2 Pages, for PLD 6U20.

Appendix B, GCC-8U11.pds for CARDX8, 3 Pages, for PLD 8U11.

Appendix B, PPC-6U20.pds for CARDX8, 2 Pages, for PLD 6U20.

Appendix C Listing: C-code routines

Appendix C: CARDINTF.C 9 Pages, subroutines to interface to conversion circuit 200.

Appendix C: CARDX2.C 19 Pages, subroutines to capture a frame set and make a standard bit map structure 420 for the CARDX2 Combination 1 of TABLE 1.

Appendix C: CARDX4.C 11 Pages, subroutines to capture a frame set and make a standard bit map structure 420 for the CARDX4 Combination 2 of TABLE 1.

Appendix C: CARDX5.C 19 Pages, subroutines to capture a frame set and make a standard bit map structure 420 for the CARDX5 Combination 3 of TABLE 1.

Appendix C: CARDX6.C 19 Pages, subroutines to capture a frame set and make a standard bit map structure 420 for the CARDX6 Combination 4 of TABLE 1.

Appendix C: CARDX7.C 12 Pages, subroutines to capture a frame set and make a standard bit map structure 420 for the CARDX7 Combination 5 of TABLE 1.

Appendix C: CARDX8.C 25 Pages, subroutines to capture a frame set and make a standard bit map structure 420 for the CARDX8 Combination 6 of TABLE 1.

Appendix C: GRBITMAP.C, GRBITMAP.H 80 Pages, subroutines to handle and manipulate SBM structure 420.

Appendix C: EISA.C, EISA.H 14 Pages, subroutines to control and manipulate EISA interface 420 from software.

Appendix C: DPMI.C, DPMI.H 13 Pages, subroutines to allocate memory and selectors in order to access GCC 220.

Appendix C: GRPHDLL.C, GRPHDLL.H 12 Pages, a general entry point which "registers" with the Windows operating system so that the functions in this DLL are available to other functions within any software running under the Windows operating system within test-control computer 300.

Appendix D Listing: programming for programmable logic devices:

Appendix D, GCC-8U1.pds, 3 Pages, programming for PLD 8U1

Appendix D, GCC-8U4.pds, 4 Pages, programming for PLD 8U4.

Appendix D, GCC-8U5.pds, 2 Pages, programming for PLD 8U5.

Appendix D, GCC-8U7.pds, 5 Pages, programming for PLD 8U7.

Appendix D, GCC-8U8.pds, 3 Pages, programming for PLD 8U8.

Appendix D, GCC-8U9.pds, 3 Pages, programming for PLD 8U9.

Appendix D, GCC-8U10.pds, 3 Pages, programming for PLD 8U10.

Appendices:

| Appendix | File | Pages |
|---|---|---|
| Appendix A: | PALASM programming CRT PLD 8U11 | 3 Pages. |
| Appendix B: | GCC-8U11.pds for CARDX2 | 3 Pages |
| Appendix B: | PPC-6U20.pds for CARDX2 | 2 Pages |
| Appendix B: | GCC-8U11.pds for CARDX4 | 3 Pages |
| Appendix B: | PPC-6U20.pds for CARDX4 | 2 Pages |
| Appendix B: | GCC-8U11.pds for CARDX5 | 4 Pages |
| Appendix B: | PPC-6U20.pds for CARDX5 | 2 Pages |
| Appendix B: | GCC-8U11.pds for CARDX6 | 4 Pages |
| Appendix B: | PPC-6U20.pds for CARDX6 | 2 Pages |
| Appendix B: | GCC-8U11.pds for CARDX7 | 2 Pages |
| Appendix B: | PPC-6U20.pds for CARDX7 | 2 Pages |
| Appendix B: | GCC-8U11.pds for CARDX8 | 3 Pages |
| Appendix B: | PPC-6U20.pds for CARDX8 | 2 Pages |
| Appendix C: | CARDINTF.C | 9 Pages |
| Appendix C: | CARDX2.C | 19 Pages |
| Appendix C: | CARDX4.C | 11 Pages |
| Appendix C: | CARDX5.C | 19 Pages |
| Appendix C: | CARDX6.C | 19 Pages |
| Appendix C: | CARDX7.C | 12 Pages |
| Appendix C: | CARDX8.C | 25 Pages |
| Appendix C: | GRBITMAP.C, GRBITMAP.H | 80 Pages |
| Appendix C: | EISA.C, EISA.H | 14 Pages |
| Appendix C: | DPMI.C, DPMI.H | 13 Pages |
| Appendix C: | GRPHDLL.C, GRPHDLL.H | 12 Pages |
| Appendix D: | GCC-8U1.pds | 3 Pages |
| Appendix D: | GCC-8U4.pds | 4 Pages |
| Appendix D: | GCC-8U5.pds | 2 Pages |
| Appendix D: | GCC-8U7.pds | 5 Pages |
| Appendix D: | GCC-8U8.pds | 3 Pages |
| Appendix D: | GCC-8U9.pds | 3 Pages |
| Appendix D: | GCC-8U10.pds | 3 Pages |

```
;PALASM Design Description        Appendix A
;------------------------------ Declaration Segment ------------
TITLE      GC_FIFO CONTROL
PATTERN    GCU11.PDS        Q0013-011          CRT GENLOCK PLD PROGRAM
REVISION   1.03
AUTHOR     RICK MURPHY-NEWMAN
COMPANY    BTREE VERIFICATION SYSTEMS, INC
DATE       03/05/94

CHIP       GCU11            MACH210-12

;------------------------------ PIN Declarations --------------
NODE  1                        GLOBAL
NODE  64,  54                  FC[1..0]       REG  ; BURIED
NODE  48,  47,  41,  40        HC[7..4]       REG  ; BURIED
NODE  42,  38,  36,  34        HC[3..0]       REG  ; BURIED
NODE  39                       LOAD           REG  ; BURIED
NODE  63,  65,  61,  59        _PD[7..4]      REG  ; BURIED
NODE  57,  55,  53,  51        _PD[3..0]      REG  ; BURIED
NODE  35                       _BLNK          REG  ; BURIED
NODE  31                       _VSNC          REG  ; BURIED
NODE  27                       _HSNC          REG  ; BURIED
NODE  23                       VPOL           REG  ; BURIED
NODE  29                       START          REG  ; BURIED
NODE  21                       _TRGR          REG  ; BURIED
NODE  52                       HPOL           REG  ; BURIED
PIN   33                       RESET          COMB ; INPUT
PIN   35                       PCLK           COMB ; INPUT
PIN   24                       PBLANK  PAIR _BLNK      COMB ; INPUT
PIN   10                       PVSYNC         COMB ; INPUT
PIN   11                       PHCYNC         COMB ; INPUT
PIN   13                       S_C            COMB ; INPUT
PIN   26                       TRIGGER        COMB ; INPUT
PIN   37,  36,  38,  39        PD[7..4] PAIR _PD[7..4]    COMB ; INPUT
PIN   40,  41,  42,  43        PD[3..0] PAIR _PD[3..0]    COMB ; INPUT
PIN   14                       CAPTURE        REG  ; OUTPUT
PIN    9,   8,   7,   6        FPD[7..4]      REG  ; OUTPUT
PIN    5,   4,   3,   2        FPD[3..0]      REG  ; OUTPUT
;PIN   9,   8,   7,   6        PPD[7..4]      COMB ; OUTPUT
;PIN   5,   4,   3,   2        PPD[3..0]      COMB ; OUTPUT
;NODE  7,  37,  60,   5        FPD[7..4]      REG  ; OUTPUT
;NODE 44,  58,   3,  56        FPD[3..0]      REG  ; OUTPUT
PIN   17,  18,  19,  20        FWR[3..0]      REG  ; OUTPUT
PIN   15                       BLANK          REG  ; OUTPUT
PIN   21                       VSYNC          REG  ; OUTPUT
PIN   16                       HSYNC          REG  ; OUTPUT ;------------------------------ Boolean Equation Segment ------
EQUATIONS
MINIMIZE_OFF GLOBAL.RSTF   = /RESET
FWR[3..0].CLKF = PCLK
FPD[7..0].CLKF = PCLK
FC[1..0].CLKF  = PCLK
HC[7..0].CLKF  = PCLK
LOAD.CLKF     = PCLK
BLANK.CLKF    = PCLK
VSYNC.CLKF    = PCLK
```

Appendix A

```
HSYNC.CLKF     = PCLK
CAPTURE.CLKF   = PCLK
START.CLKF     = PCLK
_TRGR.CLKF     = PCLK
_PD[7..0].CLKF = PCLK
_BLNK.CLKF     = PCLK
_VSNC.CLKF     = PCLK
_HSNC.CLKF     = PCLK
VPOL.CLKF      = PCLK
HPOL.CLKF      = PCLK

_PD[7..0]  := PD[7..0]

_BLNK      := PBLANK

/_VSNC     := /PVSYNC

/_HSNC     := /PHCYNC

/HPOL      :=   _BLNK  *  _HSNC  *  S_C
             + /_BLNK  * /HPOL   *  S_C
             + /S_C

/VPOL      :=   _BLNK  *  _VSNC  *  S_C
             + /_BLNK  * /VPOL   *  S_C
             + /S_C

/BLANK     := /_BLNK

/VSYNC     :=   _VSNC  *  VPOL   * /_BLNK  *  S_C
             + /_VSNC  * /VPOL   * /_BLNK  *  S_C
;            + /VSYNC  *  HSYNC  * /HC[3]  * /S_C
             +  VSYNC  * /HSYNC  *  HC[7]  * /S_C
             + /VSYNC  * /HSYNC

/HSYNC     :=   _HSNC  *  HPOL
             + /_HSNC  * /HPOL

/LOAD      :=   BLANK
             + /BLANK  * /VSYNC  * /HSYNC
             + /BLANK  *  VSYNC  *  HSYNC

HC[0].T    := /BLANK  * /VSYNC  *  HSYNC
             + /BLANK  *  VSYNC  * /HSYNC
             + /LOAD   *  HC[0]
HC[1].T    := /BLANK  * /VSYNC  *  HSYNC
             *  HC[0]
             + /BLANK  *  VSYNC  * /HSYNC
             *  HC[0]
             + /LOAD   *  HC[1]
HC[2].T    := /BLANK  * /VSYNC  *  HSYNC
             *  HC[0] *  HC[1]
             + /BLANK  *  VSYNC  * /HSYNC
             *  HC[0] *  HC[1]
             + /LOAD   *  HC[2]
HC[3].T    := /BLANK  * /VSYNC  *  HSYNC
             *  HC[0] *  HC[1] *  HC[2]
             + /BLANK  *  VSYNC  * /HSYNC
             *  HC[0] *  HC[1] *  HC[2]
             + /LOAD   *  HC[3]
```

A3

Appendix .1

```
HC[4].T   := /BLANK * /VSYNC * HSYNC
           * HC[0] * HC[1] * HC[2] * HC[3]
           + /BLANK * VSYNC * /HSYNC
           * HC[0] * HC[1] * HC[2] * HC[3]
           + /LOAD  * HC[4]
HC[5].T   := /BLANK * /VSYNC * HSYNC
           * HC[0] * HC[1] * HC[2] * HC[3]
           * HC[4]
           + /BLANK * VSYNC * /HSYNC
           * HC[0] * HC[1] * HC[2] * HC[3]
           * HC[4]
           + /LOAD  * HC[5]
HC[6].T   := /BLANK * /VSYNC * HSYNC
           * HC[0] * HC[1] * HC[2] * HC[3]
           * HC[4] * HC[5]
           + /BLANK * VSYNC * /HSYNC
           * HC[0] * HC[1] * HC[2] * HC[3]
           * HC[4] * HC[5]
           + /LOAD  * HC[6]
HC[7].T   := /BLANK * /VSYNC * HSYNC
           * HC[0] * HC[1] * HC[2] * HC[3]
           * HC[4] * HC[5] * HC[6]
           + /BLANK * VSYNC * /HSYNC
           * HC[0] * HC[1] * HC[2] * HC[3]
           * HC[4] * HC[5] * HC[6]
           + /LOAD  * HC[7]

/_TRGR    := /TRIGGER

/START    := START * /_TRGR
           + /START * /CAPTURE
           + /START * /VSYNC

CAPTURE   := /VSYNC * /START
           + CAPTURE * VSYNC

FPD[7..0] := _PD[7..0]
;PPD[7..0]  = FPD[7..0]

FC[0].T   := _BLNK * CAPTURE

FC[1].T   := _BLNK * CAPTURE * FC[0]

/FWR[0]   := FWR[0] * /FC[1] * /FC[0] * _BLNK * CAPTURE

/FWR[1]   := FWR[1] * /FC[1] *  FC[0] * _BLNK * CAPTURE

/FWR[2]   := FWR[2] *  FC[1] * /FC[0] * _BLNK * CAPTURE

/FWR[3]   := FWR[3] *  FC[1] *  FC[0] * _BLNK * CAPTURE

;--------------------------------- Simulation Segment -------------
;SIMULATION
;-----------------------------------------------------------------
```

/* Appendix B, GCC-8U11.pds for CARDX2   Page 1 */

;PALASM Design Description

;---------------------------------- Declaration Segment -----------
TITLE    GC GENLOCK FOR TOA LCD
PATTERN  TOA_GC11.PDS
REVISION 1.00
AUTHOR   RICK MURPHY-NEWMAN
COMPANY  BTREE VERIFICATION SYSTEMS INC.
DATE     02/07/95 Copyright (c) B-Tree Verification Systems, Inc. 1995. All rights reserved.

CHIP    GCU11      MACH210

;-------------------------------- PIN Declarations --------------
```
NODE 33, 31, 29, 28  LINES[7..4]   REG  ; BURIED
NODE 27, 23, 21, 18  LINES[3..0]   REG  ; BURIED
NODE 17, 15, 13, 11  FRAME[7..4]   REG  ; BURIED
NODE  9,  7,  5,  3  FRAME[3..0]   REG  ; BURIED
NODE 47, 34          BYTE[1..0]    REG  ; BURIED
NODE 62              START         REG  ; BURIED
PIN  37, 36, 38, 39  PD[7..4]      COMB ; INPUT
PIN  40, 41, 42, 43  PD[3..0]      COMB ; INPUT
PIN  24              PBL           COMB ; INPUT
PIN  32              PU6           COMB ; INPUT
PIN  33              RES           COMB ; INPUT
PIN  11              PCLK1         COMB ; INPUT
PIN  13              LCLK1         COMB ; INPUT
PIN  35              PCLK2         COMB ; INPUT
PIN  10              FLM1          COMB ; INPUT
PIN  26              TRIGGER       COMB ; INPUT
PIN  14              CAPTURE       REG  ; OUTPUT
PIN  25              PST           COMB ; OUTPUT
PIN   9,  8,  7,  6  FPD[7..4]     COMB ; OUTPUT
PIN   5,  4,  3,  2  FPD[3..0]     COMB ; OUTPUT
PIN  17, 18, 19, 20  FWR[3..0]     COMB ; OUTPUT
```

;-------------------------------- Boolean Equation Segment ------
EQUATIONS
MINIMIZE_OFF BYTE[1..0].CLKF  = PCLK2
BYTE[1..0].RSTF  = /RES
BYTE[1..0].SETF  = GND
LINES[7..0].CLKF = LCLK1
LINES[7..0].RSTF = /RES /* Appendix B, GCC-8U11.pds for CARDX2    Page 2 */

```
LINES[7..0].SETF =  GND
FRAME[7..0].CLKF = LCLK1
FRAME[7..0].RSTF = /RES
FRAME[7..0].SETF =  GND
START.CLKF      = LCLK1
START.RSTF      = /RES
START.SETF      = /TRIGGER
CAPTURE.CLKF    = PCLK2
CAPTURE.RSTF    = /RES
CAPTURE.SETF    = GND

START := START * /FLM1
      + START *  FLM1 * /CAPTURE

CAPTURE := /CAPTURE *  PCLK1 *  START
             *  LINES[7] *  LINES[6] *  LINES[5] *  LINES[4]
             * /LINES[3] * /LINES[2] * /LINES[1] *  LINES[0]
        +  CAPTURE * /PCLK1
        +  CAPTURE * /FRAME[7] * /FRAME[6] * /FRAME[5]
        +  CAPTURE * /FRAME[7] * /FRAME[6] *  FRAME[5]
             * /FRAME[4] * /FRAME[3] * /FRAME[2]

LINES[0].T := /FLM1
           +  FLM1 * LINES[0]
LINES[1].T := /FLM1 * LINES[0]
           +  FLM1 * LINES[1]
LINES[2].T := /FLM1 * LINES[0] * LINES[1]
           +  FLM1 * LINES[2]
LINES[3].T := /FLM1 * LINES[0] * LINES[1] * LINES[2]
           +  FLM1 * LINES[3]
LINES[4].T := /FLM1 * LINES[0] * LINES[1] * LINES[2] * LINES[3]
           +  FLM1 * LINES[4]
LINES[5].T := /FLM1 * LINES[0] * LINES[1] * LINES[2] * LINES[3]
                * LINES[4]
           +  FLM1 * LINES[5]
LINES[6].T := /FLM1 * LINES[0] * LINES[1] * LINES[2] * LINES[3]
                * LINES[4] * LINES[5]
           +  FLM1 * LINES[6]
LINES[7].T := /FLM1 * LINES[0] * LINES[1] * LINES[2] * LINES[3]
                * LINES[4] * LINES[5] * LINES[6]
           +  FLM1 * LINES[7]

FRAME[0].T := CAPTURE * FLM1
           + /CAPTURE * FRAME[0]
```

/* Appendix B, GCC-8U11.pds for CARDX2   Page 3 */

```
FRAME[1].T := CAPTURE * FLM1 * FRAME[0]
        + /CAPTURE * FRAME[1]
FRAME[2].T := CAPTURE * FLM1 * FRAME[0] * FRAME[1]
        + /CAPTURE * FRAME[2]
FRAME[3].T := CAPTURE * FLM1 * FRAME[0] * FRAME[1] * FRAME[2]
        + /CAPTURE * FRAME[3]
FRAME[4].T := CAPTURE * FLM1 * FRAME[0] * FRAME[1] * FRAME[2] * FRAME[3]
        + /CAPTURE * FRAME[4]
FRAME[5].T := CAPTURE * FLM1 * FRAME[0] * FRAME[1] * FRAME[2] * FRAME[3]
                * FRAME[4]
        + /CAPTURE * FRAME[5]
FRAME[6].T := CAPTURE * FLM1 * FRAME[0] * FRAME[1] * FRAME[2] * FRAME[3]
                * FRAME[4] * FRAME[5]
        + /CAPTURE * FRAME[6]
FRAME[7].T := CAPTURE * FLM1 * FRAME[0] * FRAME[1] * FRAME[2] * FRAME[3]
                * FRAME[4] * FRAME[5] * FRAME[6]
        + /CAPTURE * FRAME[7]

BYTE[0].T := CAPTURE
BYTE[1].T := CAPTURE * BYTE[0]

/FWR[0] = /BYTE[1] * /BYTE[0] * CAPTURE * /PCLK2
/FWR[1] = /BYTE[1] *  BYTE[0] * CAPTURE * /PCLK2
/FWR[2] =  BYTE[1] * /BYTE[0] * CAPTURE * /PCLK2
/FWR[3] =  BYTE[1] *  BYTE[0] * CAPTURE * /PCLK2

FPD[7..0] = PD[7..0]

PST = /PBL * PU6 * START

;-------------------------------- Simulation Segment ------------
;SIMULATION
;----------------------------------------------------------------
```

/* Appendix B, PPC-6U20.pds for CARDX2   Page 1 */

;PALASM Design Description

;-------------------------------- Declaration Segment ------------
TITLE    GC MULTIPLEXER PROBE FOR TOA LCD
PATTERN  GC_PROBE.PDS
REVISION 1.02
AUTHOR   RICK MURPHY-NEWMAN
COMPANY  BTREE VERIFICATION SYSTEMS INC.
DATE 02/09/95 Copyright (c) B-Tree Verification Systems, Inc. 1995. All rights reserved.

CHIP     GCU1       MACH210

;-------------------------------- PIN Declarations --------------
NODE 1 GLOBAL
NODE 13, 11, 7,  3  _UD[7..4]    REG  ; BURIED
NODE 53, 57, 59, 65 _UD[3..0]    REG  ; BURIED
NODE 17, 15, 9,  5  _LD[7..4]    REG  ; BURIED
NODE 51, 55, 61, 63 _LD[3..0]    REG  ; BURIED
PIN  43, 42, 41, 40  UD[7..4]    COMB ; INPUT
PIN  39, 38, 37, 36  UD[3..0]    COMB ; INPUT
PIN  9,  8,  7,  6   LD[7..4]    COMB ; INPUT
PIN  5,  4,  3,  2   LD[3..0]    COMB ; INPUT
PIN  32              FLM         COMB ; INPUT
PIN  35              PCLK        COMB ; INPUT
PIN  11              LCLK        COMB ; INPUT
PIN  13              CLK2        COMB ; INPUT
PIN  33              TAP2        COMB ; INPUT
PIN  10              OE          COMB ; INPUT
PIN  14              XCLK2       COMB ; OUTPUT
PIN  31              FLM1        COMB ; OUTPUT
PIN  29              PCLK1       COMB ; OUTPUT
PIN  30              PCLK2       COMB ; OUTPUT
PIN  17              LCLK1       COMB ; OUTPUT
;PIN 28, 27, 26, 25   PD[7..4]   COMB ; OUTPUT
;PIN 24, 21, 20, 19   PD[3..0]   COMB ; OUTPUT
;REVERSE THE BIT ORDER
PIN  19, 20, 21, 24  PD[7..4]    COMB ; OUTPUT
PIN  25, 26, 27, 28  PD[3..0]    COMB ; OUTPUT ;-------------------------------- Boolean Equation Segment ------
EQUATIONS
MINIMIZE_OFF

GLOBAL.RSTF   = OE

/* Appendix B, PPC-6U20.pds for CARDX2   Page 2 */

```
_UD[7..0].CLKF  = CLK2
_LD[7..0].CLKF  = CLK2

_LD[7..0] = LD[7..0]

_UD[7..0] = UD[7..0]

PD[7..0] =  CLK2 * _LD[7..0]
        + /CLK2 * _UD[7..0]

PCLK1    = PCLK

PCLK2    = PCLK * /TAP2
        + /PCLK * TAP2

XCLK2    = /PCLK

FLM1     = FLM

LCLK1    = /LCLK

;--------------------------------- Simulation Segment ------------
;SIMULATION
;----------------------------------------------------------------
```

/* Appendix B. GCC-8U11.pds for CARDX4    Page 1 */

;PALASM Design Description

;--------------------------------- Declaration Segment ------------
TITLE    GC_FIFO CONTROL FOR MEDTRONIC
PATTERN  GCU11.PDS     Q????-011
REVISION 1.00
AUTHOR   RICK MURPHY-NEWMAN
COMPANY  BTREE VERIFICATION SYSTEMS INC.
DATE 09/05/95 Copyright (c) B-Tree Verification Systems, Inc. 1995. All rights reserved.

CHIP    GCU11      MACH210

;--------------------------------- PIN Declarations --------------
NODE 1                  GLOBAL
NODE 64, 54             FC[1..0]        REG ; BURIED
NODE 41, 40, 39, 38     _FD[7..4]       REG ; BURIED
NODE 36, 34, 19, 49     _FD[3..0]       REG ; BURIED
NODE 63, 65, 61, 59     _PD[7..4]       REG ; BURIED
NODE 57, 55, 53, 51     _PD[3..0]       REG ; BURIED
NODE 31                 _VSNC           REG ; BURIED
NODE 27                 _HSNC           REG ; BURIED
NODE 21                 VPOL            REG ; BURIED
NODE 23                 START           REG ; BURIED
NODE 50                 _TRGR           REG ; BURIED
NODE 52                 HPOL            REG ; BURIED
PIN  33                 RESET           COMB ; INPUT
PIN  35                 PCLK            COMB ; INPUT
PIN  13                 PBLANK          COMB ; INPUT
PIN  10                 PVSYNC          COMB ; INPUT
PIN  11                 PHCYNC          COMB ; INPUT
PIN  26                 TRIGGER         COMB ; INPUT
PIN  37, 36, 38, 39 PD[7..4] PAIR _PD[7..4]   COMB ; INPUT
PIN  40, 41, 42, 43 PD[3..0] PAIR _PD[3..0]   COMB ; INPUT
PIN  14                 CAPTURE         REG ; OUTPUT
PIN  9, 8, 7, 6     FPD[7..4]           REG ; OUTPUT
PIN  5, 4, 3, 2     FPD[3..0]           REG ; OUTPUT
PIN  17, 18, 19, 20 FWR[3..0]           REG ; OUTPUT
PIN  15                 BLANK           REG ; OUTPUT
PIN  21                 VSYNC           REG ; OUTPUT
PIN  16                 HSYNC           REG ; OUTPUT ;--------------------------------- Boolean Equation Segment ------
EQUATIONS
MINIMIZE_OFF /* Appendix B, GCC-8U11.pds for CARDX4    Page 2 */

```
GLOBAL.RSTF    = /RESET
FWR[3..0].CLKF = PCLK
FPD[7..0].CLKF = PCLK
FC[1..0].CLKF  = PCLK
_FD[7..0].CLKF = PCLK
BLANK.CLKF     = PCLK
VSYNC.CLKF     = PCLK
HSYNC.CLKF     = PCLK
CAPTURE.CLKF   = PCLK
START.CLKF     = PCLK
_TRGR.CLKF     = PCLK
_PD[7..0].CLKF = PCLK
_VSNC.CLKF     = PCLK
_HSNC.CLKF     = PCLK
VPOL.CLKF      = PCLK
HPOL.CLKF      = PCLK

_PD[7..0] := PD[7..0]

/_VSNC   := /PVSYNC

/_HSNC   := /PHCYNC

/HPOL    := BLANK * _HSNC
         + /BLANK * /HPOL

/VPOL    := BLANK * _VSNC
         + /BLANK * /VPOL

/BLANK   := /PBLANK

/VSYNC   := _VSNC * VPOL * /BLANK
         + /_VSNC * /VPOL * /BLANK
         + /VSYNC * /HSYNC

/HSYNC   := _HSNC * HPOL
         + /_HSNC * /HPOL

/_TRGR   := /TRIGGER

/START   := START * /_TRGR
         + /START * /CAPTURE
         + /START * /VSYNC
```

```
/* Appendix B, GCC-8U11.pds for CARDX4   Page 3 */

CAPTURE   := /VSYNC * /START
           + CAPTURE * VSYNC

FPD[7..0] := _FD[7..0]
_FD[7..0] := _PD[7..0]

FC[0].T  := BLANK * CAPTURE

FC[1].T  := BLANK * CAPTURE * FC[0]

/FWR[0]  := FWR[0] * /FC[1] * /FC[0] * BLANK * CAPTURE
         + /FWR[0] * /FC[1] *  FC[0] * BLANK * CAPTURE

/FWR[1]  := FWR[1] * /FC[1] *  FC[0] * BLANK * CAPTURE
         + /FWR[1] *  FC[1] * /FC[0] * BLANK * CAPTURE

/FWR[2]  := FWR[2] *  FC[1] * /FC[0] * BLANK * CAPTURE
         + /FWR[2] *  FC[1] *  FC[0] * BLANK * CAPTURE

/FWR[3]  := FWR[3] *  FC[1] *  FC[0] * BLANK * CAPTURE
         + /FWR[3] * /FC[1] * /FC[0] * BLANK * CAPTURE

;--------------------------------- Simulation Segment ------------
;SIMULATION
;----------------------------------------------------------------
```

/* Appendix B, PPC-6U20.pds for CARDX4   Page 1 */

;PALASM Design Description

;---------------------------------- Declaration Segment -----------
TITLE    GC MULTIPLEXER PROBE FOR MEDTRONIC EL PANEL
PATTERN  GC_PROBE.PDS
REVISION 1.00
AUTHOR   RICK MURPHY-NEWMAN
COMPANY  BTREE VERIFICATION SYSTEMS INC.
DATE     09/05/95 Copyright (c) B-Tree Verification Systems, Inc. 1995.  All rights reserved.

CHIP     GCU1         MACH210

;---------------------------------- PIN Declarations --------------
PIN  6                 LD[4]      COMB ; INPUT BLANK
PIN  5,  4,  3,  2     LD[3..0]   COMB ; INPUT
PIN  32                FLM        COMB ; INPUT VSYNC
PIN  35                PCLK       COMB ; INPUT
PIN  11                LCLK       COMB ; INPUT HSYNC
PIN  13                CLK2       COMB ; INPUT
PIN  33                TAP2       COMB ; INPUT
PIN  10                OE         COMB ; INPUT
PIN  14                XCLK2      COMB ; OUTPUT
PIN  31                FLM1       COMB ; OUTPUT VSYNC
PIN  29                PCLK1      COMB ; OUTPUT HSYNC
PIN  30                PCLK2      COMB ; OUTPUT
PIN  17                LCLK1      COMB ; OUTPUT BLANK
PIN  28, 27, 26, 25    PD[7..4]   COMB ; OUTPUT
PIN  24, 21, 20, 19    PD[3..0]   COMB ; OUTPUT ;---------------------------------- Boolean Equation Segment ------
EQUATIONS
MINIMIZE_OFF

PD[7..4] =  GND

PD[3..0] =  LD[3..0]

PCLK1    =  LCLK

PCLK2    =  PCLK

XCLK2    =  /PCLK

FLM1     =  FLM

/* Appendix B, PPC-6U20.pds for CARDX4    Page 2 */

LCLK1   = LD[4]

XCLK2   = OE * TAP2

;--------------------------------- Simulation Segment ------------
;SIMULATION
;-------------------------------------------------------------

/* Appendix B, GCC-8U11.pds for CARDX5   Page 1 */

;PALASM Design Description

;------------------------------- Declaration Segment -----------
TITLE    GC GENLOCK FOR PBT MONOCHROME LCD
PATTERN  PBT_GC11.PDS
REVISION 1.01
AUTHOR   RICK MURPHY-NEWMAN
COMPANY  BTREE VERIFICATION SYSTEMS INC.
DATE     05/01/95  Copyright (c) B-Tree Verification Systems, Inc. 1995. All rights reserved.

CHIP    GCU11       MACH210

;-------------------------------- PIN Declarations --------------
NODE ?                LINES[8]    REG  ; BURIED
NODE ?                LINES[7..4] REG  ; BURIED
NODE ?                LINES[3..0] REG  ; BURIED
NODE ?                FRAME[7..4] REG  ; BURIED
NODE ?                FRAME[3..0] REG  ; BURIED
NODE ?                BYTE[1..0]  REG  ; BURIED
NODE ?                START       REG  ; BURIED
PIN 37, 36, 38, 39    PD[7..4]    COMB ; INPUT
PIN 40, 41, 42, 43    PD[3..0]    COMB ; INPUT
PIN 24                PBL         COMB ; INPUT
PIN 32                PU6         COMB ; INPUT
PIN 33                RES         COMB ; INPUT
PIN 11                PCLK1       COMB ; INPUT
PIN 13                LCLK1       COMB ; INPUT
PIN 35                PCLK2       COMB ; INPUT
PIN 10                FLM1        COMB ; INPUT
PIN 26                TRIGGER     COMB ; INPUT
PIN 14                CAPTURE     REG  ; OUTPUT
PIN 25                PST         COMB ; OUTPUT
PIN 9, 8, 7, 6        FPD[7..4]   COMB ; OUTPUT
PIN 5, 4, 3, 2        FPD[3..0]   COMB ; OUTPUT
PIN 17, 18, 19, 20    FWR[3..0]   COMB ; OUTPUT
PIN 31                LG240       REG  ; OUTPUT ;-------------------------------- Boolean Equation Segment ------
EQUATIONS
MINIMIZE_OFF

BYTE[1..0].CLKF = PCLK2
BYTE[1..0].RSTF = /RES
BYTE[1..0].SETF = GND

/* Appendix B, GCC-8U11.pds for CARDX5   Page 2 */

```
LINES[8..0].CLKF = LCLK1
LINES[8..0].RSTF = /RES
LINES[8..0].SETF =  GND
FRAME[7..0].CLKF = LCLK1
FRAME[7..0].RSTF = /RES
FRAME[7..0].SETF =  GND
START.CLKF     = LCLK1
START.RSTF     = /RES
START.SETF     = /TRIGGER
CAPTURE.CLKF   = LCLK1
CAPTURE.RSTF   = /RES
CAPTURE.SETF   = GND
LG240.CLKF     = LCLK1
LG240.RSTF     = /RES
LG240.SETF     = GND

START := START * /FLM1
       + START *  FLM1 * /CAPTURE

CAPTURE := /CAPTURE * START
            *  LINES[8]
            * /LINES[7] * /LINES[6] * /LINES[5] *  LINES[4]
            * /LINES[3] *  LINES[2] *  LINES[1] * /LINES[0]
         + CAPTURE * /FRAME[7] * /FRAME[6] * /FRAME[5]
         + CAPTURE * /FRAME[7] * /FRAME[6] *  FRAME[5]
            * /FRAME[4] * /FRAME[3] * /FRAME[2]

LINES[0].T := /FLM1
           +  FLM1 * LINES[0]
LINES[1].T := /FLM1 * LINES[0]
           +  FLM1 * LINES[1]
LINES[2].T := /FLM1 * LINES[0] * LINES[1]
           +  FLM1 * LINES[2]
LINES[3].T := /FLM1 * LINES[0] * LINES[1] * LINES[2]
           +  FLM1 * LINES[3]
LINES[4].T := /FLM1 * LINES[0] * LINES[1] * LINES[2] * LINES[3]
           +  FLM1 * LINES[4]
LINES[5].T := /FLM1 * LINES[0] * LINES[1] * LINES[2] * LINES[3]
                   * LINES[4]
           +  FLM1 * LINES[5]
LINES[6].T := /FLM1 * LINES[0] * LINES[1] * LINES[2] * LINES[3]
                   * LINES[4] * LINES[5]
           +  FLM1 * LINES[6]
LINES[7].T := /FLM1 * LINES[0] * LINES[1] * LINES[2] * LINES[3]
```

/* Appendix B, GCC-8U11.pds for CARDX5   Page 3 */

```
            * LINES[4] * LINES[5] * LINES[6]
        + FLM1 * LINES[7]
LINES[8].T := /FLM1 * LINES[0] * LINES[1] * LINES[2] * LINES[3]
            * LINES[4] * LINES[5] * LINES[6] * LINES[7]
        + FLM1 * LINES[8]

FRAME[0].T := CAPTURE * FLM1
        + /CAPTURE * FRAME[0]
FRAME[1].T := CAPTURE * FLM1 * FRAME[0]
        + /CAPTURE * FRAME[1]
FRAME[2].T := CAPTURE * FLM1 * FRAME[0] * FRAME[1]
        + /CAPTURE * FRAME[2]
FRAME[3].T := CAPTURE * FLM1 * FRAME[0] * FRAME[1] * FRAME[2]
        + /CAPTURE * FRAME[3]
FRAME[4].T := CAPTURE * FLM1 * FRAME[0] * FRAME[1] * FRAME[2] * FRAME[3]
        + /CAPTURE * FRAME[4]
FRAME[5].T := CAPTURE * FLM1 * FRAME[0] * FRAME[1] * FRAME[2] * FRAME[3]
                * FRAME[4]
        + /CAPTURE * FRAME[5]
FRAME[6].T := CAPTURE * FLM1 * FRAME[0] * FRAME[1] * FRAME[2] * FRAME[3]
                * FRAME[4] * FRAME[5]
        + /CAPTURE * FRAME[6]
FRAME[7].T := CAPTURE * FLM1 * FRAME[0] * FRAME[1] * FRAME[2] * FRAME[3]
                * FRAME[4] * FRAME[5] * FRAME[6]
        + /CAPTURE * FRAME[7]

BYTE[0].T := CAPTURE
BYTE[1].T := CAPTURE * BYTE[0]

/FWR[0] = /BYTE[1] * /BYTE[0] * CAPTURE * /PCLK2 * LG240
/FWR[1] = /BYTE[1] *  BYTE[0] * CAPTURE * /PCLK2 * LG240
/FWR[2] =  BYTE[1] * /BYTE[0] * CAPTURE * /PCLK2 * LG240
/FWR[3] =  BYTE[1] *  BYTE[0] * CAPTURE * /PCLK2 * LG240

FPD[7..0] = PD[7..0]

PST = /PBL * PU6 * START * PCLK1

;SET WHEN LINES = 239
;CLEARED WHEN LINES = 283
LG240 := /LG240 * /FLM1
      * /LINES[8]
      * LINES[7] * LINES[6] * LINES[5] * /LINES[4]
      * LINES[3] * LINES[2] * LINES[1] * LINES[0]
```

/* Appendix B. GCC-8U11.pds for CARDX5   Page 4 */

```
+   LG240 * /FLM1 * /LINES[8]
+   LG240 * /FLM1 *  LINES[8]
 * /LINES[7] * /LINES[6] * /LINES[5] * /LINES[4]
+   LG240 * /FLM1 *  LINES[8]
 * /LINES[7] * /LINES[6] * /LINES[5] * /LINES[3]
+   LG240 * /FLM1 *  LINES[8]
 * /LINES[7] * /LINES[6] * /LINES[5] *  LINES[4]
 *  LINES[3] * /LINES[2] * /LINES[1]
+   LG240 * /FLM1 *  LINES[8]
 * /LINES[7] * /LINES[6] * /LINES[5] *  LINES[4]
 *  LINES[3] * /LINES[2] *  LINES[1] * /LINES[0]

;--------------------------------- Simulation Segment ------------
;SIMULATION
;------------------------------------------------------------------
```

/* Appendix B, PPC-6U20.pds for CARDX5   Page 1 */

;PALASM Design Description

;---------------------------------- Declaration Segment ------------
TITLE    GC PROBE FOR ICO LCD
PATTERN  GC_PR.PDS
REVISION 1.01
AUTHOR   RICK MURPHY-NEWMAN
COMPANY  BTREE VERIFICATION SYSTEMS INC.
DATE 03/20/95 Copyright (c) B-Tree Verification Systems, Inc. 1995. All rights reserved.

CHIP    GCU20       MACH210

;---------------------------------- PIN Declarations --------------
NODE 1 GLOBAL
PIN 39, 38, 37, 36 UD[3..0]    COMB ; INPUT
PIN 5,  4,  3,  2  LD[3..0]    COMB ; INPUT
PIN 32             FLM         COMB ; INPUT
PIN 35             PCLK        COMB ; INPUT
PIN 11             LCLK        COMB ; INPUT
PIN 13             CLK2        COMB ; INPUT
PIN 33             TAP2        COMB ; INPUT
PIN 10             OE          COMB ; INPUT
PIN 14             XCLK2       COMB ; OUTPUT
PIN 31             FLM1        COMB ; OUTPUT
PIN 29             PCLK1       COMB ; OUTPUT
PIN 30             PCLK2       COMB ; OUTPUT
PIN 17             LCLK1       COMB ; OUTPUT ;THIS PIN ASSIGNMENT SWAPS BIT ORDER WITHIN A NIBBLE
PIN 25, 26, 27, 28 PD[7..4]    COMB ; OUTPUT
PIN 19, 20, 21, 24 PD[3..0]    COMB ; OUTPUT ;THIS PIN ASSIGNMENT WOULD SEEM TO BE THE NORMAL ORDER
;PIN 28, 27, 26, 25 PD[7..4]    COMB ; OUTPUT
;PIN 24, 21, 20, 19 PD[3..0]    COMB ; OUTPUT ;THIS PIN ASSIGNMENT REVERSES THE BIT ORDER (MIRRORED)
;PIN 19, 20, 21, 24 PD[7..4]    COMB ; OUTPUT
;PIN 25, 26, 27, 28 PD[3..0]    COMB ; OUTPUT ;---------------------------------- Boolean Equation Segment ------
EQUATIONS
MINIMIZE_OFF /* Appendix B, PPC-6U20.pds for CARDX5   Page 2 */

```
GLOBAL.RSTF   = OE

PD[7..4] = LD[3..0]
PD[3..0] = UD[3..0]

PCLK1    = /PCLK

PCLK2    = /PCLK

XCLK2    = /PCLK * CLK2 * TAP2

FLM1     = FLM

LCLK1    = /LCLK

;--------------------------------- Simulation Segment ------------
;SIMULATION
;----------------------------------------------------------------
```

/* Appendix B, GCC-8U11.pds for CARDX6   Page 1 */

;PALASM Design Description

;---------------------------------- Declaration Segment ------------
TITLE    GC GENLOCK FOR PBT MONOCHROME LCD
PATTERN  PBT_GC11.PDS
REVISION 1.01
AUTHOR   RICK MURPHY-NEWMAN
COMPANY  BTREE VERIFICATION SYSTEMS INC.
DATE     05/01/95 Copyright (c) B-Tree Verification Systems, Inc. 1995. All rights reserved.

CHIP    GCU11      MACH210

;---------------------------------- PIN Declarations ---------------
```
NODE ?              LINES[8]     REG ; BURIED
NODE ?              LINES[7..4]  REG ; BURIED
NODE ?              LINES[3..0]  REG ; BURIED
NODE ?              FRAME[7..4]  REG ; BURIED
NODE ?              FRAME[3..0]  REG ; BURIED
NODE ?              BYTE[1..0]   REG ; BURIED
NODE ?              START        REG ; BURIED
PIN 37, 36, 38, 39  PD[7..4]     COMB ; INPUT
PIN 40, 41, 42, 43  PD[3..0]     COMB ; INPUT
PIN 24              PBL          COMB ; INPUT
PIN 32              PU6          COMB ; INPUT
PIN 33              RES          COMB ; INPUT
PIN 11              PCLK1        COMB ; INPUT
PIN 13              LCLK1        COMB ; INPUT
PIN 35              PCLK2        COMB ; INPUT
PIN 10              FLM1         COMB ; INPUT
PIN 26              TRIGGER      COMB ; INPUT
PIN 14              CAPTURE      REG  ; OUTPUT
PIN 25              PST          COMB ; OUTPUT
PIN 9, 8, 7, 6      FPD[7..4]    COMB ; OUTPUT
PIN 5, 4, 3, 2      FPD[3..0]    COMB ; OUTPUT
PIN 17, 18, 19, 20  FWR[3..0]    COMB ; OUTPUT
PIN 31              LG240        REG  ; OUTPUT
```

;---------------------------- Boolean Equation Segment ------
EQUATIONS
MINIMIZE_OFF

BYTE[1..0].CLKF = PCLK2
BYTE[1..0].RSTF = /RES
BYTE[1..0].SETF = GND

```
/* Appendix B, GCC-8U11.pds for CARDX6    Page 2 */

LINES[8..0].CLKF = LCLK1
LINES[8..0].RSTF = /RES
LINES[8..0].SETF =  GND
FRAME[7..0].CLKF = LCLK1
FRAME[7..0].RSTF = /RES
FRAME[7..0].SETF =  GND
START.CLKF      = LCLK1
START.RSTF      = /RES
START.SETF      = /TRIGGER
CAPTURE.CLKF    = LCLK1
CAPTURE.RSTF    = /RES
CAPTURE.SETF    = GND
LG240.CLKF      = LCLK1
LG240.RSTF      = /RES
LG240.SETF      = GND

START := START * /FLM1
      + START * FLM1 * /CAPTURE

CAPTURE := /CAPTURE * START
             * LINES[8]
             * /LINES[7] * /LINES[6] * /LINES[5] * LINES[4]
             * /LINES[3] * LINES[2] * LINES[1] * /LINES[0]
        + CAPTURE * /FRAME[7] * /FRAME[6] * /FRAME[5]
        + CAPTURE * /FRAME[7] * /FRAME[6] * FRAME[5]
             * /FRAME[4] * /FRAME[3] * /FRAME[2]

LINES[0].T := /FLM1
           + FLM1 * LINES[0]
LINES[1].T := /FLM1 * LINES[0]
           + FLM1 * LINES[1]
LINES[2].T := /FLM1 * LINES[0] * LINES[1]
           + FLM1 * LINES[2]
LINES[3].T := /FLM1 * LINES[0] * LINES[1] * LINES[2]
           + FLM1 * LINES[3]
LINES[4].T := /FLM1 * LINES[0] * LINES[1] * LINES[2] * LINES[3]
           + FLM1 * LINES[4]
LINES[5].T := /FLM1 * LINES[0] * LINES[1] * LINES[2] * LINES[3]
             * LINES[4]
           + FLM1 * LINES[5]
LINES[6].T := /FLM1 * LINES[0] * LINES[1] * LINES[2] * LINES[3]
             * LINES[4] * LINES[5]
           + FLM1 * LINES[6]
LINES[7].T := /FLM1 * LINES[0] * LINES[1] * LINES[2] * LINES[3]
```

```
/* Appendix B, GCC-8U11.pds for CARDX6   Page 3 */
                * LINES[4] * LINES[5] * LINES[6]
        + FLM1 * LINES[7]
LINES[8].T := /FLM1 * LINES[0] * LINES[1] * LINES[2] * LINES[3]
                * LINES[4] * LINES[5] * LINES[6] * LINES[7]
        + FLM1 * LINES[8]

FRAME[0].T := CAPTURE * FLM1
        + /CAPTURE * FRAME[0]
FRAME[1].T := CAPTURE * FLM1 * FRAME[0]
        + /CAPTURE * FRAME[1]
FRAME[2].T := CAPTURE * FLM1 * FRAME[0] * FRAME[1]
        + /CAPTURE * FRAME[2]
FRAME[3].T := CAPTURE * FLM1 * FRAME[0] * FRAME[1] * FRAME[2]
        + /CAPTURE * FRAME[3]
FRAME[4].T := CAPTURE * FLM1 * FRAME[0] * FRAME[1] * FRAME[2] * FRAME[3]
        + /CAPTURE * FRAME[4]
FRAME[5].T := CAPTURE * FLM1 * FRAME[0] * FRAME[1] * FRAME[2] * FRAME[3]
                * FRAME[4]
        + /CAPTURE * FRAME[5]
FRAME[6].T := CAPTURE * FLM1 * FRAME[0] * FRAME[1] * FRAME[2] * FRAME[3]
                * FRAME[4] * FRAME[5]
        + /CAPTURE * FRAME[6]
FRAME[7].T := CAPTURE * FLM1 * FRAME[0] * FRAME[1] * FRAME[2] * FRAME[3]
                * FRAME[4] * FRAME[5] * FRAME[6]
        + /CAPTURE * FRAME[7]

BYTE[0].T := CAPTURE
BYTE[1].T := CAPTURE * BYTE[0]

/FWR[0] = /BYTE[1] * /BYTE[0] * CAPTURE * /PCLK2 * /LG240
/FWR[1] = /BYTE[1] *  BYTE[0] * CAPTURE * /PCLK2 * /LG240
/FWR[2] =  BYTE[1] * /BYTE[0] * CAPTURE * /PCLK2 * /LG240
/FWR[3] =  BYTE[1] *  BYTE[0] * CAPTURE * /PCLK2 * /LG240

FPD[7..0] = PD[7..0]

PST = /PBL * PU6 * START * PCLK1

;SET WHEN LINES = 239
;CLEARED WHEN LINES = 283
LG240 := /LG240 * /FLM1
        * /LINES[8]
        * LINES[7] * LINES[6] * LINES[5] * /LINES[4]
        * LINES[3] * LINES[2] * LINES[1] * LINES[0]
```

/* Appendix B, GCC-8U11.pds for CARDX6   Page 4 */

```
+ LG240 * /FLM1 * /LINES[8]
+ LG240 * /FLM1 * LINES[8]
* /LINES[7] * /LINES[6] * /LINES[5] * /LINES[4]
+ LG240 * /FLM1 * LINES[8]
* /LINES[7] * /LINES[6] * /LINES[5] * /LINES[3]
+ LG240 * /FLM1 * LINES[8]
* /LINES[7] * /LINES[6] * /LINES[5] *  LINES[4]
*  LINES[3] * /LINES[2] * /LINES[1]
+ LG240 * /FLM1 * LINES[8]
* /LINES[7] * /LINES[6] * /LINES[5] *  LINES[4]
*  LINES[3] * /LINES[2] *  LINES[1] * /LINES[0]

;---------------------------------- Simulation Segment ------------
;SIMULATION
;------------------------------------------------------------------
```

/* Appendix B, PPC-6U20.pds for CARDX6   Page 1 */

;PALASM Design Description

;--------------------------------- Declaration Segment ------------
TITLE    GC PROBE FOR ICO LCD
PATTERN  GC_PR.PDS
REVISION 1.01
AUTHOR   RICK MURPHY-NEWMAN
COMPANY  BTREE VERIFICATION SYSTEMS INC.
DATE 03/20/95 Copyright (c) B-Tree Verification Systems, Inc. 1995. All rights reserved.

CHIP    GCU20       MACH210

;--------------------------------- PIN Declarations --------------
NODE 1 GLOBAL
PIN 39, 38, 37, 36  UD[3..0]    COMB ; INPUT
PIN 5, 4, 3, 2      LD[3..0]    COMB ; INPUT
PIN 32              FLM         COMB ; INPUT
PIN 35              PCLK        COMB ; INPUT
PIN 11              LCLK        COMB ; INPUT
PIN 13              CLK2        COMB ; INPUT
PIN 33              TAP2        COMB ; INPUT
PIN 10              OE          COMB ; INPUT
PIN 14              XCLK2       COMB ; OUTPUT
PIN 31              FLM1        COMB ; OUTPUT
PIN 29              PCLK1       COMB ; OUTPUT
PIN 30              PCLK2       COMB ; OUTPUT
PIN 17              LCLK1       COMB ; OUTPUT ;THIS PIN ASSIGNMENT SWAPS BIT ORDER WITHIN A NIBBLE
PIN 25, 26, 27, 28  PD[7..4]    COMB ; OUTPUT
PIN 19, 20, 21, 24  PD[3..0]    COMB ; OUTPUT ;THIS PIN ASSIGNMENT WOULD SEEM TO BE THE NORMAL ORDER
;PIN 28, 27, 26, 25  PD[7..4]   COMB ; OUTPUT
;PIN 24, 21, 20, 19  PD[3..0]   COMB ; OUTPUT ;THIS PIN ASSIGNMENT REVERSES THE BIT ORDER (MIRRORED)
;PIN 19, 20, 21, 24  PD[7..4]   COMB ; OUTPUT
;PIN 25, 26, 27, 28  PD[3..0]   COMB ; OUTPUT ;--------------------------------- Boolean Equation Segment ------
EQUATIONS
MINIMIZE_OFF

```
/* Appendix B, PPC-6U20.pds for CARDX6   Page 2 */

GLOBAL.RSTF   = OE

PD[7..4] =  LD[3..0]
PD[3..0] =  UD[3..0]

PCLK1    = /PCLK

PCLK2    = /PCLK

XCLK2    = /PCLK * CLK2 * TAP2

FLM1     = FLM

LCLK1    = /LCLK

;---------------------------------- Simulation Segment ------------
;SIMULATION
;------------------------------------------------------------------
```

/* Appendix B, GCC-8U11.pds for CARDX7   Page 1 */

;PALASM Design Description

;---------------------------------- Declaration Segment ------------
TITLE    GC GENLOCK FOR INTERMEDICS MONOCHROME ELD
PATTERN  INT_GC11.PDS
REVISION 1.00
AUTHOR   RICK MURPHY-NEWMAN
COMPANY  BTREE VERIFICATION SYSTEMS INC.
DATE     05/24/95 Copyright (c) B-Tree Verification Systems, Inc. 1995. All rights reserved.

CHIP     GCU11      MACH210

;--------------------------------- PIN Declarations ---------------
NODE 38, 34          BYTE[1..0]    REG  ; BURIED
NODE 50              START         REG  ; BURIED
PIN 37, 36, 38, 39   PD[7..4]      COMB ; INPUT
PIN 40, 41, 42, 43   PD[3..0]      COMB ; INPUT
PIN 24               PBL           COMB ; INPUT
PIN 32               PU6           COMB ; INPUT
PIN 33               RES           COMB ; INPUT
PIN 11               PCLK1         COMB ; INPUT
PIN 13               LCLK1         COMB ; INPUT
PIN 35               PCLK2         COMB ; INPUT
PIN 10               FLM1          COMB ; INPUT
PIN 26               TRIGGER       COMB ; INPUT
PIN 14               CAPTURE       REG  ; OUTPUT
PIN 25               PST           REG  ; OUTPUT
PIN 28               DUMMY         COMB ; OUTPUT
PIN 9, 8, 7, 6       FPD[7..4]     REG  ; OUTPUT
PIN 5, 4, 3, 2       FPD[3..0]     REG  ; OUTPUT
PIN 17, 18, 19, 20   FWR[3..0]     REG  ; OUTPUT ;--------------------------------- Boolean Equation Segment ------
EQUATIONS
MINIMIZE_OFF BYTE[1..0].CLKF  = PCLK2
BYTE[1..0].RSTF  = /RES
BYTE[1..0].SETF  = GND
START.CLKF       = PCLK2
START.RSTF       = /RES
START.SETF       = /TRIGGER
CAPTURE.CLKF     = PCLK2
CAPTURE.RSTF     = /RES /* Appendix B, GCC-8U11.pds for CARDX7   Page 2 */

```
CAPTURE.SETF   = GND
FPD[7..0].CLKF = PCLK2
FPD[7..0].RSTF = /RES
FPD[7..0].SETF = GND
FWR[3..0].CLKF = PCLK2
FWR[3..0].RSTF = /RES
FWR[3..0].SETF = GND

START := START * FLM1
      + START * /FLM1 * /CAPTURE

CAPTURE.T := /CAPTURE * START * /FLM1 * PST
          +  CAPTURE * /FLM1 * PST

BYTE[0].T := CAPTURE * LCLK1
BYTE[1].T := CAPTURE * LCLK1 * BYTE[0]

/FWR[0] := /BYTE[1] * /BYTE[0] * CAPTURE * LCLK1
/FWR[1] := /BYTE[1] *  BYTE[0] * CAPTURE * LCLK1
/FWR[2] :=  BYTE[1] * /BYTE[0] * CAPTURE * LCLK1
/FWR[3] :=  BYTE[1] *  BYTE[0] * CAPTURE * LCLK1

FPD[7..0] := PD[7..0]

/PST := /FLM1

DUMMY = PBL * PU6 * PCLK1

;--------------------------------- Simulation Segment ------------
;SIMULATION
;----------------------------------------------------------------
```

/* Appendix B, PPC-6U20.pds for CARDX7   Page 1 */

;PALASM Design Description

;-------------------------------- Declaration Segment ------------
TITLE    GC PROBE FOR INTERMEDICS LCD
PATTERN  GC_PR.PDS
REVISION 1.00
AUTHOR   RICK MURPHY-NEWMAN
COMPANY  BTREE VERIFICATION SYSTEMS INC.
DATE     05/24/95 Copyright (c) B-Tree Verification Systems, Inc. 1995.  All rights reserved.

CHIP     GCU20          MACH210

;-------------------------------- PIN Declarations --------------
NODE 1 GLOBAL
PIN  2             LD[0]       COMB ; INPUT
PIN  32            FLM         COMB ; INPUT
PIN  35            PCLK        COMB ; INPUT
PIN  11            LCLK        COMB ; INPUT
PIN  13            CLK2        COMB ; INPUT
PIN  33            TAP2        COMB ; INPUT
PIN  10            OE          COMB ; INPUT
PIN  14            XCLK2       COMB ; OUTPUT
PIN  31            FLM1        COMB ; OUTPUT
PIN  29            PCLK1       COMB ; OUTPUT
PIN  30            PCLK2       COMB ; OUTPUT
PIN  17            LCLK1       COMB ; OUTPUT
PIN  28, 27, 26, 25  PD[7..4]  COMB ; OUTPUT
PIN  24, 21, 20, 19  PD[3..0]  COMB ; OUTPUT ;-------------------------------- Boolean Equation Segment ------
EQUATIONS
MINIMIZE_OFF

GLOBAL.RSTF   = OE

PD[7..1] =  OE
PD[0]    =  LD[0]

PCLK1    =  PCLK

PCLK2    =  PCLK

XCLK2    =  PCLK * CLK2 * TAP2

/* Appendix B, PPC-6U20.pds for CARDX7   Page 2 */

```
FLM1    = FLM

LCLK1   = LCLK

;--------------------------------- Simulation Segment ------------
;SIMULATION
;----------------------------------------------------------------
```

/* Appendix B, GCC-8U11.pds for CARDX8    Page 1 */

;PALASM Design Description

;--------------------------------- Declaration Segment ------------
TITLE    GC_FIFO CONTROL FOR MEDTRONIC 1
PATTERN  GCU11.PDS     Q????-011
REVISION 1.00
AUTHOR   RICK MURPHY-NEWMAN
COMPANY  BTREE VERIFICATION SYSTEMS INC.
DATE     08/14/95 Copyright (c) B-Tree Verification Systems, Inc. 1995. All rights reserved.

CHIP    GCU11      MACH210

;-------------------------------- PIN Declarations ---------------
NODE 1                GLOBAL
NODE 64, 54           FC[1..0]      REG ; BURIED
NODE 41, 40, 39, 38   _FD[7..4]     REG ; BURIED
NODE 36, 34, 19, 49   _FD[3..0]     REG ; BURIED
NODE 63, 65, 61, 59   _PD[7..4]     REG ; BURIED
NODE 57, 55, 53, 51   _PD[3..0]     REG ; BURIED
NODE 31               _VSNC         REG ; BURIED
NODE 27               _HSNC         REG ; BURIED
NODE 21               VPOL          REG ; BURIED
NODE 23               START         REG ; BURIED
NODE 50               _TRGR         REG ; BURIED
NODE 52               HPOL          REG ; BURIED
PIN 33                RESET         COMB ; INPUT
PIN 35                PCLK          COMB ; INPUT
PIN 13                PBLANK        COMB ; INPUT
PIN 10                PVSYNC        COMB ; INPUT
PIN 11                PHCYNC        COMB ; INPUT
PIN 26                TRIGGER       COMB ; INPUT
PIN 37, 36, 38, 39  PD[7..4] PAIR _PD[7..4]   COMB ; INPUT
PIN 40, 41, 42, 43  PD[3..0] PAIR _PD[3..0]   COMB ; INPUT
PIN 14                CAPTURE       REG ; OUTPUT
PIN 9, 8, 7, 6        FPD[7..4]     REG ; OUTPUT
PIN 5, 4, 3, 2        FPD[3..0]     REG ; OUTPUT
PIN 17, 18, 19, 20    FWR[3..0]     REG ; OUTPUT
PIN 15                BLANK         REG ; OUTPUT
PIN 21                VSYNC         REG ; OUTPUT
PIN 16                HSYNC         REG ; OUTPUT ;--------------------------------- Boolean Equation Segment ------
EQUATIONS
MINIMIZE_OFF /* Appendix B, GCC-8U11.pds for CARDX8   Page 2 */

```
GLOBAL.RSTF    = /RESET
FWR[3..0].CLKF = PCLK
FPD[7..0].CLKF = PCLK
FC[1..0].CLKF  = PCLK
_FD[7..0].CLKF = PCLK
BLANK.CLKF     = PCLK
VSYNC.CLKF     = PCLK
HSYNC.CLKF     = PCLK
CAPTURE.CLKF   = PCLK
START.CLKF     = PCLK
_TRGR.CLKF     = PCLK
_PD[7..0].CLKF = PCLK
_VSNC.CLKF     = PCLK
_HSNC.CLKF     = PCLK
VPOL.CLKF      = PCLK
HPOL.CLKF      = PCLK

_PD[7..0] := PD[7..0]

/_VSNC   := /PVSYNC

/_HSNC   := /PHCYNC

/HPOL    :=  BLANK * _HSNC
         + /BLANK * /HPOL

/VPOL    :=  BLANK * _VSNC
         + /BLANK * /VPOL

/BLANK   := /PBLANK

/VSYNC   :=  _VSNC *  VPOL * /BLANK
         + /_VSNC * /VPOL * /BLANK
         + /VSYNC * /HSYNC

/HSYNC   :=  _HSNC *  HPOL
         + /_HSNC * /HPOL

/_TRGR   := /TRIGGER

/START   :=  START  * /_TRGR
         + /START  * /CAPTURE
         + /START  * /VSYNC
```

/* Appendix B, GCC-8U11.pds for CARDX8   Page 3 */

```
CAPTURE   := /VSYNC * /START
           + CAPTURE * VSYNC

FPD[7..0] := _FD[7..0]
_FD[7..0] := _PD[7..0]

FC[0].T   := BLANK * CAPTURE

FC[1].T   := BLANK * CAPTURE * FC[0]

/FWR[0]   := FWR[0] * /FC[1] * /FC[0] * BLANK * CAPTURE
           + /FWR[0] * /FC[1] *  FC[0] * BLANK * CAPTURE

/FWR[1]   := FWR[1] * /FC[1] *  FC[0] * BLANK * CAPTURE
           + /FWR[1] *  FC[1] * /FC[0] * BLANK * CAPTURE

/FWR[2]   := FWR[2] *  FC[1] * /FC[0] * BLANK * CAPTURE
           + /FWR[2] *  FC[1] *  FC[0] * BLANK * CAPTURE

/FWR[3]   := FWR[3] *  FC[1] *  FC[0] * BLANK * CAPTURE
           + /FWR[3] * /FC[1] * /FC[0] * BLANK * CAPTURE

;---------------------------------- Simulation Segment ------------
:SIMULATION
;------------------------------------------------------------------
```

/* Appendix B, PPC-6U20.pds for CARDX8    Page 1 */

;PALASM Design Description

;---------------------------------- Declaration Segment ------------
TITLE    GC MULTIPLEXER PROBE FOR MEDTRONIC COLOR LCD
PATTERN  GC_PROBE.PDS
REVISION 1.00
AUTHOR   RICK MURPHY-NEWMAN
COMPANY  BTREE VERIFICATION SYSTEMS INC.
DATE     08/14/95 Copyright (c) B-Tree Verification Systems, Inc. 1995. All rights reserved.

CHIP     GCU1        MACH210

;--------------------------------- PIN Declarations ---------------
NODE 1 GLOBAL
NODE 11, 7,  3       _UD[6..4]    REG  ; BURIED
NODE 53, 57, 59, 65  _UD[3..0]    REG  ; BURIED
NODE 17, 15, 9,  5   _LD[7..4]    REG  ; BURIED
NODE 51, 55, 61, 63  _LD[3..0]    REG  ; BURIED
PIN  43              DE           COMB ; INPUT
PIN  42, 41, 40      UD[6..4]     COMB ; INPUT
PIN  39, 38, 37, 36  UD[3..0]     COMB ; INPUT
PIN  9,  8,  7,  6   LD[7..4]     COMB ; INPUT
PIN  5,  4,  3,  2   LD[3..0]     COMB ; INPUT
PIN  32              FLM          COMB ; INPUT VSYNC
PIN  35              PCLK         COMB ; INPUT
PIN  11              LCLK         COMB ; INPUT HSYNC
PIN  13              CLK2         COMB ; INPUT
PIN  33              TAP2         COMB ; INPUT
PIN  10              OE           COMB ; INPUT
PIN  14              XCLK2        COMB ; OUTPUT
PIN  31              FLM1         COMB ; OUTPUT VSYNC
PIN  29              PCLK1        COMB ; OUTPUT HSYNC
PIN  30              PCLK2        COMB ; OUTPUT
PIN  17              LCLK1        COMB ; OUTPUT BLANK
PIN  28, 27, 26, 25  PD[7..4]     COMB ; OUTPUT
PIN  24, 21, 20, 19  PD[3..0]     COMB ; OUTPUT ;--------------------------------- Boolean Equation Segment ------
EQUATIONS
MINIMIZE_OFF

GLOBAL.RSTF      = OE
_UD[6..0].CLKF   = CLK2
_LD[7..0].CLKF   = CLK2

/* Appendix B, PPC-6U20.pds for CARDX8    Page 2 */

```
_LD[7..0] = LD[7..0]

_UD[6..0] = UD[6..0]

PD[7]    = CLK2 * _LD[7]
         + /CLK2

PD[6..0] = CLK2 * _LD[6..0]
         + /CLK2 * _UD[6..0]

PCLK1    = LCLK

PCLK2    = PCLK * /TAP2
         + /PCLK * TAP2

XCLK2    = /PCLK

FLM1     = FLM

LCLK1    = DE

;---------------------------------- Simulation Segment ------------
;SIMULATION
;-----------------------------------------------------------------
```

```
/* Appendix C:   CARDINTF.C   Page 1 */

// Copyright (c) B-Tree Verification Systems, Inc. 1990-1995.  All rights reserved.
//

// $Header:   T:\svs\grphdll\cardintf.c_v   1.13   14 Sep 1995 20:39:02   MLOUDEN $ /****************************** CARDINTF.C
***********************************
 * This module contains routines that interface to the graphics capture card.

****************************************************************************/

/*
 * $Log:   T:\svs\grphdll\cardintf.c_v  $
 *
 *
 */

// INCLUDE FILES ************************************************************ include <windows.h>
include <dos.h>
include "grphdll.h"
include "eisa.h"
include "dpmi.h"

// END INCLUDE FILES
********************************************************* pragma page()
// *************************************************************************
// MANIFEST CONSTANTS AND MACROS define IDS_OK 0

// END MANIFEST CONSTANTS AND
MACRO******************************************

/****************************************************************************/
//     STRUCTURES AND TYPEDEFS
```

/* Appendix C:   CARDINTF.C   Page 2 */

```c
// END STRUCTURES AND TYPEDEFS
//************************************************

// ******************************************************************************
//      GLOBAL VARIABLES

// END GLOBAL VARIABLES
//********************************************************

BOOL FAR PASCAL CompressBitmapLineHugeSrc( WORD huge * hpwDestLine, char huge
* hpcSrcLine, int iLen );

// END GLOBAL VARIABLES
//******************************************************** int FAR PASCAL ClearFrameBuff( void )
{
    return 0;
}

BOOL FAR PASCAL CheckForCard( WORD wSlot )
{
    if( xCheckForCard( wSlot ) != 0 )
        return TRUE;
    return FALSE;
}

// D+
pragma page()
//*******************************************************************************
**
//      ConvertFrameToBitMap
//
// Takes the data from the frame grabber and converts it to the B-TREE format
//      bitmap.
//
//      PARAMETERS: sBitMap - Pointer to the bitmap structure to use
//                  iXDim - Size of the device along the X axis in pixels
//                  iYDim - Size of the device along the Y axis in scanlines
```

/* Appendix C:   CARDINTF.C   Page 3 */

```
//                  rPad  - defines the padding along each edge of the capture
//                          buffer. Each device may have different padding
//                          values and the frame grabber itself is unaware of
//                          the padding, so the software must adjust for it.
//                  iSlot - SLOT # that the grahics card resides in
//              Memory is allocated and locked for the bitmap data
//
//     RETURNS: TRUE if successful, FALSE if failed
//                  If true memory has been loaded with data from the frame
//                  grabber. The handle is placed in the bitmap
//                  data structure and the memory is unlocked.
//
//*********************************************************************
**
BOOL ConvertFrameToBitMap( LPBIT_MAP sBitMap, int iXDim, int iYDim, RECT rPad,
int iSlot )
// D-
{
        int i, iStatus, iLineIncr;
        DWORD dwBaseAddr, dwDataSize, dwFrameSize;
        WORD wSel;
        WORD huge *hpwCompressedData;
        char huge *hpcFramePtr;
        char far  *fpcFramePtr;

// TEMP UNTIL CAN GET ADDRESS FROM MANAGER
        dwBaseAddr = GetBaseAddressForSlot( iSlot );
        iLineIncr = iXDim + rPad.left + rPad.right;
        dwFrameSize = iLineIncr * (DWORD) ( iYDim + rPad.top );

// Create a huge pointer to physical mem on graphics capture card
        iStatus = SetupSelectorsForMsWindows( (WORD far *) &wSel,
                                                                                        dwBaseAddr,
dwFrameSize );
        if( iStatus != 0 )
                return FALSE;

hpcFramePtr = ( (char huge *) MAKELP( wSel, 0 ) ) +
                                        ( rPad.top * iLineIncr ) + rPad.left;
        fpcFramePtr = (char far *) hpcFramePtr;
        EnableMem( iSlot );
        for( i = 0, dwDataSize = 0; i < iYDim; i++ ) {
                hpwCompressedData = RLELineAddress( i, sBitMap );
```

```
/* Appendix C:   CARDINTF.C   Page 4 */
        CompressBitmapLineHugeSrc( hpwCompressedData, hpcFramePtr, iXDim );
        // Update number of WORDS in data
        dwDataSize += ( *hpwCompressedData + 1 );    // 1 is for counter itself
        hpcFramePtr += iLineIncr;
    }
    // Convert data to character size
    dwDataSize *= sizeof( WORD );

DisableMem( iSlot );
    FreeSelectorsForMsWindows( wSel, dwFrameSize );

// Reallocate the memory, hopefully releasing some back to system
    GlobalUnlock( sBitMap->hBitmap );
    sBitMap->hpcPixels = NULL;
    sBitMap->hBitmap = GlobalReAlloc( sBitMap->hBitmap,
                                                          dwDataSize,
                                                          GMEM_SHARE |
GMEM_MOVEABLE );
    sBitMap->dwBitMapSize = GlobalSize( sBitMap->hBitmap );

return TRUE;

}
// - End ConvertFrameToBitMap *****************************************

// D+
pragma page()
//*******************************************************************************
//      GetCaptureStats
//
//      Return characteristics about the last capture done for a given card.
//
//      PARAMETERS:     iId - identifies the graphics card
//                              fplStats - points to array of longs
//                                              [ 0 ] = Total bytes captured
//                                              [ 1 ] = Horz res in pixels
//                                              [ 2 ] = Vert res in pixels
//                                              [ 3 ] = offset of first non-pad character
//                                                              if -1 this field not valid
//
//      RETURNS:   TRUE if successful, else FALSE
```

```
/* Appendix C:   CARDINTF.C   Page 5 */
//
//*********************************************************************
**
BOOL FAR PASCAL GetCaptureStats( int iId, long far *fplStats )
// D-
{
        int i, iSlot;
        WORD wSel;
        DWORD dwBaseAddr;
        BYTE far *fpbyFramePtr;

iSlot = iId;

if( xCheckForCard( iSlot ) )
        {
                fplStats[ 0 ] = 4 * GetFrameCounter( iSlot );
                fplStats[ 1 ] = GetHorizontalResolution( iSlot );
                fplStats[ 2 ] = GetVerticalResolution( iSlot );

EnableMem( iSlot );
                dwBaseAddr = GetBaseAddressForSlot( iSlot );
                // Create a huge pointer to physical mem on graphics capture card
                i = SetupSelectorsForMsWindows( (WORD far *) &wSel, dwBaseAddr, 32768
);
                if( i != 0 )

{
                        MessageBox( (HANDLE) NULL, "Could not create selector",
                                    "GetCaptureStats", MB_ICONSTOP |
MB_OK );
                        return FALSE;
                }
                fpbyFramePtr = (BYTE far *) MAKELP( wSel, 0 );
                fplStats[ 3 ] = (long) -1;
                // Now search for non-pad character ( != black ) for reasonable area.
                for( i = 0; i < 32768; i++ )
                {
                        if( fpbyFramePtr[ i ] != 0 )
                        {
                                fplStats[ 3 ] = (long) i;
                                break;
                        }
                }
                FreeSelectorsForMsWindows( wSel, 32768 );
```

```
                            /* Appendix C:   CARDINTF.C   Page 6 */
        }
        else
                return FALSE;

return TRUE;
}
// - End GetCaptureStats *********************************************************

// D+
/* <f> */
//*******************************************************************************
**
//      CaptureRawGraphicsData
//
//      This routine makes a capture but does not create a B-Tree bitmap. In effect
//      it simply loads the raw graphics data.
//
//      PARAMETERS:     iId - identifies the graphics card
//
//      RETURNS:    TRUE if successful, else FALSE
//                          if TRUE the graphics card memory contains valid data
//
//*******************************************************************************
**
BOOL FAR PASCAL CaptureRawGraphicsData( int iId )
// D-
{
        int i, iSlot;

iSlot = iId;

if( xCheckForCard( iSlot ) )
        {
                xSetGBFrameCounter( iSlot );           // Set frame address to zero
                // Tell frame grabber to capture a frame
                EnableMem( iSlot );
                i = 0;
                // Retry up to 5 times to get a good capture.
                while( i < 5 )
                {
                        if( ! CaptureData( iSlot, 60 )      && i == 4 )
                        {
                                MessageBox( (HANDLE) NULL, "Graphics card timeout",
                                        "CaptureGraphicsData", MB_ICONSTOP |
```

/* Appendix C: CARDINTF.C Page 7 */

```
MB_OK );
                                return FALSE;
                        }
                        else
                                break;
                }
        }
        else
                return FALSE;

return TRUE;
}
// - End CaptureRawGraphicsData
//*******************************************************

// D+
pragma page()
//***************************************************************************
//
//      MakeActBitMap
//
//      This routine loads a bitmap with data from the graphics board.
//      It initializes the bitmap structure, sets up all required values,
//      and copys the data from the board into local memory.
//
//      PARAMETERS:     wId - the slot ID
//                      sBitMap - Pointer to the bitmap structure to use
//                      iXDim - Size of the device along the X axis in pixels
//                      iYDim - Size of the device along the Y axis in scanlines
//                      rPad  - defines the padding along each edge of the capture
//                              buffer. Each device may have different padding
//                              values and the frame grabber itself is unaware of
//                              the padding, so the software must adjust for it.
//
//      RETURNS:    TRUE if successful, FALSE if failed
//                      If true memory has been allocated and loaded with data
//                              from the file. The handle is placed in the bitmap
//                              data structure and the memory is unlocked.
//
//                      The clipping region is always set to the maximum area
//
//***************************************************************************
```

/* Appendix C: CARDINTF.C Page 8 */

```c
BOOL FAR PASCAL MakeActBitMap( WORD wId, LPBIT_MAP sBitMap, int iXDim, int
iYDim, RECT rPad )
// D-
{
        DWORD dwFrameCount, dwSize = 0;
        int i, iSlot, iVRes, iHRes;
        DWORD dwBaseAddr;
        WORD wSel;
        DWORD far *fpdwFramePtr;

iSlot = wId;

if( xCheckForCard( iSlot ) )
        {
                xSetGBFrameCounter( iSlot );            // Set frame address to zero
                // Tell frame grabber to capture a frame
                EnableMem( iSlot );
                dwBaseAddr = GetBaseAddressForSlot( iSlot );
                // Create a huge pointer to physical mem on graphics capture card
                i = SetupSelectorsForMsWindows( (WORD far *) &wSel, dwBaseAddr, 10 );
                if( i != 0 )
                {
                        MessageBox( (HANDLE) NULL, "Could not create selector",
                                            "MakeActBitMap", MB_ICONSTOP |
MB_OK );
                        return FALSE;
                }
                fpdwFramePtr = (DWORD far *) MAKELP( wSel, 0 );
                *fpdwFramePtr = 0x5aa55aa5;
                i = 0;
                // Retry up to 5 times to get a good capture.
                while( i < 5 )
                {
                        if( ! CaptureData( iSlot, 60 )       && i == 4 )
                        {
                                MessageBox( (HANDLE) NULL, "Graphics card timeout",
                                                    "MakeActBitMap", MB_ICONSTOP |
MB_OK );
                                FreeSelectorsForMsWindows( wSel, 10 );
                                return FALSE;
                        }
                        else
```

```c
/* Appendix C:   CARDINTF.C   Page 9 */
                break;
        }
        // We only get here if successful
        FreeSelectorsForMsWindows( wSel, 10 );
    }
    else
        return FALSE;

dwFrameCount = GetFrameCounter( iSlot );
    iVRes = GetVerticalResolution( iSlot );
    iHRes = GetHorizontalResolution( iSlot );

ReleaseBitMap( sBitMap );

sBitMap->iScanLineWidth = iXDim;
    sBitMap->iNumScanLines = iYDim;
    SetNoClip( sBitMap );                                   // No clip area sBitMap->byBmpType = BMP_TYPE_COMPRESSED;  // Type indicates the nature of
    sBitMap->bCompressed = TRUE;               // Indicates if data is compressed // We allocate twice as much as possible size in case of negative
    // compression.    Memory is now locked
    if( AllocateMemoryForBitMap( sBitMap ) != 0 )
        return FALSE;

sBitMap->hColorMono = 0;                   // No color monochrome's yet
    sBitMap->fpColors = NULL;                  // Ditto // Convert the frame data to a B-Tree format bitmap
    return ConvertFrameToBitMap( sBitMap, iXDim, iYDim, rPad, iSlot );

}
// - End MakeActBitMap
//**********************************************************
```

/* Appendix C:   CARDX2.C   Page 1 */

// Copyright (c) B-Tree Verification Systems, Inc. 1990-1995. All rights reserved.
//

// $Header:   T:\svs\grphdll\cardx2.c_v   1.3   14 Sep 1995 20:38:46   MLOUDEN $ /**************************** CARDx2.C ********************************
 * This module contains routines that interface to the graphics capture card.
 * Modified for use with the TOA color LCD.
 ***************************************************************************/

/*
 * $Log:   T:\svs\grphdll\cardx2.c_v $
 *
 */

// INCLUDE FILES ********************************************************** include <windows.h>
include <windowsx.h>
include <dos.h>
include "grphdll.h"
include "eisa.h"
include "dpmi.h"

// END INCLUDE FILES
//************************************************************* pragma page()
// ************************************************************************
// MANIFEST CONSTANTS AND MACROS // TOA controller generates 3 bits per pixel. We get a single scan line
// worth of data by ( 3 x 640 ) / 8 or 240. Data start is based on fact that
// we drop the first line of data in both upper half and lower half of screen.
define DATA_START              0
define FRAME_SIZE              115200L
define FRAME_COUNT             36 define GRAPHICS_MEM_SIZE 0x400000

/* Appendix C: CARDX2.C   Page 2 */

```
// END MANIFEST CONSTANTS AND
MACRO******************************************

/****************************************************************************/
//      STRUCTURES AND TYPEDEFS

// END STRUCTURES AND TYPEDEFS
************************************************

// ****************************************************************************
//      GLOBAL VARIABLES

BOOL bDebug = FALSE;
static BOOL bShowSeq = FALSE;

// END GLOBAL VARIABLES
********************************************************* int FAR PASCAL ClearFrameBuff( void )
{
        return 0;
}

BOOL FAR PASCAL CheckForCard( WORD wSlot )
{
        if( xCheckForCard( wSlot ) != 0 )
            return TRUE;
        return FALSE;
}
//****************************************************************************
//
//      Given a physical address
//  Set selector address via DPMI call
//
//****************************************************************************
```

/* Appendix C: CARDX2.C Page 3 */
```c
int SetSegmentAddress( WORD wSelector, DWORD dwAddress )
{
    int iStatus = 0;

_asm
    {
        // DPMI: Physical Address Mapping
        //      (returns a linear address in bx:cx)
        mov  ax, 0x0800
        mov  bx, WORD PTR dwAddress+2
        mov  cx, WORD PTR dwAddress
        mov  si, 0
        mov  di, FRAME_SIZE
        int  31h
        jc   ERROR_EXIT
        // DPMI: Set Segment Base Address
        mov  ax, 0x0007
        mov  dx, cx
        mov  cx, bx
        mov  bx, wSelector
        int  31h
        jc   ERROR_EXIT
        jmp  EXIT
    ERROR_EXIT:
        mov  iStatus, ax
        cmp  iStatus, 0
        jne  EXIT
        mov  iStatus, 0xffff
    EXIT:
    } return iStatus;
}

// D+
pragma page()
//*******************************************************************************
**
//    ZeroGraphicsMem
//
//    Zero fill all of the graphics card memory
```

/* Appendix C: CARDX2.C Page 4 */

```c
//
//      PARAMETERS:     iId - identifies the graphics card
//
//      RETURNS:        TRUE if successful, else FALSE
//
//***************************************************************************
**
BOOL ZeroGraphicsMem( int iId )
// D-
{
        int i, iSlot;
        long l;
        WORD wSel;
        DWORD dwBaseAddr;
        DWORD huge *hpdwFramePtr;

iSlot = iId;

if( xCheckForCard( iSlot ) )
        {
                dwBaseAddr = GetBaseAddressForSlot( iSlot );
                // Create a huge pointer to physical mem on graphics capture card
                i = SetupSelectorsForMsWindows( (WORD far *) &wSel,
                                                                        dwBaseAddr,
                                                                        GRAPHICS_MEM_SIZE );
                if( i != 0 )

{
                        MessageBox( (HANDLE) NULL, "Could not create selector",
                                                        "ZeroGraphicsMem", MB_ICONSTOP |
MB_OK );
                        return FALSE;
                }
                EnableMem( iSlot );
                (void huge *) hpdwFramePtr = MAKELP( wSel, 0 );
                for( l = 0; l < GRAPHICS_MEM_SIZE / sizeof(DWORD); l++ )
                        hpdwFramePtr[ l ] = 0;
                FreeSelectorsForMsWindows( wSel, GRAPHICS_MEM_SIZE );
        }
        else
                return FALSE;
```

/* Appendix C:   CARDX2.C   Page 5 */

```c
        return TRUE;
}
// - End ZeroGraphicsMem ***********************************************

// D+
pragma page()
//****************************************************************************
**
//      GetCaptureStats
//
//      Return characteristics about the last capture done for a given card.
//
//      PARAMETERS:     iId - identifies the graphics card
//                      fplStats - points to array of longs
//                                      [ 0 ] = Total bytes captured
//                                      [ 1 ] = Horz res in pixels
//                                      [ 2 ] = Vert res in pixels
//                                      [ 3 ] = offset of first non-pad character
//                                                  if -1 this field not valid
//
//      RETURNS:        TRUE if successful, else FALSE
//
//****************************************************************************
**
BOOL FAR PASCAL GetCaptureStats( int iId, long far *fplStats )
// D-
{
        int i, iSlot;
        WORD wSel;
        DWORD dwBaseAddr;
        BYTE far *fpbyFramePtr;

iSlot = iId;

if( xCheckForCard( iSlot ) )
        {
                fplStats[ 0 ] = 4 * GetFrameCounter( iSlot );
                fplStats[ 1 ] = GetHorizontalResolution( iSlot );
                fplStats[ 2 ] = GetVerticalResolution( iSlot );

EnableMem( iSlot );
                dwBaseAddr = GetBaseAddressForSlot( iSlot );
                // Create a huge pointer to physical mem on graphics capture card
```

```
                    /* Appendix C:   CARDX2.C   Page 6 */ i = SetupSelectorsForMsWindows( (WORD far *) &wSel, dwBaseAddr, 32768
);
            if( i != 0 )

{
                    MessageBox( (HANDLE) NULL, "Could not create selector",
                                            "GetCaptureStats", MB_ICONSTOP |
MB_OK );
                    return FALSE;
            }
            fpbyFramePtr = (BYTE far *) MAKELP( wSel, 0 );
            fplStats[ 3 ] = (long) -1;
            // Now search for non-pad character ( != black ) for reasonable area.
            for( i = 0; i < 32768; i++ )
            {
                    if( fpbyFramePtr[ i ] != 0 )
                    {
                            fplStats[ 3 ] = (long) i;
                            break;
                    }
            }
            FreeSelectorsForMsWindows( wSel, 32768 );
        }
        else
            return FALSE;

return TRUE;
}
// - End GetCaptureStats ****************************************************

// D+
/* <f> */
//***************************************************************************
**
//      CaptureRawGraphicsData
//
//      This routine makes a capture but does not create a B-Tree bitmap. In effect
//      it simply loads the raw graphics data.
//
//      PARAMETERS:     iId - identifies the graphics card
//
//      RETURNS:        TRUE if successful, else FALSE
//                      if TRUE the graphics card memory contains valid data
//
```

/* Appendix C: CARDX2.C Page 7 */

```c
//*************************************************************************
**
BOOL FAR PASCAL CaptureRawGraphicsData( short int iId )
// D-
{
        short int i, iSlot;

iSlot = iId;

//-- WHILE WE ARE BRINGING UP THE SYSTEM LET'S ZERO OUT THE CARD
EACH TIME
        ZeroGraphicsMem( iSlot );

if( iSlot = xCheckForCard( iSlot ) )
        {
                xSetGBFrameCounter( iSlot );          // Set frame address to zero
                // Tell frame grabber to capture a frame
                EnableMem( iSlot );
                i = 0;
                // Retry up to 5 times to get a good capture.
                while( i < 5 )
                {
                        if( ! CaptureData( iSlot, 0x7fff )     && i == 4 )
                        {
                                MessageBox( (HANDLE) NULL, "Graphics card timeout",
                                                "CaptureGraphicsData", MB_ICONSTOP |
MB_OK );
                                return FALSE;
                        }
                        else
                                break;
                }
        }
        else
                return FALSE;

return TRUE;
}
// - End CaptureRawGraphicsData
//*******************************************************

// Make a test pattern to work with for debug.
char far * MakeTestPattern( void )
```

```c
/* Appendix C:   CARDX2.C    Page 8 */
{
    char far *fpWork;
    DWORD far *fpTmpPtr;
    DWORD dwPattern;
    int i;

fpTmpPtr = (DWORD far *) fpWork = (DWORD far *) GlobalAllocPtr(
GMEM_SHARE, 38400 );
    dwPattern = 0xc3c3c3c3;

for( i = 0; i < 38400/4; ++i )
        fpTmpPtr[ i ] = dwPattern;

return fpWork;
}

// Because the values are summed to create another unique value and the way that TOA
// uses the pixel values ( 2 colors, 1 intensity to make a single new value ) there
// can not be more than 15 unique values and the possibility to make 15 unique values
// care must be take with values that are common
// divisors.  This table allows us to not lose
BYTE xlate[ 8 ] = { 0, 1, 11, 3, 13, 5, 6, 7 };

// D+
pragma page()
//-----------------------------------------------------------------------
//
// GetValByPixelLocation
//
//      Get the pixel value by unloading the pixels 3 bit value given its x,y
//      coordinate in the frame buffer.  Speed is of some importance here so
//      little or no error checking is done and we use hardcoded values.
//
// PARAMETERS:  hpcFrame - the pixel data (probably on the capture card)
//              iX - X coordinate
//              iY - Y coordinate
//
// RETURNS:     The pixels value in range of of 0 - 8
//                              0xFF indicates error
//
//-----------------------------------------------------------------------
BYTE GetValByPixelLocation( BYTE huge *hpcFrame, int iX, int iY )
// D-
```

/* Appendix C:   CARDX2.C   Page 9 */

```c
{
    BYTE huge *hpbyPixels;
    long lSeqOffs;
    short int siToken;
    BYTE byVal = 0xFF;

// We want to compute the address that bit sequence starts in as well
    // as the position in that address that the sequence starts in.
    // 24 is the smallest value factorable by both 8 & 3 so the
    // bit position resyncs to pos 0 of a byte every 3 bytes so we find address
    // of the three byte sequence and compute based from there.
    // Since we are only interested in 3 bits we will never span more than
    // one byte boundary which implies we can use an integer pointer.

// I have chosen to use a switch statement and do the individual computation
    // for each possible pixel location in the 3 byte sequence since there are
    // only 7 of them. This should be the fastest way I think since I will not
    // have shift more than the minimum appropriate for each location.

// Addendum:
    // In order to handle 16 bit data Ric has changed it so odd bytes are upper
    // half screen data and even bytes are lower half screen data. As long as
    // scan lines do not have odd lengths this will hold true for the iX value
    // passed as well.

// Get start of 3 byte sequence (240 is frame line width) remembering that
    // upper screen and lower screen data resides in odd and even bytes
    // respectively.

lSeqOffs = (long) ( (iY % 240) * 480L ) + (long) (( iX / 8 ) * 6L );
    hpbyPixels = hpcFrame + lSeqOffs;
    if( iY < 240 )                  // Increment to the odd byte if the data is
        hpbyPixels++;               // in the upper half of the screen // Determine the token which is used to determine how to process the data. The
    // data bits are stored as follows:
    //   BYTE 0          BYTE 1           BYTE 3
    // 00000000        00000000         00000000
    // |^ ^ /          \ ^ /\  \ ^ ^\
    // 2 1 0           5 4 3 2    7   6 5   <--- Pixel Number (modulo 8)
    // Note that byte1 is address of byte0 + 2 because the upper screen and
    //      lower screen are multiplexed together.
```

```c
/* Appendix C:    CARDX2.C   Page 10 */

// Compute a unique value which will indicate how to proces the data.
siToken = (short int) ( iX % 8 );

switch( siToken )
{
        // Offset 0 of the first byte of the 3 byte sequence
        case 0:
                byVal = *( (BYTE huge *) hpbyPixels );
                byVal &= 7;
                break;
        // Offset 3 of the first byte of the 3 byte sequence
        case 1:
                byVal = *( (BYTE huge *) hpbyPixels );
                byVal = ( byVal >> 3 ) & 7;
                break;
        // Offset 6 of the first byte of the 3 byte sequence (use 1 bit of byte 2)
        case 2:
                byVal = *( (BYTE huge *) hpbyPixels );
                byVal = ( byVal >> 6 );
                if( *( (BYTE huge *) hpbyPixels + 2 ) & 1 )
                        byVal |= 4;
                break;
        // Offset 1 of the second byte of the 3 byte sequence
        case 3:
                byVal = *( (BYTE huge *) hpbyPixels + 2 );
                byVal = ( byVal >> 1 ) & 7;
                break;
        // Offset 4 of the second byte of the 3 byte sequence
        case 4:
                byVal = *( (BYTE huge *) hpbyPixels + 2 );
                byVal = ( byVal >> 4 ) & 7;
                break;
        // Offset 7 of the second byte of the 3 byte sequence (use 2 bits of byte 3)
        case 5:
                byVal = *( (BYTE huge *) hpbyPixels + 2 );
                byVal = ( byVal >> 7 );
                if( *( (BYTE huge *) hpbyPixels + 4 ) & 1 )
                        byVal |= 2;
                if( *( (BYTE huge *) hpbyPixels + 4 ) & 2 )
                        byVal |= 4;
                break;
        // Offset 2 of the last byte of the 3 byte sequence
        case 6:
                byVal = *( (BYTE huge *) hpbyPixels + 4 );
```

```
                /* Appendix C:   CARDX2.C   Page 11 */
                        byVal = ( byVal >> 2 ) & 7;
                        break;
                // Offset 4 of the last byte of the 3 byte sequence
                case 7:
                        byVal = *( (BYTE huge *) hpbyPixels + 4 );
                        byVal = ( byVal >> 5 ) & 7;
                        break;
        } ifdef MIKE_DEBUG
        // MSB FIRST
        switch( siToken )
        {
                // Offset 0 of the first byte of the 3 byte sequence
                case 0:
                        byVal = ( *( (BYTE huge *) hpbyPixels ) ) >> 5;
                        break;
                // Offset 3 of the first byte of the 3 byte sequence
                case 1:
                        byVal = *( (BYTE huge *) hpbyPixels );
                        byVal = ( byVal >> 2 ) & 7;
                        break;
                // Offset 6 of the first byte of the 3 byte sequence (use 1 bit of byte 2)
                case 2:
                        byVal = *( (BYTE huge *) hpbyPixels );
                        byVal = ( byVal << 1 );
                        if( *( (BYTE huge *) hpbyPixels + 2 ) & 0x80 )
                                byVal |= 1;
                        break;
                // Offset 1 of the second byte of the 3 byte sequence
                case 3:
                        byVal = *( (BYTE huge *) hpbyPixels + 2 );
                        byVal = ( byVal >> 4 ) & 7;
                        break;
                // Offset 4 of the second byte of the 3 byte sequence
                case 4:
                        byVal = *( (BYTE huge *) hpbyPixels + 2 );
                        byVal = ( byVal >> 1 ) & 7;
                        break;
                // Offset 7 of the second byte of the 3 byte sequence (use 2 bits of byte 3)
                case 5:
                        byVal = *( (BYTE huge *) hpbyPixels + 2 );
                        byVal = ( byVal << 2 );
                        if( *( (BYTE huge *) hpbyPixels + 4 ) & 0x80 )
```

```c
/* Appendix C:   CARDX2.C   Page 12 */
                byVal |= 2;
            if( *( (BYTE huge *) hpbyPixels + 4 ) & 0x40 )
                byVal |= 1;
            break;
        // Offset 2 of the last byte of the 3 byte sequence
        case 6:
            byVal = *( (BYTE huge *) hpbyPixels + 4 );
            byVal = ( byVal >> 3 ) & 7;
            break;
        // Offset 4 of the last byte of the 3 byte sequence
        case 7:
            byVal = ( *( (BYTE huge *) hpbyPixels + 4 ) ) & 7;
            break;
    }
endif return xlate[ byVal ];
} pragma page()
//******************************************************************************
**
//      ExpandFrameToBytes
//
//      PARAMETERS: sBitMap - Pointer to the bitmap structure to use
//                              data is allocated and locked
//                  iSlot - SLOT # that the grahics card resides in
//
//      RETURNS:    a status code
//                          0 - success
//                          -1 - invalid data parameters
//                          -2 - could not get selectors
//                          -3 - other error
//
//******************************************************************************
**
int ExpandFrameToBytes( LPBIT_MAP sBitMap, int iSlot )
// D-
{
    static WORD wBegSeq = 0;
    int iStatus;
    int iXDim, iYDim;
```

/* Appendix C:   CARDX2.C   Page 13 */

```
    int i, j;
    BYTE huge *hpbyData;
    BYTE huge *hpbyPixels;
    BYTE huge *hpbyFrame;
    BYTE huge *hpbyWork;
    BYTE huge *hpbySave;
    DWORD dwBaseAddr;
    long lSeqOffs;
    register BYTE byVal = 0xFF;
    WORD wSel, wF;
    WORD wSeq1;                              // Number of frames required to generate
                                             //    valid color codes.

iXDim = sBitMap->iScanLineWidth;
    iYDim = sBitMap->iNumScanLines;

// Create a huge pointer to physical mem on graphics capture card
    dwBaseAddr = GetBaseAddressForSlot( iSlot );

hpbyData = GlobalAllocPtr( GMEM_SHARE | GMEM_ZEROINIT, (DWORD) iXDim * iYDim );
    if( hpbyData == NULL )
            return -2;

//FOR DEBUG - MAKE A FRAME and a DATA AREA
    //if( bDebug )
    //      hpbyFrame = MakeTestPattern();

iStatus = SetupSelectorsForMsWindows(    (WORD far *) &wSel,
                                             dwBaseAddr + DATA_START,
    FRAME_SIZE * FRAME_COUNT );
    if( iStatus != 0 )
    {
            GlobalFreePtr( hpbyData );

return -2;
    }

EnableMem( iSlot );
```

```c
/* Appendix C:   CARDX2.C   Page 14 */
        if( bShowSeq )
        {
                wF = wBegSeq;
                wSeq1 = wBegSeq + 1;
                wBegSeq++;
        }
        else
        {
                wF = 0;
                wSeq1 = 3;
        }

// Make the selector start at top of next captured frame
        SetSegmentAddress( wSel, dwBaseAddr + DATA_START + ( ( DWORD) wF *
FRAME_SIZE ) );
        hpbyFrame = (char far *) MAKELP( wSel, (WORD) 0 );

for( ; wF < wSeq1; ++wF )
        {
                hpbyWork = hpbyData;                            // Start back at the top // We are going to do both upper and lower screen in one go
                for( i = 0; i < iYDim / 2; i++ )
                {
                        // One single scan line (640 pixels) occupies 240 bytes in the frame
                        // buffer, but since upper and lower screen are interleaved 480
                        // contiguous bytes in the frame buffer define 1 scan line in both the
                        // upper and lower screen.
                        lSeqOffs = (long) ( i * 480L );
                        hpbyWork = hpbyData + ( i * 640L );
                        for( j = 0; j < 480; j += 6 )
                        {
//-- DO THE UPPER SCREEN FIRST
                                hpbyPixels = hpbyFrame + lSeqOffs + j + 1;

// Offset 0 of the first byte of the 3 byte sequence
                                byVal = *( (BYTE huge *) hpbyPixels );
//                              byVal &= 7;
                                *hpbyWork += xlate[ byVal & 7 ];  hpbyWork++;
                                // Offset 3 of the first byte of the 3 byte sequence
//                              byVal = *( (BYTE huge *) hpbyPixels );
//                              byVal = ( byVal >> 3 ) & 7;
                                *hpbyWork += xlate[ ( byVal >> 3 ) & 7 ];  hpbyWork++;
```

```c
/* Appendix C:   CARDX2.C   Page 15 */

// Offset 6 of the first byte of the 3 byte sequence (use 1 bit of byte 2)
        byVal = *( (BYTE huge *) hpbyPixels );
        byVal = ( byVal >> 6 );
        if( *( (BYTE huge *) hpbyPixels + 2 ) & 1 )
                byVal |= 4;
        *hpbyWork += xlate[ byVal ];  hpbyWork++;
// Offset 1 of the second byte of the 3 byte sequence
        byVal = *( (BYTE huge *) hpbyPixels + 2 );
//      byVal = ( byVal >> 1 ) & 7;
        *hpbyWork += xlate[ ( byVal >> 1 ) & 7 ];  hpbyWork++;
// Offset 4 of the second byte of the 3 byte sequence
//      byVal = *( (BYTE huge *) hpbyPixels + 2 );
//      byVal = ( byVal >> 4 ) & 7;
        *hpbyWork += xlate[ ( byVal >> 4 ) & 7 ];  hpbyWork++;
// Offset 7 of the second byte of the 3 byte sequence (use 2 bits of byte
3)
        byVal = *( (BYTE huge *) hpbyPixels + 2 );
        byVal = ( byVal >> 7 );
        if( *( (BYTE huge *) hpbyPixels + 4 ) & 1 )
                byVal |= 2;
        if( *( (BYTE huge *) hpbyPixels + 4 ) & 2 )
                byVal |= 4;
        *hpbyWork += xlate[ byVal ];  hpbyWork++;
// Offset 2 of the last byte of the 3 byte sequence
        byVal = *( (BYTE huge *) hpbyPixels + 4 );
//      byVal = ( byVal >> 2 ) & 7;
        *hpbyWork += xlate[ ( byVal >> 2 ) & 7 ];  hpbyWork++;
// Offset 4 of the last byte of the 3 byte sequence
//      byVal = *( (BYTE huge *) hpbyPixels + 4 );
//      byVal = ( byVal >> 5 ) & 7;
        *hpbyWork += xlate[ ( byVal >> 5 ) & 7 ];  hpbyWork++;
//-- DO THE LOWER SCREEN LAST
        hpbyPixels = hpbyFrame + lSeqOffs + j;
        // Skip to the lower half of the screen in the
        // expanded buffer. 6 BYTES from frame expands
        // to 8 pixels
        hpbySave = hpbyWork;
        hpbyWork += ( ( (long) (iYDim / 2) * iXDim ) - 8 );

// Offset 0 of the first byte of the 3 byte sequence
        byVal = *( (BYTE huge *) hpbyPixels );
//      byVal &= 7;
        *hpbyWork += xlate[ byVal & 7 ];  hpbyWork++;
// Offset 3 of the first byte of the 3 byte sequence
```

```
                    /* Appendix C:    CARDX2.C    Page 16 */
//                  byVal = *( (BYTE huge *) hpbyPixels );
//                  byVal = ( byVal >> 3 ) & 7;
                    *hpbyWork += xlate[ ( byVal >> 3 ) & 7 ]; hpbyWork++;
                // Offset 6 of the first byte of the 3 byte sequence (use 1 bit of byte 2)
                    byVal = *( (BYTE huge *) hpbyPixels );
                    byVal = ( byVal >> 6 );
                    if( *( (BYTE huge *) hpbyPixels + 2 ) & 1 )
                        byVal |= 4;
                    *hpbyWork += xlate[ byVal ]; hpbyWork++;
                // Offset 1 of the second byte of the 3 byte sequence
                    byVal = *( (BYTE huge *) hpbyPixels + 2 );
//                  byVal = ( byVal >> 1 ) & 7;
                    *hpbyWork += xlate[ ( byVal >> 1 ) & 7 ]; hpbyWork++;
                // Offset 4 of the second byte of the 3 byte sequence
//                  byVal = *( (BYTE huge *) hpbyPixels + 2 );
//                  byVal = ( byVal >> 4 ) & 7;
                    *hpbyWork += xlate[ ( byVal >> 4 ) & 7 ]; hpbyWork++;
                // Offset 7 of the second byte of the 3 byte sequence (use 2 bits of byte
3)
                    byVal = *( (BYTE huge *) hpbyPixels + 2 );
                    byVal = ( byVal >> 7 );
                    if( *( (BYTE huge *) hpbyPixels + 4 ) & 1 )
                        byVal |= 2;
                    if( *( (BYTE huge *) hpbyPixels + 4 ) & 2 )
                        byVal |= 4;
                    *hpbyWork += xlate[ byVal ]; hpbyWork++;
                // Offset 2 of the last byte of the 3 byte sequence
                    byVal = *( (BYTE huge *) hpbyPixels + 4 );
//                  byVal = ( byVal >> 2 ) & 7;
                    *hpbyWork += xlate[ ( byVal >> 2 ) & 7 ]; hpbyWork++;
                // Offset 4 of the last byte of the 3 byte sequence
//                  byVal = *( (BYTE huge *) hpbyPixels + 4 );
//                  byVal = ( byVal >> 5 ) & 7;
                    *hpbyWork += xlate[ ( byVal >> 5 ) & 7 ]; hpbyWork++;

// Now get back to the upper screen
                    hpbyWork = hpbySave;
                }
            } hpbyFrame += FRAME_SIZE;
        }

(void) CompressData( hpbyData, (WORD huge *) sBitMap->hpcPixels,
```

/* Appendix C:   CARDX2.C   Page 17 */
```
                    (WORD) iYDim,
                    (WORD) iXDim );

DisableMem( iSlot );
    FreeSelectorsForMsWindows( wSel, FRAME_SIZE * FRAME_COUNT );
    GlobalFreePtr( hpbyData );

return 0;
}
// - End ExpandFrameToBytes *******************************************

// D+
pragma page()
//********************************************************************
*
//      MakeActBitMap
//
//      This routine loads a bitmap with data from the graphics board.
//      It initializes the bitmap structure, sets up all required values,
//      and copys the data from the board into local memory.
//
//      PARAMETERS:     wId - the slot ID
//                      sBitMap - Pointer to the bitmap structure to use
//                      iXDim - Size of the device along the X axis in pixels
//                      iYDim - Size of the device along the Y axis in scanlines
//                      rPad  - defines the padding along each edge of the capture
//                              buffer.  Each device may have different padding
//                              values and the frame grabber itself is unaware of
//                              the padding, so the software must adjust for it.
//
//      RETURNS:        TRUE if successful, FALSE if failed
//                      If true memory has been allocated and loaded with data
//                              from the file.  The handle is placed in the bitmap
//                              data structure and the memory is unlocked.
//
//                      The clipping region is always set to the maximum area
//
//********************************************************************
*
BOOL FAR PASCAL MakeActBitMap( WORD wId, LPBIT_MAP sBitMap, int iXDim, int
```

/* Appendix C:   CARDX2.C   Page 18 */
```
iYDim, RECT rPad )
// D-
{
        DWORD dwFrameCount, dwSize = 0;
        int i, iSlot, iVRes, iHRes;

iSlot =  wId;

//-- WHILE WE ARE BRINGING UP THE SYSTEM LET'S ZERO OUT THE CARD
EACH TIME
//      ZeroGraphicsMem( iSlot );

if( bShowSeq )
                goto DO_NO_CAPTURE;

if( xCheckForCard( iSlot ) )
        {
                xSetGBFrameCounter( iSlot );        // Set frame address to zero
                // Tell frame grabber to capture a frame
                EnableMem( iSlot );

i = 0;
                // Retry up to 5 times to get a good capture.
                while( i < 5 )
                {
                        if( CaptureData( iSlot, 0x7ff ) )
                                break;
                        else if ( i == 4 )
                        {
                                MessageBox( (HANDLE) NULL, "Graphics card timeout",
                                            "MakeActBitMap", MB_ICONSTOP |
MB_OK );
                                return FALSE;
                        }
                        i++;
                }

DisableMem( iSlot );
        }
        else
                return FALSE;

iVRes = GetVerticalResolution( iSlot );
```

```
/* Appendix C:   CARDX2.C   Page 19 */
```

```c
        iHRes = GetHorizontalResolution( iSlot );

DO_NO_CAPTURE:

ReleaseBitMap( sBitMap );

sBitMap->iScanLineWidth = iXDim;
        sBitMap->iNumScanLines = iYDim;
        SetNoClip( sBitMap );                                   // No clip area sBitMap->byBmpType = BMP_TYPE_COMPRESSED;   // Type indicates the
nature of
        sBitMap->bCompressed = TRUE;                // Indicates if data is
compressed // We allocate twice as much as possible size in case of negative
        // compression. Memory is now locked
        if( AllocateMemoryForBitMap( sBitMap ) != 0 )
                return FALSE;

sBitMap->hColorMono = 0;                                // No color monochrome's
yet
        sBitMap->fpColors = NULL;                               // Ditto dwFrameCount = FRAME_COUNT;
        dwSize = FRAME_SIZE;

// Convert the frame data to a B-Tree format bitmap
        return ExpandFrameToBytes( sBitMap, iSlot ) ? FALSE : TRUE;
}
// - End MakeActBitMap
*************************************************************
```

```
/* Appendix C:   CARDX4.C   Page 1 */
// Copyright (c) B-Tree Verification Systems, Inc. 1990-1995.  All rights reserved.
//
// $Header:   T:\svs\grphdll\cardx4.c_v   1.2   14 Sep 1995 20:38:58   MLOUDEN $ /*************************** CARDX4.C********************************
 * This module contains routines that interface to the graphics capture card.
 *      modified for the MEI system.
 ***********************************************************************/

/*
 * $Log:   T:\svs\grphdll\cardx4.c_v $
 *
 */

// INCLUDE FILES ******************************************************** include <windows.h>
include <dos.h>
include "grphdll.h"
include "eisa.h"
include "dpmi.h"

// END INCLUDE FILES
*********************************************************** pragma page()
// *********************************************************************
// MANIFEST CONSTANTS AND MACROS define IDS_OK 0

// END MANIFEST CONSTANTS AND
MACRO******************************************

/***********************************************************************/
//      STRUCTURES AND TYPEDEFS
```

/* Appendix C: CARDX4.C Page 2 */

```c
// END STRUCTURES AND TYPEDEFS
//************************************************

//**************************************************************************
//      GLOBAL VARIABLES

// END GLOBAL VARIABLES
//********************************************************

BOOL FAR PASCAL CompressBitmapLineHugeSrc( WORD huge * hpwDestLine, char huge
* hpcSrcLine, int iLen );

// END GLOBAL VARIABLES
//********************************************************* int FAR PASCAL ClearFrameBuff( void )
{
    return 0;
}

BOOL FAR PASCAL CheckForCard( WORD wSlot )
{
    if( xCheckForCard( wSlot ) != 0 )
        return TRUE;
    return FALSE;
}

// D+
pragma page()
//**************************************************************************
**
//      ConvertFrameToBitMap
//
//   Takes the data from the frame grabber and converts it to the B-TREE format
//      bitmap.
//
//      PARAMETERS: sBitMap - Pointer to the bitmap structure to use
//                  iXDim - Size of the device along the X axis in pixels
//                  iYDim - Size of the device along the Y axis in scanlines
//                  rPad  - defines the padding along each edge of the capture
//                          buffer. Each device may have different padding
```

/* Appendix C: CARDX4.C   Page 3 */

```
//                              values and the frame grabber itself is unaware of
//                              the padding, so the software must adjust for it.
//                      iSlot - SLOT # that the grahics card resides in
//              Memory is allocated and locked for the bitmap data
//
//      RETURNS:        TRUE if successful, FALSE if failed
//                      If true memory has been loaded with data from the frame
//                      grabber.  The handle is placed in the bitmap
//                      data structure and the memory is unlocked.
//
//*************************************************************************
**
BOOL ConvertFrameToBitMap( LPBIT_MAP sBitMap, int iXDim, int iYDim, RECT rPad,
int iSlot )
// D-
{
        int i, iStatus, iLineIncr;
        WORD w, wLen, wTmp;
        BYTE byTmp, byTmp1;
        DWORD dwBaseAddr, dwDataSize, dwFrameSize;
        WORD wSel;
        WORD huge *hpwCompressedData;
        char huge *hpcFramePtr;
        char far  *fpcFramePtr;

// TEMP UNTIL CAN GET ADDRESS FROM MANAGER
        dwBaseAddr = GetBaseAddressForSlot( iSlot );
        iLineIncr = iXDim + rPad.left + rPad.right;
        dwFrameSize = iLineIncr * (DWORD) ( iYDim + rPad.top );

// Create a huge pointer to physical mem on graphics capture card
        iStatus = SetupSelectorsForMsWindows( (WORD far *) &wSel,
                                                                        dwBaseAddr,
dwFrameSize );
        if( iStatus != 0 )
                return FALSE;

hpcFramePtr = ( (char huge *) MAKELP( wSel, 0 ) ) +
                                        ( rPad.top * iLineIncr ) + rPad.left;
        fpcFramePtr = (char far *) hpcFramePtr;
        EnableMem( iSlot );
        for( i = 0, dwDataSize = 0; i < iYDim; i++ ) {
                hpwCompressedData = RLELineAddress( i, sBitMap );
```

/* Appendix C: CARDX4.C Page 4 */

```c
CompressBitmapLineHugeSrc( hpwCompressedData, hpcFramePtr, iXDim );
// Now we filter the memory because of the weird way MEI outs
// their data.
wLen = *hpwCompressedData;
for( w = 0; w < wLen; w++ )
{
        wTmp = hpwCompressedData[ w + 1 ];
        byTmp = LOBYTE( wTmp );
        byTmp1 = byTmp & (BYTE) 0x0F;          // Take off the upper bits
        // If it is black, it may have waveform data in the upper
        // nibble.
        if( byTmp1 == 0 )
        {
                byTmp = byTmp >> 4;            // Move in the upper bits
                byTmp1 |= byTmp;               // Now we have data whether it was
        }                                      // was in upper or lower nibble
        wTmp &= 0xFF00;
        wTmp |= (WORD) byTmp1;                 // put it back in the line
        hpwCompressedData[ w + 1 ] = wTmp;
}

// Update number of WORDS in data
        dwDataSize += ( *hpwCompressedData + 1 );   // 1 is for counter itself
        hpcFramePtr += iLineIncr;

}
// Convert data to character size
dwDataSize *= sizeof( WORD );

DisableMem( iSlot );
FreeSelectorsForMsWindows( wSel, dwFrameSize );

// Reallocate the memory, hopefully releasing some back to system
GlobalUnlock( sBitMap->hBitmap );
sBitMap->hpcPixels = NULL;
sBitMap->hBitmap = GlobalReAlloc( sBitMap->hBitmap,
                                        dwDataSize,
                                        GMEM_SHARE |
GMEM_MOVEABLE );
        sBitMap->dwBitMapSize = GlobalSize( sBitMap->hBitmap );
```

/* Appendix C:   CARDX4.C   Page 5 */

```c
        return TRUE;

}
// - End ConvertFrameToBitMap ***********************************************

// D+
pragma page()
//***************************************************************************
**
//      GetCaptureStats
//
//      Return characteristics about the last capture done for a given card.
//
//      PARAMETERS:     ild - identifies the graphics card
//                      fplStats - points to array of longs
//                                      [ 0 ] = Total bytes captured
//                                      [ 1 ] = Horz res in pixels
//                                      [ 2 ] = Vert res in pixels
//                                      [ 3 ] = offset of first non-pad character
//                                              if -1 this field not valid
//
//      RETURNS:   TRUE if successful, else FALSE
//
//***************************************************************************
**
BOOL FAR PASCAL GetCaptureStats( int iId, long far *fplStats )
// D-
{
        int i, iSlot;
        WORD wSel;
        DWORD dwBaseAddr;
        BYTE far *fpbyFramePtr;

iSlot = iId;

if( xCheckForCard( iSlot ) )
        {
                fplStats[ 0 ] = 4 * GetFrameCounter( iSlot );
                fplStats[ 1 ] = GetHorizontalResolution( iSlot );
                fplStats[ 2 ] = GetVerticalResolution( iSlot );

EnableMem( iSlot );
```

```
/* Appendix C:   CARDX4.C   Page 6 */ dwBaseAddr = GetBaseAddressForSlot( iSlot );
        // Create a huge pointer to physical mem on graphics capture card
        i = SetupSelectorsForMsWindows( (WORD far *) &wSel, dwBaseAddr, 32768
);
        if( i != 0 )

{
                        MessageBox( (HANDLE) NULL, "Could not create selector",
                                        "GetCaptureStats", MB_ICONSTOP |
MB_OK );
                        return FALSE;
                }
        fpbyFramePtr = (BYTE far *) MAKELP( wSel, 0 );
        fplStats[ 3 ] = (long) -1;
        // Now search for non-pad character ( != black ) for reasonable area.
        for( i = 0; i < 32768; i++ )
        {
                if( fpbyFramePtr[ i ] != 0 )
                {
                        fplStats[ 3 ] = (long) i;
                        break;
                }
        }
        FreeSelectorsForMsWindows( wSel, 32768 );
        }
        else
                return FALSE;

return TRUE;
}
// - End GetCaptureStats ****************************************************

// D+
/* <f> */
//**************************************************************************
**
//      CaptureRawGraphicsData
//
//      This routine makes a capture but does not create a B-Tree bitmap. In effect
//      it simply loads the raw graphics data.
//
//      PARAMETERS:     ild - identifies the graphics card
//
//      RETURNS:   TRUE if successful, else FALSE
```

```
/* Appendix C:   CARDX4.C   Page 7 */
//                    if TRUE the graphics card memory contains valid data
//
//*********************************************************************
**
BOOL FAR PASCAL CaptureRawGraphicsData( int iId )
// D-
{
        int i, iSlot;

iSlot = iId;

if( xCheckForCard( iSlot ) )
        {
                xSetGBFrameCounter( iSlot );          // Set frame address to zero
                // Tell frame grabber to capture a frame
                EnableMem( iSlot );
                i = 0;
                // Retry up to 5 times to get a good capture.
                while( i < 5 )
                {
                        if( ! CaptureData( iSlot, 60 )     && i == 4 )
                        {
                                MessageBox( (HANDLE) NULL, "Graphics card timeout",
                                                "CaptureGraphicsData", MB_ICONSTOP |
MB_OK );
                                return FALSE;
                        }
                        else
                                break;
                }
        }
        else
                return FALSE;

return TRUE;
}
// - End CaptureRawGraphicsData
//****************************************************

// D+
pragma page()
//*********************************************************************
**
//      FilterMEIData
```

/* Appendix C:   CARDX4.C   Page 8 */

```c
//
//      PARAMETERS: sBitMap - Pointer to the bitmap structure to use
//                           data is allocated and locked
//                           iSlot - SLOT # that the grahics card resides in
//
//      RETURNS:    a status code
//                           0 - success
//                          -1 - invalid data parameters
//                          -2 - could not get selectors
//                          -3 - other error
//
//*****************************************************************************
**
int FilterMEIData( LPBIT_MAP sBitMap, int iXDim, int iYDim, RECT rPad, int iSlot )
// D-
{
        int iStatus, iLineIncr;
        DWORD dwCount;
        BYTE huge *hpbyFrame;
        BYTE huge *hpbyFltr;
        DWORD dwBaseAddr, dwFrameSize;
        WORD wSel;

// Create a huge pointer to physical mem on graphics capture card
        dwBaseAddr = GetBaseAddressForSlot( iSlot );
        iLineIncr = iXDim + rPad.left + rPad.right;
        dwFrameSize = iLineIncr * (DWORD) ( iYDim + rPad.top );

iStatus =
        SetupSelectorsForMsWindows( (WORD far *) &wSel, dwBaseAddr, 2 * dwFrameSize
);
        if( iStatus != 0 )
                return FALSE;
        hpbyFrame = (char far *) MAKELP( wSel, (WORD) 0 );
        hpbyFltr = hpbyFrame + dwFrameSize;

// Filter the captured data to another area of the graphics
        // memory.
        for( dwCount = 0; dwCount < dwFrameSize; dwCount++ )
        {
        }

FreeSelectorsForMsWindows( wSel, 2 * dwFrameSize );
```

/* Appendix C:   CARDX4.C   Page 9 */

```
        return 0;
}
// - End ExpandFrameToBytes ***************************************************

// D+
pragma page()
//*****************************************************************************
*
//      MakeActBitMap
//
//      This routine loads a bitmap with data from the graphics board.
//      It initializes the bitmap structure, sets up all required values,
//      and copys the data from the board into local memory.
//
//      PARAMETERS:     wId - the slot ID
//                      sBitMap - Pointer to the bitmap structure to use
//                      iXDim - Size of the device along the X axis in pixels
//                      iYDim - Size of the device along the Y axis in scanlines
//                      rPad  - defines the padding along each edge of the capture
//                              buffer.  Each device may have different padding
//                              values and the frame grabber itself is unaware of
//                              the padding, so the software must adjust for it.
//
//      RETURNS:   TRUE if successful, FALSE if failed
//                 If true memory has been allocated and loaded with data
//                      from the file.  The handle is placed in the bitmap
//                      data structure and the memory is unlocked.
//
//                 The clipping region is always set to the maximum area
//
//*****************************************************************************
*
BOOL FAR PASCAL MakeActBitMap( WORD wId, LPBIT_MAP sBitMap, int iXDim, int
iYDim, RECT rPad )
// D-
{
        DWORD dwFrameCount, dwSize = 0;
        int i, iSlot, iVRes, iHRes;
        DWORD dwBaseAddr;
```

```c
/* Appendix C:   CARDX4.C   Page 10 */

WORD wSel;
DWORD far *fpdwFramePtr;

iSlot = wId;

if( xCheckForCard( iSlot ) )
{
        xSetGBFrameCounter( iSlot );           // Set frame address to zero
        // Tell frame grabber to capture a frame
        EnableMem( iSlot );
        dwBaseAddr = GetBaseAddressForSlot( iSlot );
        // Create a huge pointer to physical mem on graphics capture card
        i = SetupSelectorsForMsWindows( (WORD far *) &wSel, dwBaseAddr, 10 );
        if( i != 0 )
        {
                MessageBox( (HANDLE) NULL, "Could not create selector",
                                        "MakeActBitMap", MB_ICONSTOP |
MB_OK );
                return FALSE;
        }
        fpdwFramePtr = (DWORD far *) MAKELP( wSel, 0 );
        *fpdwFramePtr = 0x5aa55aa5;
        i = 0;
        // Retry up to 5 times to get a good capture.
        while( i < 5 )
        {
                if( ! CaptureData( iSlot, 60 )      && i == 4 )
                {
                        MessageBox( (HANDLE) NULL, "Graphics card timeout",
                                                "MakeActBitMap", MB_ICONSTOP |
MB_OK );
                        FreeSelectorsForMsWindows( wSel, 10 );
                        return FALSE;
                }
                else
                        break;
        }
        // We only get here if successful
        FreeSelectorsForMsWindows( wSel, 10 );
}
else
        return FALSE;

dwFrameCount = GetFrameCounter( iSlot );
```

```c
/* Appendix C:    CARDX4.C    Page 11 */ iVRes = GetVerticalResolution( iSlot );
    iHRes = GetHorizontalResolution( iSlot );

ReleaseBitMap( sBitMap );

sBitMap->iScanLineWidth = iXDim;
    sBitMap->iNumScanLines = iYDim;
    SetNoClip( sBitMap );                           // No clip area sBitMap->byBmpType = BMP_TYPE_COMPRESSED;       // Type indicates the nature
of
    sBitMap->bCompressed = TRUE;                    // Indicates if data is
compressed // We allocate twice as much as possible size in case of negative
    // compression.    Memory is now locked
    if( AllocateMemoryForBitMap( sBitMap ) != 0 )
        return FALSE;

sBitMap->hColorMono = 0;                        // No color monochrome's
yet
    sBitMap->fpColors = NULL;                       // Ditto // Convert the frame data to a B-Tree format bitmap
    return ConvertFrameToBitMap( sBitMap, iXDim, iYDim, rPad, iSlot );

}
// - End MakeActBitMap
***********************************************************
```

/* Appendix C:   CARDX5.C   Page 1 */

// Copyright (c) B-Tree Verification Systems, Inc. 1990-1995.  All rights reserved.
//

// $Header:   T:\svs\grphdll\cardx5.c_v   1.1   10 Apr 1995 20:18:10   MLOUDEN $ /***************************** CARDx5.C ******************************
* This module contains routines that interface to the graphics capture card.
*   Modified for INCONTROL Chips & Technologies LCD Controller..
*************************************************************************/

/*
* $Log:   T:\svs\grphdll\cardx5.c_v $
*
*
*
*/

// INCLUDE FILES ******************************************************** include <windows.h>
include <windowsx.h>
include <dos.h>
include "grphdll.h"
include "eisa.h"
include "dpmi.h"

// END INCLUDE FILES
******************************************************** pragma page()
// *********************************************************************
// MANIFEST CONSTANTS AND MACROS // Determined by experimentation
define DATA_START    96 define FRAME_SIZE       38400
define FRAME_COUNT          16
define FRAME_X              160 define GRAPHICS_MEM_SIZE  0x400000
WORD wDataStart = DATA_START;

```
/* Appendix C:   CARDX5.C   Page 2 */
// END MANIFEST CONSTANTS AND
MACRO*******************************************

/*****************************************************************/
//    STRUCTURES AND TYPEDEFS

// END STRUCTURES AND TYPEDEFS
***********************************************

// ****************************************************************************
//    GLOBAL VARIABLES

BOOL bDebug = FALSE;
BOOL bBadCapture = FALSE;

// END GLOBAL VARIABLES
*********************************************************** int FAR PASCAL ClearFrameBuff( void )
{
        return 0;
}

BOOL FAR PASCAL CheckForCard( WORD wSlot )
{
        if( xCheckForCard( wSlot ) != 0 )
                return TRUE;
        return FALSE;
}
//******************************************************************************
//
//    Given a physical address
//    Set selector address via DPMI call
//
//******************************************************************************
int SetSegmentAddress( WORD wSelector, DWORD dwAddress )
```

```c
/* Appendix C:   CARDX5.C   Page 3 */

{
    int iStatus = 0;

_asm
    {
        // DPMI: Physical Address Mapping
        //      (returns a linear address in bx:cx)
        mov  ax, 0x0800
        mov  bx, WORD PTR dwAddress+2
        mov  cx, WORD PTR dwAddress
        mov  si, 0
        mov  di, FRAME_SIZE
        int  31h
        jc   ERROR_EXIT
        // DPMI: Set Segment Base Address
        mov  ax, 0x0007
        mov  dx, cx
        mov  cx, bx
        mov  bx, wSelector
        int  31h
        jc   ERROR_EXIT
        jmp  EXIT
    ERROR_EXIT:
        mov  iStatus, ax
        cmp  iStatus, 0
        jne  EXIT
        mov  iStatus, 0xffff
    EXIT:
    } return iStatus;
}

// D+
pragma page()
//******************************************************************************
//     ZeroGraphicsMem
//
//     Zero fill all of the graphics card memory
//
```

/* Appendix C: CARDX5.C Page 4 */
```
//      PARAMETERS:     ild - identifies the graphics card
//
//      RETURNS:        TRUE if successful, else FALSE
//
//*************************************************************************
**
BOOL ZeroGraphicsMem( int ild )
// D-
{
        int i, iSlot;
        long l;
        WORD wSel;
        DWORD dwBaseAddr;
        DWORD huge *hpdwFramePtr;

iSlot = ild;

if( xCheckForCard( iSlot ) )
        {
                dwBaseAddr = GetBaseAddressForSlot( iSlot );
                // Create a huge pointer to physical mem on graphics capture card
                i = SetupSelectorsForMsWindows( (WORD far *) &wSel,
                                                                dwBaseAddr,
                                                GRAPHICS_MEM_SIZE );
                if( i != 0 )
                {
                        MessageBox( (HANDLE) NULL, "Could not create selector",
                                                "ZeroGraphicsMem", MB_ICONSTOP
MB_OK );
                        return FALSE;
                }
                EnableMem( iSlot );
                (void huge *) hpdwFramePtr = MAKELP( wSel, 0 );
                for( l = 0; l < GRAPHICS_MEM_SIZE / sizeof(DWORD); l++ )
                        hpdwFramePtr[ l ] = 0;
                FreeSelectorsForMsWindows( wSel, GRAPHICS_MEM_SIZE );
        }
        else
                return FALSE;

return TRUE;
```

```c
/* Appendix C:   CARDX5.C   Page 5 */

}
// - End ZeroGraphicsMem ******************************************

// D+
pragma page()
//*********************************************************************
**
//      GetCaptureStats
//
//      Return characteristics about the last capture done for a given card.
//
//      PARAMETERS:     ild - identifies the graphics card
//                      fplStats - points to array of longs
//                                  [ 0 ] = Total bytes captured
//                                  [ 1 ] = Horz res in pixels
//                                  [ 2 ] = Vert res in pixels
//                                  [ 3 ] = offset of first non-pad character
//                                          if -1 this field not valid
//
//      RETURNS:        TRUE if successful, else FALSE
//
//*********************************************************************
**
BOOL FAR PASCAL GetCaptureStats( int ild, long far *fplStats )
// D-
{
        int i, iSlot;
        WORD wSel;
        DWORD dwBaseAddr;
        BYTE far *fpbyFramePtr;

iSlot = ild;

if( xCheckForCard( iSlot ) )
        {
                fplStats[ 0 ] = 4 * GetFrameCounter( iSlot );
                fplStats[ 1 ] = GetHorizontalResolution( iSlot );
                fplStats[ 2 ] = GetVerticalResolution( iSlot );

EnableMem( iSlot );
                dwBaseAddr = GetBaseAddressForSlot( iSlot );
                // Create a huge pointer to physical mem on graphics capture card
                i = SetupSelectorsForMsWindows( (WORD far *) &wSel, dwBaseAddr, 32768
```

```c
/* Appendix C:   CARDX5.C   Page 6 */
            );
                if( i != 0 )

{
                        MessageBox( (HANDLE) NULL, "Could not create selector",
                                                "GetCaptureStats", MB_ICONSTOP |
MB_OK );
                        return FALSE;
                }
                fpbyFramePtr = (BYTE far *) MAKELP( wSel, 0 );
                fplStats[ 3 ] = (long) -1;
                // Now search for non-pad character ( != black ) for reasonable area.
                for( i = 0; i < 32768; i++ )
                {
                        if( fpbyFramePtr[ i ] != 0 )
                        {
                                fplStats[ 3 ] = (long) i;
                                break;
                        }
                }
                FreeSelectorsForMsWindows( wSel, 32768 );
        }
        else
                return FALSE;

return TRUE;
}
// - End GetCaptureStats ****************************************************

// D+
pragma page()
//******************************************************************************
**
//      CaptureRawGraphicsData
//
//      This routine makes a capture but does not create a B-Tree bitmap.  In effect
//      it simply loads the raw graphics data.
//
//      PARAMETERS:     iId - identifies the graphics card
//
//      RETURNS:        TRUE if successful, else FALSE
//                      if TRUE the graphics card memory contains valid data
//
```

```c
/* Appendix C:   CARDX5.C   Page 7 */
//*************************************************************************
**
BOOL FAR PASCAL CaptureRawGraphicsData( short int iId )
// D-
{
        short int i, iSlot;

iSlot = iId;

//-- WHILE WE ARE BRINGING UP THE SYSTEM LET'S ZERO OUT THE CARD EACH TIME
        ZeroGraphicsMem( iSlot );

if( iSlot = xCheckForCard( iSlot ) )
        {
                xSetGBFrameCounter( iSlot );        // Set frame address to zero
                // Tell frame grabber to capture a frame
                EnableMem( iSlot );
                i = 0;
                // Retry up to 5 times to get a good capture.
                while( i < 5 )
                {
                        if( ! CaptureData( iSlot, 0x7fff )    && i == 4 )
                        {
                                MessageBox( (HANDLE) NULL, "Graphics card timeout",
                                        "CaptureGraphicsData", MB_ICONSTOP |
MB_OK );
                                return FALSE;
                        }
                        else
                                break;
                }
        }
        else
                return FALSE;

return TRUE;

}
// - End CaptureRawGraphicsData
//********************************************************

// Make a test pattern to work with for debug.
char far * MakeTestPattern( void )
```

/* Appendix C:   CARDX5.C   Page 8 */

```c
{
    char far *fpWork;
    DWORD far *fpTmpPtr;
    DWORD dwPattern;
    int i;

fpTmpPtr = (DWORD far *) fpWork = (DWORD far *) GlobalAllocPtr(
GMEM_SHARE, 38400 );
    dwPattern = 0xc3c3c3c3;

for( i = 0; i < 38400/4; ++i )
        fpTmpPtr[ i ] = dwPattern;

return fpWork;
} pragma page()
//*********************************************************************
**
//      ExpandFrameToBytes
//
//      PARAMETERS: sBitMap - Pointer to the bitmap structure to use
//                            data is allocated and locked
//                  iSlot - SLOT # that the grahics card resides in
//
//      RETURNS:    a status code
//                            0 - success
//                           -1 - invalid data parameters
//                           -2 - could not get selectors
//                           -3 - other error
//
//*********************************************************************
**
int ExpandFrameToBytes( LPBIT_MAP sBitMap, int iSlot )
// D-
{

//-- WARNING --
//-- THIS FUNCTION CONTAINS HAND TUNED ASSEMBLY LANGUAGE CODE.
CHANGING ANY
//-- OF THE LOCAL VARIABLES (OR ADDING NEW VARIABLES) MAY
INVALIDATE
//-- THE ASSEMBLY LANGUAGE CODE
```

```
/* Appendix C:   CARDX5.C   Page 9 */ long li;
    int iStatus;
    int iXDim, iYDim;
    BYTE far  *fpbyFrame;
    BYTE huge *hpbyData;
    BYTE huge *hpUScreen;
    BYTE huge *hpLScreen;
    BYTE far  *fpUScreen;       // We use far pointers for speed
    BYTE far  *fpLScreen;       // We use far pointers for speed
    DWORD dwBaseAddr;
    WORD wSel;
    WORD wF, wSeq1, wSeq2;
    DWORD dwBeg, dwEnd, dwTime;
    union
    {
        DWORD dwAll;
        struct
        {
            BYTE by0;
            BYTE by1;
            BYTE by2;
            BYTE by3;
        } bytes;
    } dwVal;
//-- WARNING --
//-- THIS FUNCTION CONTAINS HAND TUNED ASSEMBLY LANGUAGE CODE. CHANGING ANY
//-- OF THE LOCAL VARIABLES (OR ADDING NEW VARIABLES) MAY INVALIDATE
//-- THE ASSEMBLY LANGUAGE CODE iXDim = sBitMap->iScanLineWidth;
    iYDim = sBitMap->iNumScanLines;

// Create a huge pointer to physical mem on graphics capture card
    dwBaseAddr = GetBaseAddressForSlot( iSlot );

hpbyData = GlobalAllocPtr( GMEM_SHARE | GMEM_ZEROINIT, (DWORD)
iXDim * (iYDim + 53L) );

wSeq1 = FRAME_COUNT;
    wSeq2 = 0;
```

```c
/* Appendix C:   CARDX5.C   Page 10 */

//FOR DEBUG - MAKE A FRAME and a DATA AREA
//if( bDebug )
//      hpbyFrame = MakeTestPattern();

iStatus =
SetupSelectorsForMsWindows(     (WORD far *) &wSel,
                                                dwBaseAddr + wDataStart,
FRAME_SIZE );;
        if( iStatus != 0 )
                return -2;

// For each frame we add up the 'on' pixel
for( wF = 0; wF < wSeq1; ++wF )
{
        SetSegmentAddress(      wSel,
                                                dwBaseAddr + wDataStart - ( ( DWORD)
wF * FRAME_SIZE ) );
        // We skip by the first (partial) frame
        fpbyFrame = (char far *) MAKELP( wSel, (WORD) 0 );

hpUScreen = hpbyData + (53L * iXDim);
        hpLScreen = hpUScreen + ( ( (long) iXDim * iYDim ) / 2 );
        fpUScreen = hpUScreen;          // For speed use far pointers
        fpLScreen = hpLScreen;          // For speed use far pointers
        // For each byte in the frame
        for( li = 0; (DWORD) li < ( FRAME_SIZE / 4 ); ++li, fpbyFrame += 4 )
        {
                dwVal.dwAll = *((DWORD far *) fpbyFrame);
/* This is commented out because we use a hand tuned assembler to accomplish if( dwVal.bytes.by0 & 1 )
                        fpUScreen[ 0 ]++;
                if( dwVal.bytes.by0 & 2 )
                        fpUScreen[ 1 ]++;
                if( dwVal.bytes.by0 & 4 )
                        fpUScreen[ 2 ]++;
                if( dwVal.bytes.by0 & 8 )
                        fpUScreen[ 3 ]++;
                if( dwVal.bytes.by1 & 1 )
                        fpUScreen[ 4 ]++;
                if( dwVal.bytes.by1 & 2 )
                        fpUScreen[ 5 ]++;
```

```
/* Appendix C:   CARDX5.C   Page 11 */
    if( dwVal.bytes.by1 & 4 )
        fpUScreen[ 6 ]++;
    if( dwVal.bytes.by1 & 8 )
        fpUScreen[ 7 ]++;
    if( dwVal.bytes.by2 & 1 )
        fpUScreen[ 8 ]++;
    if( dwVal.bytes.by2 & 2 )
        fpUScreen[ 9 ]++;
    if( dwVal.bytes.by2 & 4 )
        fpUScreen[ 10 ]++;
    if( dwVal.bytes.by2 & 8 )
        fpUScreen[ 11 ]++;
    if( dwVal.bytes.by3 & 1 )
        fpUScreen[ 12 ]++;
    if( dwVal.bytes.by3 & 2 )
        fpUScreen[ 13 ]++;
    if( dwVal.bytes.by3 & 4 )
        fpUScreen[ 14 ]++;
    if( dwVal.bytes.by3 & 8 )
        fpUScreen[ 15 ]++;
    if( dwVal.bytes.by0 & 0x10 )
        fpLScreen[ 0 ]++;
    if( dwVal.bytes.by0 & 0x20 )
        fpLScreen[ 1 ]++;
    if( dwVal.bytes.by0 & 0x40 )
        fpLScreen[ 2 ]++;
    if( dwVal.bytes.by0 & 0x80 )
        fpLScreen[ 3 ]++;
    if( dwVal.bytes.by1 & 0x10 )
        fpLScreen[ 4 ]++;
    if( dwVal.bytes.by1 & 0x20 )
        fpLScreen[ 5 ]++;
    if( dwVal.bytes.by1 & 0x40 )
        fpLScreen[ 6 ]++;
    if( dwVal.bytes.by1 & 0x80 )
        fpLScreen[ 7 ]++;
    if( dwVal.bytes.by2 & 0x10 )
        fpLScreen[ 8 ]++;
    if( dwVal.bytes.by2 & 0x20 )
        fpLScreen[ 9 ]++;
    if( dwVal.bytes.by2 & 0x40 )
        fpLScreen[ 10 ]++;
    if( dwVal.bytes.by2 & 0x80 )
        fpLScreen[ 11 ]++;
```

/* Appendix C:   CARDX5.C   Page 12 */

```
        if( dwVal.bytes.by3 & 0x10 )
            fpLScreen[ 12 ]++;
        if( dwVal.bytes.by3 & 0x20 )
            fpLScreen[ 13 ]++;
        if( dwVal.bytes.by3 & 0x40 )
            fpLScreen[ 14 ]++;
        if( dwVal.bytes.by3 & 0x80 )
            fpLScreen[ 15 ]++;
*/
_asm
{
        les     bx,DWORD PTR [fpUScreen]      ;fpUScreen
        test    BYTE PTR [dwVal.bytes.by0],1  ;dwVal
        je      $I2268
        inc     BYTE PTR es:[bx]
$I2268:
        test    BYTE PTR [dwVal.bytes.by0],2  ;dwVal
        je      $I2269
        inc     BYTE PTR es:[bx+1]
$I2269:
        test    BYTE PTR [dwVal.bytes.by0],4  ;dwVal
        je      $I2270
        inc     BYTE PTR es:[bx+2]
$I2270:
        test    BYTE PTR [dwVal.bytes.by0],8  ;dwVal
        je      $I2271
        inc     BYTE PTR es:[bx+3]
$I2271:
        test    BYTE PTR [dwVal.bytes.by1],1
        je      $I2272
        inc     BYTE PTR es:[bx+4]
$I2272:
        test    BYTE PTR [dwVal.bytes.by1],2
        je      $I2273
        inc     BYTE PTR es:[bx+5]
$I2273:
        test    BYTE PTR [dwVal.bytes.by1],4
        je      $I2274
        inc     BYTE PTR es:[bx+6]
$I2274:
        test    BYTE PTR [dwVal.bytes.by1],8
        je      $I2275
        inc     BYTE PTR es:[bx+7]
$I2275:
```

/* Appendix C:   CARDX5.C   Page 13 */

```
        test    BYTE PTR [dwVal.bytes.by2],1
        je      $12276
        inc     BYTE PTR es:[bx+8]
$12276:
        test    BYTE PTR [dwVal.bytes.by2],2
        je      $12277
        inc     BYTE PTR es:[bx+9]
$12277:
        test    BYTE PTR [dwVal.bytes.by2],4
        je      $12278
        inc     BYTE PTR es:[bx+10]
$12278:
        test    BYTE PTR [dwVal.bytes.by2],8
        je      $12279
        inc     BYTE PTR es:[bx+11]
$12279:
        test    BYTE PTR [dwVal.bytes.by3],1
        je      $12280
        inc     BYTE PTR es:[bx+12]
$12280:
        test    BYTE PTR [dwVal.bytes.by3],2
        je      $12281
        inc     BYTE PTR es:[bx+13]
$12281:
        test    BYTE PTR [dwVal.bytes.by3],4
        je      $12282
        inc     BYTE PTR es:[bx+14]
$12282:
        test    BYTE PTR [dwVal.bytes.by3],8
        je      $12283
        inc     BYTE PTR es:[bx+15]

$12283:
        les     bx,DWORD PTR [fpLScreen]      ;fpLScreen
        test    BYTE PTR [dwVal.bytes.by0],16    ;0010H  ;dwVal
        je      $12284
        inc     BYTE PTR es:[bx]
$12284:
        test    BYTE PTR [dwVal.bytes.by0],32    ;0020H  ;dwVal
        je      $12285
        inc     BYTE PTR es:[bx+1]
$12285:
        test    BYTE PTR [dwVal.bytes.by0],64    ;0040H  ;dwVal
```

/* Appendix C:   CARDX5.C   Page 14 */

```
            je      $12286
            inc     BYTE PTR es:[bx+2]
$12286:
            test    BYTE PTR [dwVal.bytes.by0],128    ;0080H  ;dwVal
            je      $12287
            inc     BYTE PTR es:[bx+3]
$12287:
            test    BYTE PTR [dwVal.bytes.by1],16     ;0010H
            je      $12288
            inc     BYTE PTR es:[bx+4]
$12288:
            test    BYTE PTR [dwVal.bytes.by1],32     ;0020H
            je      $12289
            inc     BYTE PTR es:[bx+5]
$12289:
            test    BYTE PTR [dwVal.bytes.by1],64     ;0040H
            je      $12290
            inc     BYTE PTR es:[bx+6]
$12290:
            test    BYTE PTR [dwVal.bytes.by1],128    ;0080H
            je      $12291
            inc     BYTE PTR es:[bx+7]
$12291:
            test    BYTE PTR [dwVal.bytes.by2],16     ;0010H
            je      $12292
            inc     BYTE PTR es:[bx+8]
$12292:
            test    BYTE PTR [dwVal.bytes.by2],32     ;0020H
            je      $12293
            inc     BYTE PTR es:[bx+9]
$12293:
            test    BYTE PTR [dwVal.bytes.by2],64     ;0040H
            je      $12294
            inc     BYTE PTR es:[bx+10]
$12294:
            test    BYTE PTR [dwVal.bytes.by2],128    ;0080H
            je      $12295
            inc     BYTE PTR es:[bx+11]
$12295:
            test    BYTE PTR [dwVal.bytes.by3],16     ;0010H
            je      $12296
            inc     BYTE PTR es:[bx+12]
$12296:
            test    BYTE PTR [dwVal.bytes.by3],32     ;0020H
```

/* Appendix C: CARDX5.C Page 15 */

```
        je      $12297
        inc     BYTE PTR es:[bx+13]
$12297:
        test    BYTE PTR [dwVal.bytes.by3],64    ;0040H
        je      $12298
        inc     BYTE PTR es:[bx+14]
$12298:
        test    BYTE PTR [dwVal.bytes.by3],128   ;0080H
        je      $12299
        inc     BYTE PTR es:[bx+15]
$12299:
        }
                // This fails miserable if we didn't start at zero offset
                if( (WORD) FP_OFF( fpUScreen ) == ( 65536 - 16 ) ||
                    (WORD) FP_OFF( fpLScreen ) == ( 65536 - 16 ) )

{ hpUScreen = fpUScreen;
                        hpLScreen = fpLScreen;
                        hpUScreen += 16;
                        hpLScreen += 16;
                        fpUScreen = hpUScreen;      // For speed use far pointers
                        fpLScreen = hpLScreen;      // For speed use far pointers
                }
                else
                {
                        fpUScreen += 16;
                        fpLScreen += 16;
                }
            }
        }

// Experiments determined that the screen layout after construction had the
        // upper 53 lines of both the upper and lower screen appearing at bottom of
        // the respective screens so now we must move the lower 53 lines to the
        // top. We allocated an extra 53 lines and skipped over them on the initial
        // construction so now we only have to move the 53 lines to the top of their
        // respective half screens.  Note that we are using far pointers because I
        // checked to make sure no roll occurs.
        for( wF = 0; wF < 53; wF++ )
        {
                hpUScreen = hpbyData + ( wF * iXDim );
```

/* Appendix C: CARDX5.C Page 16 */

```
        fpUScreen = hpbyData + ( (240L + wF) * iXDim );
        hpLScreen = hpUScreen + ( ( (long) iXDim * iYDim ) );
        fpLScreen = fpUScreen;
        _fmemmove( hpUScreen, fpUScreen, iXDim );
        _fmemmove( fpLScreen, hpLScreen, iXDim );
    }

(void) CompressData(   hpbyData, (WORD huge *) sBitMap->hpcPixels,
                                        (WORD) iYDim,
                                        (WORD) iXDim );

//FOR DEBUG - MAKE A FRAME and a DATA AREA
    FreeSelectorsForMsWindows( wSel, FRAME_SIZE );
    GlobalFreePtr( hpbyData );

return 0;
}
// - End ExpandFrameToBytes ****************************************************

// D+
pragma page()
//-----------------------------------------------------------------
//
//  PBBadCapture
//
//
//  PARAMETERS: NONE
//
//  RETURNS:
//
//-----------------------------------------------------------------
BOOL _export FAR PASCAL PBBadCapture( void )
// D-
{
        return bBadCapture;
}

// mCALC_EP_BASE_REG -
// Function: Calculate the EP base register from the slot number that the EP
```

/* Appendix C: CARDX5.C Page 17 */

```
//          card is seeded in.
//
#define mCALC_EP_BASE_REG(bySlotNbr) ((WORD)(BYTE) bySlotNbr << 12)

// D+
pragma page()
//*******************************************************************
*
//      MakeActBitMap
//
//      This routine loads a bitmap with data from the graphics board.
//      It initializes the bitmap structure, sets up all required values,
//      and copys the data from the board into local memory.
//
//      PARAMETERS:   wId - the slot ID
//                    sBitMap - Pointer to the bitmap structure to use
//                    iXDim - Size of the device along the X axis in pixels
//                    iYDim - Size of the device along the Y axis in scanlines
//                    rPad  - defines the padding along each edge of the capture
//                                  buffer. Each device may have different padding
//                                  values and the frame grabber itself is unaware of
//                                  the padding, so the software must adjust for it.
//
//      RETURNS:      TRUE if successful, FALSE if failed
//                    If true memory has been allocated and loaded with data
//                            from the file. The handle is placed in the bitmap
//                            data structure and the memory is unlocked.
//
//                    The clipping region is always set to the maximum area
//
//*******************************************************************
*
BOOL FAR PASCAL MakeActBitMap( WORD wId, LPBIT_MAP sBitMap, int iXDim, int
iYDim, RECT rPad )
// D-
{
        DWORD dwTick, dwFrameCount, dwSize = 0;
        int i, iSlot, iVRes, iHRes, iXtra;
        WORD wBaseReg;
        BOOL bFifoClear;
```

/* Appendix C:   CARDX5.C   Page 18 */

```
    iSlot = wId;

//-- WHILE WE ARE BRINGING UP THE SYSTEM LET'S ZERO OUT THE CARD EACH TIME
//      ZeroGraphicsMem( iSlot );

bBadCapture = FALSE;
    if( xCheckForCard( iSlot ) )
    {
        xSetGBFrameCounter( iSlot );        // Set frame address to zero
        // Tell frame grabber to capture a frame
        EnableMem( iSlot );

i = 0;
        // Retry up to 5 times to get a good capture.
        while( i < 5 )
        {
            if( ! CaptureData( iSlot, 0xfff )  && i == 4 )
            {
                MessageBox( (HANDLE) NULL, "Graphics card timeout",
                            "MakeActBitMap", MB_ICONSTOP | MB_OK );
                return FALSE;
            }
            ++i;
        }
    }
    else
        return FALSE;

iVRes = GetVerticalResolution( iSlot );
    iHRes = GetHorizontalResolution( iSlot );

ReleaseBitMap( sBitMap );

sBitMap->iScanLineWidth = iXDim;
    sBitMap->iNumScanLines = iYDim;
    SetNoClip( sBitMap );                           // No clip area sBitMap->byBmpType = BMP_TYPE_COMPRESSED;       // Type indicates the nature of
    sBitMap->bCompressed = TRUE;                    // Indicates if data is compressed
```

/* Appendix C:  CARDX5.C   Page 19 */

```c
// We allocate twice as much as possible size in case of negative
// compression. Memory is now locked
if( AllocateMemoryForBitMap( sBitMap ) != 0 )
        return FALSE;

sBitMap->hColorMono = 0;                        // No color monochrome's yet
    sBitMap->fpColors = NULL;                       // Ditto dwFrameCount = FRAME_COUNT;
    dwSize = FRAME_SIZE;
    iXtra = FRAME_X;

// Convert the frame data to a B-Tree format bitmap
    return ExpandFrameToBytes( sBitMap, iSlot ) ? FALSE : TRUE;
}
// - End MakeActBitMap
//********************************************************* undef mCALC_EP_BASE_REG
```

/* Appendix C:  CARDX6.C  Page 1 */

// Copyright (c) B-Tree Verification Systems, Inc. 1990-1995.  All rights reserved.
//

// $Header:   T:\svs\grphdll\cardx6.c_v   1.2   14 Sep 1995 20:39:04   MLOUDEN $ /***************************** CARDx6.C *******************************
 * This module contains routines that interface to the graphics capture card.
 *    Modified for INCONTROL Chips & Technologies LCD Controller..
 ***************************************************************************/

/*
 * $Log:   T:\svs\grphdll\cardx6.c_v  $
 *
 *
 */

// INCLUDE FILES *********************************************************** include <windows.h>
include <windowsx.h>
include <dos.h>
include "grphdll.h"
include "eisa.h"
include "dpmi.h"

// END INCLUDE FILES ******************************************************* pragma page()
// *************************************************************************
// MANIFEST CONSTANTS AND MACROS // Determined by experimentation
define DATA_START    0 define FRAME_SIZE       38400
define FRAME_COUNT          16
define FRAME_X             160 define GRAPHICS_MEM_SIZE  0x400000
WORD wDataStart = DATA_START;

```c
/* Appendix C:   CARDX6.C   Page 2 */
//    END  MANIFEST  CONSTANTS  AND  MACRO********************************

/***************************************************************************/
//    STRUCTURES AND TYPEDEFS

//    END  STRUCTURES  AND  TYPEDEFS
//*************************************************

//***************************************************************************
//    GLOBAL VARIABLES

BOOL bDebug = FALSE;
BOOL bBadCapture = FALSE;

//    END  GLOBAL  VARIABLES
//********************************************* int FAR PASCAL ClearFrameBuff( void )
{
        return 0;
}

BOOL FAR PASCAL CheckForCard( WORD wSlot )
{
        if( xCheckForCard( wSlot ) != 0 )
                return TRUE;
        return FALSE;
}
//***************************************************************************
//
//    Given a physical address
//    Set selector address via DPMI call
//
//***************************************************************************
int SetSegmentAddress( WORD wSelector, DWORD dwAddress )
```

/* Appendix C:   CARDX6.C   Page 3 */

```c
{
    int iStatus = 0;

_asm
    {
        // DPMI: Physical Address Mapping
        //      (returns a linear address in bx:cx)
        mov  ax, 0x0800
        mov  bx, WORD PTR dwAddress+2
        mov  cx, WORD PTR dwAddress
        mov  si, 0
        mov  di, FRAME_SIZE
        int  31h
        jc   ERROR_EXIT
        // DPMI: Set Segment Base Address
        mov  ax, 0x0007
        mov  dx, cx
        mov  cx, bx
        mov  bx, wSelector
        int  31h
        jc   ERROR_EXIT
        jmp  EXIT
    ERROR_EXIT:
        mov  iStatus, ax
        cmp  iStatus, 0
        jne  EXIT
        mov  iStatus, 0xffff
    EXIT:
    } return iStatus;
}

// D+
pragma page()
//*******************************************************************************
**
//      ZeroGraphicsMem
//
//      Zero fill all of the graphics card memory
//
```

```
/* Appendix C:   CARDX6.C   Page 4 */
//     PARAMETERS:    iId - identifies the graphics card
//
//     RETURNS:       TRUE if successful, else FALSE
//
//***************************************************************************
**
BOOL ZeroGraphicsMem( int iId )
// D-
{
        int i, iSlot;
        long l;
        WORD wSel;
        DWORD dwBaseAddr;
        DWORD huge *hpdwFramePtr;

iSlot = iId;

if( xCheckForCard( iSlot ) )
        {
                dwBaseAddr = GetBaseAddressForSlot( iSlot );
                // Create a huge pointer to physical mem on graphics capture card
                i = SetupSelectorsForMsWindows( (WORD far *) &wSel,
                                                dwBaseAddr,
                                                GRAPHICS_MEM_SIZE
                                                );
                if( i != 0 )
                {
                        MessageBox( (HANDLE) NULL, "Could not create selector",
                                        "ZeroGraphicsMem", MB_ICONSTOP |
MB_OK );
                        return FALSE;
                }
                EnableMem( iSlot );
                (void huge *) hpdwFramePtr = MAKELP( wSel, 0 );
                for( l = 0; l < GRAPHICS_MEM_SIZE / sizeof(DWORD); l++ )
                        hpdwFramePtr[ l ] = 0;
                FreeSelectorsForMsWindows( wSel, GRAPHICS_MEM_SIZE );
        }
        else
                return FALSE;

return TRUE;
```

```
/* Appendix C:   CARDX6.C   Page 5 */

}
// - End ZeroGraphicsMem *********************************************

// D+
pragma page()
//************************************************************************
**
//      GetCaptureStats
//
//      Return characteristics about the last capture done for a given card.
//
//      PARAMETERS:    iId - identifies the graphics card
//                     fplStats - points to array of longs
//                                  [ 0 ] = Total bytes captured
//                                  [ 1 ] = Horz res in pixels
//                                  [ 2 ] = Vert res in pixels
//                                  [ 3 ] = offset of first non-pad character
//                                              if -1 this field not valid
//
//
//      RETURNS:       TRUE if successful, else FALSE
//
//************************************************************************
**
BOOL FAR PASCAL GetCaptureStats( int iId, long far *fplStats )
// D-
{
        int i, iSlot;
        WORD wSel;
        DWORD dwBaseAddr;
        BYTE far *fpbyFramePtr;

iSlot = iId;

if( xCheckForCard( iSlot ) )
        {
                fplStats[ 0 ] = 4 * GetFrameCounter( iSlot );
                fplStats[ 1 ] = GetHorizontalResolution( iSlot );
                fplStats[ 2 ] = GetVerticalResolution( iSlot );

EnableMem( iSlot );
                dwBaseAddr = GetBaseAddressForSlot( iSlot );
                // Create a huge pointer to physical mem on graphics capture card
                i = SetupSelectorsForMsWindows( (WORD far *) &wSel, dwBaseAddr, 32768 );
```

/* Appendix C:   CARDX6.C   Page 6 */

```c
            if( i != 0 )
            {
                    MessageBox( (HANDLE) NULL, "Could not create selector",
                                            "GetCaptureStats", MB_ICONSTOP|MB_OK
);
                    return FALSE;
            }
            fpbyFramePtr = (BYTE far *) MAKELP( wSel, 0 );
            fplStats[ 3 ] = (long) -1;
            // Now search for non-pad character ( != black ) for reasonable area.
            for( i = 0; i < 32768; i++ )
            {
                    if( fpbyFramePtr[ i ] != 0 )
                    {
                            fplStats[ 3 ] = (long) i;
                            break;
                    }
            }
            FreeSelectorsForMsWindows( wSel, 32768 );
        }
        else
                return FALSE;

return TRUE;
}
// - End GetCaptureStats ***************************************************

// D+
pragma page()
//**************************************************************************
**
//      CaptureRawGraphicsData
//
//      This routine makes a capture but does not create a B-Tree bitmap.  In effect
//      it simply loads the raw graphics data.
//
//      PARAMETERS:     ild - identifies the graphics card
//
//      RETURNS:        TRUE if successful, else FALSE
//                              if TRUE the graphics card memory contains valid data
//
//**************************************************************************
```

```c
/* Appendix C:   CARDX6.C   Page 7 */
**
BOOL FAR PASCAL CaptureRawGraphicsData( short int iId )
// D-
{
        short int i, iSlot;

iSlot = iId;

//-- WHILE WE ARE BRINGING UP THE SYSTEM LET'S ZERO OUT THE CARD EACH TIME
        ZeroGraphicsMem( iSlot );

if( iSlot = xCheckForCard( iSlot ) )
        {
                xSetGBFrameCounter( iSlot );        // Set frame address to zero
                // Tell frame grabber to capture a frame
                EnableMem( iSlot );
                i = 0;
                // Retry up to 5 times to get a good capture.
                while( i < 5 )
                {
                        if( ! CaptureData( iSlot, 0x7fff )     && i == 4 )
                        {
                                MessageBox( (HANDLE) NULL, "Graphics card timeout",
                                                "CaptureGraphicsData", MB_ICONSTOP |
MB_OK );
                                return FALSE;
                        }
                        else
                                break;
                }
        }
        else
            return FALSE;

return TRUE;
}
//- End CaptureRawGraphicsData ****************************************************

// Make a test pattern to work with for debug.
char far * MakeTestPattern( void )
{
        char far *fpWork;
```

```
                    /* Appendix C:   CARDX6.C   Page 8 */

DWORD far *fpTmpPtr;
    DWORD dwPattern;
    int i;

fpTmpPtr = (DWORD far *) fpWork = (DWORD far *) GlobalAllocPtr(
GMEM_SHARE, 38400 );
    dwPattern = 0xc3c3c3c3;

for( i = 0; i < 38400/4; ++i )
        fpTmpPtr[ i ] = dwPattern;

return fpWork;
} pragma page()
//**********************************************************************
//
//    ExpandFrameToBytes
//
//    PARAMETERS: sBitMap - Pointer to the bitmap structure to use
//                          data is allocated and locked
//                iSlot - SLOT # that the grahics card resides in
//
//    RETURNS:    a status code
//                       0 - success
//                      -1 - invalid data parameters
//                      -2 - could not get selectors
//                      -3 - other error
//
//**********************************************************************
int ExpandFrameToBytes( LPBIT_MAP sBitMap, int iSlot )
// D-
{

//-- WARNING --
//-- THIS FUNCTION CONTAINS HAND TUNED ASSEMBLY LANGUAGE CODE. CHANGING ANY
//-- OF THE LOCAL VARIABLES (OR ADDING NEW VARIABLES) MAY INVALIDATE
//-- THE ASSEMBLY LANGUAGE CODE long li;
    int iStatus;
```

/* Appendix C:   CARDX6.C   Page 9 */

```
        int iXDim, iYDim;
        BYTE far  *fpbyFrame;
        BYTE huge *hpbyData;
        BYTE huge *hpUScreen;
        BYTE huge *hpLScreen;
        BYTE far  *fpUScreen;          // We use far pointers for speed
        BYTE far  *fpLScreen;          // We use far pointers for speed
        DWORD dwBaseAddr;
        WORD wSel;
        WORD wF, wSeq1, wSeq2;
        DWORD dwBeg, dwEnd, dwTime;
        WORD wXFactor = 160;
        union
        {
                DWORD dwAll;
                struct
                {
                        BYTE by0;
                        BYTE by1;
                        BYTE by2;
                        BYTE by3;
                } bytes;
        } dwVal;
//-- WARNING --
//-- THIS FUNCTION CONTAINS HAND TUNED ASSEMBLY LANGUAGE CODE. CHANGING ANY
//-- OF THE LOCAL VARIABLES (OR ADDING NEW VARIABLES) MAY INVALIDATE
//-- THE ASSEMBLY LANGUAGE CODE iXDim = sBitMap->iScanLineWidth;
        iYDim = sBitMap->iNumScanLines;

// Create a huge pointer to physical mem on graphics capture card
        dwBaseAddr = GetBaseAddressForSlot( iSlot );

// - FOR TEST hpbyData = GlobalAllocPtr( GMEM_SHARE | GMEM_ZEROINIT,
(DWORD) iXDim * (iYDim + 53L) );
        hpbyData = GlobalAllocPtr( GMEM_SHARE | GMEM_ZEROINIT, (DWORD) iXDim
* (iYDim + 53L) );

wSeq1 = FRAME_COUNT;
        wSeq2 = 0;
```

/* Appendix C: CARDX6.C Page 10 */

```c
//FOR DEBUG - MAKE A FRAME and a DATA AREA
//if( bDebug )
//      hpbyFrame = MakeTestPattern();

iStatus =
SetupSelectorsForMsWindows(    (WORD far *) &wSel,
                                         dwBaseAddr   +   wDataStart,
FRAME_SIZE );
      if( iStatus != 0 )
            return -2;

// For each frame we add up the 'on' pixel
      for( wF = 0; wF < wSeq1; ++wF )
      {
            SetSegmentAddress(     wSel,
                                       dwBaseAddr + wDataStart + ( ( DWORD) wF
* FRAME_SIZE )
                                          + ( ( wF / 2 ) * wXFactor ) );
            // We skip by the first (partial) frame
            fpbyFrame = (char far *) MAKELP( wSel, (WORD) 0 );

// - FOR TEST hpUScreen = hpbyData + (53L * iXDim);
            hpUScreen = hpbyData;
            hpLScreen = hpUScreen + ( ( (long) iXDim * iYDim ) / 2 );
            fpUScreen = hpUScreen;       // For speed use far pointers
            fpLScreen = hpLScreen;       // For speed use far pointers
            // For each byte in the frame
            for( li = 0; (DWORD) li < ( FRAME_SIZE / 4 ); ++li, fpbyFrame += 4 )
            {
                  dwVal.dwAll = *((DWORD far *) fpbyFrame);
/* This is commented out because we use a hand tuned assembler to accomplish if( dwVal.bytes.by0 & 1 )
                        fpUScreen[ 0 ]++;
                  if( dwVal.bytes.by0 & 2 )
                        fpUScreen[ 1 ]++;
                  if( dwVal.bytes.by0 & 4 )
                        fpUScreen[ 2 ]++;
                  if( dwVal.bytes.by0 & 8 )
                        fpUScreen[ 3 ]++;
                  if( dwVal.bytes.by1 & 1 )
                        fpUScreen[ 4 ]++;
```

```c
/* Appendix C:   CARDX6.C   Page 11 */
        if( dwVal.bytes.by1 & 2 )
                fpUScreen[ 5 ]++;
        if( dwVal.bytes.by1 & 4 )
                fpUScreen[ 6 ]++;
        if( dwVal.bytes.by1 & 8 )
                fpUScreen[ 7 ]++;
        if( dwVal.bytes.by2 & 1 )
                fpUScreen[ 8 ]++;
        if( dwVal.bytes.by2 & 2 )
                fpUScreen[ 9 ]++;
        if( dwVal.bytes.by2 & 4 )
                fpUScreen[ 10 ]++;
        if( dwVal.bytes.by2 & 8 )
                fpUScreen[ 11 ]++;
        if( dwVal.bytes.by3 & 1 )
                fpUScreen[ 12 ]++;
        if( dwVal.bytes.by3 & 2 )
                fpUScreen[ 13 ]++;
        if( dwVal.bytes.by3 & 4 )
                fpUScreen[ 14 ]++;
        if( dwVal.bytes.by3 & 8 )
                fpUScreen[ 15 ]++;
        if( dwVal.bytes.by0 & 0x10 )
                fpLScreen[ 0 ]++;
        if( dwVal.bytes.by0 & 0x20 )
                fpLScreen[ 1 ]++;
        if( dwVal.bytes.by0 & 0x40 )
                fpLScreen[ 2 ]++;
        if( dwVal.bytes.by0 & 0x80 )
                fpLScreen[ 3 ]++;
        if( dwVal.bytes.by1 & 0x10 )
                fpLScreen[ 4 ]++;
        if( dwVal.bytes.by1 & 0x20 )
                fpLScreen[ 5 ]++;
        if( dwVal.bytes.by1 & 0x40 )
                fpLScreen[ 6 ]++;
        if( dwVal.bytes.by1 & 0x80 )
                fpLScreen[ 7 ]++;
        if( dwVal.bytes.by2 & 0x10 )
                fpLScreen[ 8 ]++;
        if( dwVal.bytes.by2 & 0x20 )
                fpLScreen[ 9 ]++;
        if( dwVal.bytes.by2 & 0x40 )
                fpLScreen[ 10 ]++;
```

/* Appendix C:   CARDX6.C   Page 12 */
```
                if( dwVal.bytes.by2 & 0x80 )
                        fpLScreen[ 11 ]++;
                if( dwVal.bytes.by3 & 0x10 )
                        fpLScreen[ 12 ]++;
                if( dwVal.bytes.by3 & 0x20 )
                        fpLScreen[ 13 ]++;
                if( dwVal.bytes.by3 & 0x40 )
                        fpLScreen[ 14 ]++;
                if( dwVal.bytes.by3 & 0x80 )
                        fpLScreen[ 15 ]++;
*/
_asm
{
        les     bx,DWORD PTR [fpUScreen]        ;fpUScreen
        test    BYTE PTR [dwVal.bytes.by0],1    ;dwVal
        je      $12268
        inc     BYTE PTR es:[bx]
$12268:
        test    BYTE PTR [dwVal.bytes.by0],2    ;dwVal
        je      $12269
        inc     BYTE PTR es:[bx+1]
$12269:
        test    BYTE PTR [dwVal.bytes.by0],4    ;dwVal
        je      $12270
        inc     BYTE PTR es:[bx+2]
$12270:
        test    BYTE PTR [dwVal.bytes.by0],8    ;dwVal
        je      $12271
        inc     BYTE PTR es:[bx+3]
$12271:
        test    BYTE PTR [dwVal.bytes.by1],1
        je      $12272
        inc     BYTE PTR es:[bx+4]
$12272:
        test    BYTE PTR [dwVal.bytes.by1],2
        je      $12273
        inc     BYTE PTR es:[bx+5]
$12273:
        test    BYTE PTR [dwVal.bytes.by1],4
        je      $12274
        inc     BYTE PTR es:[bx+6]
$12274:
        test    BYTE PTR [dwVal.bytes.by1],8
        je      $12275
```

```
/* Appendix C:   CARDX6.C   Page 13 */
        inc     BYTE PTR es:[bx+7]
$I2275:
        test    BYTE PTR [dwVal.bytes.by2],1
        je      $I2276
        inc     BYTE PTR es:[bx+8]
$I2276:
        test    BYTE PTR [dwVal.bytes.by2],2
        je      $I2277
        inc     BYTE PTR es:[bx+9]
$I2277:
        test    BYTE PTR [dwVal.bytes.by2],4
        je      $I2278
        inc     BYTE PTR es:[bx+10]
$I2278:
        test    BYTE PTR [dwVal.bytes.by2],8
        je      $I2279
        inc     BYTE PTR es:[bx+11]
$I2279:
        test    BYTE PTR [dwVal.bytes.by3],1
        je      $I2280
        inc     BYTE PTR es:[bx+12]
$I2280:
        test    BYTE PTR [dwVal.bytes.by3],2
        je      $I2281
        inc     BYTE PTR es:[bx+13]
$I2281:
        test    BYTE PTR [dwVal.bytes.by3],4
        je      $I2282
        inc     BYTE PTR es:[bx+14]
$I2282:
        test    BYTE PTR [dwVal.bytes.by3],8
        je      $I2283
        inc     BYTE PTR es:[bx+15]

$I2283:
        les     bx,DWORD PTR [fpLScreen]    ;fpLScreen
        test    BYTE PTR [dwVal.bytes.by0],16    ;0010H  ;dwVal
        je      $I2284
        inc     BYTE PTR es:[bx]
$I2284:
        test    BYTE PTR [dwVal.bytes.by0],32    ;0020H  ;dwVal
        je      $I2285
        inc     BYTE PTR es:[bx+1]
```

/* Appendix C:   CARDX6.C   Page 14 */

```
$12285:
        test    BYTE PTR [dwVal.bytes.by0],64      ;0040H  ;dwVal
        je      $12286
        inc     BYTE PTR es:[bx+2]
$12286:
        test    BYTE PTR [dwVal.bytes.by0],128     ;0080H  ;dwVal
        je      $12287
        inc     BYTE PTR es:[bx+3]
$12287:
        test    BYTE PTR [dwVal.bytes.by1],16      ;0010H
        je      $12288
        inc     BYTE PTR es:[bx+4]
$12288:
        test    BYTE PTR [dwVal.bytes.by1],32      ;0020H
        je      $12289
        inc     BYTE PTR es:[bx+5]
$12289:
        test    BYTE PTR [dwVal.bytes.by1],64      ;0040H
        je      $12290
        inc     BYTE PTR es:[bx+6]
$12290:
        test    BYTE PTR [dwVal.bytes.by1],128     ;0080H
        je      $12291
        inc     BYTE PTR es:[bx+7]
$12291:
        test    BYTE PTR [dwVal.bytes.by2],16      ;0010H
        je      $12292
        inc     BYTE PTR es:[bx+8]
$12292:
        test    BYTE PTR [dwVal.bytes.by2],32      ;0020H
        je      $12293
        inc     BYTE PTR es:[bx+9]
$12293:
        test    BYTE PTR [dwVal.bytes.by2],64      ;0040H
        je      $12294
        inc     BYTE PTR es:[bx+10]
$12294:
        test    BYTE PTR [dwVal.bytes.by2],128     ;0080H
        je      $12295
        inc     BYTE PTR es:[bx+11]
$12295:
        test    BYTE PTR [dwVal.bytes.by3],16      ;0010H
        je      $12296
        inc     BYTE PTR es:[bx+12]
```

/* Appendix C:   CARDX6.C   Page 15 */

```
$I2296:
        test    BYTE PTR [dwVal.bytes.by3],32       ;0020H
        je      $I2297
        inc     BYTE PTR es:[bx+13]
$I2297:
        test    BYTE PTR [dwVal.bytes.by3],64       ;0040H
        je      $I2298
        inc     BYTE PTR es:[bx+14]
$I2298:
        test    BYTE PTR [dwVal.bytes.by3],128      ;0080H
        je      $I2299
        inc     BYTE PTR es:[bx+15]
$I2299:
}
            // This fails miserable if we didn't start at zero offset
            if( (WORD) FP_OFF( fpUScreen ) == ( 65536 - 16 ) |
                (WORD) FP_OFF( fpLScreen ) == ( 65536 - 16 ) )

{
                    hpUScreen = fpUScreen;
                    hpLScreen = fpLScreen;
                    hpUScreen += 16;
                    hpLScreen += 16;
                    fpUScreen = hpUScreen;      // For speed use far pointers
                    fpLScreen = hpLScreen;      // For speed use far pointers
                }
            else
                {
                    fpUScreen += 16;
                    fpLScreen += 16;
                }
        }
    }

// Experiments determined that the screen layout after construction had the
    // upper 53 lines of both the upper and lower screen appearing at bottom of
    // the respective screens so now we must move the lower 53 lines to the
    // top. We allocated an extra 53 lines and skipped over them on the initial
    // construction so now we only have to move the 53 lines to the top of their
    // respective half screens.   Note that we are using far pointers because I
    // checked to make sure no roll occurs.
// - FOR TEST
```

```
                        /* Appendix C:   CARDX6.C   Page 16 */
//      for( wF = 0; wF < 53; wF++ )
//      {
//              hpUScreen = hpbyData + ( wF * iXDim );
//              fpUScreen = hpbyData + ( (240L + wF) * iXDim );
//              hpLScreen = hpUScreen + ( ( (long) iXDim * iYDim ) );
//              fpLScreen = fpUScreen;
//              _fmemmove( hpUScreen, fpUScreen, iXDim );
//              _fmemmove( fpLScreen, hpLScreen, iXDim );
//      }

(void) CompressData(   hpbyData, (WORD huge *) sBitMap->hpcPixels,
                                        (WORD) iYDim,
                                        (WORD) iXDim );

//FOR DEBUG - MAKE A FRAME and a DATA AREA
        FreeSelectorsForMsWindows( wSel, FRAME_SIZE );
        GlobalFreePtr( hpbyData );

return 0;
}
// - End ExpandFrameToBytes ****************************************************

// D+
pragma page()
//-----------------------------------------------------------------------
//
// PBBadCapture
//
//
// PARAMETERS: NONE
//
// RETURNS:
//
//-----------------------------------------------------------------------
BOOL _export FAR PASCAL PBBadCapture( void )
// D-
{
        return bBadCapture;
}
```

/* Appendix C:   CARDX6.C   Page 17 */

```c
// mCALC_EP_BASE_REG -
// Function: Calculate the EP base register from the slot number that the EP
//           card is seeded in.
//
define mCALC_EP_BASE_REG(bySlotNbr)  ((WORD)(BYTE) bySlotNbr << 12)

// D+
pragma page()
//*********************************************************************
*
//     MakeActBitMap
//
//     This routine loads a bitmap with data from the graphics board.
//     It initializes the bitmap structure, sets up all required values,
//     and copys the data from the board into local memory.
//
//
//     PARAMETERS:   wId - the slot ID
//                   sBitMap - Pointer to the bitmap structure to use
//                   iXDim - Size of the device along the X axis in pixels
//                   iYDim - Size of the device along the Y axis in scanlines
//                   rPad  - defines the padding along each edge of the capture
//                           buffer.  Each device may have different padding
//                           values and the frame grabber itself is unaware of
//                           the padding, so the software must adjust for it.
//
//
//     RETURNS:      TRUE if successful, FALSE if failed
//                   If true memory has been allocated and loaded with data
//                       from the file.  The handle is placed in the bitmap
//                       data structure and the memory is unlocked.
//
//                   The clipping region is always set to the maximum area
//
//*********************************************************************
*
BOOL FAR PASCAL MakeActBitMap( WORD wId, LPBIT_MAP sBitMap, int iXDim, int
iYDim, RECT rPad )
// D-
{
        DWORD dwTick, dwFrameCount, dwSize = 0;
        int i, iSlot, iVRes, iHRes, iXtra;
```

```c
/* Appendix C:   CARDX6.C   Page 18 */

WORD wBaseReg;
        BOOL bFifoClear;

iSlot = wId;

//-- WHILE WE ARE BRINGING UP THE SYSTEM LET'S ZERO OUT THE CARD EACH TIME
//      ZeroGraphicsMem( iSlot );

bBadCapture = FALSE;
        if( xCheckForCard( iSlot ) )
        {
                xSetGBFrameCounter( iSlot );        // Set frame address to zero
                // Tell frame grabber to capture a frame
                EnableMem( iSlot );
                if( ! CaptureData( iSlot, 0xfff )   )
                {
                        MessageBox( (HANDLE) NULL, "Graphics card capture failed",
                                        "MakeActBitMap", MB_ICONSTOP | MB_OK );
                        return FALSE;
                }

//              i = 0;
//              // Retry up to 5 times to get a good capture.
//              while( i < 5 )
//              {
//                      if( ! CaptureData( iSlot, 0xfff )  && i == 4 )
//                      {
//                              MessageBox( (HANDLE) NULL, "Graphics card timeout",
//                                              "MakeActBitMap", MB_ICONSTOP | MB_OK
);
//                              return FALSE;
//                      }
//                      ++i;
//              }
        }
        else
                return FALSE;

iVRes = GetVerticalResolution( iSlot );
        iHRes = GetHorizontalResolution( iSlot );
        dwFrameCount = 4 * GetFrameCounter( iSlot );
```

/* Appendix C: CARDX6.C Page 19 */

```
    ReleaseBitMap( sBitMap );

sBitMap->iScanLineWidth = iXDim;
    sBitMap->iNumScanLines = iYDim;
    SetNoClip( sBitMap );                              // No clip area sBitMap->byBmpType = BMP_TYPE_COMPRESSED;          // Type indicates the nature of
    sBitMap->bCompressed = TRUE;                       // Indicates if data is compressed // We allocate twice as much as possible size in case of negative
    // compression. Memory is now locked
    if( AllocateMemoryForBitMap( sBitMap ) != 0 )
        return FALSE;

sBitMap->hColorMono = 0;                           // No color monochrome's yet
    sBitMap->fpColors = NULL;                          // Ditto // Convert the frame data to a B-Tree format bitmap
    return ExpandFrameToBytes( sBitMap, iSlot ) ? FALSE : TRUE;
}
// - End MakeActBitMap *********************************************** undef mCALC_EP_BASE_REG
```

/* Appendix C: CARDX7.C Page 1 */

// Copyright (c) B-Tree Verification Systems, Inc. 1990-1995. All rights reserved.
//

// $Header: T:\svs\grphdll\cardx7.c_v 1.2 14 Sep 1995 20:39:06 MLOUDEN $

/**************************** CARDx7.C *******************************
* This module contains routines that interface to the graphics capture card.
* Modified for use Intermedics FINLUX LCD controller.
**************************************************************************/

/*
* $Log: T:\svs\grphdll\cardx7.c_v $
*/

// INCLUDE FILES ********************************************************

```c
#include <windows.h>
include <windowsx.h>
include <dos.h>
include "grphdll.h"
include "eisa.h"
include "dpmi.h"
```

// END INCLUDE FILES
******************************************************** pragma page()
// *********************************************************************
// MANIFEST CONSTANTS AND MACROS // TOA controller generates 3 bits per pixel. We get a single scan line
// worth of data by ( 3 x 640 ) / 8 or 240. Data start is based on fact that
// we drop the first line of data in both upper half and lower half of screen.
```c
#define DATA_START       0
#define FRAME_SIZE       ( ( 480L * 244L ) / 4 )
define FRAME_COUNT      1 define GRAPHICS_MEM_SIZE  0x400000
```

// END MANIFEST CONSTANTS AND

```c
/* Appendix C:   CARDX7.C   Page 2 */
MACRO*******************************************

/***************************************************************/
//    STRUCTURES AND TYPEDEFS

// END STRUCTURES AND TYPEDEFS
//*********************************************

// ****************************************************************
//    GLOBAL VARIABLES

BOOL bDebug = FALSE;

// END GLOBAL VARIABLES
//******************************************************** int FAR PASCAL ClearFrameBuff( void )
{
        return 0;
}

BOOL FAR PASCAL CheckForCard( WORD wSlot )
{
        if( xCheckForCard( wSlot ) != 0 )
                return TRUE;
        return FALSE;
}
//*****************************************************************
//
//    Given a physical address
// Set selector address via DPMI call
//
//*****************************************************************
int SetSegmentAddress( WORD wSelector, DWORD dwAddress )
{
```

/* Appendix C:   CARDX7.C   Page 3 */

```
    int iStatus = 0;

_asm
    {
            // DPMI: Physical Address Mapping
            //    (returns a linear address in bx:cx)
            mov  ax, 0x0800
            mov  bx, WORD PTR dwAddress+2
            mov  cx, WORD PTR dwAddress
            mov  si, 0
            mov  di, FRAME_SIZE
            int  31h
            jc   ERROR_EXIT
            // DPMI: Set Segment Base Address
            mov  ax, 0x0007
            mov  dx, cx
            mov  cx, bx
            mov  bx, wSelector
            int  31h
            jc   ERROR_EXIT
            jmp  EXIT
    ERROR_EXIT:
            mov  iStatus, ax
            cmp  iStatus, 0
            jne  EXIT
            mov  iStatus, 0xffff
    EXIT:
    } return iStatus;
}

// D+
pragma page()
//******************************************************************************
**
//    ZeroGraphicsMem
//
//    Zero fill all of the graphics card memory
//
//    PARAMETERS:    iId - identifies the graphics card
//
```

/* Appendix C: CARDX7.C  Page 4 */

```c
//      RETURNS:        TRUE if successful, else FALSE
//
//*****************************************************************************
**
BOOL ZeroGraphicsMem( int iId )
// D-
{
        int i, iSlot;
        long l;
        WORD wSel;
        DWORD dwBaseAddr;
        DWORD huge *hpdwFramePtr;

iSlot = iId;

if( xCheckForCard( iSlot ) )
        { dwBaseAddr = GetBaseAddressForSlot( iSlot );
                // Create a huge pointer to physical mem on graphics capture card
                i = SetupSelectorsForMsWindows( (WORD far *) &wSel,
                                                                        dwBaseAddr,
GRAPHICS_MEM_SIZE );
                if( i != 0 )

{
                                MessageBox( (HANDLE) NULL, "Could not create selector",
                                                                "ZeroGraphicsMem", MB_ICONSTOP |
MB_OK );
                                return FALSE;
                        }
                        EnableMem( iSlot );
                        (void huge *) hpdwFramePtr = MAKELP( wSel, 0 );
                        for( l = 0; l < GRAPHICS_MEM_SIZE / sizeof(DWORD); l++ )
                                hpdwFramePtr[ l ] = 0;
                        FreeSelectorsForMsWindows( wSel, GRAPHICS_MEM_SIZE );
        }
        else
                return FALSE;

return TRUE;
}
// - End ZeroGraphicsMem ****************************************************
```

```c
/* Appendix C:   CARDX7.C   Page 5 */

// D+
pragma page()
//*************************************************************************
**
//      GetCaptureStats
//
//      Return characteristics about the last capture done for a given card.
//
//      PARAMETERS:     iId - identifies the graphics card
//                      fplStats - points to array of longs
//                                      [ 0 ] = Total bytes captured
//                                      [ 1 ] = Horz res in pixels
//                                      [ 2 ] = Vert res in pixels
//                                      [ 3 ] = offset of first non-pad character
//                                                  if -1 this field not valid
//
//      RETURNS:        TRUE if successful, else FALSE
//
//*************************************************************************
**
BOOL FAR PASCAL GetCaptureStats( int iId, long far *fplStats )
// D-
{
        int i, iSlot;
        WORD wSel;
        DWORD dwBaseAddr;
        BYTE far *fpbyFramePtr;

iSlot = iId;

if( xCheckForCard( iSlot ) )
        {
                fplStats[ 0 ] = 4 * GetFrameCounter( iSlot );
                fplStats[ 1 ] = GetHorizontalResolution( iSlot );
                fplStats[ 2 ] = GetVerticalResolution( iSlot );

EnableMem( iSlot );
                dwBaseAddr = GetBaseAddressForSlot( iSlot );
                // Create a huge pointer to physical mem on graphics capture card
                i = SetupSelectorsForMsWindows( (WORD far *) &wSel, dwBaseAddr, 32768
);
                if( i != 0 )
```

/* Appendix C:   CARDX7.C   Page 6 */

```c
        {
                MessageBox( (HANDLE) NULL, "Could not create selector",
                                        "GetCaptureStats", MB_ICONSTOP |
MB_OK );
                return FALSE;
        }
        fpbyFramePtr = (BYTE far *) MAKELP( wSel, 0 );
        fplStats[ 3 ] = (long) -1;
        // Now search for non-pad character ( != black ) for reasonable area.
        for( i = 0; i < 32768; i++ )
        {
                if( fpbyFramePtr[ i ] != 0 )
                {
                        fplStats[ 3 ] = (long) i;
                        break;
                }
        }
        FreeSelectorsForMsWindows( wSel, 32768 );
    }
    else
        return FALSE;

return TRUE;
}
// - End GetCaptureStats ******************************************************

// D+
/* <f> */
//*****************************************************************************
**
//      CaptureRawGraphicsData
//
//      This routine makes a capture but does not create a B-Tree bitmap. In effect
//      it simply loads the raw graphics data.
//
//      PARAMETERS:     ild - identifies the graphics card
//
//      RETURNS:        TRUE if successful, else FALSE
//                      if TRUE the graphics card memory contains valid data
//
//*****************************************************************************
**
BOOL FAR PASCAL CaptureRawGraphicsData( short int ild )
```

/* Appendix C:   CARDX7.C   Page 7 */

```c
// D-
{
    short int i, iSlot;

iSlot = iId;

//-- WHILE WE ARE BRINGING UP THE SYSTEM LET'S ZERO OUT THE CARD
EACH TIME
    ZeroGraphicsMem( iSlot );

if( iSlot = xCheckForCard( iSlot ) )
    {
        xSetGBFrameCounter( iSlot );        // Set frame address to zero
        // Tell frame grabber to capture a frame
        EnableMem( iSlot );
        i = 0;
        // Retry up to 5 times to get a good capture.
        while( i < 5 )
        {
            if( ! CaptureData( iSlot, 0x7fff )    && i == 4 )
            {
                MessageBox( (HANDLE) NULL, "Graphics card timeout",
                            "CaptureGraphicsData", MB_ICONSTOP |
MB_OK );
                return FALSE;
            }
            else
                break;
        }
    }
    else
        return FALSE;

return TRUE;
}
// - End CaptureRawGraphicsData
//*****************************************************

// Make a test pattern to work with for debug.
char far * MakeTestPattern( void )
{
    char far *fpWork;
    DWORD far *fpTmpPtr;
```

```c
/* Appendix C:   CARDX7.C   Page 8 */
    DWORD dwPattern;
    int i;

fpTmpPtr = (DWORD far *) fpWork = (DWORD far *) GlobalAllocPtr(
GMEM_SHARE, 38400 );
    dwPattern = 0xc3c3c3c3;

for( i = 0; i < 38400/4; ++i )
        fpTmpPtr[ i ] = dwPattern;

return fpWork;
} pragma page()
//******************************************************************************
//   ExpandFrameToBytes
//
//   PARAMETERS:  sBitMap - Pointer to the bitmap structure to use
//                          data is allocated and locked
//                iSlot - SLOT # that the grahics card resides in
//
//   RETURNS:     a status code
//                          0 - success
//                         -1 - invalid data parameters
//                         -2 - could not get selectors
//                         -3 - other error
//
//******************************************************************************
int ExpandFrameToBytes( LPBIT_MAP sBitMap, int iSlot )
// D-
{

//-- WARNING --
//-- THIS FUNCTION CONTAINS HAND TUNED ASSEMBLY LANGUAGE CODE. CHANGING ANY
//-- OF THE LOCAL VARIABLES (OR ADDING NEW VARIABLES) MAY INVALIDATE
//-- THE ASSEMBLY LANGUAGE CODE int iStatus;
```

```
/* Appendix C:   CARDX7.C   Page 9 */
    int iXDim, iYDim;
    WORD w;
    WORD wCount;
    BYTE byChar;
    BYTE huge *hpbyData;
    BYTE far *fpbyFrame;
    BYTE huge *hpbyWork;
    DWORD dwBaseAddr;
    WORD wSel;

iXDim = sBitMap->iScanLineWidth;
    iYDim = sBitMap->iNumScanLines;

// Create a huge pointer to physical mem on graphics capture card
    dwBaseAddr = GetBaseAddressForSlot( iSlot );

hpbyData = GlobalAllocPtr( GMEM_SHARE | GMEM_ZEROINIT, (DWORD)
iXDim * iYDim );

//FOR DEBUG - MAKE A FRAME and a DATA AREA
    //if( bDebug )
    //     hpbyFrame = MakeTestPattern();

iStatus =
    SetupSelectorsForMsWindows(    (WORD far *) &wSel,
                                                   dwBaseAddr + DATA_START,
FRAME_SIZE * FRAME_COUNT );
        if( iStatus != 0 )
            return FALSE;
    fpbyFrame = (char far *) MAKELP( wSel, (WORD) 0 );

// Analysis showed that the top line of the LCD is actually captured last so
    // we must go back and store the data at the end of the frame at the start of
    // the B-Tree bitmap structure and we store the start of the frame at one line
    // into the B-Tree array.
    hpbyWork = hpbyData + iXDim;

// There are 4 pixels per byte with bit 0 of byte 0 being the first pixel
    wCount = (WORD ) ( ( ( (long) iYDim - 1 ) * iXDim ) );
    for( w = 0; w < wCount; w++ )
    {
            byChar = fpbyFrame[ w ];
```

```
                    /* Appendix C:   CARDX7.C   Page 10 */
            if( byChar & 1 )
                    *hpbyWork = 1;
            hpbyWork++;

}

// Now we have to pick up the end of the frame and put it at the start
    // of our array of data
    hpbyWork = hpbyData;
    for( ;w < ( ((WORD) iXDim ) + wCount ); w++ )
    {
            byChar = fpbyFrame[ w ];
            if( byChar & 1 )
                    *hpbyWork = 1;
            hpbyWork++;

}

(void) CompressData(   hpbyData, (WORD huge *) sBitMap->hpcPixels,
                                    (WORD) iYDim,
                                    (WORD) iXDim );

//FOR DEBUG - MAKE A FRAME and a DATA AREA
    FreeSelectorsForMsWindows( wSel, FRAME_SIZE );
    GlobalFreePtr( hpbyData );

return 0;
}
// - End ExpandFrameToBytes ****************************************************

// D+
pragma page()
//*****************************************************************************
*
//      MakeActBitMap
//
//      This routine loads a bitmap with data from the graphics board.
//      It initializes the bitmap structure, sets up all required values,
//      and copys the data from the board into local memory.
//
//
//      PARAMETERS:     wId - the slot ID
//                              sBitMap - Pointer to the bitmap structure to use
```

```
/* Appendix C:   CARDX7.C   Page 11 */
//           iXDim - Size of the device along the X axis in pixels
//           iYDim - Size of the device along the Y axis in scanlines
//           rPad  - defines the padding along each edge of the capture
//                   buffer.  Each device may have different padding
//                   values and the frame grabber itself is unaware of
//                   the padding, so the software must adjust for it.
//
//  RETURNS: TRUE if successful, FALSE if failed
//           If true memory has been allocated and loaded with data
//                   from the file.  The handle is placed in the bitmap
//                   data structure and the memory is unlocked.
//
//           The clipping region is always set to the maximum area
//
//*******************************************************************
*
BOOL FAR PASCAL MakeActBitMap( WORD wId, LPBIT_MAP sBitMap, int iXDim, int
iYDim, RECT rPad )
// D-
{
        DWORD dwFrameCount, dwSize = 0;
        int i, iSlot, iVRes, iHRes;

iSlot = wId;

//-- WHILE WE ARE BRINGING UP THE SYSTEM LET'S ZERO OUT THE CARD
EACH TIME
//      ZeroGraphicsMem( iSlot );

if( xCheckForCard( iSlot ) )
        {
                xSetGBFrameCounter( iSlot );         // Set frame address to zero
                // Tell frame grabber to capture a frame
                EnableMem( iSlot );

i = 0;
                // Retry up to 5 times to get a good capture.
                while( i < 5 )
                {
                        if( ! CaptureData( iSlot, 0x7fff )   && i == 4 )
                        {
                                MessageBox( (HANDLE) NULL, "Graphics card timeout",
```

/* Appendix C: CARDX7.C Page 12 */

```
                                            "MakeActBitMap", MB_ICONSTOP |
MB_OK );
                        return FALSE;
                }
                else
                        break;
            }
        }
        else
                return FALSE;

iVRes = GetVerticalResolution( iSlot );
        iHRes = GetHorizontalResolution( iSlot );

ReleaseBitMap( sBitMap );

sBitMap->iScanLineWidth = iXDim;
        sBitMap->iNumScanLines = iYDim;
        SetNoClip( sBitMap );                           // No clip area sBitMap->byBmpType = BMP_TYPE_COMPRESSED;       // Type indicates the
nature of
        sBitMap->bCompressed = TRUE;                    // Indicates if data is
compressed // We allocate twice as much as possible size in case of negative
        // compression. Memory is now locked
        if( AllocateMemoryForBitMap( sBitMap ) != 0 )
                return FALSE;

sBitMap->hColorMono = 0;                        // No color monochrome's
yet
        sBitMap->fpColors = NULL;                       // Ditto dwFrameCount = FRAME_COUNT;
        dwSize = FRAME_SIZE;

// Convert the frame data to a B-Tree format bitmap
        return ExpandFrameToBytes( sBitMap, iSlot ) ? FALSE : TRUE;
}
// - End MakeActBitMap
*****************************************************
```

/* Appendix C:   CARDX8.C   Page 1 */

// Copyright (c) B-Tree Verification Systems, Inc. 1990-1995. All rights reserved.
//

// $Header:   T:\svs\grphdll\cardx8.c_v   1.2   14 Sep 1995 20:39:08   MLOUDEN $ /**************************** CARDX8.C ******************************
 * This module contains routines for handling the MEDTRONIC color DISPLAY.

***********************************************************************/

/*
 * $Log:   T:\svs\grphdll\cardx8.c_v $
 *
 *
 *
 *
 *
 *
 *
 *
 *
 *
 *
 *
 */

// INCLUDE FILES ******************************************************** include <windows.h>
include <windowsx.h>
include <stdio.h>
include <dos.h>
include "grphdll.h"
include "eisa.h"
include "dpmi.h"

// END INCLUDE FILES
*********************************************************

/* Appendix C:   CARDX8.C   Page 2 */

```c
#pragma page()
// ****************************************************************************
// MANIFEST CONSTANTS AND MACROS define IDS_OK 0
define MAX_UNIQUE_VALS         32768 // Max values generated by 5-bit
RGB

// END MANIFEST CONSTANTS AND
MACRO*******************************************

/****************************************************************************/
//      STRUCTURES AND TYPEDEFS

// END STRUCTURES AND TYPEDEFS
**********************************************

// ****************************************************************************
//      GLOBAL VARIABLES

// -- For analysis
int iUniqueVals = 0;

WORD awCVals[ 256 ];

// -- For real life
BOOL bSorted = FALSE;
int iRealVals;

// You cal use any slot that is 0 except for awRVals[ 0 ] which must be 0
// Do not use duplicate values.
// !!!!!!!!!!!!!!!!!!!!!!!!!!!!!!!!!!!!!!!!!!!!!!!!!!!!!!!!!!!!
//
//          DO NOT CHANGE THE POSITION OF ANY COLORS ALREADY
DEFINED OR YOU
//          WILL CHANGE THE COLOR VALUES OF BITMAPS.
// !!!!!!!!!!!!!!!!!!!!!!!!!!!!!!!!!!!!!!!!!!!!!!!!!!!!!!!!!!!!
WORD awRVals[ 256 ] = {
        /*   0 is */     0,                      // ALWAYS MUST BE ZERO
(black)
```

```
                  /* Appendix C:   CARDX8.C   Page 3 */

/*   1 is  */      20,
/*   2 is  */      30,
/*   3 is  */     144,
/*   4 is  */     160,
/*   5 is  */     180,
/*   6 is  */     218,
/*   7 is  */     224,
/*   8 is  */     254,
/*   9 is  */    4096,
/*  10 is  */    4116,
/*  11 is  */    4126,
/*  12 is  */    4240,
/*  13 is  */    4256,
/*  14 is  */    4276,
/*  15 is  */    4314,
/*  16 is  */    4320,
/*  17 is  */    4350,
/*  18 is  */    5120,
/*  19 is  */    5140,
/*  20 is  */    5150,
/*  21 is  */    5264,
/*  22 is  */    5268,
/*  23 is  */    5280,
/*  24 is  */    5300,
/*  25 is  */    5338,
/*  26 is  */    5344,
/*  27 is  */    5374,
/*  28 is  */    7680,
/*  29 is  */    7700,
/*  30 is  */    7710,
/*  31 is  */    7824,
/*  32 is  */    7898,
/*  33 is  */    7904,
/*  34 is  */    7934,
/*  35 is  */   16384,
/*  36 is  */   16414,
/*  37 is  */   16528,
/*  38 is  */   16544,
/*  39 is  */   16564,
/*  40 is  */   16602,
/*  41 is  */   16608,
/*  42 is  */   16638,
/*  43 is  */   23040,
/*  44 is  */   23060,
```

```
/* Appendix C:   CARDX8.C   Page 4 */

/*  45 is  */   23070,
/*  46 is  */   23184,
/*  47 is  */   23200,
/*  48 is  */   23220,
/*  49 is  */   23258,
/*  50 is  */   23264,
/*  51 is  */   23294,
/*  52 is  */   24064,
/*  53 is  */   24084,
/*  54 is  */   24094,
/*  55 is  */   24208,
/*  56 is  */   24224,
/*  57 is  */   24244,
/*  58 is  */   24282,
/*  59 is  */   24288,
/*  60 is  */   24318,
/*  61 is  */       0,
/*  62 is  */       0,
/*  63 is  */       0,
/*  64 is  */       0,
/*  65 is  */       0,
/*  66 is  */       0,
/*  67 is  */       0,
/*  68 is  */       0,
/*  69 is  */       0,
/*  70 is  */       0,
/*  71 is  */       0,
/*  72 is  */       0,
/*  73 is  */       0,
/*  74 is  */       0,
/*  75 is  */       0,
/*  76 is  */       0,
/*  77 is  */       0,
/*  78 is  */       0,
/*  79 is  */       0,
/*  80 is  */       0,
/*  81 is  */       0,
/*  82 is  */       0,
/*  83 is  */       0,
/*  84 is  */       0,
/*  85 is  */       0,
/*  86 is  */       0,
/*  87 is  */       0,
/*  88 is  */       0,
```

/* Appendix C: CARDX8.C Page 5 */

```
/*  89 is */    0,
/*  90 is */    0,
/*  91 is */    0,
/*  92 is */    0,
/*  93 is */    0,
/*  94 is */    0,
/*  95 is */    0,
/*  96 is */    0,
/*  97 is */    0,
/*  98 is */    0,
/*  99 is */    0,
/* 100 is */    0,
/* 101 is */    0,
/* 102 is */    0,
/* 103 is */    0,
/* 104 is */    0,
/* 105 is */    0,
/* 106 is */    0,
/* 107 is */    0,
/* 108 is */    0,
/* 109 is */    0,
/* 110 is */    0,
/* 111 is */    0,
/* 112 is */    0,
/* 113 is */    0,
/* 114 is */    0,
/* 115 is */    0,
/* 116 is */    0,
/* 117 is */    0,
/* 118 is */    0,
/* 119 is */    0,
/* 120 is */    0,
/* 121 is */    0,
/* 122 is */    0,
/* 123 is */    0,
/* 124 is */    0,
/* 125 is */    0,
/* 126 is */    0,
/* 127 is */    0,
/* 128 is */    0,
/* 129 is */    0,
/* 130 is */    0,
/* 131 is */    0,
/* 132 is */    0,
```

/* Appendix C: CARDX8.C Page 6 */

```
/* 133 is */    0,
/* 134 is */    0,
/* 135 is */    0,
/* 136 is */    0,
/* 137 is */    0,
/* 138 is */    0,
/* 139 is */    0,
/* 140 is */    0,
/* 141 is */    0,
/* 142 is */    0,
/* 143 is */    0,
/* 144 is */    0,
/* 145 is */    0,
/* 146 is */    0,
/* 147 is */    0,
/* 148 is */    0,
/* 149 is */    0,
/* 150 is */    0,
/* 151 is */    0,
/* 152 is */    0,
/* 153 is */    0,
/* 154 is */    0,
/* 155 is */    0,
/* 156 is */    0,
/* 157 is */    0,
/* 158 is */    0,
/* 159 is */    0,
/* 160 is */    0,
/* 161 is */    0,
/* 162 is */    0,
/* 163 is */    0,
/* 164 is */    0,
/* 165 is */    0,
/* 166 is */    0,
/* 167 is */    0,
/* 168 is */    0,
/* 169 is */    0,
/* 170 is */    0,
/* 171 is */    0,
/* 172 is */    0,
/* 173 is */    0,
/* 174 is */    0,
/* 175 is */    0,
/* 176 is */    0,
```

```
/* Appendix C:   CARDX8.C   Page 7 */

/* 177 is */    0,
/* 178 is */    0,
/* 179 is */    0,
/* 180 is */    0,
/* 181 is */    0,
/* 182 is */    0,
/* 183 is */    0,
/* 184 is */    0,
/* 185 is */    0,
/* 186 is */    0,
/* 187 is */    0,
/* 188 is */    0,
/* 189 is */    0,
/* 190 is */    0,
/* 191 is */    0,
/* 192 is */    0,
/* 193 is */    0,
/* 194 is */    0,
/* 195 is */    0,
/* 196 is */    0,
/* 197 is */    0,
/* 198 is */    0,
/* 199 is */    0,
/* 200 is */    0,
/* 201 is */    0,
/* 202 is */    0,
/* 203 is */    0,
/* 204 is */    0,
/* 205 is */    0,
/* 206 is */    0,
/* 207 is */    0,
/* 208 is */    0,
/* 209 is */    0,
/* 210 is */    0,
/* 211 is */    0,
/* 212 is */    0,
/* 213 is */    0,
/* 214 is */    0,
/* 215 is */    0,
/* 216 is */    0,
/* 217 is */    0,
/* 218 is */    0,
/* 219 is */    0,
/* 220 is */    0,
```

```
/* Appendix C:   CARDX8.C   Page 8 */

/* 221 is */    0,
/* 222 is */    0,
/* 223 is */    0,
/* 224 is */    0,
/* 225 is */    0,
/* 226 is */    0,
/* 227 is */    0,
/* 228 is */    0,
/* 229 is */    0,
/* 230 is */    0,
/* 231 is */    0,
/* 232 is */    0,
/* 233 is */    0,
/* 234 is */    0,
/* 235 is */    0,
/* 236 is */    0,
/* 237 is */    0,
/* 238 is */    0,
/* 239 is */    0,
/* 240 is */    0,
/* 241 is */    0,
/* 242 is */    0,
/* 243 is */    0,
/* 244 is */    0,
/* 245 is */    0,
/* 246 is */    0,
/* 247 is */    0,
/* 248 is */    0,
/* 249 is */    0,
/* 250 is */    0,
/* 251 is */    0,
/* 252 is */    0,
/* 253 is */    0,
/* 254 is */    0,
/* 255 is */    32767 };          // ALWAYS MUST BE r-1f, g-1f, b-1f (white)

static BYTE abyLookup[ 32768 ];   // We can't have more than this

// END GLOBAL VARIABLES
//*******************************************************

BOOL FAR PASCAL CompressBitmapLineHugeSrc( WORD huge * hpwDestLine, char huge
```

/* Appendix C: CARDX8.C Page 9 */

```c
* hpcSrcLine, int iLen );

// END GLOBAL VARIABLES
//*********************************************

// D+
pragma page()
//*****************************************************************************
**
//      ConvertRGBFrameToBitMap
//
//  Takes the data from the frame grabber and converts it to the B-TREE format
//       bitmap. This data is composed of RGB data stuffed into a WORD. The format
//       is below:
//
//   BYTE 0          BYTE 1
// 00000000         00000000
// ||| \ |          || \ |
// ||| Red          || Green
// |||              ||
// +++------Blue-++
//
//      As indicated there are 5 bit RGB values packed into a WORD.
//
//      PARAMETERS: wVal - The 16 bit value containing the packed 5 bit RGB data
//
//      RETURNS:   A DWORD value in which:
//                          The LOBYTE of the LOWORD contains RED
//                          The HIBYTE of the LOWORD contains GREEN
//                          The LOBYTE of the HIWORD contains BLUE
//                          The 5 bit RGB is changed to 6 bit RGB
//
//*****************************************************************************
**
DWORD WordToRGB( WORD wVal )
// D-
{
        BYTE r, g, b;

r = (BYTE) ( wVal & 0x1F );
        g = (BYTE) ( ( wVal >> 8 ) & 0x1F );
        b = (BYTE) ( ( ( wVal >> 13 ) & 3 ) | ( ( wVal >> 3 ) & 0x1c ) );
```

/* Appendix C: CARDX8.C Page 10 */

```c
        r = r << 3;
        g = g << 3;
        b = b << 3;

return (DWORD) RGB( r, g, b );
}
// - End WordToRGB
//*************************************************************

BOOL WritePaletteFile( void )
{

FILE *stream;
        int i;
        BOOL bStatus = TRUE;

stream = fopen( "analysis.pal", "w" );
        fprintf( stream, "GOBPAL\n" );

// Run through our list making a palette table for ourselves
        for( i = 0; i < 256; i++ )
        {
                fprintf( stream, "%3d is %8d - %3d,%3d,%3d\n",
                                        i,
                                        awCVals[ i ],
                                        LOBYTE( LOWORD( WordToRGB( awCVals[ i ] ) ) ),
                                        HIBYTE( LOWORD( WordToRGB( awCVals[ i ] ) ) ),
                                        LOBYTE( HIWORD( WordToRGB( awCVals[ i ] ) ) ) );

} fclose( stream );

return TRUE;

}

// This function will generate a default palette based on the current values
// saved in the table of values. It can be called via user-defined DLL or
// if desparate you could use devtable.
```

```c
/* Appendix C:   CARDX8.C   Page 11 */
BOOL _export FAR PASCAL MakeDefaultPalette( void )
{
        FILE *stream;
        int i;
        BOOL bStatus = TRUE;

stream = fopen( "default.pal", "w" );
        fprintf( stream, "GOBPAL\n" );

// Run through our list making a palette table for ourselves
        for( i = 0; i < 256; i++ )
        {
                fprintf( stream, "%3d,%3d,%3d\n",
                                LOBYTE( LOWORD( WordToRGB( awRVals[ i ] ) ) ),
                                HIBYTE( LOWORD( WordToRGB( awRVals[ i ] ) ) ),
                                LOBYTE( HIWORD( WordToRGB( awRVals[ i ] ) ) ) );

} fclose( stream );

return TRUE;

}

// Converts the data from a line of 16 bit data to a line of 8 bit data
// Using the table of xlated values
//      USED WITH ANALYSIS ROUTINES
BOOL MakeXlatedLine( WORD huge *hpwFramePtr, char far *fpcBuf, BYTE far *fpHit, int
iXDim )
{
        int i, k, iSwap;
        BOOL bStatus = TRUE;

for( i = 0; i < iXDim; i++ )
        {
                // We swap bytes due to documentation error and easier to
                // change here.
                iSwap = hpwFramePtr[ i ];
                k = 0; k |= HIBYTE( iSwap ); k |= ( LOBYTE( iSwap ) << 8 );
                k &= 0x7fff;
```

```c
/* Appendix C:   CARDX8.C   Page 12 */
            fpcBuf[ i ] = fpHit[ k ];
            // 0 means undefined if it is not representing r-0,g-0,b-0
            if( fpcBuf[ i ] == 0 && k != 0 )
            {
                    bStatus = FALSE;
                    break;
            }
        } return bStatus;
}

// Converts the data from a line of 16 bit data to a line of 8 bit data
// Using the table of xlated values
//              USED WITH REAL CAPTURE ROUTINES
BOOL MakeRealXlatedLine( WORD huge *hpwFramePtr, char far *fpcBuf, int iNumElms,
int iXDim )
{
        int i, k, iSwap;
        BOOL bStatus = TRUE;

for( i = 0; i < iXDim; i++ )
        {
                // We swap bytes due to documentation error and easier to
                // change here than in hardware.
                iSwap = hpwFramePtr[ i ];
                k = 0; k |= HIBYTE( iSwap ); k |= ( LOBYTE( iSwap ) << 8 );
                k &= 0x7fff;
                fpcBuf[ i ] = abyLookup[ k ];
                // 0 means undefined if it is not representing r-0,g-0,b-0
                if( fpcBuf[ i ] == 0 && k != 0 )
                {
                        bStatus = FALSE;
                        break;
                }
        } return bStatus;
}
```

/* Appendix C:   CARDX8.C   Page 13 */

```c
// Converts the data from a line of 16 bit data to a line of 8 bit data
// Using the table of xlated values
//              USED WITH REAL CAPTURE ROUTINES
// USES FAR POINTER for speed
BOOL MakeRealXlatedLineFar( WORD far *hpwFramePtr, char far *fpcBuf, int iNumElms,
int iXDim )
{
        int i, k, iSwap;
        BOOL bStatus = TRUE;

for( i = 0; i < iXDim; i++ )
        {
                // We swap bytes due to documentation error and easier to
                // change here than in hardware.
                iSwap = hpwFramePtr[ i ];
                k = 0; k |= HIBYTE( iSwap ); k |= ( LOBYTE( iSwap ) << 8 );
                k &= 0x7fff;
                fpcBuf[ i ] = abyLookup[ k ];
                // 0 means undefined if it is not representing r-0,g-0,b-0
                if( fpcBuf[ i ] == 0 && k != 0 )
                {
                        bStatus = FALSE;
                        break;
                }
        } return bStatus;
}

// D+
pragma page()
//*********************************************************************
**
//      DoRGBAnalysis
//
// Takes the data from the frame grabber and converts it to the B-TREE format
//      bitmap.  This data is composed of RGB data stuffed into a WORD. The format
//      is below:
//
//   BYTE 1           BYTE 0
// 00000000        00000000
```

/* Appendix C: CARDX8.C Page 14 */

```
//  |||    Red         ||  Green
//  |||                ||
//  |||                ||
// +++------Blue-++
//
//      As indicated there are 5 bit RGB values packed into a WORD.
//
//      PARAMETERS: sBitMap - Pointer to the bitmap structure to use
//                  iXDim - Size of the device along the X axis in pixels
//                  iYDim - Size of the device along the Y axis in scanlines
//                  rPad  - defines the padding along each edge of the capture
//                          buffer. Each device may have different padding
//                          values and the frame grabber itself is unaware of
//                          the padding, so the software must adjust for it.
//                  iSlot - SLOT # that the grahics card resides in
//                  Memory is allocated and locked for the bitmap data
//
//      RETURNS:    TRUE if successful, FALSE if failed
//                  If true memory has been loaded with data from the frame
//                  grabber. The handle is placed in the bitmap
//                  data structure and the memory is unlocked.
//
//*********************************************************************
**
BOOL DoRGBAnalysis( LPBIT_MAP sBitMap, int iXDim, int iYDim, RECT rPad, int iSlot
)
// D-
{
    int i, j, k, iSwap, iStatus, iLineIncr;
    BOOL bFoundFailure = FALSE;
    long lNumVals = MAX_UNIQUE_VALS;
    DWORD dwBaseAddr, dwDataSize, dwFrameSize;
    WORD wSel;
    WORD huge *hpwCompressedData;
    WORD huge *hpwFramePtr;
    BYTE far  *fpHit;                       // Used as bit array
    char far  *fpcBuf;

// TEMP UNTIL CAN GET ADDRESS FROM MANAGER
    dwBaseAddr = GetBaseAddressForSlot( iSlot );
    iLineIncr = ( iXDim + rPad.left + rPad.right );
    dwFrameSize = (iLineIncr * sizeof(WORD) ) * (DWORD) ( iYDim + rPad.top );

// GET MEM FOR OUR HIT BITMAP (and a work buffer at the end)
```

/* Appendix C:   CARDX8.C   Page 15 */

```c
fpHit = GlobalAllocPtr( GMEM_ZEROINIT, lNumVals + iLineIncr );
if( ! fpHit )
        return FALSE;
fpcBuf = fpHit + lNumVals;              // End of bit array is a work buffer
// Initialize our lists of translated values.
_fmemset( awCVals, 0x0, sizeof( awCVals ) );

// Force 0 to black && RGB VAL 0x1f, 0x1f, 0x1f TO 255
// Note that we are adding in white as the last value in table
// this affects how we use iUniqueVals for indexing.
awCVals[ 255 ] = 0x7fff;
fpHit[ 0x7fff ] = 255;
iUniqueVals = 2;

// Create a huge pointer to physical mem on graphics capture card
iStatus = SetupSelectorsForMsWindows( (WORD far *) &wSel,
                                                                    dwBaseAddr,
                dwFrameSize );
        if( iStatus != 0 )
        {
                GlobalFreePtr( fpHit );
                return FALSE;
        }

// First check all colors and mark all the color values we
// encounter.
hpwFramePtr = ( (WORD huge *) MAKELP( wSel, 0 ) ) +
                                ( rPad.top * iLineIncr ) + rPad.left;
EnableMem( iSlot );
for( i = 0; i < iYDim; i++ )
{
        for( j = 0; j < iLineIncr; j++ )
        {
                // We swap bytes due to documentation error and easier to
                // change here.
                iSwap = hpwFramePtr[ j ];
                k = 0; k |= HIBYTE( iSwap ); k |= ( LOBYTE( iSwap ) << 8 );
                k &= 0x7fff;
                // If value is not zero and we have not assigned a translation value
                // assign the translation value now.
                if( k != 0 && fpHit[ k ] == 0 )
                {
                        fpHit[ k ] = iUniqueVals - 1;
```

```
/* Appendix C:   CARDX8.C   Page 16 */
                awCVals[ iUniqueVals - 1 ] = k;
                iUniqueVals++;
                // 256 Values is all we are allowed
                if( iUniqueVals > 256 )
                {
                        MessageBox( (HANDLE) NULL,
                                                "Too many color values",
                                                "DoRGBAnalysis",
                                                MB_ICONSTOP | MB_OK );
                        GlobalFreePtr( fpHit );
                        DisableMem( iSlot );
                        FreeSelectorsForMsWindows( wSel, dwFrameSize );
                        return FALSE;
                }
            }
        }
        hpwFramePtr += iLineIncr;
}

// Now we generate a useable bitmap
hpwFramePtr = ( (WORD huge *) MAKELP( wSel, 0 ) ) +
                                ( rPad.top * iLineIncr ) + rPad.left;
for( i = 0, dwDataSize = 0; i < iYDim; i++ ) {
        hpwCompressedData = RLELineAddress( i, sBitMap );
        if( ! MakeXlatedLine( hpwFramePtr, fpcBuf, fpHit, iXDim ) )
                bFoundFailure = TRUE;
        CompressBitmapLineHugeSrc( hpwCompressedData, fpcBuf, iXDim );
        // Update number of WORDS in data
        dwDataSize += ( *hpwCompressedData + 1 );     // 1 is for counter itself
        hpwFramePtr += iLineIncr;
}
// Convert data to character size
dwDataSize *= sizeof( WORD );

DisableMem( iSlot );
FreeSelectorsForMsWindows( wSel, dwFrameSize );

if( bFoundFailure )
        MessageBox( (HANDLE) NULL,
                                "Color Analysis Mismatch",
                                "DoRGBAnalysis",
                                MB_ICONSTOP | MB_OK );

// Reallocate the memory, hopefully releasing some back to system
```

/* Appendix C: CARDX8.C Page 17 */

```
        GlobalFreePtr( fpHit );
        GlobalUnlock( sBitMap->hBitmap );
        sBitMap->hpcPixels = NULL;
        sBitMap->hBitmap = GlobalReAlloc( sBitMap->hBitmap,
                                                          dwDataSize,
                                                          GMEM_SHARE |
GMEM_MOVEABLE );
        sBitMap->dwBitMapSize = GlobalSize( sBitMap->hBitmap );

return WritePaletteFile();

}
// - End DoRGBAnalysis ************************************************

// D+
pragma page()
//*****************************************************************************
*
//      GenRGBData
//
//      This routine attempts to load a bitmap with data from the graphics board.
//      It initializes the bitmap structure, sets up all required values,
//      and tries to do an analysis on the data before converting to a bitmap.
//
//      It is intended primarily for debug and early development and is accessed by
//      changing the device table to reflect this as the capture function.
//
//      This routine writes out file containing an analysis of all the RGB values
//      found and it writes them in the format
//
//      PARAMETERS:     wId - the slot ID
//                      sBitMap - Pointer to the bitmap structure to use
//                      iXDim - Size of the device along the X axis in pixels
//                      iYDim - Size of the device along the Y axis in scanlines
//                      rPad  - defines the padding along each edge of the capture
//                                    buffer. Each device may have different padding
//                                    values and the frame grabber itself is unaware of
//                                    the padding, so the software must adjust for it.
//
//      RETURNS: TRUE if successful, FALSE if failed
```

```c
/* Appendix C:   CARDX8.C   Page 18 */
//              If true memory has been allocated and loaded with data
//                      from the frame. The handle is placed in the bitmap
//                      data structure and the memory is unlocked.
//
//              A palette file with name "analysis.pal" is in existence.
//
//              The clipping region is always set to the maximum area
//
//***************************************************************************
*
BOOL _export FAR PASCAL GenRGBData( WORD wId, LPBIT_MAP sBitMap, int iXDim,
int iYDim, RECT rPad )
// D-
{
        DWORD dwFrameCount, dwSize = 0;
        int i, iSlot, iVRes, iHRes;
        DWORD dwBaseAddr;
        WORD wSel;
        DWORD far *fpdwFramePtr;

iSlot = wId;

if( xCheckForCard( iSlot ) )
        {
                xSetGBFrameCounter( iSlot );        // Set frame address to zero
                // Tell frame grabber to capture a frame
                EnableMem( iSlot );
                dwBaseAddr = GetBaseAddressForSlot( iSlot );
                // Create a huge pointer to physical mem on graphics capture card
                i = SetupSelectorsForMsWindows( (WORD far *) &wSel, dwBaseAddr, 10 );
                if( i != 0 )
                {
                        MessageBox( (HANDLE) NULL, "Could not create selector",
                                        "MakeActBitMap", MB_ICONSTOP |
MB_OK );
                        return FALSE;
                }
                fpdwFramePtr = (DWORD far *) MAKELP( wSel, 0 );
                *fpdwFramePtr = 0x5aa55aa5;
                i = 0;
                // Retry up to 5 times to get a good capture.
                while( i < 5 )
                {
```

```
/* Appendix C:   CARDX8.C   Page 19 */
        if( ! CaptureData( iSlot, 60 )     && i == 4 )
        {
                MessageBox( (HANDLE) NULL, "Graphics card timeout",
                                "MakeActBitMap", MB_ICONSTOP |
MB_OK );
                FreeSelectorsForMsWindows( wSel, 10 );
                return FALSE;
        }
        else
                break;
        ++i;
    }
    // We only get here if successful
    FreeSelectorsForMsWindows( wSel, 10 );
}
else
        return FALSE;

dwFrameCount = GetFrameCounter( iSlot );
iVRes = GetVerticalResolution( iSlot );
iHRes = GetHorizontalResolution( iSlot );

ReleaseBitMap( sBitMap );

sBitMap->iScanLineWidth = iXDim;
sBitMap->iNumScanLines = iYDim;
SetNoClip( sBitMap );                              // No clip area sBitMap->byBmpType = BMP_TYPE_COMPRESSED;   // Type indicates the nature
of
sBitMap->bCompressed = TRUE;                       // Indicates if data is
compressed // We allocate twice as much as possible size in case of negative
// compression.    Memory is now locked
if( AllocateMemoryForBitMap( sBitMap ) != 0 )
        return FALSE;

sBitMap->hColorMono = 0;                           // No color monochrome's
yet
sBitMap->fpColors = NULL;                          // Ditto // Convert the frame data to a B-Tree format bitmap
return DoRGBAnalysis( sBitMap, iXDim, iYDim, rPad, iSlot );
```

/* Appendix C:   CARDX8.C   Page 20 */

```
}
// - End GenRGBData ****************************************************

// D+
pragma page()
//*********************************************************************
**
//      ConvertRGBFrameToBitMap
//
//  Takes the data from the frame grabber and converts it to the B-TREE format
//      bitmap.  This data is composed of RGB data stuffed into a WORD. The format
//      is below:
//
//   BYTE 1          BYTE 0
// 00000000        00000000
// ||| \ |         || \ |
// |||  Red        || Green
// |||             ||
// +++------Blue-++
//
//      As indicated there are 5 bit RGB values packed into a WORD.
//
//      PARAMETERS: sBitMap - Pointer to the bitmap structure to use
//                  iXDim - Size of the device along the X axis in pixels
//                  iYDim - Size of the device along the Y axis in scanlines
//                  rPad  - defines the padding along each edge of the capture
//                              buffer. Each device may have different padding
//                              values and the frame grabber itself is unaware of
//                              the padding, so the software must adjust for it.
//                  iSlot - SLOT # that the grahics card resides in
//              Memory is allocated and locked for the bitmap data
//
//      RETURNS:  TRUE if successful, FALSE if failed
//                  If true memory has been loaded with data from the frame
//                      grabber. The handle is placed in the bitmap
//                      data structure and the memory is unlocked.
//
//*********************************************************************
**
```

```
/* Appendix C:   CARDX8.C   Page 21 */
```

```c
BOOL ConvertRGBFrameToBitMap( LPBIT_MAP sBitMap, int iXDim, int iYDim, RECT
rPad, int iSlot )
// D-
{
        int i, j, iStatus, iLineIncr;
        BOOL bFoundFailure = FALSE;
        DWORD dwBaseAddr, dwDataSize, dwFrameSize;
        WORD wSel;
        WORD huge *hpwCompressedData;
        WORD huge *hpwFramePtr;
        char far *fpcBuf;

// TEMP UNTIL CAN GET ADDRESS FROM MANAGER
        dwBaseAddr = GetBaseAddressForSlot( iSlot );
        iLineIncr = ( iXDim + rPad.left + rPad.right );
        dwFrameSize = (iLineIncr * sizeof(WORD) ) * (DWORD) ( iYDim + rPad.top );

// GET MEM FOR OUR HIT BITMAP (and a work buffer at the end)
        fpcBuf = GlobalAllocPtr( GMEM_ZEROINIT, iLineIncr );
        if( ! fpcBuf )
                return FALSE;

// First time through we must create table for binary search.
        if( ! bSorted )
        {
                // We put all the values we have into a table of our XLATER
                // elements skipping the first since that must be 0 and the last
                // since that must 32767.
                for( i = 0, j = 0; i < 256; ++i )
                {
                        if( awRVals[ i ] != 0 )
                        {
                                j++;
                                abyLookup[ awRVals[ i ] ] = i;
                        }
                } iRealVals = j;

bSorted = TRUE;
        }

// Create a huge pointer to physical mem on graphics capture card
```

```c
/* Appendix C:   CARDX8.C   Page 22 */ iStatus = SetupSelectorsForMsWindows( (WORD far *) &wSel,
                                                                              dwBaseAddr,
dwFrameSize );

// Now we generate a useable bitmap
        hpwFramePtr = ( (WORD huge *) MAKELP( wSel, 0 ) ) +
                                    ( rPad.top * iLineIncr ) + rPad.left;
        for( i = 0, dwDataSize = 0; i < iYDim; i++ )
        {
                _fmemset( fpcBuf, 0x00, iLineIncr );
                hpwCompressedData = RLELineAddress( i, sBitMap );
                // We use far pointers for speed sake whenever possible.
                if( FP_OFF( hpwFramePtr ) > (WORD) ( 65536 - iXDim ) )
                {
                        if( ! MakeRealXlatedLine( hpwFramePtr, fpcBuf, iRealVals, iXDim ) )
                                bFoundFailure = TRUE;
                }
                else
                {
                        if( ! MakeRealXlatedLineFar( (WORD far *) hpwFramePtr, fpcBuf,
iRealVals, iXDim ) )
                                bFoundFailure = TRUE;
                }

CompressBitmapLineHugeSrc( hpwCompressedData, fpcBuf, iXDim );
                // Update number of WORDS in data
                dwDataSize += ( *hpwCompressedData + 1 );     // 1 is for counter itself
                hpwFramePtr += iLineIncr;
        }
        // Convert data to character size
        dwDataSize *= sizeof( WORD );

DisableMem( iSlot );
        FreeSelectorsForMsWindows( wSel, dwFrameSize );

if( bFoundFailure )
                MessageBox( (HANDLE) NULL,
                                        "Color Analysis Mismatch",
                                        "DoRGBAnalysis",
                                        MB_ICONSTOP | MB_OK );

// Reallocate the memory, hopefully releasing some back to system
        GlobalFreePtr( fpcBuf );
        GlobalUnlock( sBitMap->hBitmap );
```

/* Appendix C: CARDX8.C Page 23 */

```c
        sBitMap->hpcPixels = NULL;
        sBitMap->hBitmap = GlobalReAlloc( sBitMap->hBitmap,
                                                            dwDataSize,
                                                            GMEM_SHARE |
GMEM_MOVEABLE );
        sBitMap->dwBitMapSize = GlobalSize( sBitMap->hBitmap );

return TRUE;

}
// - End ConvertRGBFrameToBitMap
//****************************************************

// D+
pragma page()
//***************************************************************************
*
//      MakeActColorBitMap
//
//      This routine loads a bitmap with data from the graphics board.
//      It initializes the bitmap structure, sets up all required values,
//      and copys the data from the board into local memory.
//
//      PARAMETERS:     wId - the slot ID
//                      sBitMap - Pointer to the bitmap structure to use
//                      iXDim - Size of the device along the X axis in pixels
//                      iYDim - Size of the device along the Y axis in scanlines
//                      rPad  - defines the padding along each edge of the capture
//                                      buffer.  Each device may have different padding
//                                      values and the frame grabber itself is unaware of
//                                      the padding, so the software must adjust for it.
//
//      RETURNS:   TRUE if successful, FALSE if failed
//                              If true memory has been allocated and loaded with data
//                                      from the file.  The handle is placed in the bitmap
//                                      data structure and the memory is unlocked.
//
//                              The clipping region is always set to the maximum area
//
```

```c
/* Appendix C: CARDX8.C    Page 24 */
//*****************************************************************************
 *
BOOL _export FAR PASCAL MakeActColorBitMap( WORD wId, LPBIT_MAP sBitMap, int
iXDim, int iYDim, RECT rPad )
// D-
{
    DWORD dwFrameCount, dwSize = 0;
    int i, iSlot, iVRes, iHRes;
    DWORD dwBaseAddr;
    WORD wSel;
    DWORD far *fpdwFramePtr;

iSlot = wId;

if( xCheckForCard( iSlot ) )
    {
        xSetGBFrameCounter( iSlot );          // Set frame address to zero
        // Tell frame grabber to capture a frame
        EnableMem( iSlot );
        dwBaseAddr = GetBaseAddressForSlot( iSlot );
        // Create a huge pointer to physical mem on graphics capture card
        i = SetupSelectorsForMsWindows( (WORD far *) &wSel, dwBaseAddr, 10 );
        if( i != 0 )
        {
            MessageBox( (HANDLE) NULL, "Could not create selector",
                                      "MakeActBitMap", MB_ICONSTOP |
MB_OK );
            return FALSE;
        }
        fpdwFramePtr = (DWORD far *) MAKELP( wSel, 0 );
        *fpdwFramePtr = 0x5aa55aa5;
        i = 0;
        // Retry up to 5 times to get a good capture.
        while( i < 5 )
        {
            if( ! CaptureData( iSlot, 60 )    && i == 4 )
            {
                MessageBox( (HANDLE) NULL, "Graphics card timeout",
                                          "MakeActBitMap", MB_ICONSTOP |
MB_OK );
                FreeSelectorsForMsWindows( wSel, 10 );
                return FALSE;
            }
```

/* Appendix C:   CARDX8.C   Page 25 */

```
                else
                        break;
                ++i;
        }
        // We only get here if successful
        FreeSelectorsForMsWindows( wSel, 10 );
}
else
        return FALSE;

dwFrameCount = GetFrameCounter( iSlot );
iVRes = GetVerticalResolution( iSlot );
iHRes = GetHorizontalResolution( iSlot );

ReleaseBitMap( sBitMap );

sBitMap->iScanLineWidth = iXDim;
sBitMap->iNumScanLines = iYDim;
SetNoClip( sBitMap );                                  // No clip area sBitMap->byBmpType = BMP_TYPE_COMPRESSED;   // Type indicates the nature.
of
        sBitMap->bCompressed = TRUE;                   // Indicates if data is
compressed // We allocate twice as much as possible size in case of negative
        // compression.     Memory is now locked
        if( AllocateMemoryForBitMap( sBitMap ) != 0 )
                return FALSE;

sBitMap->hColorMono = 0;                       // No color monochrome's
yet
        sBitMap->fpColors = NULL;                      // Ditto // Convert the frame data to a B-Tree format bitmap
        return ConvertRGBFrameToBitMap( sBitMap, iXDim, iYDim, rPad, iSlot );

}
// - End MakeActColorBitMap
*************************************************************
```

/* Appendix C: GRBITMAP.C   Page 1 */

```c
// Copyright (c) B-Tree Verification Systems, Inc. 1990-1995.  All rights reserved.
//
/* $Header:   T:\svs\grphdll\grbitmap.c_v   1.14   20 Sep 1995 08:08:28   CLOSCHEIDER  $
 */
/****************************** GRBITMAP.C
***********************************
 * This module contains routines that are used to support the working with
 * and manipulation of bitmaps.
 ****************************************************************************
 *
 */ include <windows.h>
include <string.h>
#include "grphdll.h"
#include "btrfonts.h"

//****************************************************************************
//
// Initializes a BIT_MAP structure -- this is important to do because
// so many routines in the library release a bitmap before using it
//
// If you happen to release an un-initialized bitmap then you in effect
// free random blocks of memory ..... this can lead to U.A.E.'s or
// even worse .....
//
//****************************************************************************
void FAR PASCAL InitBtreeBitMap( BIT_MAP far * sBitMap )
{
   _fmemset( (void far *) sBitMap, 0, sizeof(BIT_MAP) );
}

//****************************************************************************
//
// Computes the worst case size of a RLE compressed bitmap (in bytes)
// given the dimensions of the bitmap
//
//****************************************************************************
DWORD FAR PASCAL GetWorstCaseCompressedBmpSize( int iNumScanLines,
                                                int iScanLineWidth )
{
  return ((DWORD) iNumScanLines * (DWORD) iScanLineWidth * 2L) + ((DWORD)
iNumScanLines * 2L);
```

/* Appendix C: GRBITMAP.C Page 2 */

```c
}
//**************************************************************************
//
// Allocates and initializes memory for a monochrome bitmap
// Assumes the dimensions are given in the initialized bitmap structure
// Leaves the memory locked
//
//**************************************************************************
int FAR PASCAL AllocateMemoryForMonochromeBitMap( BIT_MAP far * sBitMap )
{
  DWORD dwSize;
  int i;

// ALLOCATE MEMORY FOR THE BITMAP ITSELF .....
  dwSize = ((DWORD) sBitMap->iNumScanLines * (DWORD) sBitMap->iScanLineWidth +
7L) / 8L;
  sBitMap->hBitmap = GlobalAlloc( GMEM_SHARE | GMEM_ZEROINIT, dwSize );
  sBitMap->dwBitMapSize = GlobalSize( sBitMap->hBitmap );

// ALLOCATE MEMORY FOR THE HIT LISTS .....
  dwSize = sBitMap->iNumScanLines * sizeof(int);
  sBitMap->hLineFirstHit = GlobalAlloc( GMEM_SHARE | GMEM_ZEROINIT, dwSize );
  sBitMap->hLineLastHit = GlobalAlloc( GMEM_SHARE | GMEM_ZEROINIT, dwSize );

// LOCK UP THE POINTERS .....
  sBitMap->hpcPixels = (char huge *) GlobalLock( sBitMap->hBitmap );
  sBitMap->fpiFirstHit = (int far *) GlobalLock( sBitMap->hLineFirstHit );
  sBitMap->fpiLastHit = (int far *) GlobalLock( sBitMap->hLineLastHit );

// THIS SHOULD CATCH ANY MEMORY ALLOCATION ERRORS THAT MAY
  // HAVE OCCURED .....
  if (  sBitMap->hpcPixels == NULL
     || sBitMap->fpiFirstHit == NULL
     || sBitMap->fpiLastHit == NULL )
  {
    ReleaseBitMap( sBitMap );
    return -1;
  }

// INITIALIZE THE HIT LISTS .....
  for (i = 0; i < sBitMap->iNumScanLines; i++ )
  {
    sBitMap->fpiFirstHit[ i ] = EMPTY;
```

```c
/* Appendix C:   GRBITMAP.C   Page 3 */
    sBitMap->fpiLastHit[ i ] = EMPTY;
  } return 0;
}

//***************************************************************************
//
// Allocates and initializes memory for a bitmap
// Assumes the bitmap type is given in the initialized bitmap structure
// Assumes the dimensions are given in the initialized bitmap structure
//
// Leaves the (allocated) memory locked
//
//***************************************************************************
int FAR PASCAL AllocateMemoryForBitMap( BIT_MAP far * sBitMap )
{
  DWORD dwSize;

switch (sBitMap->byBmpType)
  {
    case BMP_TYPE_RAW:
      dwSize = (DWORD) sBitMap->iNumScanLines * (DWORD) sBitMap->iScanLineWidth;
      break;
    case BMP_TYPE_COMPRESSED:
      dwSize = GetWorstCaseCompressedBmpSize( sBitMap->iNumScanLines,
                          sBitMap->iScanLineWidth );
      break;
    case BMP_TYPE_MONOCHROME:
      return (AllocateMemoryForMonochromeBitMap(sBitMap));
      break;
        case BMP_TYPE_FONT:
        case BMP_TYPE_NEWFONT:
             // No allocation necessary for FONTS
             return 0;
    default:
      return -1;
      break;
  }

// ALLOCATE THE MEMORY ....
  sBitMap->hBitmap = GlobalAlloc( GMEM_SHARE | GMEM_MOVEABLE |
```

```c
/* Appendix C:   GRBITMAP.C   Page 4 */
GMEM_ZEROINIT, dwSize );
  sBitMap->dwBitMapSize = GlobalSize( sBitMap->hBitmap );
  if (sBitMap->hBitmap == (HANDLE) NULL)
    return -2;

// LOCK THE POINTER .....
  sBitMap->hpcPixels = GlobalLock( sBitMap->hBitmap );
  if (sBitMap->hBitmap == NULL)
    return -3;

return 0;
}

//***********************************************************************
//
// Locks all the pointers for the given bitmap
// Assumes the bitmap type is given in the bitmap structure
//
//***********************************************************************
int FAR PASCAL LockBitMap( BIT_MAP far * sBitMap )
{
  switch (sBitMap->byBmpType)
  {
    case BMP_TYPE_RAW:
      sBitMap->hpcPixels = (char huge *) GlobalLock( sBitMap->hBitmap );
      if (sBitMap->hpcPixels == NULL)
      {
        return -1;
      }
      return 0;
    case BMP_TYPE_COMPRESSED:
      sBitMap->hpcPixels = (char huge *) GlobalLock( sBitMap->hBitmap );
      if (sBitMap->hpcPixels == NULL)
      {
        return -1;
      }
      return 0;
    case BMP_TYPE_MONOCHROME:
      sBitMap->hpcPixels = (char huge *) GlobalLock( sBitMap->hBitmap );
      if (sBitMap->hpcPixels == NULL)
      {
        return -1;
      }
      sBitMap->fpiFirstHit = (int far *) GlobalLock( sBitMap->hLineFirstHit );
```

```c
                    /* Appendix C:   GRBITMAP.C   Page 5 */
    if (sBitMap->fpiFirstHit == NULL)
    {
      GlobalUnlock( sBitMap->hBitmap );
      return -1;
    }
    sBitMap->fpiLastHit = (int far *) GlobalLock( sBitMap->hLineLastHit );
    if (sBitMap->fpiLastHit == NULL)
    {
      GlobalUnlock( sBitMap->hBitmap );
      GlobalUnlock( sBitMap->hLineFirstHit );
      return -1;
    }
    return 0;
  case BMP_TYPE_FONT:
      case BMP_TYPE_NEWFONT:
            sBitMap->hpcPixels = (char huge *) GlobalLock( sBitMap->hBitmap );
            if (sBitMap->hpcPixels == NULL)
            {
              return -1;
            }
            return LockFontStructure( sBitMap );
    default:
      return -1;
  }
}

//***************************************************************************
//
// Locks both bitmaps
//
//***************************************************************************
int FAR PASCAL LockBitMapPair( BIT_MAP far * fpsBitMapA,
                    BIT_MAP far * fpsBitMapB )
{
  int iStatus;

iStatus = LockBitMap( fpsBitMapA );
  if (iStatus != 0)
  {
    return -1;
  }
  iStatus = LockBitMap( fpsBitMapB );
  if (iStatus != 0)
  {
```

/* Appendix C:   GRBITMAP.C   Page 6 */
```c
    UnlockBitMap( fpsBitMapA );
    return -2;
  }
  return 0;
}
//****************************************************************************
//
// Unlocks all the pointers for the given bitmap
// Assumes the bitmap type is given in the bitmap structure
//
//****************************************************************************
int FAR PASCAL UnlockBitMap( BIT_MAP far * sBitMap )
{
  switch (sBitMap->byBmpType)
  {
    case BMP_TYPE_RAW:
      GlobalUnlock( sBitMap->hBitmap );
      return 0;
    case BMP_TYPE_COMPRESSED:
      GlobalUnlock( sBitMap->hBitmap );
      return 0;
    case BMP_TYPE_MONOCHROME:
      GlobalUnlock( sBitMap->hBitmap );
      GlobalUnlock( sBitMap->hLineFirstHit );
      GlobalUnlock( sBitMap->hLineLastHit );
      return 0;
    case BMP_TYPE_FONT:
        case BMP_TYPE_NEWFONT:
            GlobalUnlock( sBitMap->hBitmap );
            return 0;
    default:
      return -1;
  }
}
//****************************************************************************
//
// >>> obsolete - use "LockBitMap"
//
//****************************************************************************
//
// FUNCTION: Lock up all the pointers on a monochrome bitmap
//
```

/* Appendix C:   GRBITMAP.C   Page 7 */

```c
//  RETURNS: TRUE if successful
//
//****************************************************************************
BOOL FAR PASCAL LockupMonoBitMap( BIT_MAP far * sBitMap )
{
  int iStatus;

iStatus = LockBitMap( sBitMap );
  if (iStatus != 0)
    return FALSE;
  return TRUE;
}

//****************************************************************************
//
// >>> obsolete -- use "UnLockBitMap"
//
//****************************************************************************
//
// Just release locks that may exist on the bitmap data, not the bitmap
// itself.
//
// PARAMETERS: sDestBitMap - Pointer to a bitmap structure that defines
//                           the monochrome bitmap
//
// RETURNS: TRUE if successful, FALSE if failed
//
//****************************************************************************
BOOL FAR PASCAL UnlockMonoBitMap( LPBIT_MAP sDestBitMap )
{
  UnlockBitMap( sDestBitMap );
  return TRUE;
}

//****************************************************************************
//
// >>> obsolete - use "AllocateMemoryForBitMap"
//                and a few other functions .....
//
//****************************************************************************
//
// THIS SHOULD PROBABLY BE RE-NAMED TO SOMETHING LIKE:
//
// PrepareToMakeAMonochromeBitMapFromTheSourceBitMapUsingTheSameDimensionsAs
```

/* Appendix C:   GRBITMAP.C   Page 8 */

```
// TheSourceBitMapThisMeansAllocateAndInitializeTheMonochomeBitMapMemoryAnd
// ByTheWayLeaveThePointersLockedAndWhileWereAtItCopyTheClippingRectOfThe
// SourceToTheOverlayRectOfTheNotYetCompletelyBuiltMonoBitMap
//
// (Partially) Makes a monochrome bitmap from the given bitmap.
//
// -- OK, What this really does:
//
//    - Destroys the destination bitmap.
//    - Sets the # of rows and columns of the destination the same
//      as the source
//    - Sets the overlay the same as the source clipping rect
//    - Sets noclip
//    - Sets byBmpType to Monochrome
//    - Allocates (zero-init'd) memory for a monochrome bitmap
//      and LEAVES it zero-init'd
//    - Allocates the hit lists and initializes them to (-1)
//    - Locks the globally allocated memory (v.i.a. GlobalLock)
//      and LEAVES it locked
//
// -- Fixed to handle errors correctly and release memory correctly
//
//****************************************************************************
//
//      This routine locks and allocates (if necessary) memory for the
//      monochrome bitmap. It intializes some of the structure variables.
//
//      PARAMETERS:     sDestBitMap - Pointer to a bitmap structure that will
//                                    define the monochrome bitmap.
//                      sBitMap - Pointer to the bitmap structure to use as
//                                    input.
//
//      RETURNS:   TRUE if successful, FALSE if failed
//                      If true memory has been allocated and The handle
//                                    is placed in the bitmap data structure and the
//                                    memory is locked.
//
//****************************************************************************
BOOL FAR PASCAL LockMonoBitMap( LPBIT_MAP sDestBitMap, LPBIT_MAP sBitMap
)
{
  int iStatus;

if (sDestBitMap == NULL || sBitMap == NULL)
```

```c
/* Appendix C:   GRBITMAP.C   Page 9 */
  return FALSE;

// Release so we always get cleared memory
ReleaseBitMap( sDestBitMap );
InitBtreeBitMap( sDestBitMap );

sDestBitMap->iScanLineWidth = sBitMap->iScanLineWidth;
sDestBitMap->iNumScanLines = sBitMap->iNumScanLines;
sDestBitMap->byBmpType = BMP_TYPE_MONOCHROME;
iStatus = AllocateMemoryForBitMap( sDestBitMap );
if (iStatus != 0)
{
  InitBtreeBitMap( sDestBitMap );
  return FALSE;
} sDestBitMap->rOverlay = sBitMap->rSrcClip;
SetNoClip( sDestBitMap );

return TRUE;
}
//****************************************************************************
//
// We release any and all color monochrome bitmaps that may have been
// attached to the bitmap, and release the space held for their table.
//
// PARAMETERS: sBitMap - The bitmap whose color bitmaps we wish to release
//
// NOTE:  There is potential for mutual recursion between this routine
//        and "ReleaseBitMap"
//
//****************************************************************************
void FAR PASCAL ReleaseColors( LPBIT_MAP sBitMap )
{
  int i, j;
  LPBIT_MAP sColorMono;

if ( sBitMap->hColorMono == NULL )
    return;

sBitMap->fpColors = (COLORS far *) GlobalLock( sBitMap->hColorMono );

for ( i = 0; i < NUM_COLOR_HANDLES; i++ )
```

/* Appendix C:   GRBITMAP.C   Page 10 */

```c
  {
    if ( sBitMap->fpColors->ahHandle[ i ] != NULL )
    {
      sColorMono = (LPBIT_MAP) GlobalLock( sBitMap->fpColors->ahHandle[ i ] );
      ReleaseBitMap( sColorMono );
      // We force lockcount to zero to free it
      j = GlobalFlags( sBitMap->fpColors->ahHandle[ i ] ) & GMEM_LOCKCOUNT;
      for( ; j > 0; j-- )
        GlobalUnlock( sBitMap->fpColors->ahHandle[ i ] );
      GlobalFree( sBitMap->fpColors->ahHandle[ i ] );
      sBitMap->fpColors->ahHandle[ i ] = NULL;
    }
  }
  GlobalUnlock( sBitMap->hColorMono );
  GlobalFree( sBitMap->hColorMono );
}

//*************************************************************************
//
// Releases any globally allocated memory associated with the given
// bitmap
//
// RETURNS: TRUE
//
// NOTE:  There is potential for mutual recursion between this routine
//        and "ReleaseColors"
//
// The calls to Unlock are not really necessary
//
//*************************************************************************
BOOL FAR PASCAL ReleaseBitMap( LPBIT_MAP sBitMap )
{
        if (sBitMap->hBitmap != NULL)
        {
                GlobalUnlock( sBitMap->hBitmap );   // Unlock is not really necessary
                GlobalFree( sBitMap->hBitmap );
                sBitMap->hBitmap = NULL;
                sBitMap->hpcPixels = NULL;
        }
        if (sBitMap->hLineFirstHit != NULL)
        {
                GlobalUnlock( sBitMap->hLineFirstHit );
                GlobalFree( sBitMap->hLineFirstHit );
                sBitMap->hLineFirstHit = NULL;
```

/* Appendix C:   GRBITMAP.C   Page 11 */

```
        sBitMap->fpiFirstHit = NULL;
    }
    if (sBitMap->hLineLastHit != NULL)
    {
        GlobalUnlock( sBitMap->hLineLastHit );
        GlobalFree( sBitMap->hLineLastHit );
        sBitMap->hLineLastHit = NULL;
        sBitMap->fpiLastHit = NULL;
    } if( sBitMap->byBmpType == BMP_TYPE_FONT || sBitMap->byBmpType ==
BMP_TYPE_NEWFONT )
        (void) UnlockFontStructure( sBitMap );

if (sBitMap->hColorMono)
    {
        ReleaseColors( sBitMap );
        sBitMap->hColorMono = NULL;
        sBitMap->fpColors = NULL;
    } return TRUE;
}

//*******************************************************************
//
// >>> The get/put font character routines could use this function too
//     (after it is cleaned up)
//
//*******************************************************************
//
// THIS NEEDS WORK
//
// This does not check for GlobalAlloc Failures
// This does not check for GlobalLock Failures
// This does not duplicate a bitmap of any type, (contrary to to the
//    following comments)
//
//*******************************************************************
//
// It may be necessary to duplicate a bitmap.  This routine will duplicate
// a bitmap of any type ("NOT").  It allocates memory for all the necessary
// data areas and replaces the appropriate handles in the duplicate.  This
// routine can be used to create an empty bitmap structure by calling with
```

/* Appendix C:   GRBITMAP.C   Page 12 */
```c
// a NULL pointer.
//
// Note that recursive calls to this routine may be generated while copying
// the color monochrome bitmaps of a raw bitmap.
//
// PARAMETERS: sBitMap - the bitmap we wish to duplicate. if sBitMap
//                       is NULL we return handle to empty structure
//
// RETURNS: TRUE if successful completion, else FALSE
//
//**************************************************************************
BOOL FAR PASCAL MakeDuplicateBitmap( LPBIT_MAP sDupBmp, LPBIT_MAP sBitMap
)
{
 LPBIT_MAP sColorBmp;
 LPBIT_MAP sWorkBmp;
 int i;
 char huge *hpcDest;
 char huge *hpcSrce;

// Release any old stuff and clear to zeros
 ReleaseBitMap( sDupBmp );
 _fmemset( (char far *) sDupBmp, 0, sizeof( BIT_MAP ) );

// If NULL we must create and return an empty bitmap (SAY WHAT ???)
 if (sBitMap == NULL)
   return TRUE;

// Copy the structure itself
 _fmemcpy( (char far *) sDupBmp, (char far *) sBitMap, sizeof( BIT_MAP ) );
 sDupBmp->hColorMono = 0;
 sDupBmp->fpColors = NULL;

// Duplicate the bitmap data
 if( sBitMap->hBitmap != NULL )
 {
   sBitMap->hpcPixels = GlobalLock( sBitMap->hBitmap );
   sDupBmp->hBitmap = GlobalAlloc( GMEM_SHARE | GMEM_MOVEABLE,
sBitMap->dwBitMapSize );
   if( sDupBmp->hBitmap == NULL )  // Return immediately if no mem avail
   {
     return FALSE;
   }
   sDupBmp->hpcPixels = GlobalLock( sDupBmp->hBitmap );
```

```c
/* Appendix C:  GRBITMAP.C  Page 13 */

// If less than a segment of data we can use fast copy
if( sBitMap->dwBitMapSize < 0xffff )
   _fmemcpy( (char far *) sDupBmp->hpcPixels,
            (char far *) sBitMap->hpcPixels,
            (WORD) sBitMap->dwBitMapSize );
// Have to use the slow Huge array copy
else
{
     hpcSrce = sBitMap->hpcPixels;
     hpcDest = sDupBmp->hpcPixels;
     hmemcpy( hpcDest, hpcSrce, sBitMap->dwBitMapSize );

// for( dwi = 0; dwi < sBitMap->dwBitMapSize; dwi++ )
  //       *hpcDest++ = *hpcSrce++;

}
 GlobalUnlock( sBitMap->hBitmap );
 GlobalUnlock( sDupBmp->hBitmap );
}

// COMPRESSED DATA
if( sBitMap->byBmpType == BMP_TYPE_COMPRESSED )
{
 // Duplicate color map
 if( sBitMap->hColorMono != NULL )
 {
    sDupBmp->hColorMono = GlobalAlloc( GMEM_SHARE | GMEM_MOVEABLE |
GMEM_ZEROINIT, sizeof( COLORS ) );
    if( sDupBmp->hColorMono == NULL )
    {
      GlobalFree( sDupBmp->hBitmap );
      return FALSE;
    }
    sDupBmp->fpColors = (COLORS far *) GlobalLock( sDupBmp->hColorMono );
    sBitMap->fpColors = (COLORS far *) GlobalLock( sBitMap->hColorMono );
    for( i = 0; i < NUM_COLOR_HANDLES; i++ )
      if( sBitMap->fpColors->ahHandle[ i ] != NULL )
      {
        sColorBmp = (LPBIT_MAP) GlobalLock( sBitMap->fpColors->ahHandle[ i ] );
        sDupBmp->fpColors->ahHandle[ i ] = GlobalAlloc( GMEM_SHARE |
GMEM_MOVEABLE | GMEM_ZEROINIT, sizeof(BIT_MAP) );
        sWorkBmp = (LPBIT_MAP) GlobalLock( sDupBmp->fpColors->ahHandle[ i ] );
        MakeDuplicateBitmap( sWorkBmp, sColorBmp );
        GlobalUnlock( sBitMap->fpColors->ahHandle[ i ] );
```

```c
/* Appendix C:   GRBITMAP.C   Page 14 */
          GlobalUnlock( sDupBmp->fpColors->ahHandle[ i ] );
      }
      GlobalUnlock( sDupBmp->hColorMono );
      GlobalUnlock( sBitMap->hColorMono );
    }
  }

// MONOCHROME
  if( sBitMap->byBmpType == BMP_TYPE_MONOCHROME )
  {
    if( sBitMap->hLineFirstHit != NULL )
    {
      sBitMap->fpiFirstHit = (int far *) GlobalLock( sBitMap->hLineFirstHit );
      sDupBmp->hLineFirstHit = GlobalAlloc( GMEM_SHARE | GMEM_MOVEABLE,
mBMP_HEIGHT( sBitMap ) * sizeof( int ) );
      sDupBmp->fpiFirstHit = (int far *) GlobalLock( sDupBmp->hLineFirstHit );
      _fmemcpy( (char far *) sDupBmp->fpiFirstHit,
                (char far *) sBitMap->fpiFirstHit,
                mBMP_HEIGHT( sBitMap ) * sizeof( int ) );
      GlobalUnlock( sBitMap->hLineFirstHit );
      GlobalUnlock( sDupBmp->hLineFirstHit );
    }
    if( sBitMap->hLineLastHit != NULL )
    {
      sBitMap->fpiLastHit = (int far *) GlobalLock( sBitMap->hLineLastHit );
      sDupBmp->hLineLastHit = GlobalAlloc( GMEM_SHARE | GMEM_MOVEABLE,
mBMP_HEIGHT( sBitMap ) * sizeof( int ) );
      sDupBmp->fpiLastHit = (int far *) GlobalLock( sDupBmp->hLineLastHit );
      _fmemcpy( (char far *) sDupBmp->fpiLastHit,
                (char far *) sBitMap->fpiLastHit,
                mBMP_HEIGHT( sBitMap ) * sizeof( int ) );
      GlobalUnlock( sBitMap->hLineLastHit );
      GlobalUnlock( sDupBmp->hLineLastHit );
    }
  } return TRUE;
}
//***********************************************************************
//
// >>> obsolete
//
// (does not work as advertised anyway)
```

```c
/* Appendix C:   GRBITMAP.C   Page 15 */
//
//**************************************************************************
//
// Sets the clipping area of a bitmap
//
// The clipping area must be within the bounds of the given bitmap
// and this routine will enforce that fact
//
// PARAMETERS:  sBitMap - Pointer to the bitmap
//              iL - Left clip boundary
//              iT - Top clip boundary
//              iR - Right clip boundary
//              iB - Bottom clip boundary
//
//**************************************************************************
*
void FAR PASCAL SetClipArea( LPBIT_MAP sBitMap, int iL, int iT, int iR, int iB )
{
  sBitMap->rSrcClip.left = max( 0, iL );
  sBitMap->rSrcClip.top = max( 0, iT );
  sBitMap->rSrcClip.right = min( iR, mBMP_WIDTH( sBitMap ) - 1 );
  sBitMap->rSrcClip.bottom = min( iB, mBMP_HEIGHT( sBitMap ) - 1 );
}

//**************************************************************************
//
// Set the clipping rectangle of the bitmap to the given rectangle
//
//**************************************************************************
void FAR PASCAL SetClip( BIT_MAP far * fpsBitMap, RECT rcClippingRect )
{
  fpsBitMap->rSrcClip = rcClippingRect;
}

//**************************************************************************
//
// Clears the clipping rectangle to no clip - this means the clipping
// rectangle is made the same as the bitmap dimensions
//
//**************************************************************************
void FAR PASCAL SetNoClip( BIT_MAP far * fpsBitMap )
{
  fpsBitMap->rSrcClip.top = 0;
  fpsBitMap->rSrcClip.left = 0;
```

```c
/* Appendix C:  GRBITMAP.C  Page 16 */ fpsBitMap->rSrcClip.bottom = max( 0, (fpsBitMap->iNumScanLines - 1) );
  fpsBitMap->rSrcClip.right  = max( 0, (fpsBitMap->iScanLineWidth - 1) );
}

//*********************************************************************
//
// Return TRUE if the clipping region is valid for the given bitmap
//
//*********************************************************************
BOOL FAR PASCAL BitMapHasLegalClippingRect( BIT_MAP far * fpsBitMap )
{
  return( (fpsBitMap->rSrcClip.left >= 0)
       && (fpsBitMap->rSrcClip.right >= fpsBitMap->rSrcClip.left)
       && (fpsBitMap->rSrcClip.right < fpsBitMap->iScanLineWidth)
       && (fpsBitMap->rSrcClip.top >= 0)
       && (fpsBitMap->rSrcClip.bottom >= fpsBitMap->rSrcClip.top)
       && (fpsBitMap->rSrcClip.bottom < fpsBitMap->iNumScanLines) );
}

//*********************************************************************
//
// Given a B-tree bit map, count the number of pixels of each color
// and put the counts in the DWORD array.
//
// For raw or compressed B-tree bit maps, the doubleword array
// should be 256 doublewords long.
//
// For monochrome bitmaps, the doubleword array should be 2 doublewords
// long.
//
// RETURNS: a status
//
//*********************************************************************
int FAR PASCAL CountPixels( BIT_MAP far * sBitMap,
                DWORD far * dwRefTable )
{
  int iStatus;
  WORD i, j;
  WORD wBitsPerPixel;
  WORD wRefTableEntries;
  BYTE huge * hpbyPixels;
  WORD huge * hpwPixels;
  WORD wScanLineByteCount;
  WORD wRLEPair;
```

```c
/* Appendix C:   GRBITMAP.C   Page 17 */
BYTE byCount;
BYTE byColor;
DWORD dwOffset;

if (sBitMap == NULL || dwRefTable == NULL)
  return -1;

switch (sBitMap->byBmpType)
{
  case BMP_TYPE_RAW:
    wBitsPerPixel = 8;
    break;
  case BMP_TYPE_COMPRESSED:
    wBitsPerPixel = 8;
    break;
  case BMP_TYPE_MONOCHROME:
    wBitsPerPixel = 1;
    break;
  default:
    return -2;
} wRefTableEntries = 0x0001 << wBitsPerPixel;

for (i=0;i<wRefTableEntries;i++)
{
  dwRefTable[i] = 0L;
} iStatus = LockBitMap( sBitMap );
if (iStatus != 0)
  return -3;

hpbyPixels = (BYTE huge *) hpwPixels = sBitMap->hpcPixels;

iStatus = 0;

switch (sBitMap->byBmpType)
{
  case BMP_TYPE_RAW:
    for (i=0; (int) i<sBitMap->iNumScanLines;i++)
    {
      for (j=0; (int) j<sBitMap->iScanLineWidth;j++)
      {
```

```c
/* Appendix C:   GRBITMAP.C   Page 18 */ byColor = *hpbyPixels++;
      dwRefTable[ byColor ]++;
    }
  }
  break;
case BMP_TYPE_COMPRESSED:
  for (i=0; (int) i<sBitMap->iNumScanLines;i++)
  {
    wScanLineByteCount = *hpwPixels++;
    for (j=0; j<wScanLineByteCount;j++)
    {
      wRLEPair = *hpwPixels++;
      byCount = HIBYTE( wRLEPair );
      byColor = LOBYTE( wRLEPair );
      dwRefTable[ byColor ] += (DWORD) byCount;
    }
  }
  break;
case BMP_TYPE_MONOCHROME:
  // This is not the most efficient .....
  dwOffset = 0;
  for (i=0; (int) i<sBitMap->iNumScanLines;i++)
  {
    for (j=0; (int) j<sBitMap->iScanLineWidth;j++)
    {
      if mTESTBIT( dwOffset, hpbyPixels )
        byColor = 1;
      else
        byColor = 0;
      dwRefTable[ byColor ]++;
      dwOffset++;
    }
  }
  break;
default:
  iStatus = -4;
  break;
}

UnlockBitMap( sBitMap );

return iStatus;
}
```

```c
/* Appendix C:   GRBITMAP.C   Page 19 */
//****************************************************************************
//
// Given a pointer to a B-tree bit map structure (compressed format)
// compute a boolean array (0 .. 255). Each index into the boolean
// array also refers also a color index (or pixel color value) used
// in the given bit map structure. The boolean array element is set
// to TRUE if and only if the corresponding color index is referenced
// (used) in the given bit map structure.
//
// RETURNS: the number of referenced colors in the compressed bit map
//
//****************************************************************************
int FAR PASCAL GetReferencedColors( BIT_MAP far * sBitMap,
                       BYTE far * RefTable )
{
  int iStatus;
  DWORD dwRefTable[256];
  int i, n;

for (i=0;i<256;i++)
    RefTable[i] = 0;

iStatus = CountPixels( sBitMap, &dwRefTable[0] );
  if (iStatus != 0)
    return 0;

for (i=0,n=0;i<256;i++) // Count the Number of Colors Referenced
  {
    if (dwRefTable[i] != 0)
    {
      RefTable[i] = 1;
      n++;
    }
    else
    {
      RefTable[i] = 0;
    }
  } return n;
}

//****************************************************************************
//
```

```c
/* Appendix C:   GRBITMAP.C   Page 20 */

// Return a huge pointer to the begining of the compressed data for
// the given line of the given compressed bitmap
//
// The pointer will point at the word count which indicates the number
// of RLE pairs to follow
//
// COMPRESSED SCANLINE FORMAT:
//
// <word-count> <RLE-pair> <RLE-pair> ... <RLE-pair>
//
//*********************************************************************
WORD huge * FAR PASCAL GetRLELineAddress( WORD wLine, BIT_MAP far * sBitMap
)
{
  WORD huge * hpwAddr;
  int i;

if (sBitMap->byBmpType != BMP_TYPE_COMPRESSED)
    return NULL;

hpwAddr = (WORD huge *) sBitMap->hpcPixels;

for (i=0; (WORD) i<wLine; i++)
    hpwAddr = hpwAddr + *hpwAddr + 1;

return hpwAddr;
}

//*********************************************************************
//
// hpwAddr points to the begining of a line of RLE compressed data
// (it points at the word count which indicates the number of RLE
//  pairs to follow)
//
// This function will return a pointer to the begining of the next
// line of compressed data
//
// Assumes the next line of RLE data immediately follows the given
// line of RLE data
//
//*********************************************************************
WORD huge * FAR PASCAL GetNextRLELineAddress( WORD huge * hpwAddr )
{
  return (hpwAddr + *hpwAddr + 1);
```

/* Appendix C:   GRBITMAP.C   Page 21 */
}
//**********************************************************************
//
// >>> obsolete
//
// >>> dangerous & not re-entrant
//
// >>> this is dangerous and not re-entrant and should be obsoleted
//     there is no reason that the calling routine cannot keep
//     track of this "cached" data itself -- we could even write
//     a function called "GetNextRLELineAddress" for them
//
//**********************************************************************
//
// Calculates the address of the run length encoded scan line.
//
// The pointer will point at a word count which indicates the number
// of RLE pairs to follow
//
// NOTE: A dependency exists on expecting a zero in first byte of the
//       the bitmap being passed into this routine, use with caution.
//       ("NOT")
//
// PARAMETERS: sBitMap - Pointer to the bitmap
//             wLine   - the line number we need the address of
//                       if wLine = 0xffff we flush the cache
//
//**********************************************************************
WORD huge * FAR PASCAL RLELineAddress( WORD wLine, LPBIT_MAP sBitMap )
{
  // Maintain a simple cache to speed up location of next line
  static LPBIT_MAP sOldBitMap = NULL;
  static WORD huge *hpwAddr;
  static short int iPrevLine = -1;
  short int i;

// Check for cache flush requested and do so if asked
  if (wLine == 0xffff)
  {
    sOldBitMap = NULL;
    iPrevLine = -1;
    return NULL;
  }
```

/* Appendix C: GRBITMAP.C Page 22 */

```c
// Dont traverse if just getting the next line
if (sBitMap != sOldBitMap || (int) wLine != (iPrevLine + 1))
{
  hpwAddr = (WORD huge *) sBitMap->hpcPixels;
  for (i = 0; i < (int) wLine; i++)
    hpwAddr = hpwAddr + *hpwAddr + 1;
}
else
{
  hpwAddr = hpwAddr + *hpwAddr + 1;
} iPrevLine = (int) wLine;
sOldBitMap = sBitMap;
return hpwAddr;
}

//*********************************************************************
//
// Given a pointer to some RLE data (the pointer points at the first RLE
// pair)
//
// Find the RLE pair that defines the pixel given by iCol
//
// Modify the <byCount> of RLE pair such that the pixel given by iCol
// is the first pixel defined by the RLE pair
//
// RETURNS: the RLE pair
//          (and the pointer is advanced to the following pair)
//
//*********************************************************************
WORD FAR PASCAL GetAndModifyFirstRLEPair( WORD huge * far * fphpwRLEData,
WORD iCol )
{
  WORD huge * hpwTemp;
  WORD wNextPairStartCol;
  WORD wRLEPair;
  BYTE byCount, byColor;

hpwTemp = *fphpwRLEData;

// Get the RLE pair that defines the given source pixel
  wNextPairStartCol = 0;
```

/* Appendix C: GRBITMAP.C  Page 23 */

```
while (wNextPairStartCol <= iCol)   // Always taken at least once
{
  wRLEPair = *hpwTemp++;
  wNextPairStartCol += HIBYTE(wRLEPair);
}

// POSSIBLY MODIFY THE FIRST RLE PAIR
// (wNextPairStartCol - iSourceCol) gives the number of pixels
// to use out of the first RLE pair
byCount = HIBYTE( wRLEPair );
byColor = LOBYTE( wRLEPair );
byCount = (BYTE) min( byCount, wNextPairStartCol - iCol );
wRLEPair = (byCount << 8) | (byColor);

*fphpwRLEData = hpwTemp;

return wRLEPair;
}

//*************************************************************************
//
// >>> obsolete
//
// >>> This thing calls the "dangerous" version of RLELineAddress
//     It should also be obsoleted - it is also extremely slow
//
//*************************************************************************
//
// Returns the pixel color of the given row and column of the given
// compressed bitmap
//
// Ready to be obsoleted - not called internally
//
//*************************************************************************
//    A pixel is defined by its color and position.  This routine returns
//    the pixels color given it's position.
//
//    It is assumed that the global memory has been locked for this bitmap.
//
//    PARAMETERS:    iCol - Offset into the scan line
//                   iScanLine - Scanline number
//                   sBitMap - pointer to the compressed bitmap we are
//                                interested in
//
```

```
/* Appendix C:   GRBITMAP.C    Page 24 */
//      RETURNS:    The raw pixel color as captured by the graphics board.
//
//*********************************************************************
BYTE FAR PASCAL GetBmpPixel( int iCol, int iScanLine, LPBIT_MAP sBitMap )
{
  WORD huge * hpwPixels;
  int iColCount = 0;

hpwPixels = RLELineAddress( iScanLine, sBitMap );

// Find the run length that starts the clipping region
  while( iColCount <= iCol )
    iColCount += *( ++hpwPixels ) >> 8;

// Return the color associated with this run length
  return LOBYTE( *hpwPixels );
}

//*********************************************************************
//      This routine returns the number of pixels of a given color in a given
//      rectangular region of a bitmap
//
//      It is assumed that the global memory has been locked for this bitmap.
//
//      PARAMETERS:     bColor - Color of pixels to be counted
//                      iCol - Offset into the scan line
//                      iScanLine - Scanline number
//                      iColWidth - width of rectangle
//                      iScanLineHeight - height of rectangle
//                      sBitMap - pointer to the compressed bitmap we are interested in
//
//      RETURNS:    The number of pixels counted or error condition.
//
//********************************************************************* long FAR PASCAL GetPixelCount( BYTE bColor, UINT iCol, UINT iScanLine, UINT
iColWidth, UINT iScanLineHeight, LPBIT_MAP sBitMap )
{
  WORD huge * hpwPixels;
  BYTE huge * hpbyPixels;
  WORD i, j;
  DWORD dwOffset;
  int iColCount = 0;
```

/* Appendix C:   GRBITMAP.C   Page 25 */

```c
int iLineCount = 0;
long lPixelCount = 0;

// Do Pat's short-cut for searching the whole bitmap
if ((iColWidth == 0) && (iScanLineHeight == 0) &&
    (iCol ==0) && (iScanLine == 0))
{
  iColWidth = sBitMap->iScanLineWidth;
  iScanLineHeight = sBitMap->iNumScanLines;
}

// Return 0 if area is 0
if ((iColWidth == 0) || (iScanLineHeight == 0))
  return (0L);

// If clip region is too big
if (((iCol+iColWidth) > sBitMap->iScanLineWidth) ||
    ((iScanLine+iScanLineHeight) > sBitMap->iNumScanLines))
      return (-1);

switch (sBitMap->byBmpType)
{
  case BMP_TYPE_RAW:
    hpbyPixels = sBitMap->hpcPixels;
    for (i=0; (int) i<sBitMap->iNumScanLines;i++)
    {
      for (j=0; (int) j<sBitMap->iScanLineWidth;j++)
      {
        if (*hpbyPixels == bColor)
            if (((iCol+iColWidth) > j) && (iCol <= j) &&
                ((iScanLine+iScanLineHeight) > i) && (iScanLine <= i))
              lPixelCount++;
          hpbyPixels++;
      }
    }
    break;

case BMP_TYPE_MONOCHROME:
    // This is not the most efficient .....
    dwOffset = 0;
    hpbyPixels = sBitMap->hpcPixels;
    for (i=0; (int) i<sBitMap->iNumScanLines;i++)
    {
      for (j=0; (int) j<sBitMap->iScanLineWidth;j++)
```

/* Appendix C:   GRBITMAP.C   Page 26 */

```c
    {
      if (mTESTBIT( dwOffset, hpbyPixels ) == bColor)
          if (((iCol+iColWidth) > j) && (iCol <= j) &&
              ((iScanLine+iScanLineHeight) > i) && (iScanLine <= i))
            lPixelCount++;
      dwOffset++;
    }
  }
  break;

case BMP_TYPE_COMPRESSED:
      // Find the scan line that starts the clipping region
      hpwPixels = RLELineAddress( iScanLine, sBitMap );
      hpwPixels++; // skip line word count // Find the run length that starts the clipping region
      while( (iColCount + (*( hpwPixels ) >> 8)) < iCol )
        iColCount += *( hpwPixels++ ) >> 8;

// For each scan line
      while (iLineCount < iScanLineHeight)
      {
      // Do run lengths that aren't partially clipped
            while ((iCol+iColWidth) >= (iColCount+(*hpwPixels >> 8)))
            {
              if (LOBYTE( *hpwPixels ) == bColor)
              {
                lPixelCount += *hpwPixels >> 8;
                if (iCol > iColCount)
                  lPixelCount -= (iCol - iColCount);
              }
              iColCount += *hpwPixels >> 8;
              hpwPixels++;
            }

// If clipping region ended in the middle of a run length
            if (LOBYTE( *hpwPixels ) == bColor)
              if ((iCol+iColWidth) > iColCount)
              {
                lPixelCount += iCol + iColWidth - iColCount;
                if (iCol > iColCount)
                  lPixelCount -= iCol - iColCount;
              }
```

```c
/* Appendix C:   GRBITMAP.C   Page 27 */ iLineCount++;
            hpwPixels = RLELineAddress( iScanLine+iLineCount, sBitMap );
        hpwPixels++; // skip line word count
                iColCount = 0;
                while( (iColCount + (*( hpwPixels ) >> 8)) < iCol )
                    iColCount += *( hpwPixels++ ) >> 8;
        }
        break;
    }

// Return the number of pixels found to match bColor
    return lPixelCount;
}

//*************************************************************************
//
// >>> I think this is the same as "UnCompressData" but I don't dare
//     change it just yet .....
//
// (it is not called anywhere within the graphics DLL)
//
//*************************************************************************
//      ExpandCompressedLine
//
//      Expands a line of compressed data to uncompressed format.
//
//      PARAMETERS:     fpcDestLine - points to the data area which will take the
//                                    uncompressed data
//                      hpwSrcLine - points to the source data
//      It is assumed the output area is large enough to contain the output.
//
//      RETURNS:   TRUE if successful, else FALSE
//
//*************************************************************************
**
BOOL FAR PASCAL ExpandCompressedLine( char far * fpcDestLine, WORD huge *
hpwSrcLine )
{
        int i, j, iLineLen;

iLineLen = *( hpwSrcLine++ );        // Save the number of data words
        for( i = 0; i < iLineLen; i++, hpwSrcLine++ )
                for( j = 0; j < HIBYTE( *hpwSrcLine ); j++ )
```

/* Appendix C:   GRBITMAP.C   Page 28 */

```
        *( fpcDestLine++ ) = LOBYTE( *hpwSrcLine );

return TRUE;
}
//***************************************************************
//
// >>> I think this is the same as "CompressData" but I don't dare
//     change it just yet .....
//
// (it is called at least once from cardintf.c)
//
//***************************************************************
//      CompressBitmapLine
//
//      Takes a line of uncompressed data and converts it to a line of
//      compressed data.
//
//      PARAMETERS:     hpwDestLine - points to area the compressed data should be placed
//                      fpcSrcLine - points to the uncompressed data.
//                      iLen    - contains the length of the source line
//      It is assummed the destination area is large enough to contain the resulting
//      compressed line.
//
//      RETURNS:   TRUE if successful, else FALSE
//
//*****************************************************************
BOOL FAR PASCAL CompressBitmapLine( WORD huge * hpwDestLine, char far * fpcSrcLine, int iLen )
{
    int i, j, iCount;
    BYTE byColor;

for( i = 0, iCount = 0, hpwDestLine[ 0 ] = 0; i <= iLen - 1; ) {
        byColor = fpcSrcLine[ i ];

// Count the number of contiguous pixels with same color
        j = 0;
        while( (j + i) <= iLen - 1 ) {
            if( byColor != fpcSrcLine[ j + i ] ) {
                j = ( ( j == 0 ) ? 1 : j );
                break;
```

/* Appendix C:   GRBITMAP.C   Page 29 */

```
                        }
                        j++;
                }
                i += j;

// We must break into byte sized chunks, since compression counter is a byte
                if( j > 255 ) {
                        while( j > 255 ) {
                                hpwDestLine[ 0 ]++;
                                hpwDestLine[ ++iCount ] = ( (WORD) ( byColor ) ) | (
(WORD) 255  << 8 );
                                j -= 255;
                        } hpwDestLine[ 0 ]++;
                        hpwDestLine[ ++iCount ] = ( (WORD) ( byColor ) ) | ( j << 8 );
                }
                else {
                        hpwDestLine[ 0 ]++;
                        hpwDestLine[ ++iCount ] = ( (WORD) ( byColor ) ) | ( j  << 8 );
                }

} return TRUE;
}
//*********************************************************************
//      CompressBitmapLineHugeSrc
//
//      The only difference between this and CompressBitmapLineHugeSrc is that
//   this works with a HUGE pointer and is thus quited a bit slower.
//
//      Takes a line of uncompressed data and converts it to a line of
//      compressed data where the source is passed as a HUGE pointer.
//
//      PARAMETERS:     hpwDestLine - points to area the compressed data should be
placed
//                              hpcSrcLine - points to the uncompressed data.
//                              iLen    - contains the length of the source line
//      It is assummed the destination area is large enough to contain the resulting
//      compressed line.
//
//      RETURNS:  TRUE if successful, else FALSE
```

/* Appendix C: GRBITMAP.C Page 30 */
```
//
//******************************************************************************
**
BOOL FAR PASCAL CompressBitmapLineHugeSrc( WORD huge * hpwDestLine, char huge
* hpcSrcLine, int iLen )
{
        int i, j, iCount;
        BYTE byColor;

for( i = 0, iCount = 0, hpwDestLine[ 0 ] = 0; i <= iLen - 1; ) {
                byColor = hpcSrcLine[ i ];

// Count the number of contiguous pixels with same color
                j = 0;
                while( (j + i) <= iLen - 1 ) {
                        if( byColor != hpcSrcLine[ j + i ] ) {
                                j = ( ( j == 0 ) ? 1 : j );
                                break;
                        }
                        j++;
                }
                i += j;

// We must break into byte sized chunks, since compression counter is a byte
                if( j > 255 ) {
                        while( j > 255 ) {
                                hpwDestLine[ 0 ]++;
                                hpwDestLine[ ++iCount ] = ( (WORD) ( byColor ) ) | ( (WORD) 255 << 8 );
                                j -= 255;
                        } hpwDestLine[ 0 ]++;
                        hpwDestLine[ ++iCount ] = ( (WORD) ( byColor ) ) | ( j << 8 );
                }
                else {
                        hpwDestLine[ 0 ]++;
                        hpwDestLine[ ++iCount ] = ( (WORD) ( byColor ) ) | ( j << 8 );
                }

}
```

/* Appendix C: GRBITMAP.C Page 31 */

```c
    return TRUE;
}

//*********************************************************************
//
// RLE compress the data at p (the data at p is just a string of bytes)
// and put the results of this RLE compression at location q. The data
// is interpreted as multiple lines (or rows) of a given width as given
// by the wNumRows and wNumCols parameters
//
// For each line (row) the compressed format is:
//
// <word count> <RLE word> <RLE word> ... <RLE word>
//
// The word count for the line (row) does NOT include itself
//
// RETURNS: the total number of WORDS in the compressed data
//
//*********************************************************************
DWORD FAR PASCAL CompressData( BYTE huge * p,
                               WORD huge * q,
                               WORD wNumRows,
                               WORD wNumCols )
{
  WORD wRow, wCol;
  WORD huge * hpBeginLine;
  WORD wWordCount;
  BYTE byCurrentColor;
  WORD wRepeatCount;
  DWORD dwSize = 0;  // Size in words if ((wNumRows == 0) || (wNumCols == 0))
  {
    return dwSize;
  } for (wRow=0;wRow<wNumRows;wRow++)
  {
    hpBeginLine = q++;
    wWordCount = 0;
    wCol = 0;
    while (wCol < wNumCols)
    {
      byCurrentColor = *p++;
```

```c
/* Appendix C:   GRBITMAP.C    Page 32 */ wRepeatCount = 1;
      wCol++;
      while ((wCol < wNumCols) && (*p == byCurrentColor) && (wRepeatCount<255))
      {
        wRepeatCount++;
        p++;
        wCol++;
      }
      *q++ = (wRepeatCount << 8) | (WORD) (byCurrentColor);
      wWordCount++;
    }
    *hpBeginLine = wWordCount;
    dwSize = dwSize + wWordCount + 1;  // 1 more word for the count field
  } return dwSize;
}

//*************************************************************************
//
// Uncompress the RLE compressed data at location p and put the
// results at location q.  The number of rows (lines) of RLE data
// is given and it is assumed that all the RLE data is contigious.
//
// For each line (row) the compressed format is:
//
// <word count> <RLE word> <RLE word> ... <RLE word>
//
// The word count for the line (row) does NOT include itself
//
//*************************************************************************
void FAR PASCAL UnCompressData( WORD huge * p,
                                BYTE huge * q,
                                WORD wNumRows )
{
  WORD i, j, k, wScanLineByteCount, wRLEPair;

for (i=0;i<wNumRows;i++)
  {
    wScanLineByteCount = *p++;
    for (j=0;j<wScanLineByteCount;j++)
    {
      wRLEPair = *p++;
      for (k=0;k<HIBYTE(wRLEPair);k++)
```

```c
/* Appendix C:   GRBITMAP.C   Page 33 */
        {
          *q++ = LOBYTE( wRLEPair );
        }
      }
    }
  }
}
//****************************************************************************
//
// Computes the size of a compressed bitmap
//
// Traverses the compressed bitmap's data, counting up the total number of
// bytes used along the way.
//
// Compressed bitmaps only.
//
// RETURNS: the number of bytes used by the compressed bitmap
//          (not necessarily the same as the amount of memory allocated)
//
//****************************************************************************
DWORD FAR PASCAL ComputeBitMapSize( BIT_MAP far * sBitMap )
{
  int iStatus;
  short int i, j;
  WORD huge * hpwPixels;
  short int wScanLineByteCount;
  WORD wRLEPair;
  DWORD dwCount;

if (  (sBitMap == NULL)
     || (sBitMap->byBmpType != BMP_TYPE_COMPRESSED)
     || (sBitMap->hBitmap == NULL) )
    return 0;

iStatus = LockBitMap( sBitMap );
  if (iStatus != 0)
    return 0;

hpwPixels = (WORD huge *) sBitMap->hpcPixels;

dwCount = 0;

// TRAVERSE THE COMPRESSED DATA
```

/* Appendix C:   GRBITMAP.C   Page 34 */

```c
for (i=0;i<sBitMap->iNumScanLines;i++)
{
  wScanLineByteCount = *hpwPixels++;
  dwCount += 2;
  for (j=0;j<wScanLineByteCount;j++)
  {
    wRLEPair = *hpwPixels++;
    dwCount += 2;
  }
}

UnlockBitMap( sBitMap );

return dwCount;
}

//*************************************************************************
//
// FUNCTION:
//
// Check a compressed bitmap for "consistancy". i.e. the number of
// pixels on each line should be equal to that defined by the BIT_MAP
// structure.  Unfortunatelly, a few bit maps have been created
// with this inconsistancy in their data structure, and they can
// lead to all sorts of problems -- like U.A.E.'s when calling some
// of the functions in this library.
//
// Traverses the compressed bitmap's data, counting up the total number of
// pixels on each scan line. After each scan line has been traversed,
// verify that the number of pixels is equal to the scan line width as
// given in the BIT_MAP structure.
//
// RETURNS:  status 0 - Ok
//           status 1 - There were fewer pixels on a line than were
//                      specified by the BIT_MAP structure
//           status 2 - There were more pixels on a line than were
//                      specified by the BIT_MAP structure
//
// Compressed bitmaps only.
//
//*************************************************************************
WORD FAR PASCAL CheckBmpForConsistancy( BIT_MAP far * sBitMap )
{
  int iStatus;
```

/* Appendix C: GRBITMAP.C   Page 35 */

```
short int i, j, k, wScanLineByteCount, wRLEPair, wPixelCount;
WORD huge * p;
WORD wStatus = 0;

if (  (sBitMap == NULL)
   || (sBitMap->byBmpType != BMP_TYPE_COMPRESSED)
   || (sBitMap->hBitmap == NULL) )
  return 0;

iStatus = LockBitMap( sBitMap );
if (iStatus != 0)
  return 0;

p = (WORD huge *) sBitMap->hpcPixels;

// TRAVERSE THE COMPRESSED DATA for (i=0;i<sBitMap->iNumScanLines;i++)
{
  wScanLineByteCount = *p++;
  wPixelCount = 0;
  for (j=0;j<wScanLineByteCount;j++)
  {
    wRLEPair = *p++;
    for (k=0;k<HIBYTE(wRLEPair);k++)
    {
      wPixelCount++;
    }
  }
  if (wPixelCount < sBitMap->iScanLineWidth)
  {
    wStatus = 1;
    goto EXIT;
  }
  else if (wPixelCount > sBitMap->iScanLineWidth)
  {
    wStatus = 2;
    goto EXIT;
  }
}

EXIT:

UnlockBitMap( sBitMap );
```

/* Appendix C:   GRBITMAP.C   Page 36 */

```
    return wStatus;
}
//*******************************************************************
//
// >>> WARNING: unreliable .....
//
// >>> Obsolete
//
//*******************************************************************
// THIS THING PROBABLY FAILS IF THE LINE LENGTH IS NOT A MULTIPLE OF 2
//
//      SetmonochromeLine
//
//      A long continuous row of bits in the monochrome bit map may be set
//      more quickly with this high speed routine, rather than doing a
//      bit at a time.
//
//      PARAMETERS: sBitMap - Pointer to the bitmap structure to use
//                  iLine - the line in the bitmap that we are to set
//                  iOffs - the offset into the line to start
//                  iCount - the number of pixels to set
//          Memory is assumed to be locked.
//
//*******************************************************************

// Table of Masks for 'Or' depending on position count
static char acBegTbl[8] = { 0x00, 0x7f, 0x3f, 0x1f, 0x0f, 0x07, 0x03, 0x01 };

void FAR PASCAL SetMonochromeLine( LPBIT_MAP sBitMap, int iLine, int iOffs, int
iCount )
{
        char far *fpcPixels;
        char huge *hpcPixels;
        int i;

if( sBitMap->dwBitMapSize > 65534L )
        {
                // Calc address of start of line
                hpcPixels =
                        &sBitMap->hpcPixels[( (DWORD ) mBMP_WIDTH( sBitMap ) * iLine
) >> 3 ];
```

```c
/* Appendix C:   GRBITMAP.C    Page 37 */

// Only use other method if we have a long run of pixels
            if( iCount < 17 )
            {
                    for( i = 0; i < iCount; i++ )
                            mSETBIT( i + iOffs, hpcPixels );
                    return;
            } hpcPixels += ( iOffs >> 3 );           // Increment by offset ( in bytes )
            // Set fraction of byte at beginning of line
            if( iOffs & 0x07 )
            {
                    *hpcPixels++ |= acBegTbl[ iOffs & 0x07 ];
                    iCount -= 8 - ( iOffs & 0x07 );
            } for( i = 0; i < ( iCount >> 3 ); i++ )
                    *( hpcPixels++ ) = (char) 0xff;

// Set fraction of byte at end of line
            if( iCount & 0x07 )
                    *hpcPixels |= ~acBegTbl[ iCount & 0x07 ];
    }
    else
    {
            // Calc address of start of line
            fpcPixels = (char far *)
                    &sBitMap->hpcPixels[( (DWORD ) mBMP_WIDTH( sBitMap ) * iLine
) >> 3 ];

// Only use other method if we have a long run of pixels
            if( iCount < 17 )
            {
                    for( i = 0; i < iCount; i++ )
                            mSETBIT( i + iOffs, fpcPixels );
                    return;
            } fpcPixels += ( iOffs >> 3 );           // Increment by offset ( in bytes )
            // Set fraction of byte at beginning of line
            if( iOffs & 0x07 )
            {
                    *fpcPixels++ |= acBegTbl[ iOffs & 0x07 ];
                    iCount -= 8 - ( iOffs & 0x07 );
```

```
/* Appendix C:  GRBITMAP.C  Page 38 */
        } for( i = 0; i < ( iCount >> 3 ); i++ )
            *( fpcPixels++ ) = (char) 0xff;

// Set fraction of byte at end of line
        if( iCount & 0x07 )
            *fpcPixels |= ~acBegTbl[ iCount & 0x07 ];
    }
}

//*****************************************************************************
//
// >>> WARNING: unreliable .....
//
// >>> Obsolete - use xBuildMonoBitMap
//
//*****************************************************************************
//      BuildMonoBitMap
//
//      This routine creates a monochrome bitmap from a color bitmap.  It
//      takes as input a bitmap and a color and generates a monochrome
// bitmap that has only pixel positions of the requested color turned
//      on.  Monochrome bitmaps require considerably less storage space
//      and can be operated on much more quickly than full color bitmaps.
//
//      NOTE: The clipping regions are NOT set in the monochrome bitmap.
//
//      PARAMETERS:     sDestBitMap - Pointer to a bitmap structure that will
//                                    define the monochrome bitmap.
//                      sBitMap - Pointer to the bitmap structure to use as
//                                    input.
//                      byColor     - Color that is to be retained.
//
//      RETURNS:  TRUE if successful, FALSE if failed
//                    If true memory has been allocated and loaded with color data
//
//*****************************************************************************
BOOL FAR PASCAL BuildMonoBitMap( LPBIT_MAP sDestBitMap, LPBIT_MAP sBitMap,
BYTE byColor )
{
    short int i, iOffs;
    WORD wWordCount;
```

```c
/* Appendix C:   GRBITMAP.C   Page 39 */
    WORD huge *hpwPixels;

// FAIL IT BECAUSE THIS WON'T WORK
if ((sBitMap->iScanLineWidth % 2) != 0)
  return FALSE;

LockMonoBitMap( sDestBitMap, sBitMap );
    sBitMap->hpcPixels = (char huge *) GlobalLock( sBitMap->hBitmap );

sDestBitMap->byColor = byColor;

for( i = 0; i < mBMP_HEIGHT( sDestBitMap ); i++ ) {
            hpwPixels = RLELineAddress( i, sBitMap );
            wWordCount = *hpwPixels++;
            for( iOffs = 0; wWordCount != 0; wWordCount--, hpwPixels++ ) {
                    // If we find the color then set the monochrome bits and values
                    if( LOBYTE( *hpwPixels ) == byColor ) {
                            if( sDestBitMap->fpiFirstHit[ i ] == EMPTY )
                                 sDestBitMap->fpiFirstHit[ i ] = iOffs;
                            sDestBitMap->fpiLastHit[ i ] = iOffs + HIBYTE( *hpwPixels ) -
1;
                            SetMonochromeLine( sDestBitMap, i, iOffs, HIBYTE(
*hpwPixels ) );
                    }
                    iOffs += HIBYTE( *hpwPixels );
            }
    }

UnlockBitMap( sDestBitMap );
    GlobalUnlock( sBitMap->hBitmap );

return TRUE;

}
//*************************************************************************
**
//      SelectColorBitmap
//
//      Selects a color monochrome bitmap from the parent. This may be used to search
//      against or to add into a composite monochrome map, etc.      If no color
monochrome
//      bitmap exists for this color one is created.
```

```
/* Appendix C:   GRBITMAP.C   Page 40 */
//
//      PARAMETERS:     sBitMap - the parent bitmap from which we wish to get it's color
//                      iColor - the raw color data
//                      iCIdx - the index to user color table ( we use same index )
//
//      Note that the clipping regions are NOT set in the monochrome bitmap
//
//      RETURNS:   a handle to the color monochrome bitmap ( the memory is NOT locked )
//
//****************************************************************************
hBIT_MAP FAR PASCAL SelectColorBitmap( LPBIT_MAP sBitMap, int iColor, int iCIdx )
{
        BOOL bStatus = TRUE;
        hBIT_MAP hColorBmp = NULL;
        LPBIT_MAP sColorBmp;

// If no colors yet attached first we have to get the colors map
        if( sBitMap->hColorMono == NULL ) {
                sBitMap->hColorMono = GlobalAlloc( GMEM_SHARE | GMEM_MOVEABLE
                                        GMEM_ZEROINIT, sizeof( COLORS ) );
                if( sBitMap->hColorMono == NULL )
                        return (hBIT_MAP) NULL;
        } sBitMap->fpColors = (COLORS far *) GlobalLock( sBitMap->hColorMono );
        // If this particular color not yet attached, attach it
        if( sBitMap->fpColors->ahHandle[ iCIdx ] == NULL ) {
                sBitMap->fpColors->ahHandle[ iCIdx ] =
                        GlobalAlloc( GMEM_SHARE | GMEM_MOVEABLE |
                                        GMEM_ZEROINIT, sizeof( BIT_MAP ) );
                sColorBmp = (LPBIT_MAP) GlobalLock( sBitMap->fpColors->ahHandle[ iCIdx ] );

bStatus = BuildMonoBitMap( sColorBmp, sBitMap, (BYTE) iColor );
                GlobalUnlock( sBitMap->fpColors->ahHandle[ iCIdx ] );
        }
```

```c
/* Appendix C:   GRBITMAP.C   Page 41 */
        if( bStatus )
            hColorBmp = sBitMap->fpColors->ahHandle[ iCIdx ];

GlobalUnlock( sBitMap->hColorMono );
    return hColorBmp;
}
//*****************************************************************************
//
// Re-computes and sets ptFirst for the given b-tree monochrome bitmap
//
// Searches the bitmap data (rather than the hit lists) to find the
// first bit
//
// Assumes the bitmap really is monochrome and that the pointers are
// locked
//
// Uses a 16-bit offset so the bitmap must be less than 64K
//
//*****************************************************************************
int FAR PASCAL ComputeMonoBitMapPtFirst( BIT_MAP far * sBitMap )
{
  int i, j;
  WORD wOffset;

for (i=0;i<mBMP_HEIGHT(sBitMap);i++)
  {
    wOffset = i * sBitMap->iScanLineWidth;
    for (j=0;j<mBMP_WIDTH(sBitMap);j++)
    {
      if (mTESTBIT( wOffset + j, sBitMap->hpcPixels ))
      {
        sBitMap->ptFirst.y = i;
        sBitMap->ptFirst.x = j;
        return 0;
      }
    }
  } sBitMap->ptFirst.y = 0;
  sBitMap->ptFirst.x = 0;
  return 0;
}
```

/* Appendix C:   GRBITMAP.C   Page 42 */
```
//****************************************************************
//
// Re-computes and fills in the hit lists for the given b-tree monochrome
// bitmap
//
// Assumes the hit list have already been allocated
//
// RETURNS: a status
//
//****************************************************************
int FAR PASCAL MakeMonoBitMapHitLists( BIT_MAP far * fpsBitMap )
{
  int iStatus;
  int i, j;
  DWORD dwOffset;

if (fpsBitMap == NULL)
    return -1;

if (fpsBitMap->byBmpType != BMP_TYPE_MONOCHROME)
    return -2;

iStatus = LockBitMap( fpsBitMap );
  if (iStatus != 0)
    return -3;

for (i=0;i<fpsBitMap->iNumScanLines;i++)
  {
    fpsBitMap->fpiFirstHit[i] = EMPTY;
    fpsBitMap->fpiLastHit[i] = EMPTY;
  } dwOffset = 0L;
  for (i=0;i<fpsBitMap->iNumScanLines;i++)
  {
    for (j=0;j<fpsBitMap->iScanLineWidth;j++)
    {
      if mTESTBIT(dwOffset, fpsBitMap->hpcPixels)
      {
        if (fpsBitMap->fpiFirstHit[i] == EMPTY)
        {
          fpsBitMap->fpiFirstHit[i] = j;
        }
        fpsBitMap->fpiLastHit[i] = j;
```

/* Appendix C: GRBITMAP.C Page 43 */

```c
        }
        dwOffset++;
      }
    }

UnlockBitMap( fpsBitMap );

return 0;
}
//***************************************************************************
//
// Converts a compressed bitmap to a monochrome bitmap.  Any color that
// translates to black (0) in the original bitmap is a '1' bit in the
// monochrome bitmap.
//
// Careful, the black bit becomes the white bit .....
//
// Assumes memory is allocated (and initialized) and pointers are locked
//
//***************************************************************************
void xCompressedDataToMonochrome( BIT_MAP far * sBitMap,
                    BIT_MAP far * sDestBitMap,
                    BYTE far * XlateTable )
{
  WORD huge * hpwRLELine;    // Use two pointers to limit the damage done if
  WORD huge * hpwRLEData;    // the compressed data is inconsistant
  int iRow, iCol;
  DWORD dwLineOffset;        // Saved value of multiplication
  WORD wNumPairs;
  WORD wRLEPair;
  BYTE byColor, byCount;
  int k;
  DWORD dwOffset;

hpwRLELine = (WORD huge *) sBitMap->hpcPixels;

for ( iRow=0;
        iRow<sDestBitMap->iNumScanLines;
        iRow++, hpwRLELine = hpwRLELine + *hpwRLELine + 1)
  {
    hpwRLEData = hpwRLELine;
    wNumPairs = *hpwRLEData++;
    dwLineOffset = (DWORD) iRow * (DWORD) sDestBitMap->iScanLineWidth;
```

/* Appendix C: GRBITMAP.C Page 44 */

```c
    for ( iCol = 0; wNumPairs != 0; wNumPairs--, iCol += byCount )
    {
      wRLEPair = *hpwRLEData++;
      byCount = HIBYTE( wRLEPair );
      byColor = LOBYTE( wRLEPair );
      if (XlateTable[ byColor ] == 0)
      {
        if (sDestBitMap->fpiFirstHit[ iRow ] == EMPTY)
          sDestBitMap->fpiFirstHit[ iRow ] = iCol;
        sDestBitMap->fpiLastHit[ iRow ] = iCol + byCount - 1;
        dwOffset = dwLineOffset + iCol;
        for (k=0;k<byCount;k++)  // Room for improvement if byCount is large
          mSETBIT( dwOffset+k, sDestBitMap->hpcPixels );
      }
    }
  }
}

////*************************************************************************
//// This is slower than the compressed version,, can you believe it ???
////*************************************************************************
//void xUnCompressedDataToMonochrome( BIT_MAP far * sBitMap,
//                                    BIT_MAP far * sDestBitMap,
//                                    BYTE far * XlateTable )
//{
// int i, j;
// BYTE huge * hpData;
// DWORD dwOffset;
//
// hpData = sBitMap->hpcPixels;
//
// for (i=0;i<sBitMap->iNumScanLines;i++)
// {
//   for (j=0;j<sBitMap->iScanLineWidth;j++)
//   {
//     // The zero value becomes the 1-bit in the monochrome data
//     if (XlateTable[*hpData++] == 0)
//     {
//       if (sDestBitMap->fpiFirstHit[ i ] == EMPTY)
//         sDestBitMap->fpiFirstHit[ i ] = j;
//       sDestBitMap->fpiLastHit[ i ] = j;
//       dwOffset = (DWORD) i * (DWORD) sBitMap->iScanLineWidth + (DWORD) j;
//       mSETBIT( dwOffset, sDestBitMap->hpcPixels );
//     }
```

```
/* Appendix C:   GRBITMAP.C   Page 45 */
//   }
//   }
//}

//**************************************************************************
//
// Internal Function
//
// THIS NEEDS WORK (needs to be made faster)
//
//**************************************************************************
//
// This is still slower than the compressed version,, can you beleive it ?
//
// Careful, the black bit becomes the white bit .....
//       PARAMETERS: sBitMap - color bitmap that is source
//                   sDestBitMap - the monochrome bitmap that will represent
//                                 color positions
//                   XlateTable - array of bytes, where the position indicates a
//                                 color value and the value at that position
//                                 ( 0 ) indicates if this color is a target
//                                 color.
//
// Assumes pointers are locked
//
//**************************************************************************
void xUnCompressedDataToMonochrome( BIT_MAP far * sBitMap,
                    BIT_MAP far * sDestBitMap,
                    BYTE far * XlateTable )
{
        int i, j;
        BYTE huge * hpData;
        WORD far * fpwMonoData;
        WORD huge * hpwMonoData;
        WORD wMask, wMonoData;

hpData = sBitMap->hpcPixels;

wMask = 0x8000;
        wMonoData = 0;

if( sDestBitMap->dwBitMapSize > 65534L )
```

```c
/* Appendix C:   GRBITMAP.C   Page 46 */

{
    hpwMonoData = (WORD far *) sDestBitMap->hpcPixels;
    for (i=0;i<sBitMap->iNumScanLines;i++)
    {
        for (j=0;j<sBitMap->iScanLineWidth;j++)
        {
            // The zero value becomes the 1-bit in the monochrome data
            if (XlateTable[*hpData++] == 0)
            {
                if (sDestBitMap->fpiFirstHit[ i ] == EMPTY)
                    sDestBitMap->fpiFirstHit[ i ] = j;
                sDestBitMap->fpiLastHit[ i ] = j;
                wMonoData = wMonoData | wMask;
            }
            wMask = wMask >> 1;
            if (wMask == 0)
            {
                _asm
                {
                    mov ax, wMonoData
                    xchg ah,al
                    mov wMonoData, ax
                }
                *hpwMonoData++ = wMonoData;
                wMonoData = 0;
                wMask = 0x8000;
            }
        }
    }
    if (wMask != 0x8000)
    {
        _asm
        {
            mov ax, wMonoData
            xchg ah,al
            mov wMonoData, ax
        }
        *hpwMonoData = wMonoData;
    }
}
else
{
    fpwMonoData = (WORD far *) sDestBitMap->hpcPixels;
    for (i=0;i<sBitMap->iNumScanLines;i++)
```

/* Appendix C: GRBITMAP.C Page 47 */

```c
    {
        for (j=0;j<sBitMap->iScanLineWidth;j++)
        {
            // The zero value becomes the 1-bit in the monochrome data
            if (XlateTable[*hpData++] == 0)
            {
                if (sDestBitMap->fpiFirstHit[ i ] == EMPTY)
                    sDestBitMap->fpiFirstHit[ i ] = j;
                sDestBitMap->fpiLastHit[ i ] = j;
                wMonoData = wMonoData | wMask;
            }
            wMask = wMask >> 1;
            if (wMask == 0)
            {
                _asm
                {
                    mov ax, wMonoData
                    xchg ah,al
                    mov wMonoData, ax
                }
                *fpwMonoData++ = wMonoData;
                wMonoData = 0;
                wMask = 0x8000;
            }
        }
    }
    if (wMask != 0x8000)
    {
        _asm
        {
            mov ax, wMonoData
            xchg ah,al
            mov wMonoData, ax
        }
        *fpwMonoData = wMonoData;
    }
    }
}
//*******************************************************************************
//
// Build a Monochrome Bitmap using a Translate Table
// Accepts a compressed or uncompressed bitmap as the source
//
```

```
/* Appendix C:   GRBITMAP.C   Page 48 */
// RETURNS: a status
//
//***********************************************************************
int FAR PASCAL xBuildMonoBitMap( BIT_MAP far * sDestBitMap,
                                 BIT_MAP far * sBitMap,
                                 BYTE far * XlateTable )
{
  int iStatus;

ReleaseBitMap( sDestBitMap );
  InitBtreeBitMap( sDestBitMap );

iStatus = LockBitMap( sBitMap );
  if (iStatus != 0)
    return -1;

sDestBitMap->iScanLineWidth = sBitMap->iScanLineWidth;
  sDestBitMap->iNumScanLines = sBitMap->iNumScanLines;
  sDestBitMap->byBmpType = BMP_TYPE_MONOCHROME;
  iStatus = AllocateMemoryForBitMap( sDestBitMap );
  if (iStatus != 0)
  {
    InitBtreeBitMap( sDestBitMap );
    UnlockBitMap( sBitMap );
    return -2;
  } switch (sBitMap->byBmpType)
  {
    case BMP_TYPE_RAW:
      xUnCompressedDataToMonochrome( sBitMap,
                                     sDestBitMap,
                                     XlateTable );
      iStatus = 0;
      break;
    case BMP_TYPE_COMPRESSED:
      xCompressedDataToMonochrome( sBitMap,
                                   sDestBitMap,
                                   XlateTable );
      iStatus = 0;
      break;
    default:
      iStatus = -3;
      break;
```

/* Appendix C:   GRBITMAP.C   Page 49 */

}

UnlockBitMap( sBitMap );
  UnlockBitMap( sDestBitMap );

return iStatus;
}

//***************************************************************************
//
// Build a Monochrome Bitmap using a Translate Table
// Accepts a compressed or uncompressed bitmap as the source
//
// Invert the translate table so that zeros stay zeros (or black pixels
// remain black)
//
// RETURNS: a status
//
//***************************************************************************
int FAR PASCAL xxBuildMonoBitMap( BIT_MAP far * sDestinationBitMap,
                    BIT_MAP far * sSourceBitMap,
                    BYTE far * XlateTable )
{
  BYTE TempXlateTable[256];
  int i;

for (i=0;i<256;i++)
    TempXlateTable[i] = (!(XlateTable[i]));

return (xBuildMonoBitMap(sDestinationBitMap,sSourceBitMap,TempXlateTable));
}

//***************************************************************************
//
// Make a b-tree compressed bit map from an array of bytes.
//
// RETURNS:   0 - successful
//        else - an error occured
//
//***************************************************************************
int FAR PASCAL MakeBitMapFromArray( BYTE huge * p,
                    int iNumScanLines,
                    int iScanLineWidth,
                    BIT_MAP far * sBitMap )

/* Appendix C:   GRBITMAP.C   Page 50 */

```c
{
 int iStatus;
 DWORD dwSize;

ReleaseBitMap( sBitMap );
 InitBtreeBitMap( sBitMap );

sBitMap->iNumScanLines = iNumScanLines;
 sBitMap->iScanLineWidth = iScanLineWidth;
 sBitMap->byBmpType = BMP_TYPE_COMPRESSED;
 iStatus = AllocateMemoryForBitMap( sBitMap );
 if (iStatus != 0)
 {
   InitBtreeBitMap( sBitMap );
   return -1;
 }
 sBitMap->bCompressed = TRUE;
 SetNoClip( sBitMap );

dwSize = CompressData( p,
                   (WORD huge *) sBitMap->hpcPixels,
                   iNumScanLines,
                   iScanLineWidth );
 dwSize = dwSize * (DWORD) sizeof(WORD);  // Convert to byte count // Reallocate the memory, hopefully releasing some back to system
 GlobalUnlock( sBitMap->hBitmap );
 sBitMap->hpcPixels = NULL;
 sBitMap->hBitmap = GlobalReAlloc( sBitMap->hBitmap,
                         dwSize,
                         GMEM_SHARE | GMEM_MOVEABLE );
 sBitMap->dwBitMapSize = GlobalSize( sBitMap->hBitmap );

return 0;
}
//****************************************************************************
//
// Compresses an Uncompressed bitmap
//
//****************************************************************************
int FAR PASCAL MakeCompressedBitMap( BIT_MAP far * sUnCompressedBmp,
                       BIT_MAP far * sCompressedBmp )
{
```

/* Appendix C:   GRBITMAP.C   Page 51 */

```c
  int iStatus;

ReleaseBitMap( sCompressedBmp );
  InitBtreeBitMap( sCompressedBmp );

iStatus = LockBitMap( sUnCompressedBmp );
  if (iStatus != 0)
    return -1;

iStatus = MakeBitMapFromArray( (BYTE huge *) sUnCompressedBmp->hpcPixels,
                      sUnCompressedBmp->iNumScanLines,
                      sUnCompressedBmp->iScanLineWidth,
                      sCompressedBmp );

UnlockBitMap( sUnCompressedBmp );

return iStatus;
}
//**************************************************************************
//
// >>> Obsolete - use make "MakeUnCompressedBitMap"
//
//**************************************************************************
//
// Allocate memory and uncompress a compressed bitmap to an array of bytes
//
//**************************************************************************
HANDLE FAR PASCAL UnCompressBitMap( BIT_MAP far * sBitMap )
{
  return (HANDLE) NULL;
}

//**************************************************************************
//
// Uncompresses an Compressed bitmap
//
//**************************************************************************
int FAR PASCAL MakeUnCompressedBitMap( BIT_MAP far * sCompressedBmp,
                       BIT_MAP far * sUnCompressedBmp )
{
  int iStatus;

ReleaseBitMap( sUnCompressedBmp );
```

/* Appendix C:   GRBITMAP.C   Page 52 */

```
InitBtreeBitMap( sUnCompressedBmp );

iStatus = LockBitMap( sCompressedBmp );
if (iStatus != 0)
  return -1;

sUnCompressedBmp->iNumScanLines = sCompressedBmp->iNumScanLines;
sUnCompressedBmp->iScanLineWidth = sCompressedBmp->iScanLineWidth;
sUnCompressedBmp->byBmpType = BMP_TYPE_RAW;
iStatus = AllocateMemoryForBitMap( sUnCompressedBmp );
if (iStatus != 0)
{
  UnlockBitMap( sCompressedBmp );
  InitBtreeBitMap( sUnCompressedBmp );
  return -2;
}
SetNoClip( sUnCompressedBmp );

UnCompressData( (WORD huge *) sCompressedBmp->hpcPixels,
          (BYTE huge *) sUnCompressedBmp->hpcPixels,
          sCompressedBmp->iNumScanLines );

UnlockBitMap( sCompressedBmp );
UnlockBitMap( sUnCompressedBmp );

return 0;
}

//****************************************************************************
//
// Some of the functions work only on uncompressed bitmaps. This
// function will uncompress one or both bitmaps if they are not already
// uncompressed. The delete flag is set to true if the corresponding
// bitmap had to be uncompressed
//
// RETURNS: a status
//
//****************************************************************************
int FAR PASCAL UnCompressBitMapPair( BIT_MAP far * fpsBitMapA,
                  BIT_MAP far * fpsBitMapB,
                  BIT_MAP far * fpsTempBitMapA,
                  BIT_MAP far * fpsTempBitMapB,
                  BOOL far * bDeleteA,
                  BOOL far * bDeleteB )
```

/* Appendix C:   GRBITMAP.C   Page 53 */

```c
{
  int iStatus;

InitBtreeBitMap( fpsTempBitMapA );
  InitBtreeBitMap( fpsTempBitMapB );
  *bDeleteA = FALSE;
  *bDeleteB = FALSE;
  switch (fpsBitMapA->byBmpType)
  {
    case BMP_TYPE_RAW:
      *fpsTempBitMapA = *fpsBitMapA;
      break;
    case BMP_TYPE_COMPRESSED:
      iStatus = MakeUnCompressedBitMap( fpsBitMapA, fpsTempBitMapA );
      if (iStatus != 0)
        return -1;
      *bDeleteA = TRUE;
      break;
    default:
      return -2;
  }
  switch (fpsBitMapB->byBmpType)
  {
    case BMP_TYPE_RAW:
      *fpsTempBitMapB = *fpsBitMapB;
      break;
    case BMP_TYPE_COMPRESSED:
      iStatus = MakeUnCompressedBitMap( fpsBitMapB, fpsTempBitMapB );
      if (iStatus != 0)
        return -3;
      *bDeleteB = TRUE;
      break;
    default:
      return -4;
  }
  return 0;
}
//*********************************************************************
// This is a modified version of PasteBitMapToBitMapUnCompressed - copies
// the foreground in, leaves the background alone.
//
// Copy the given bitmap onto the other bitmap starting at the given point
//
```

```c
/* Appendix C:   GRBITMAP.C   Page 54 */
// Both bitmaps must be uncompressed
//
//****************************************************************************
int FAR PASCAL CompositeBitMapWithBitMapUnCompressed( BIT_MAP far *
SourceBitMap,
                                    BIT_MAP far * DestinationBitMap,
                                    POINT pt,
                                    BYTE byGlobTextColor,
                                    BYTE byGlobBackgroundColor )

{
 int iStatus;
 RECT rcTemp;
 BYTE huge * hpSourceData;
 BYTE huge * hpDestinationData;
 int i, j;
 DWORD dwOffset;
 BYTE huge * sp;
 BYTE huge * dp;

rcTemp.top    = pt.y;
 rcTemp.bottom = rcTemp.top + SourceBitMap->iNumScanLines - 1;
 rcTemp.left   = pt.x;
 rcTemp.right  = rcTemp.left + SourceBitMap->iScanLineWidth - 1;

if (rcTemp.right >= DestinationBitMap->iScanLineWidth
     || rcTemp.bottom >= DestinationBitMap->iNumScanLines)
 {
   return -1;
 } iStatus = LockBitMapPair( SourceBitMap, DestinationBitMap );
 if (iStatus != 0)
 {
   return -2;
 } hpSourceData = (BYTE huge *) SourceBitMap->hpcPixels;
 hpDestinationData = (BYTE huge *) DestinationBitMap->hpcPixels;

sp = hpSourceData;
 for (i=0;i<SourceBitMap->iNumScanLines;i++)
 {
   dwOffset = (((DWORD) pt.y + i) * (DWORD) DestinationBitMap->iScanLineWidth);
   dwOffset += pt.x;
```

/* Appendix C:   GRBITMAP.C   Page 55 */

```c
    dp = hpDestinationData + dwOffset;
    for (j=0;j<SourceBitMap->iScanLineWidth;j++)
    {
      if (*sp == byGlobTextColor)
        *dp++ = *sp++;
      else
      {
        dp++;
        sp++;
      }
    }
  }
}

UnlockBitMap( SourceBitMap );
UnlockBitMap( DestinationBitMap );

return 0;
}

//**************************************************************************
//
// Copy the given bitmap onto the other bitmap starting at the given point
//
// Both bitmaps must be uncompressed
//
//**************************************************************************
int FAR PASCAL PasteBitMapToBitMapUnCompressed( BIT_MAP far * SourceBitMap,
                                BIT_MAP far * DestinationBitMap,
                                POINT pt )
{
  int iStatus;
  RECT rcTemp;
  BYTE huge * hpSourceData;
  BYTE huge * hpDestinationData;
  int i, j;
  DWORD dwOffset;
  BYTE huge * sp;
  BYTE huge * dp;

rcTemp.top    = pt.y;
  rcTemp.bottom = rcTemp.top + SourceBitMap->iNumScanLines - 1;
  rcTemp.left   = pt.x;
  rcTemp.right  = rcTemp.left + SourceBitMap->iScanLineWidth - 1;
```

/* Appendix C: GRBITMAP.C Page 56 */

```c
  if (rcTemp.right >= DestinationBitMap->iScanLineWidth
     || rcTemp.bottom >= DestinationBitMap->iNumScanLines)
  {
    return -1;
  } iStatus = LockBitMapPair( SourceBitMap, DestinationBitMap );
  if (iStatus != 0)
  {
    return -2;
  } hpSourceData = (BYTE huge *) SourceBitMap->hpcPixels;
  hpDestinationData = (BYTE huge *) DestinationBitMap->hpcPixels;

sp = hpSourceData;
  for (i=0;i<SourceBitMap->iNumScanLines;i++)
  {
    dwOffset = (((DWORD) pt.y + i) * (DWORD) DestinationBitMap->iScanLineWidth);
    dwOffset += pt.x;
    dp = hpDestinationData + dwOffset;
    for (j=0;j<SourceBitMap->iScanLineWidth;j++)
    {
        *dp++ = *sp++;
    }
  }

UnlockBitMap( SourceBitMap );
  UnlockBitMap( DestinationBitMap );

return 0;
}
//****************************************************************************
//
// Copy the given bitmap onto the other bitmap starting at the given point
//
// One or both of the bitmaps may be compressed.  If the destination
// is compressed, it will stay compressed.
//
//****************************************************************************
int FAR PASCAL PasteBitMapToBitMap( BIT_MAP far * SourceBitMap,
                    BIT_MAP far * DestinationBitMap,
```

```
/* Appendix C:   GRBITMAP.C   Page 57 */
                POINT pt )
{
  BOOL bDeleteSource, bDeleteDestination;
  BIT_MAP TempSourceBitMap;
  BIT_MAP TempDestinationBitMap;
  int iStatus = 0;
  RECT rcTemp;

rcTemp.top    = pt.y;
  rcTemp.bottom = rcTemp.top + SourceBitMap->iNumScanLines - 1;
  rcTemp.left   = pt.x;
  rcTemp.right  = rcTemp.left + SourceBitMap->iScanLineWidth - 1;

if (rcTemp.right >= DestinationBitMap->iScanLineWidth
     || rcTemp.bottom >= DestinationBitMap->iNumScanLines)
  {
    return -1;
  } iStatus = UnCompressBitMapPair( SourceBitMap,
                                  DestinationBitMap,
                                  &TempSourceBitMap,
                                  &TempDestinationBitMap,
                                  &bDeleteSource,
                                  &bDeleteDestination );
  if (iStatus != 0)
    return -2;

iStatus = PasteBitMapToBitMapUnCompressed( &TempSourceBitMap,
                                             &TempDestinationBitMap,
                                             pt );
  if (iStatus != 0)
  {
    iStatus = -3;
    goto EXIT;
  } if (bDeleteSource)
  {
    ReleaseBitMap( &TempSourceBitMap );
    bDeleteSource = FALSE;
  } if (DestinationBitMap->byBmpType == BMP_TYPE_COMPRESSED)
```

/* Appendix C: GRBITMAP.C Page 58 */

```c
{
  iStatus = MakeCompressedBitMap( &TempDestinationBitMap,
                      DestinationBitMap );
  ReleaseBitMap( &TempDestinationBitMap );
  bDeleteDestination = FALSE;
}

EXIT:

if (bDeleteSource)
  ReleaseBitMap( &TempSourceBitMap );
if (bDeleteDestination)
  ReleaseBitMap( &TempDestinationBitMap );

return iStatus;
}

//*************************************************************************
//
// Copy the given bitmap (interpreted as a cursor type bitmap) onto the
// other bitmap starting at the given point
//
// Both bitmaps must be uncompressed
//
//*************************************************************************
int FAR PASCAL PasteCursorToBitMapUnCompressed( BIT_MAP far * SourceBitMap,
                      BYTE far * XlateTable,
                      BIT_MAP far * DestinationBitMap,
                      POINT pt )
{
  int iStatus;
  RECT rcTemp;
  BYTE huge * hpbySource;
  BYTE huge * hpbyDestination;
  int i, j;

rcTemp.top    = pt.y;
  rcTemp.bottom = rcTemp.top + SourceBitMap->iNumScanLines - 1;
  rcTemp.left   = pt.x;
  rcTemp.right  = rcTemp.left + SourceBitMap->iScanLineWidth - 1;

if (rcTemp.right >= DestinationBitMap->iScanLineWidth
      || rcTemp.bottom >= DestinationBitMap->iNumScanLines)
  {
```

/* Appendix C:   GRBITMAP.C   Page 59 */

```c
  return -1;
  } iStatus = LockBitMapPair( SourceBitMap, DestinationBitMap );
  if (iStatus != 0)
  {
    return -2;
  } hpbySource = (BYTE huge *) SourceBitMap->hpcPixels;

for (i=0;i<SourceBitMap->iNumScanLines;i++)
  {
    hpbyDestination = (BYTE huge *) DestinationBitMap->hpcPixels + ((DWORD) (pt.y + i)
 * DestinationBitMap->iScanLineWidth);
    hpbyDestination += pt.x;
    for (j=0;j<SourceBitMap->iScanLineWidth;j++)
    {
      if (XlateTable[*hpbySource])
      {
        *hpbyDestination = *hpbySource;
      }
      hpbySource++;
      hpbyDestination++;
    }
  }

UnlockBitMap( SourceBitMap );
  UnlockBitMap( DestinationBitMap );

return 0;
}

//****************************************************************************
//
// Copy the given bitmap (interpreted as a cursor type bitmap) onto the
// other bitmap starting at the given point
//
// One or both of the bitmaps may be compressed.  If the destination
// is compressed, it will stay compressed.
//
//****************************************************************************
int FAR PASCAL PasteCursorToBitMap( BIT_MAP far * SourceBitMap,
                    BYTE far * XlateTable,
```

/* Appendix C: GRBITMAP.C Page 60 */

```c
                    BIT_MAP far * DestinationBitMap,
                    POINT pt )
{
BOOL bDeleteSource, bDeleteDestination;
BIT_MAP TempSourceBitMap;
BIT_MAP TempDestinationBitMap;
int iStatus = 0;
RECT rcTemp;

rcTemp.top    = pt.y;
rcTemp.bottom = rcTemp.top + SourceBitMap->iNumScanLines - 1;
rcTemp.left   = pt.x;
rcTemp.right  = rcTemp.left + SourceBitMap->iScanLineWidth - 1;

if (rcTemp.right >= DestinationBitMap->iScanLineWidth
    || rcTemp.bottom >= DestinationBitMap->iNumScanLines)
{
  return -1;
} iStatus = UnCompressBitMapPair( SourceBitMap,
                    DestinationBitMap,
                    &TempSourceBitMap,
                    &TempDestinationBitMap,
                    &bDeleteSource,
                    &bDeleteDestination );
if (iStatus != 0)
  return -2;

iStatus = PasteCursorToBitMapUnCompressed( &TempSourceBitMap,
                    XlateTable,
                    &TempDestinationBitMap,
                    pt );
if (iStatus != 0)
{
  iStatus = -3;
  goto EXIT;
} if (bDeleteSource)
{
  ReleaseBitMap( &TempSourceBitMap );
  bDeleteSource = FALSE;
}
```

/* Appendix C:   GRBITMAP.C   Page 61 */

```c
  if (DestinationBitMap->byBmpType == BMP_TYPE_COMPRESSED)
  {
    iStatus = MakeCompressedBitMap( &TempDestinationBitMap,
                          DestinationBitMap );
    ReleaseBitMap( &TempDestinationBitMap );
    bDeleteDestination = FALSE;
  }

EXIT:

if (bDeleteSource)
    ReleaseBitMap( &TempSourceBitMap );
  if (bDeleteDestination)
    ReleaseBitMap( &TempDestinationBitMap );

return iStatus;
}

//**************************************************************************
//
// Uncompress data from a given rectangular area of a given compressed
// bitmap.  The uncompressed data is just a string of bytes.
// (faster now)
//
//**************************************************************************
int FAR PASCAL UnCompressAreaOfBitMap( BIT_MAP far * SourceBitMap,
                          BYTE huge * hpDestination,
                          RECT rect )
{
  short int wLines, wCols;
  WORD huge * hpwRLELine;
  WORD huge * hpwRLEData;
  WORD wNumPairs;
  WORD wRLEPair;
  BYTE byColor, byCount;

if (SourceBitMap->byBmpType != BMP_TYPE_COMPRESSED)
    return -1;

for ( wLines = rect.top, hpwRLELine = GetRLELineAddress(rect.top,SourceBitMap);
        wLines <= rect.bottom;
        wLines++, hpwRLELine = GetNextRLELineAddress(hpwRLELine) )
  {
```

```
/* Appendix C:   GRBITMAP.C   Page 62 */ hpwRLEData = hpwRLELine;
  wNumPairs = *hpwRLEData++;
  wRLEPair = GetAndModifyFirstRLEPair( &hpwRLEData, rect.left );
  byCount = HIBYTE( wRLEPair );
  byColor = LOBYTE( wRLEPair );

for ( wCols = rect.left;
        wCols <= rect.right;
        wCols++ )
  {
    *hpDestination++ = byColor;
    byCount--;
    if (byCount == 0 && (wCols+1) <= rect.right )
    {
      wRLEPair = *hpwRLEData++;  // Get the next RLE pair
      byCount = HIBYTE( wRLEPair );
      byColor = LOBYTE( wRLEPair );
    }
   }
  }
  return 0;
}

//*********************************************************************
//
// Extract data from a given rectangular area of a compressed bitmap
// and make another bitmap (which will be UNcompressed)
//
//*********************************************************************
int FAR PASCAL CutBitMapFromCompressedBitMap( BIT_MAP far * SourceBitMap,
                                  BIT_MAP far * DestinationBitMap,
                                  RECT rect )
{
  int iStatus;
  int nRows, nCols;

ReleaseBitMap( DestinationBitMap );
  InitBtreeBitMap( DestinationBitMap );

iStatus = LockBitMap( SourceBitMap );
  if (iStatus != 0)
    return -1;

nRows = rect.bottom - rect.top + 1;
```

/* Appendix C:   GRBITMAP.C   Page 63 */

```c
  nCols = rect.right - rect.left + 1;

DestinationBitMap->iNumScanLines = nRows;
  DestinationBitMap->iScanLineWidth = nCols;
  DestinationBitMap->byBmpType = BMP_TYPE_RAW;
  iStatus = AllocateMemoryForBitMap( DestinationBitMap );
  if (iStatus != 0)
  {
    UnlockBitMap( SourceBitMap );
    InitBtreeBitMap( DestinationBitMap );
    return -2;
  }

UnCompressAreaOfBitMap( SourceBitMap,
                          DestinationBitMap->hpcPixels,
                          rect );

UnlockBitMap( SourceBitMap );
  UnlockBitMap( DestinationBitMap );

return 0;
}
//****************************************************************************
//
// Extracts data from a given rectangular area from an uncompressed
// bit map and makes another uncompressed bit map
//
//****************************************************************************
int FAR PASCAL CutBitMapFromUncompressedBitMap( BIT_MAP far * SourceBitMap,
                                                BIT_MAP far * DestinationBitMap,
                                                RECT rect )
{
  short int wLines, wCols;
  int nRows, nCols;
  int iStatus;
  BYTE huge * sp;
  DWORD dwOffset;
  BYTE huge * hpDestination;

ReleaseBitMap( DestinationBitMap );
  InitBtreeBitMap( DestinationBitMap );

if (rect.right >= SourceBitMap->iScanLineWidth
```

```c
/* Appendix C:   GRBITMAP.C   Page 64 */
  || rect.bottom >= SourceBitMap->iNumScanLines)
{
  return -1;
} iStatus = LockBitMap( SourceBitMap );
if (iStatus != 0)
  return -2;

nRows = rect.bottom - rect.top + 1;
nCols = rect.right - rect.left + 1;

DestinationBitMap->iNumScanLines = nRows;
DestinationBitMap->iScanLineWidth = nCols;
DestinationBitMap->byBmpType = BMP_TYPE_RAW;
iStatus = AllocateMemoryForBitMap( DestinationBitMap );
if (iStatus != 0)
{
  UnlockBitMap( SourceBitMap );
  InitBtreeBitMap( DestinationBitMap );
  return -3;
} hpDestination = (BYTE huge *) DestinationBitMap->hpcPixels;

for (wLines = rect.top; wLines <= rect.bottom; wLines++)
{
  dwOffset = ((DWORD) wLines * (DWORD) SourceBitMap->iScanLineWidth) +
(DWORD) rect.left;
  sp = (SourceBitMap->hpcPixels) + dwOffset;
  for( wCols = rect.left; wCols <= rect.right; wCols++ )
  {
    *hpDestination++ = *sp++;
  }
}

UnlockBitMap( SourceBitMap );
UnlockBitMap( DestinationBitMap );

return 0;
}
//**********************************************************************
//
```

```
/* Appendix C:   GRBITMAP.C   Page 65 */
// FUNCTION:
//
// Creates a b-tree bitmap from a rectangular sub-region of another
// b-tree bit map.
//
// Source         Temporary     Result
// ------------   ------------  --------------
// Compressed     Uncompressed  (as requested)
// UnCompressed   Uncompressed
//
//****************************************************************************
int FAR PASCAL CutBitMapFromBitMap( BIT_MAP far * SourceBitMap,
                            BIT_MAP far * DestinationBitMap,
                            RECT rect,
                            BYTE byDestinationBmpType )
{
  BIT_MAP TempBmp;
  int iStatus = 0;

if (rect.right >= SourceBitMap->iScanLineWidth
      | rect.bottom >= SourceBitMap->iNumScanLines)
  {
    return -1;
  }

// Create a temporay (uncompressed) bit map
  //    this is the cut area

InitBtreeBitMap( &TempBmp );

switch (SourceBitMap->byBmpType)
  {
    case BMP_TYPE_RAW:
      iStatus = CutBitMapFromUncompressedBitMap( SourceBitMap, &TempBmp, rect );
      if (iStatus != 0)
        return -2;
      break;
    case BMP_TYPE_COMPRESSED:
      iStatus = CutBitMapFromCompressedBitMap( SourceBitMap, &TempBmp, rect );
      if (iStatus != 0)
        return -3;
      break;
    default:
      return -4;
```

/* Appendix C: GRBITMAP.C Page 66 */

```c
    break;
  } switch (byDestinationBmpType)
  {
   case BMP_TYPE_RAW:
     ReleaseBitMap( DestinationBitMap );
     *DestinationBitMap = TempBmp;
     break;
   case BMP_TYPE_COMPRESSED:
     ReleaseBitMap( DestinationBitMap );
     iStatus = MakeCompressedBitMap( &TempBmp, DestinationBitMap );
     ReleaseBitMap( &TempBmp );
     break;
   default:
     ReleaseBitMap( DestinationBitMap );
     InitBtreeBitMap( DestinationBitMap );
     ReleaseBitMap( &TempBmp );
     return -5;
     break;
  } return iStatus;
}
//****************************************************************
//
// FUNCTION:
//
// Fill the given rectangle on the given B-tree bitmap with the given
// "color".
//
// Works only on Uncompressed and Monochrome bitmaps.
//
// If this is done to a monochrome bitmap the calling routine will be
// responsible for re-setting ptFirst and all the hit lists
//
// RETURNS: a status
//
//****************************************************************
int FAR PASCAL FillRectOnBitMap( BIT_MAP far * fpsBitMap,
                    RECT rcTemp,
                    BYTE byColor )
{
```

```c
/* Appendix C:   GRBITMAP.C   Page 67 */ int iStatus;
int i, j;
DWORD dwOffset;

if (fpsBitMap == NULL)
  return -1;

if (rcTemp.top < 0
    || rcTemp.left < 0
    || rcTemp.bottom >= fpsBitMap->iNumScanLines
    || rcTemp.right >= fpsBitMap->iScanLineWidth)
  return -2;

if (fpsBitMap->byBmpType != BMP_TYPE_RAW
    && fpsBitMap->byBmpType != BMP_TYPE_MONOCHROME)
  return -3;

iStatus = LockBitMap( fpsBitMap );
if (iStatus != 0)
  return -4;

iStatus = 0;

for (i=rcTemp.top;i<=rcTemp.bottom;i++)
{
  dwOffset = (DWORD) i * (DWORD) fpsBitMap->iScanLineWidth;
  dwOffset = dwOffset + rcTemp.left;
  for (j=rcTemp.left;j<=rcTemp.right;j++)
  {
    switch (fpsBitMap->byBmpType)
    {
      case BMP_TYPE_RAW:
        *(fpsBitMap->hpcPixels + dwOffset) = byColor;
        break;
      case BMP_TYPE_MONOCHROME:
        if (byColor)
          mSETBIT( dwOffset, fpsBitMap->hpcPixels );
        else
          mCLEARBIT( dwOffset, fpsBitMap->hpcPixels );
        break;
      default:
        iStatus = -4;
        break;
    }
```

```c
/* Appendix C:   GRBITMAP.C   Page 68 */ dwOffset++;
  }
 }

UnlockBitMap( fpsBitMap );
 return iStatus;
}
//****************************************************************************
//
// Make a solid colored bitmap of the given dimensions, the given
// color and of the given bitmap type.
//
// RETURNS: a status
//
//****************************************************************************
int FAR PASCAL MakeSolidColorBitMap( BIT_MAP far * sBitMap,
                     int iNumScanLines,
                     int iScanLineWidth,
                     BYTE byColor,
                     BYTE byDestinationBmpType )
{
 BIT_MAP TempBmp;
 BYTE huge * p;
 int i, j;
 int iStatus;
 BYTE TempXlateTable[256];

ReleaseBitMap( sBitMap );
 InitBtreeBitMap( sBitMap );

// Create a temporary uncompressed bitmap
 InitBtreeBitMap( &TempBmp );
 TempBmp.iNumScanLines = iNumScanLines;
 TempBmp.iScanLineWidth = iScanLineWidth;
 TempBmp.byBmpType = BMP_TYPE_RAW;
 iStatus = AllocateMemoryForBitMap( &TempBmp );
 if (iStatus != 0)
 {
   return -1;
 }

// Fill in the color
```

/* Appendix C: GRBITMAP.C Page 69 */
```c
  if (byColor != 0)
  {
    p = (BYTE huge *) TempBmp.hpcPixels;
    for (i=0;i<iNumScanLines;i++)
      for (j=0;j<iScanLineWidth;j++)
        *p++ = byColor;
  }

GlobalUnlock( TempBmp.hBitmap );

switch (byDestinationBmpType)
  {
    case BMP_TYPE_RAW:
      *sBitMap = TempBmp;
      iStatus = 0;
      break;
    case BMP_TYPE_COMPRESSED:
      iStatus = MakeCompressedBitMap( &TempBmp, sBitMap );
      if (iStatus != 0)
        iStatus = -2;
      ReleaseBitMap( &TempBmp );
      break;
    case BMP_TYPE_MONOCHROME:
      // (A horribly inefficent and ridiculous way to do this .....)
      for (i=0;i<256;i++)
        TempXlateTable[i] = 0;
      TempXlateTable[0] = 1;
      iStatus = xBuildMonoBitMap( sBitMap,
                          &TempBmp,
                          TempXlateTable );
      if (iStatus != 0)
        iStatus = -3;
      ReleaseBitMap( &TempBmp );
      break;
    default:
      iStatus = -4;
      ReleaseBitMap( &TempBmp );
      break;
  } return iStatus;
}

//*************************************************************************
```

/* Appendix C: GRBITMAP.C Page 70 */

```c
//
// Add the specified number of columns to the given bitmap
//
// (this should probably be done in place by re-allocating memory, but
//  for now just copy the entire bitmap)
//
// Uncompressed bitmaps only
//
//*************************************************************************
int FAR PASCAL AddColumnsToBitMap( BIT_MAP far * fpsBitMap,
                        int iCol,
                        int iNumCols )
{
  int iStatus;
  BIT_MAP sTempBmp;
  BYTE huge * hpbySource;
  BYTE huge * hpbyDestination;
  int i, j;

InitBtreeBitMap( &sTempBmp );
  iStatus = LockBitMap( fpsBitMap );
  if (iStatus != NULL)
  {
    iStatus = -1;
    goto ERROR_EXIT;
  }
  if (fpsBitMap->byBmpType != BMP_TYPE_RAW)
  {
    iStatus = -2;
    goto ERROR_EXIT;
  }
  if ( (iCol < 0)
      || (iCol > fpsBitMap->iScanLineWidth)
      || (iNumCols <= 0) )
  {
    iStatus = -3;
    goto ERROR_EXIT;
  }
  iStatus = MakeSolidColorBitMap( &sTempBmp,
                        fpsBitMap->iNumScanLines,
                        fpsBitMap->iScanLineWidth + iNumCols,
                        0,
                        BMP_TYPE_RAW );
  if (iStatus != 0)
```

/* Appendix C:   GRBITMAP.C   Page 71 */

```c
{
  iStatus = -3;
  goto ERROR_EXIT;
}
iStatus = LockBitMap( &sTempBmp );
if (iStatus != 0)
{
  iStatus = -4;
  goto ERROR_EXIT;
} for (i=0;i<fpsBitMap->iNumScanLines;i++)
{
  hpbySource = fpsBitMap->hpcPixels + ((DWORD) i * fpsBitMap->iScanLineWidth);
  hpbyDestination = sTempBmp.hpcPixels + ((DWORD) i * sTempBmp.iScanLineWidth);
  for (j=0;j<fpsBitMap->iScanLineWidth;j++)
  {
    if (j == iCol)
    {
      hpbyDestination += iNumCols;
    }
    *hpbyDestination++ = *hpbySource++;
  }
}

UnlockBitMap( fpsBitMap );
UnlockBitMap( &sTempBmp );
ReleaseBitMap( fpsBitMap );
*fpsBitMap = sTempBmp;
return 0;

ERROR_EXIT:

UnlockBitMap( fpsBitMap );
UnlockBitMap( &sTempBmp );
ReleaseBitMap( &sTempBmp );
return iStatus;
}

//*********************************************************************
//
// Delete the specified number of columns from the given bitmap
//
// (this should probably be done in place by re-allocating memory, but
```

```c
/* Appendix C:   GRBITMAP.C   Page 72 */
//   for now just copy the entire bitmap)
//
// Uncompressed bitmaps only
//
//*********************************************************************
int FAR PASCAL DeleteColumnsFromBitMap( BIT_MAP far * fpsBitMap,
                                        int iCol,
                                        int iNumCols )
{
  int iStatus;
  BIT_MAP sTempBmp;
  BYTE huge * hpbySource;
  BYTE huge * hpbyDestination;
  int i, j;

InitBtreeBitMap( &sTempBmp );
  iStatus = LockBitMap( fpsBitMap );
  if (iStatus != NULL)
  {
    iStatus = -1;
    goto ERROR_EXIT;
  }
  if (fpsBitMap->byBmpType != BMP_TYPE_RAW)
  {
    iStatus = -2;
    goto ERROR_EXIT;
  }
  if ( (iCol < 0)
       || (iCol >= fpsBitMap->iScanLineWidth)
       || (iNumCols <= 0) )
  {
    iStatus = -3;
    goto ERROR_EXIT;
  }
  iStatus = MakeSolidColorBitMap( &sTempBmp,
                          fpsBitMap->iNumScanLines,
                          fpsBitMap->iScanLineWidth - iNumCols,
                          0,
                          BMP_TYPE_RAW );
  if (iStatus != 0)
  {
    iStatus = -3;
    goto ERROR_EXIT;
  }
```

/* Appendix C:   GRBITMAP.C   Page 73 */

```c
  iStatus = LockBitMap( &sTempBmp );
  if (iStatus != 0)
  {
    iStatus = -4;
    goto ERROR_EXIT;
  } for (i=0;i<sTempBmp.iNumScanLines;i++)
  {
    hpbySource = fpsBitMap->hpcPixels + ((DWORD) i * fpsBitMap->iScanLineWidth);
    hpbyDestination = sTempBmp.hpcPixels + ((DWORD) i * sTempBmp.iScanLineWidth);
    for (j=0;j<sTempBmp.iScanLineWidth;j++)
    {
      if (j == iCol)
      {
        hpbySource += iNumCols;
      }
      *hpbyDestination++ = *hpbySource++;
    }
  }

UnlockBitMap( fpsBitMap );
  UnlockBitMap( &sTempBmp );
  ReleaseBitMap( fpsBitMap );
  *fpsBitMap = sTempBmp;
  return 0;

ERROR_EXIT:

UnlockBitMap( fpsBitMap );
  UnlockBitMap( &sTempBmp );
  ReleaseBitMap( &sTempBmp );
  return iStatus;
}

//****************************************************************************
//
// Add the specified number of columns to the given bitmap
//
// (this should probably be done in place by re-allocating memory, but
//  for now just copy the entire bitmap)
//
// Uncompressed bitmaps only
//
```

```c
/* Appendix C:   GRBITMAP.C   Page 74 */
//***************************************************************************
int FAR PASCAL AddRowsToBitMap( BIT_MAP far * fpsBitMap,
                                int iRow,
                                int iNumRows )
{
  int iStatus;
  BIT_MAP sTempBmp;
  BYTE huge * hpbySource;
  BYTE huge * hpbyDestination;
  int i, j;

InitBtreeBitMap( &sTempBmp );
  iStatus = LockBitMap( fpsBitMap );
  if (iStatus != NULL)
  {
    iStatus = -1;
    goto ERROR_EXIT;
  }
  if (fpsBitMap->byBmpType != BMP_TYPE_RAW)
  {
    iStatus = -2;
    goto ERROR_EXIT;
  }
  if ( (iRow < 0)
       || (iRow > fpsBitMap->iNumScanLines)
       || (iNumRows <= 0) )
  {
    iStatus = -3;
    goto ERROR_EXIT;
  }
  iStatus = MakeSolidColorBitMap( &sTempBmp,
                                  fpsBitMap->iNumScanLines + iNumRows,
                                  fpsBitMap->iScanLineWidth,
                                  0,
                                  BMP_TYPE_RAW );
  if (iStatus != 0)
  {
    iStatus = -3;
    goto ERROR_EXIT;
  }
  iStatus = LockBitMap( &sTempBmp );
  if (iStatus != 0)
  {
    iStatus = -4;
```

```
                    /* Appendix C:    GRBITMAP.C    Page 75 */
  goto ERROR_EXIT;
} for (i=0;i<fpsBitMap->iNumScanLines;i++)
{
  hpbySource = fpsBitMap->hpcPixels + ((DWORD) i * fpsBitMap->iScanLineWidth);
  hpbyDestination = sTempBmp.hpcPixels + ((DWORD) i * sTempBmp.iScanLineWidth);
  if (i >= iRow)
  {
    hpbyDestination += ((DWORD) iNumRows * sTempBmp.iScanLineWidth);
  }
  for (j=0;j<fpsBitMap->iScanLineWidth;j++)
  {
    *hpbyDestination++ = *hpbySource++;
  }
}

UnlockBitMap( fpsBitMap );
UnlockBitMap( &sTempBmp );
ReleaseBitMap( fpsBitMap );
*fpsBitMap = sTempBmp;
return 0;

ERROR_EXIT:

UnlockBitMap( fpsBitMap );
UnlockBitMap( &sTempBmp );
ReleaseBitMap( &sTempBmp );
return iStatus;
}

//*********************************************************************
//
// Delete the specified number of columns from the given bitmap
//
// (this should probably be done in place by re-allocating memory, but
//   for now just copy the entire bitmap)
//
// Uncompressed bitmaps only
//
//*********************************************************************
int FAR PASCAL DeleteRowsFromBitMap( BIT_MAP far * fpsBitMap,
                        int iRow,
                        int iNumRows )
```

/* Appendix C: GRBITMAP.C Page 76 */

```c
{
int iStatus;
BIT_MAP sTempBmp;
BYTE huge * hpbySource;
BYTE huge * hpbyDestination;
int i, j;

InitBtreeBitMap( &sTempBmp );
iStatus = LockBitMap( fpsBitMap );
if (iStatus != NULL)
{
  iStatus = -1;
  goto ERROR_EXIT;
}
if (fpsBitMap->byBmpType != BMP_TYPE_RAW)
{
  iStatus = -2;
  goto ERROR_EXIT;
}
if ( (iRow < 0)
    || (iRow >= fpsBitMap->iNumScanLines)
    || (iNumRows <= 0) )
{
  iStatus = -3;
  goto ERROR_EXIT;
}
iStatus = MakeSolidColorBitMap( &sTempBmp,
                    fpsBitMap->iNumScanLines - iNumRows,
                    fpsBitMap->iScanLineWidth,
                    0,
                    BMP_TYPE_RAW );
if (iStatus != 0)
{
  iStatus = -3;
  goto ERROR_EXIT;
}
iStatus = LockBitMap( &sTempBmp );
if (iStatus != 0)
{
  iStatus = -4;
  goto ERROR_EXIT;
} for (i=0;i<sTempBmp.iNumScanLines;i++)
```

/* Appendix C:   GRBITMAP.C   Page 77 */

```c
  {
    hpbySource = fpsBitMap->hpcPixels + ((DWORD) i * fpsBitMap->iScanLineWidth);
    hpbyDestination = sTempBmp.hpcPixels + ((DWORD) i * sTempBmp.iScanLineWidth);
    if (i >= iRow)
    {
      hpbySource += ((DWORD) iNumRows * fpsBitMap->iScanLineWidth);
    }
    for (j=0;j<sTempBmp.iScanLineWidth;j++)
    {
      *hpbyDestination++ = *hpbySource++;
    }
  }
}

UnlockBitMap( fpsBitMap );
UnlockBitMap( &sTempBmp );
ReleaseBitMap( fpsBitMap );
*fpsBitMap = sTempBmp;
return 0;

ERROR_EXIT:

UnlockBitMap( fpsBitMap );
UnlockBitMap( &sTempBmp );
ReleaseBitMap( &sTempBmp );
return iStatus;
}

//****************************************************************************
//
// Makes a compressed or uncompressed bitmap from the given monochrome
// bit map (or fontmap)
//
// (assumes source bitmap pointers are locked)
//
//****************************************************************************
int FAR PASCAL MakeBitMapFromMonochromeBitMap( BIT_MAP far * fpSource,
                            BIT_MAP far * fpDestination,
                            BYTE byZeroColor,
                            BYTE byOneColor,
                            BYTE byDestinationBmpType )
{
  BYTE huge * hpBitMapData;
  int i, j;
  BIT_MAP TempBmp;
```

/* Appendix C:   GRBITMAP.C   Page 78 */

```c
DWORD dwOffset;
int iStatus;

ReleaseBitMap( fpDestination );
InitBtreeBitMap( fpDestination );

if (fpSource == NULL || fpDestination == NULL)
  return -1;

if (  ! ( fpSource->byBmpType != BMP_TYPE_MONOCHROME
     || fpSource->byBmpType != BMP_TYPE_FONT || fpSource->byBmpType !=
BMP_TYPE_NEWFONT ) )
   return -2;

// MAKE A TEMPORARY UNCOMPRESSED BIT MAP
InitBtreeBitMap( &TempBmp );
TempBmp.iNumScanLines = fpSource->iNumScanLines;
TempBmp.iScanLineWidth = fpSource->iScanLineWidth;
TempBmp.byBmpType = BMP_TYPE_RAW;
iStatus = AllocateMemoryForBitMap( &TempBmp );
if (iStatus != 0)
{
  return -4;
} hpBitMapData = (BYTE huge *) TempBmp.hpcPixels;

for (i=0;i<fpSource->iNumScanLines;i++)
{
  dwOffset = (DWORD) i * fpSource->iScanLineWidth;
  for (j=0;j<fpSource->iScanLineWidth;j++)
  {
    if (mTESTBIT(dwOffset, fpSource->hpcPixels))
      *hpBitMapData++ = byOneColor;
    else
      *hpBitMapData++ = byZeroColor;
    dwOffset++;
  }
}

UnlockBitMap( &TempBmp );

switch (byDestinationBmpType)
{
```

```
                    /* Appendix C:   GRBITMAP.C   Page 79 */
  case BMP_TYPE_RAW:
    *fpDestination = TempBmp;
    iStatus = 0;
    break;
  case BMP_TYPE_COMPRESSED:
    iStatus = MakeCompressedBitMap( &TempBmp, fpDestination );
    if (iStatus != 0)
      iStatus = -4;
    ReleaseBitMap( &TempBmp );
    break;
  default:
    iStatus = -5;
    ReleaseBitMap( &TempBmp );
    break;
  } return iStatus;
}
```

/* Appendix C: GRBITMAP.C Page 80 */

// Copyright (c) B-Tree Verification Systems, Inc. 1990-1995. All rights reserved.
//
/* $Header: T:\svs\grphdll\grbitmap.h // THIS FILE IS replaced by grphdll.h - USE GRPHDLL.h
include "grphdll.h"

/* Appendix C: EISA.C, EISA.H  Page 1 */

// Copyright (c) B-Tree Verification Systems, Inc. 1990-1994. All rights reserved.
//

/**************************** EISA.C **************************************
 * This module contains routines specific to the EISA bus and some hardware
 * functions.
 *
 * Ricks document on Graphics Capture System follows.
 * GRAPHICS CAPTURE I/O ADDRESSES
 * (WHERE Z = SLOT NUMBER)
 *
 * $0000Z000-$0000Z003
 * EISA PRODUCT IDENTIFIER (READ ONLY)
 * SD[31..24] = 01  BYTE 3 REVISION NUMBER
 * SD[23..16] = 60  BYTE 2 PRODUCT NUMBER
 * SD[15..8]  = D3  BYTE 1 MANUFACTURER CODE
 * SD[7..0]   = 1E  BYTE 0 MANUFACTURER CODE "GVS"
 *
 * $0000Z004-$0000Z007
 * CONTROL STATUS PORT (READ-WRITE)
 * SD[31..24] = PG[7..0] BYTE 3 PAGE MAP REGISTER (READ-WRITE)
 *                       DEFAULTS TO 00, DO NOT SET TO 00 OR FF
 *                       WHEN MEMORY ACCESSES ENABLED
 * SD[23..16] = FFFFEEEE BYTE 2 FIFO FLAG STATUS (READ ONLY)
 *                       FFFF = 1111 IF FULL
 *                       EEEE = 0000 IF EMPTY
 * SD[15..8]  = CCCC000R BYTE 1 RESET CONTROL REGISTER
 *                       CCCC = 1111 IF CAPTURE IN PROGRESS (READ ONLY)
 *                       R    = 0    IF RESET (READ-WRITE)
 * SD[7..0]   = E00000P0 BYTE 0 ENABLE/STATUS CONTROL REGISTER
 *                       E    = 1 IF MEMORY ACCESSES ENABLED (READ-WRITE)
 *                       P    = 0 IF TARGET POWER IS ON (READ ONLY)
 *
 * $0000Z008-$0000Z00B
 * EIGHT DIGIT BCD SERIAL NUMBER UPDATED FOR EACH BOARD (READ ONLY)
 * SD[31..24] = 00  BYTE 3
 * SD[23..16] = 00  BYTE 2
 * SD[15..8]  = 10  BYTE 1
 * SD[7..0]   = 00  BYTE 0
 *
 * $0000Z00C-$0000Z00F
 * EIGHT DIGIT BCD DATE CODE UPDATED FOR EACH BOARD (READ ONLY)

```
        /* Appendix C:   EISA.C, EISA.H   Page 2 */
 * SD[31..24] = MM  BYTE 3
 * SD[23..16] = DD  BYTE 2
 * SD[15..8]  = YY  BYTE 1
 * SD[7..0]   = YY  BYTE 0
 *
 * $0000Z010-$0000Z013
 * HORIZONTAL AND VERTICAL RESOLUTION COUNTERS (READ ONLY)
 * SD[31..24] = VV  BYTE 3 HI BYTE OF VERTICAL COUNT
 * SD[23..16] = VV  BYTE 2 LO BYTE OF VERTICAL COUNT
 * SD[15..8]  = HH  BYTE 1 HI BYTE OF HORIZONTAL COUNT
 * SD[7..0]   = HH  BYTE 0 LO BYTE OF HORIZONTAL COUNT
 *
 * FRAME COUNTER (READ-WRITE)
 * UNDEFINED BITS ARE IGNORED DURING WRITES AND RETURN 0 DURING READS
 * $0000Z02C
 * SD[7..0]  = FC[19..18]
 * $0000Z028
 * SD[7..0]  = FC[17..10]
 * $0000Z024
 * SD[7..0]  = FC[9..8]
 * $0000Z020
 * SD[7..0]  = FC[7..0]
 *
 * $0000Z030
 * TRIGGER (READ-WRITE)
 * ANY ACCESS WILL START A CAPTURE ON THE NEXT VERTICAL SYNC
 *
 * GRAPHICS CAPTURE MEMORY ADDRESSES
 * IF THE PAGE MAP REGISTER EQUALS ADDRESS BITS A[31..24] AND THE ENABLE
 * BIT IS SET MEMORY ACCESSES WILL OCCUR IN A 16M BOUNDARY SET BY THE
 * PAGE MAP REGISTER. THE BOARD CONTAINS 4M OF MEMORY WHICH OVERLAPS
 * ITSELF IN THE 16M BOUNDARY.
 ***********************************************************************/

/*
 * $Log:   T:\svs\grphdll\eisa.c_v  $
 *
 *    Rev 1.0   10 Aug 1994 18:31:14   MLOUDEN
 * Initial revision.
```

```c
/* Appendix C:   EISA.C, EISA.H   Page 3 */
 *
 */

// INCLUDE FILES **************************************************** include <windows.h>
include "dpmi.h"

/*---------------------------------------------------------------*/
    // NOTE ONLY ACTUALLY USING 3 MEG OF MEMORY FOR NOW !

define FOUR_MEG_OF_SELECTORS    64         // Each selector points to a segment // (64k) of data

/*---------------------------------------------------------------*/ define GRAPHIC_PIX_ADDR    0x80        // Starts at 8 meg (pix/ovr data)
define GRAPHIC_OVR_ADDR    0xC0        // Starts at 12 meg (pix/ovr select)
define GRAPHIC_BD_SIZE            0xFFFF       // Size of memory that the selector // points to on the
graphics board
define CONTROL_REG_ADDR    0x310       //   Port number of control register
define ABSENT_REG_ADDR           0x317 //   Port number of an absent register define GRB_PALETTE_FLAG    0x0312
define GRB_PIX_DATA_FLAG   0x0313
define GRB_PALETTE_DATA    0x0314
define GRB_PALETTE_ADDR    0x0315
define GRB_SYNCH_STATUS    0x0316 define ENABLE_MEM_BIT              0xB0    // Enable memory and set staging to 1
define DISABLE_MEM_BIT             0x7F // Set and reset mode control bit used when setting Frame counter
define SET_MODE_CONTROL    0xFE
define CLEAR_MODE_CONTROL       1
```

/* Appendix C: EISA.C, EISA.H   Page 4 */

```
define LL_ADDR_REG        0x0311           // Line lock address register
define LL_CTRL_REG        0x0319           // Line lock control register // Values used for strobing the capture bit of Line Lock Controller (Bt261).
define CAPTURE_STROBE_LOW      0xD9
define CAPTURE_STROBE_HIGH     0xF9 define TWO_PT_FIVE_MS     156              // This is the count at 2.5
micro seconds
                                            //              for
62.5 megahertz // Initialization values to output to command registers
define CMD_REG0_INIT   0xD9
define CMD_REG1_INIT   0x02
define CMD_REG2_INIT   0xF0
define CMD_REG3_INIT   0xFF // Error codes, etc.
define IDE_G_ALLOC_LDT_SEL -1
define IDE_G_SET_SEL_BASE -2
define IDE_G_SET_SEL_LIMIT -3
define IDE_G_WRT_PATTERN_ERR -4
define IDE_G_WRT_SELECT_ERR -5

// Define the Bt261 Line Lock Controller Registers ( See Brooktree
// data sheet for complete desc ).
    enum LL_REG         {       CmdReg0,
                                CmdReg1,
                                CmdReg2,
                                CmdReg3,
                                VsyncSample,
                                OSCCntLow,
                                OSCCntHigh,
                                LineLockStatus,
                                HsynchBegLow,
                                HsynchBegHigh,
                                HsynchEndLow,
                                HsynchEndHigh,
                                ClampBegLow,
                                ClampBegHigh,
                                ClampEndLow,
                                ClampEndHigh,
                                ZeroBegLow,
```

/* Appendix C: EISA.C, EISA.H   Page 5 */

```c
                    ZeroBegHigh,
                    ZeroEndLow,
                    ZeroEndHigh,
                    FieldBegLow,
                    FieldBegHigh,
                    FieldEndLow,
                    FieldEndHigh,
                    NoiseGateBegLow,
                    NoiseGateBegHigh,
                    NoiseGateEndLow,
                    NoiseGateEndHigh,
                    HcountBegLow,
                    HcountBegHigh
        };

define FRAME_CTR_0_7       0x20
define FRAME_CTR_8_9       0x24
define FRAME_CTR_10_17             0x28
define FRAME_CTR_18_19             0x2C define HORZ_RES_HI                 0x11
define HORZ_RES_LOW        0x10
define VERT_RES_HI         0x13
define VERT_RES_LOW        0x12

// Define all GVS registers:
define REG_BASE            0       // Base of EP registers
define ENBL_STS_REG (REG_BASE + 0x4)   // Enable/status control ->
                        // bit 7 = enable bit
                        // bit 1 = host error - processor died
define PAGE_MAP_REG (REG_BASE + 0x7)   // Map EP memory on 16 Meg boundaries
                        // Default is 0, BUT never use 0 or
                        // all F's.
// mCALC_EP_BASE_REG -
// Function: Calculate the EP base register from the slot number that the EP
//          card is seeded in.
//
define mCALC_EP_BASE_REG(bySlotNbr)  ((WORD)(BYTE) bySlotNbr << 12)

// END MANIFEST CONSTANTS AND
MACRO*******************************************
```

/* Appendix C: EISA.C, EISA.H   Page 6 */

```c
BYTE inp( WORD wIO )
{
        BYTE byVal;
        _asm {
                mov dx, wIO
                in      al, dx
                mov byVal, al
        }
        return byVal;
} int outp( WORD wIO, WORD wVal )
{
        BYTE byVal = (BYTE) wVal;

_asm {
                mov dx, wIO
                mov al, byVal
                out dx, al }
        return TRUE;
}

// D-
pragma page()
//*******************************************************************
**
//      GetBaseAddressForSlot
//
//      PARAMETERS:     iSlot - defines the slot the graphics card resides in
//
//      RETURNS: the base physical address the card should is mapped to
//
//*******************************************************************
**
DWORD GetBaseAddressForSlot( int iSlot )
// D-
{
        WORD wBaseReg;
        BYTE byPageMapVal;

wBaseReg = mCALC_EP_BASE_REG( (BYTE) iSlot );
```

/* Appendix C: EISA.C, EISA.H  Page 7 */

```c
        byPageMapVal = inp( wBaseReg + PAGE_MAP_REG );

return (DWORD) byPageMapVal << 24;
}
// - End GetBaseAddressForSlot *******************************************

// D+
pragma page()
//*****************************************************************************
//      GetFrameCounter
//
//      PARAMETERS:     iSlot - defines the slot the graphics card resides in
//
//      RETURNS:   The value in the frame counter registers
//
//*****************************************************************************
DWORD GetFrameCounter( int iSlot )
// D-
{
        WORD wBaseReg;
        DWORD dwFrameCounter;

wBaseReg = mCALC_EP_BASE_REG( (BYTE) iSlot );

dwFrameCounter = (DWORD) inp( wBaseReg + FRAME_CTR_0_7 );
        dwFrameCounter |= (DWORD) inp( wBaseReg + FRAME_CTR_8_9 ) << 8;
        dwFrameCounter |= (DWORD) inp( wBaseReg + FRAME_CTR_10_17 ) << 10;
        dwFrameCounter |= (DWORD) inp( wBaseReg + FRAME_CTR_18_19 ) << 18;

return dwFrameCounter;
}
// - End GetFrameCounter *******************************************

// D+
pragma page()
//*****************************************************************************
//      GetVerticalResolution
//
//      PARAMETERS:     iSlot - defines the slot the graphics card resides in
```

/* Appendix C: EISA.C, EISA.H Page 8 */

```c
//
//     RETURNS:   The full vertical resolution as determined by the graphics
//                         capture card.
//
//*************************************************************************
**
int GetVerticalResolution( int iSlot )
// D-
{
        WORD wBaseReg;
        int iVerticalRes;

wBaseReg = mCALC_EP_BASE_REG( (BYTE) iSlot );

iVerticalRes = (int) inp( wBaseReg + VERT_RES_LOW );
        iVerticalRes |= (int) inp( wBaseReg + VERT_RES_HI ) << 8;

return iVerticalRes;
}
// - End GetVerticalResolution *******************************************

// D+
pragma page()
//*************************************************************************
**
//     GetHorizontalResolution
//
//     PARAMETERS:    iSlot - defines the slot the graphics card resides in
//
//     RETURNS:   The full horizontal resolution as determined by the graphics
//                         capture card.
//
//*************************************************************************
**
int GetHorizontalResolution( int iSlot )
// D-
{
        WORD wBaseReg;
        int iHorizontalRes;

wBaseReg = mCALC_EP_BASE_REG( (BYTE) iSlot );

iHorizontalRes = (int) inp( wBaseReg + HORZ_RES_LOW );
```

/* Appendix C:   EISA.C, EISA.H   Page 9 */

```c
        iHorizontalRes |= (int) inp( wBaseReg + HORZ_RES_HI ) << 8;

return iHorizontalRes;
}
// - End GetHorizontalResolution *************************************************

// D+
pragma page()
//*****************************************************************************
**
//      EnableMem
//
//      Enables access to the memory on the graphics capture card.
//
//      PARAMETERS:     iSlot - EISA slot the card is located in
//                      dwBaseAddr - physical address we are mapping the card to
//
//      RETURNS:
//
//*****************************************************************************
**
void EnableMem( int iSlot )
// D-
{
        WORD wBaseReg;
        BYTE byPageMapVal;

wBaseReg = mCALC_EP_BASE_REG( (BYTE) iSlot );

byPageMapVal = inp( wBaseReg + 5 );
        byPageMapVal &= 1;
        if( ! byPageMapVal ) {
                byPageMapVal = inp( wBaseReg + 5 );
                outp( wBaseReg + 5, byPageMapVal | 1 );
        } outp( wBaseReg + ENBL_STS_REG, 0x80 );

}
// - End EnableMem
//*********************************************************************** void DisableMem( int iSlot )
```

```c
/* Appendix C:    EISA.C, EISA.H    Page 10 */
{
    WORD wBaseReg;

wBaseReg = mCALC_EP_BASE_REG( (BYTE) iSlot );

outp( wBaseReg + ENBL_STS_REG, 0x00);
}

/* Assumes memory accesses have been enabled */
void FAR PASCAL xSetGBFrameCounter( int iSlot )
{
    WORD wBaseReg;

wBaseReg = mCALC_EP_BASE_REG( (BYTE) iSlot );

// Clear the FIFO's as per Ric's note that horizontal resolutions
    // not multiples of 4 will leave them unempty.
    outp( wBaseReg + 5, 0x00 );

outp( wBaseReg + 0x2c, 0x00 );
    outp( wBaseReg + 0x28, 0x00 );
    outp( wBaseReg + 0x24, 0x00 );
    outp( wBaseReg + 0x20, 0x00 );

}

WORD FAR PASCAL xCheckForCard( WORD wSlot )
{
    _asm
    {
        mov     ah, 0d8h
        mov     al, 04h
        mov     cx, wSlot
        int     15h
        jc      NoCardInSlot
        cmp     di, 0d31eh
        jne     NoCardInSlot
        cmp     si, 0160h
        je      HaveCard
NoCardInSlot:
    }
```

/* Appendix C:    EISA.C, EISA.H    Page 11 */

```c
    return 0;

HaveCard:

return wSlot;
}

// RETURNS FALSE ON TIMEOUT
// iSlot - SLOT THE CARD IS IN
// iTimeOut - time in milliseconds
BOOL FAR PASCAL CaptureData( short int iSlot, short int iTimeOut )
{
        WORD wBaseReg;
        BYTE byVal;
        DWORD dwBeg, dwEnd;
        BOOL bWentHigh = FALSE;

wBaseReg = mCALC_EP_BASE_REG( (BYTE) iSlot );

// Check for power on the target
        byVal = inp( wBaseReg + 4 );
        if( byVal & 2 )
                return FALSE;

outp( wBaseReg + 0x30, 0x00 );

// Wait ?? ms to make sure we have caught the edge
        // (Ric says should only need 20 ms)
        dwBeg = GetTickCount();
        dwEnd = GetTickCount();
        while( (short int) ( dwEnd - dwBeg ) < iTimeOut )
        {
                byVal = inp( wBaseReg + 5 );
                if( ( byVal & 0xf0 ) != 0 )
                {
                        bWentHigh = TRUE;
                        break;
                }
                dwEnd = GetTickCount();
        }
        // If it did not go high then we have a problem
        if( ! bWentHigh )
                return FALSE;
```

```c
/* Appendix C:   EISA.C, EISA.H   Page 12 */

// Now watch for capture to finish or time out
dwBeg = GetTickCount();
dwEnd = GetTickCount();
while( (short int) ( dwEnd - dwBeg ) < iTimeOut ) {
        byVal = inp( wBaseReg + 5 );
        if( ( byVal & 0xf0 ) == 0 )
                return TRUE;
        dwEnd = GetTickCount();
} if( ( byVal & 0xf0 ) == 0 )
        return TRUE;
return FALSE;
}

// D+
pragma page()
//**********************************************************************
**
//      GetNbrOfGraphicsCards
//
//      PARAMETERS:     NONE
//
//      RETURNS:   The number of graphics cards available
//
//**********************************************************************
**
WORD FAR PASCAL GetNbrOfGraphicsCards( void )
// D-
{
        WORD wSlot, wCount;

for( wSlot = 0, wCount = 0; wSlot < 15; wSlot++ )
                if( xCheckForCard( wSlot ) )
                        wCount++;

return wCount;
}
// - End GetNbrOfGraphicsCards ***********************************************

// D+
pragma page()
```

/* Appendix C:   EISA.C, EISA.H   Page 13 */

```
//*****************************************************************************
**
//      GetNextGraphicsCardSlot
//
//      PARAMETERS:     wSlot - slot number to start looking at
//
//      RETURNS:   the first slot that contains a graphics card
//                             0 - indicates no card found
//
//*****************************************************************************
**
WORD FAR PASCAL GetNextGraphicsCardSlot( WORD wSlot )
// D-
{
        for( ; wSlot < 15; wSlot++ )
            if( xCheckForCard( wSlot ) )
                return wSlot;

return 0;
}
// - End GetNextGraphicsCardSlot ************************************************
```

/* Appendix C:   EISA.C, EISA.H   Page 14 */

// Copyright (c) B-Tree Verification Systems, Inc. 1992-1994. All rights reserved.
//

```c
/* $Header: */
/**************************** EISA.H ******************************
 * This include file contains defines and structures unique to the
 * EISA card interface
 ***********************************************************************/

/*
 * $Log:   T:\svs\grphdll\eisa.h_v  $
 *
 *    Rev 1.1   07 Aug 1994 16:55:18   MLOUDEN
 * changed proto for capturedata
 *
 *    Rev 1.0   07 Aug 1994 16:26:00   MLOUDEN
 * Initial revision.
 *
 */ extern void EnableMem(int);
extern short pascal far CaptureData(short, short);
extern int outp(unsigned short, unsigned short);
extern unsigned char inp(unsigned short);
extern void pascal far xSetGBFrameCounter(int);
extern unsigned short pascal far xCheckForCard(unsigned short);
extern unsigned long GetBaseAddressForSlot(int);
extern unsigned long GetFrameCounter(int);
extern int GetHorizontalResolution(int);
extern int GetVerticalResolution(int);
extern void DisableMem(int);
```

/* Appendix C: DPMI.C, DPMI.H   Page 1 */
```c
// Copyright (c) B-Tree Verification Systems, Inc. 1993-1995. All rights reserved.
//
/* $Header:   T:\svs\dpmi\dpmi.c_v   1.3   10 Feb 1995 20:10:50   MLOUDEN  $
 *
 */
/* $Log:   T:\svs\dpmi\dpmi.c_v  $
 *
 *
 */
//*************************************************************************
//
// A windows DLL to deal with DPMI calls
//
//*************************************************************************
include <windows.h>
include "dpmi.h"

char _szLibName[] = "DPMI";

//*************************************************************************
//
// Get Version DPMI call
// (requires an 8-byte buffer)
//
//*************************************************************************
void FAR PASCAL GetDpmiVersionInfo( BYTE far * fpbyBuffer )
{
  _asm
  {
    mov  ax, 0x0400
    int  31h
    push ds
    lds  si, fpbyBuffer
    mov  [si+0], ax
    mov  [si+2], bx
    mov  [si+4], cx
    mov  [si+6], dx
    pop  ds
  }
}

//*************************************************************************
//
// Get Version DPMI call
```

/* Appendix C: DPMI.C, DPMI.H   Page 2 */
```c
// (requires an 128-byte buffer)
//
//****************************************************************************
void FAR PASCAL GetDpmiMemoryInfo( BYTE far * fpbyBuffer )
{
  _asm
  {
    push es
    mov  ax, 0x0500
    les  di, fpbyBuffer
    int  31h
    pop  es
  }
}

//****************************************************************************
//
// Get Selector Increment Value DPMI call
//
//****************************************************************************
WORD FAR PASCAL GetSelectorIncrementValue( void )
{
  WORD wIncrementValue;

_asm
  {
    mov  ax, 0x0003
    int  31h
    mov  wIncrementValue, ax
  }
  return wIncrementValue;
}

//****************************************************************************
//
// Get Segment Base Address DPMI call
//
//****************************************************************************
int FAR PASCAL GetSegmentBaseAddress( WORD wSelector, DWORD far *
fpdwLinearBaseAddress )
{
  int iStatus = 0;
  DWORD dwLinearBaseAddress = 0;
```

/* Appendix C:   DPMI.C, DPMI.H   Page 3 */

```
  _asm
  {
  // DPMI: Get Segment Base Address
  mov  ax, 0x0006
  mov  bx, wSelector
  int  31h
  jc   ERROR_EXIT
  mov  WORD PTR dwLinearBaseAddress+2, cx
  mov  WORD PTR dwLinearBaseAddress, dx
  jmp  EXIT
  ERROR_EXIT:
  mov  iStatus, ax
  cmp  iStatus, 0
  jne  EXIT
  mov  iStatus, 0xffff
  EXIT:
  }

*fpdwLinearBaseAddress = dwLinearBaseAddress;
  return iStatus;
}

//*****************************************************************************
//
// Get Descriptor DPMI call
// (requires an 8-byte buffer)
//
//*****************************************************************************
int FAR PASCAL GetDescriptor( WORD wSelector, BYTE far * fpbyBuffer )
{
  int iStatus = 0;

_asm
  {
  // DPMI: Get Descriptor
  push es
  mov  ax, 0x000b
  mov  bx, wSelector
  les  di, fpbyBuffer
  int  31h
  jc   ERROR_EXIT
  jmp  EXIT
  ERROR_EXIT:
  mov  iStatus, ax
```

/* Appendix C:   DPMI.C, DPMI.H   Page 4 */

```c
    cmp iStatus, 0
    jne EXIT
    mov iStatus, 0xffff
    EXIT:
    pop es
  }
  return iStatus;
}

//*************************************************************************
//
// Allocate LDT selectors via DPMI call
//
//*************************************************************************
int FAR PASCAL AllocateSelectors( WORD far * fpwSelector, WORD wCount )
{
  WORD wSelector = 0;
  int iStatus = 0;

_asm
  {
    // DPMI: Allocate LDT Descriptors
    mov ax, 0
    mov cx, wCount
    int 31h
    jc  ERROR_EXIT
    mov wSelector, ax
    jmp EXIT
    ERROR_EXIT:
    mov iStatus, ax
    cmp iStatus, 0
    jne EXIT
    mov iStatus, 0xffff
    EXIT:
  }

*fpwSelector = wSelector;
  return iStatus;
}

//*************************************************************************
//
// Free LDT selectors via DPMI call
//
```

/* Appendix C: DPMI.C, DPMI.H Page 5 */

```c
//***************************************************************************
int FAR PASCAL FreeSelectors( WORD wBaseSelector, WORD wCount )
{
  WORD wIncrementValue;
  int i;
  WORD wSelector;
  int iStatus = 0;

wIncrementValue = GetSelectorIncrementValue();

for( i=0; (WORD) i< wCount; i++ )
  {
    wSelector = wBaseSelector + (i * wIncrementValue);
    _asm
    {
      // DPMI: Free LDT Descriptor
      mov  ax, 0x0001
      mov  bx, wSelector
      int  31h
      jc   ERROR_EXIT
      jmp  EXIT
      ERROR_EXIT:
      or   iStatus, ax    // Make an interesting combination of error codes
      cmp  iStatus, 0
      jne  EXIT
      mov  iStatus, 0xffff
      EXIT:
    }
  } return iStatus;
}

//***************************************************************************
//
// Set segment base address via DPMI call
//
//***************************************************************************
int FAR PASCAL SetSegmentBaseAddress( WORD wSelector, DWORD dwAddress )
{
  int iStatus = 0;

_asm
  {
```

/* Appendix C: DPMI.C, DPMI.H    Page 6 */

```
    // DPMI: Set Segment Base Address
    mov  ax, 0x0007
    mov  bx, wSelector
    mov  cx, WORD PTR dwAddress+2
    mov  dx, WORD PTR dwAddress
    int  31h
    jc   ERROR_EXIT
    jmp  EXIT
    ERROR_EXIT:
    mov  iStatus, ax
    cmp  iStatus, 0
    jne  EXIT
    mov  iStatus, 0xffff
    EXIT:
  } return iStatus;
}

//*********************************************************************
//
//  Set physical address via DPMI call
//
//*********************************************************************
int FAR PASCAL SetSegmentPhysicalAddress( WORD wSelector, DWORD dwAddress,
DWORD dwSegmentLength )
{
  DWORD dwLimit;
  int iStatus = 0;

if (dwSegmentLength != 0)
    dwLimit = dwSegmentLength - 1;
  else
    dwLimit = 0;

_asm
  {
    // DPMI: Physical Address Mapping
    //      (returns a linear address in bx:cx)
    mov  ax, 0x0800
    mov  bx, WORD PTR dwAddress+2
    mov  cx, WORD PTR dwAddress
    mov  si, WORD PTR dwSegmentLength+2
    mov  di, WORD PTR dwSegmentLength
```

```
/* Appendix C:   DPMI.C, DPMI.H   Page 7 */ int  31h
      jc   ERROR_EXIT
      // DPMI: Set Segment Base Address
      mov  ax, 0x0007
      mov  dx, cx
      mov  cx, bx
      mov  bx, wSelector
      int  31h
      jc   ERROR_EXIT
      // DPMI: Set Segment Limit
      mov  ax, 0x0008
      mov  bx, wSelector
      mov  cx, WORD PTR dwLimit+2
      mov  dx, WORD PTR dwLimit
      int  31h
      jc   ERROR_EXIT
      jmp  EXIT
    ERROR_EXIT:
      mov  iStatus, ax
      cmp  iStatus, 0
      jne  EXIT
      mov  iStatus, 0xffff
    EXIT:
    } return iStatus;
  }

//*********************************************************************
//
//  Set segment limit via DPMI call
//
//*********************************************************************
  int FAR PASCAL SetSegmentLimit( WORD wSelector, DWORD dwLimit )
  {
    int iStatus = 0;

_asm
    {
      // DPMI: Set Segment Limit
      mov  ax, 0x0008
      mov  bx, wSelector
      mov  cx, WORD PTR dwLimit+2
      mov  dx, WORD PTR dwLimit
```

/* Appendix C: DPMI.C, DPMI.H   Page 8 */

```
    int  31h
    jc   ERROR_EXIT
    jmp  EXIT
    ERROR_EXIT:
    mov  iStatus, ax
    cmp  iStatus, 0
    jne  EXIT
    mov  iStatus, 0xffff
    EXIT:
  } return iStatus;
}

//*********************************************************************
//
// Compute the number of selectors required (under microsoft windows)
// for a huge pointer array of the given length in bytes
//
//*********************************************************************
WORD GetRequiredSelectorCount( DWORD dwLength )
{
  WORD wNumberOfRequiredSelectors;

wNumberOfRequiredSelectors = (WORD) ( ( dwLength + 0xffffL ) / 0x10000 );
  return wNumberOfRequiredSelectors;
}

//*********************************************************************
//
// Allocate a selector so physical memory can be accessed via a 32 bit
// offset.
//
//*********************************************************************
int FAR PASCAL SetupSelectors32bitOffset(    WORD far * fpwBaseSelector,
                                             DWORD dwBaseAddress,
                                             DWORD dwLength )
{
  int iStatus;
  WORD wSelector;

iStatus = AllocateSelectors( fpwBaseSelector, 1 );
```

```
/* Appendix C:   DPMI.C, DPMI.H   Page 9 */
if (iStatus != 0)
{
  return iStatus;
} wSelector = *fpwBaseSelector;

iStatus = SetSegmentPhysicalAddress( wSelector, dwBaseAddress, dwLength );
if (iStatus != 0)

{
  return iStatus;
}
return 0;
}

//**************************************************************************
//
// Allocate (an array of) selectors so physical memory can be used by
// microsoft windows (as a huge pointer)
//
//**************************************************************************
int FAR PASCAL SetupSelectorsForMsWindows( WORD far * fpwBaseSelector,
                      DWORD dwBaseAddress,
                      DWORD dwLength )
{
  WORD wNumberOfRequiredSelectors;
  int iStatus;
  int i;
  WORD wSelector;
  DWORD dwSegmentLength;
  DWORD dwLastSegmentLength;
  WORD wIncrementValue;

wIncrementValue = GetSelectorIncrementValue();

wNumberOfRequiredSelectors = GetRequiredSelectorCount( dwLength );

iStatus = AllocateSelectors( fpwBaseSelector, wNumberOfRequiredSelectors );
  if (iStatus != 0)
  {
    return iStatus;
  }
```

/* Appendix C: DPMI.C, DPMI.H   Page 10 */

```c
wSelector = *fpwBaseSelector;
dwLastSegmentLength = dwLength;
dwSegmentLength = 0x10000L;

for( i=0; (WORD) i < (wNumberOfRequiredSelectors-1); i++ )
{
  iStatus = SetSegmentPhysicalAddress( wSelector, dwBaseAddress, dwSegmentLength );
  if (iStatus != 0)
  {
    return iStatus;
  }
  wSelector += wIncrementValue;
  dwBaseAddress += dwSegmentLength;
      dwLastSegmentLength -= dwSegmentLength;
}
iStatus = SetSegmentPhysicalAddress( wSelector, dwBaseAddress, dwLastSegmentLength );
if (iStatus != 0)
{
  return iStatus;
} return 0;
}

//***************************************************************************
//
// Free (an array of) selectors that were used in microsoft windows to
// implement a huge pointer to physical memory
//
//***************************************************************************
int FAR PASCAL FreeSelectorsForMsWindows( WORD wBaseSelector,
                                DWORD dwLength )
{
  WORD wNumberOfRequiredSelectors;
  int iStatus;

wNumberOfRequiredSelectors = GetRequiredSelectorCount( dwLength );

iStatus = FreeSelectors( wBaseSelector, wNumberOfRequiredSelectors );

return iStatus;
}
```

```c
/* Appendix C:   DPMI.C, DPMI.H   Page 11 */
//*********************************************************************
//
// (Required by Microsoft Windows)
//
//*********************************************************************
int FAR PASCAL LibMain( HANDLE hInstance,
                WORD wDataSeq,
                WORD wHeapSize,
                LPSTR lpszCmdLine )
{
  if (wHeapSize != 0)
    UnlockData( 0 );

return 1;
}

//*********************************************************************
//
// (Required by Microsoft Windows)
//
//*********************************************************************
int FAR PASCAL WEP( int iParam )
{
  if (iParam == WEP_SYSTEM_EXIT)
  {
    // System shutdown is in progress
    return 1;
  }
  else if (iParam == WEP_FREE_DLL)
  {
    // The DLL use count is zero
    return 1;
  }
  else
  {
    // Value is undefined
    return 1;
  }
}

//*********************************************************************
//
// Set 2 double words to some version numbers
//
```

```
/* Appendix C:   DPMI.C, DPMI.H   Page 12 */
//*********************************************************************
void FAR PASCAL GetLibVersion( DWORD far * major, DWORD far * minor )
{
  *major = MAKELONG( 0, 0 );
  *minor = MAKELONG( 1, 0 );
}
```

/* Appendix C:   DPMI.C, DPMI.H   Page 13 */

// Copyright (c) B-Tree Verification Systems, Inc. 1993-1993.  All rights reserved.
//
/* $Header:   T:/svs/h/dpmi.h_v   1.0   28 Jul 1993 17:12:04   BDUENOW $
 */
/* $Log:   T:/svs/h/dpmi.h_v $
 *
 *    Rev 1.0   28 Jul 1993 17:12:04   BDUENOW
 * Initial revision.
 *
 */ void FAR PASCAL GetDpmiVersionInfo( BYTE far * fpbyBuffer );
void FAR PASCAL GetDpmiMemoryInfo( BYTE far * fpbyBuffer );
WORD FAR PASCAL GetSelectorIncrementValue( void );
int FAR PASCAL GetSegmentBaseAddress( WORD wSelector, DWORD far * fpdwLinearBaseAddress );
int FAR PASCAL GetDescriptor( WORD wSelector, BYTE far * fpbyBuffer );
int FAR PASCAL AllocateSelectors( WORD far * fpwSelector, WORD wCount );
int FAR PASCAL FreeSelectors( WORD wBaseSelector, WORD wCount );
int FAR PASCAL SetSegmentBaseAddress( WORD wSelector, DWORD dwAddress );
int FAR PASCAL SetSegmentPhysicalAddress( WORD wSelector, DWORD dwAddress, DWORD dwSegmentLength );
int FAR PASCAL SetSegmentLimit( WORD wSelector, DWORD dwLimit );
int FAR PASCAL SetupSelectorsForMsWindows( WORD far * fpwBaseSelector,
                    DWORD dwBaseAddress,
                    DWORD dwLength );
int FAR PASCAL FreeSelectorsForMsWindows( WORD wBaseSelector,
                    DWORD dwLength );

/* Appendix C:   GRPHDLL.C, GRPHDLL.H   Page 1 */

```c
// Copyright (c) B-Tree Verification Systems, Inc. 1990-1995. All rights reserved.
//
/* $Header:   T:\svs\grphdll\grphdll.c_v   1.11   14 Jul 1994 09:38:04   MLOUDEN $
 */
/**************************** GRPHDLL.C ******************************
 * This module contains the main entry into the graphics capture DLL
 * and supporting DLL memory management routines
 *************************************************************************
 */ include <windows.h>
include "grphdll.h"

void CreatePens( void );    // From grpaint.c
void DeletePens( void );    // From grpaint.c
void DeletePalette( void ); // From grpaint.c
void InitFontTbl( void );   // From grphmisc.c //**************************************************************************
//
// Initialization routine ( required ) for DLL.
//
//**************************************************************************
int FAR PASCAL LibMain( HANDLE hInstance, WORD wDataSeq, WORD wHeapSize,
LPSTR lpszCmdLine )
{
  InitFontTbl();
  if( wHeapSize > 0 )
    UnlockData( 0 );
  return TRUE;
}

//**************************************************************************
//
// DLL Termination routine
//
// (Required by Microsoft Windows)
//
//**************************************************************************
int FAR PASCAL WEP( int iParam )
{

DeletePens();
```

/* Appendix C:   GRPHDLL.C, GRPHDLL.H   Page 2 */

```c
DeletePalette();

if (iParam == WEP_SYSTEM_EXIT)
{
  // System shutdown
  return 1;
}
else if (iParam == WEP_FREE_DLL)
{
  // DLL use count zero so no one is using it and we can clean up prior
  // to this DLL being released.
  return 1;
}
else
{
  // Undefined
  return 1;
}
}

//****************************************************************************
//
// Set 2 double words to some version numbers
//
//****************************************************************************
void FAR PASCAL GetLibVersion( DWORD far * major, DWORD far * minor )
{
  *major = MAKELONG( 0, 0 );
  *minor = MAKELONG( 16, 0 );
}
```

/* Appendix C: GRPHDLL.C, GRPHDLL.H   Page 3 */

```c
// Copyright (c) B-Tree Verification Systems, Inc. 1993-1995. All rights reserved.
//
/* $Header:   T:\svs\h\grphdll.h_v   1.18   20 Sep 1995 08:41:54   CLOSCHEIDER $
 *
 */
/*
 * $Log:   T:\svs\h\grphdll.h_v $
 *
 *
 */
//*************************************************************************
//
// GRPHDLL.H
//
// Interface file for the B-tree graphics DLL library
//
//************************************************************************* ifndef GRPHDLLINCLUDED define GRPHDLLINCLUDED

// MANIFEST CONSTANTS, MACROS, STRUCTURES AND TYPEDEFS define MAX_FONTS       16     // Maximum number of fonts open at any time
define FONT_NAME_SIZE  8      // Max characters in font filename
define FONT_EXT        "FNT"  // All font files have this extension

// MANIFEST CONSTANTS, MACROS, STRUCTURES AND TYPEDEFS define NUM_FONT_CHARS      96
define NUM_COLOR_HANDLES   256 define EMPTY              -1
define BMP_VERSION        "[SvsBmp000]"  // 12 BYTES MAX define BMP_TYPE_RAW        0
define BMP_TYPE_COMPRESSED 1
define BMP_TYPE_MONOCHROME 2
define BMP_TYPE_FONT       3
define BMP_TYPE_NEWFONT    4 define mBMP_WIDTH( bmp ) ( bmp->iScanLineWidth )
define mBMP_HEIGHT( bmp ) ( bmp->iNumScanLines )
```

/* Appendix C:    GRPHDLL.C, GRPHDLL.H    Page 4 */

// Get enough memory to align scanlines on DWORD boundary ( for futures )

```c
define mBMP_SIZE( bmp ) ( (DWORD) ( ( mBMP_WIDTH( bmp ) + 3 ) & 0xfffc ) *
(DWORD) mBMP_HEIGHT( bmp ) )
define mBMP_CLPWIDTH( bmp ) ( bmp->rSrcClip.right - bmp->rSrcClip.left + 1 )
define mBMP_CLPHEIGHT( bmp ) ( bmp->rSrcClip.bottom - bmp->rSrcClip.top + 1 )

define mSETBIT( b, bmap )  ((bmap)[(b) >>3] |= ((unsigned) 0x80 >> ((b) & 0x07 )))
define mCLEARBIT( b, bmap )  ((bmap)[(b) >>3] &= ~( (unsigned) 0x80 >> ( (b) & 0x07 )
) )
define mTESTBIT( b, bmap )  ((bmap)[(b) >>3] & ((unsigned) 0x80 >> ((b) & 0x07 )))

typedef struct tagCOLORS
{
    int iNumberOfColors;            // Number of colors supported
    HANDLE hCompositeBmp;           // Handle to the composite color bitmap
    void far *sCompositeBmp;        // Pointer to composite color bitmap
    HANDLE ahHandle[ NUM_COLOR_HANDLES];  // Handle to the bitmap for the
                                    // indicated color ( many be NULL )
} COLORS;

typedef struct tagBIT_MAP
{
    short int iScanLineWidth;   // Scanline width in pixels
    short int iNumScanLines;    // Number of scanlines
    BYTE byColor;               // If monochrome this is target color
    BYTE byBmpType;             // Type indicates the nature of
                                // the bitmap.
                                // BMP_TYPE_RAW - data exists as an
                                //     matrix of bytes, the size defines
                                //     scan line width and number of scanlines
                                // BMP_TYPE_COMPRESSED - raw data that has
                                //     been compressed
                                // BMP_TYPE_MONOCHROME - special format used
                                //     for searches, where data exists as on and
                                //     off bits, typically a single color.
                                // BMP_TYPE_FONT - indicates this bitmap is
                                //     a series of character matrices.
//-------------------------------------------------------------------------
// Compression format:
// The compression format is a simple run length encoding method. The
// first word of each scan line is a count of the number of count/color
// words that make up the scan line. Each scan line is thus "count" + 1
// words long. A count/color word contains the run count in the high byte
```

/* Appendix C: GRPHDLL.C, GRPHDLL.H   Page 5 */

```c
// and the color in the low byte. The best case compression is thus:
// ("scanline width"/255 + 1 ( for remainder ) + 1 (for word count) )
// * 2 words. Worst case compression can generate negative compression
// (i.e. expansion).
// The worst case is: double the original size + (2 * NumScanLines) bytes
//----------------------------------------------------------------
BOOL bCompressed;      // Indicates if data is compressed simple
                       // RLE compression
DWORD dwBitMapSize;    // Amount of memory allocated for bitmap
RECT rSrcClip;         // Clipping area of this bitmap
RECT rOverlay;         // This bitmap may be a part of a larger
                       // bitmap. rOverlay defines the region
                       // this bitmap exists at in the larger one.
HANDLE hBitmap;        // Handle of the globally allocated memory array
                       // that may contain the bitmap.
char huge *hpcPixels;  // Points to the bitmap data
HANDLE hColorMono;     // If any monochrome bmp's this is handle to
                       // their map. This should never be set
                       // if this bitmap is a monochrome bitmap
COLORS far *fpColors;  // Points to the monochrome map
                       // This is a pointer to a list of monochrome
                       // bitmaps that may have been generated for
                       // various colors.
//----------------------------------------------------------------
// Monchrome bitmaps only:
// We can speed up searchs and displays by only looking where we know there
// is data. To facilitate this speed up I keep a hit list of the scan lines
// that contain 'On' pixels as well as the first x-coordinate (pixel offset
// into the scanline) of that 'On' pixel. This adds some overhead at the
// front end but in many cases will dramatically speed up the processing.
//----------------------------------------------------------------
POINT ptFirst;              // First 'On' bit in a monochrome bitmap
HANDLE hLineFirstHit;       // Memory handle
short int far *fpiFirstHit; // Array of x-coordinates of first 'On' pixel
                            // for each line of a monochrome bitmap. A
                            // -1 indicates no 'On' pixels on the line.
HANDLE hLineLastHit;        // Memory handle
short int far *fpiLastHit;  // Array of x-coordinates of the last 'On' pixel
                            // far each line of a monochrome bitmap.
WORD wStructSize;           // Size of this structure
char Version[12];           // Stores a version name/number void far * fpPtr;           // Generic pointer
                            //    For fonts should point off to
```

/* Appendix C: GRPHDLL.C, GRPHDLL.H   Page 6 */ a font header
```
        BYTE abyExpand1[ 14 ];           // First expansion area //-- Next two fields left for compatibility with old style fonts
        short int iMinCharWidth;         // Width of narrowest char in font
        short int iMaxCharWidth;         // Width of widest char in font BYTE abyExpansion[4];            // For future expansion without
re-compiling

} BIT_MAP;

typedef BIT_MAP far * LPBIT_MAP;   // Far pointer to a bitmap typedef HANDLE hBIT_MAP;           // Handle to a bitmap // We may wish to highlight an area of a graphics display for easier
// inspection This structure defines the area we wish to highlight
// (by inverting its colors).  Currently, there is only one inversion
// area (This should change)

typedef struct tagINVERT_RGN
{
  int iLeft;      // Define the bounding box of the region to invert
  int iTop;
  int iRight;
  int iBottom;
  WORD wMemType;  // Actual or Expected
  BOOL bValidFlag; // Indicates if the invert rgn is valid
} INVERT_RGN;

// FUNCTION PROTOTYPES

// FROM grphdll.c

// FROM grbitmap.c void FAR PASCAL InitBtreeBitMap( BIT_MAP far * sBitMap );
DWORD FAR PASCAL GetWorstCaseCompressedBmpSize( int iNumScanLines,
                                int iScanLineWidth );
int FAR PASCAL AllocateMemoryForMonochromeBitMap( BIT_MAP far * sBitMap );
int FAR PASCAL AllocateMemoryForBitMap( BIT_MAP far * sBitMap );
int FAR PASCAL LockBitMap( BIT_MAP far * sBitMap );
int FAR PASCAL LockBitMapPair( BIT_MAP far * fpsBitMapA,
```

/* Appendix C: GRPHDLL.C, GRPHDLL.H   Page 7 */
```
                BIT_MAP far * fpsBitMapB );
int FAR PASCAL UnlockBitMap( BIT_MAP far * sBitMap );
BOOL FAR PASCAL LockupMonoBitMap( BIT_MAP far * sBitMap );
BOOL FAR PASCAL UnlockMonoBitMap( LPBIT_MAP sDestBitMap );
BOOL FAR PASCAL LockMonoBitMap( LPBIT_MAP sDestBitMap, LPBIT_MAP sBitMap
);
void FAR PASCAL ReleaseColors( LPBIT_MAP sBitMap );
BOOL FAR PASCAL ReleaseBitMap( LPBIT_MAP sBitMap );
BOOL FAR PASCAL MakeDuplicateBitmap( LPBIT_MAP sDupBmp, LPBIT_MAP sBitMap
);
void FAR PASCAL SetClipArea( LPBIT_MAP sBitMap, int iL, int iT, int iR, int iB );
void FAR PASCAL SetClip( BIT_MAP far * fpsBitMap, RECT rcClippingRect );
void FAR PASCAL SetNoClip( LPBIT_MAP sBitMap );
BOOL FAR PASCAL BitMapHasLegalClippingRect( BIT_MAP far * fpsBitMap );
int FAR PASCAL CountPixels( BIT_MAP far * sBitMap,
                DWORD far * dwRefTable );
int FAR PASCAL GetReferencedColors( BIT_MAP far * sBitMap,
                BYTE far * RefTable );
WORD huge * FAR PASCAL GetRLELineAddress( WORD wLine, BIT_MAP far * sBitMap
);
WORD huge * FAR PASCAL GetNextRLELineAddress( WORD huge * hpwAddr );
WORD huge * FAR PASCAL RLELineAddress( WORD wLine, LPBIT_MAP sBitMap );
WORD FAR PASCAL GetAndModifyFirstRLEPair( WORD huge * far * fphpwRLEData,
WORD iCol );
BYTE FAR PASCAL GetBmpPixel( int iCol, int iScanLine, LPBIT_MAP sBitMap );
BOOL FAR PASCAL ExpandCompressedLine( char far * fpcDestLine, WORD huge *
hpwSrcLine );
BOOL FAR PASCAL CompressBitmapLine( WORD huge * hpwDestLine, char far *
fpcSrcLine, int iLen );
DWORD FAR PASCAL CompressData( BYTE huge * p,
                WORD huge * q,
                WORD wNumRows,
                WORD wNumCols );
void FAR PASCAL UnCompressData( WORD huge * p,
                BYTE huge * q,
                WORD wNumRows );
DWORD FAR PASCAL ComputeBitMapSize( BIT_MAP far * sBitMap );
WORD FAR PASCAL CheckBmpForConsistancy( BIT_MAP far * sBitMap );
void FAR PASCAL SetMonochromeLine( LPBIT_MAP sBitMap, int iLine, int iOffs, int
iCount );
BOOL FAR PASCAL BuildMonoBitMap( LPBIT_MAP sDestBitMap, LPBIT_MAP sBitMap,
BYTE byColor );
hBIT_MAP FAR PASCAL SelectColorBitmap( LPBIT_MAP sBitMap, int iColor, int iCIdx );
int FAR PASCAL ComputeMonoBitMapPtFirst( BIT_MAP far * sBitMap );
```

/* Appendix C: GRPHDLL.C, GRPHDLL.H  Page 8 */

```c
int FAR PASCAL MakeMonoBitMapHitLists( BIT_MAP far * fpsBitMap );
int FAR PASCAL xBuildMonoBitMap( BIT_MAP far * sDestBitMap,
                BIT_MAP far * sBitMap,
                BYTE far * XlateTable );
int FAR PASCAL xxBuildMonoBitMap( BIT_MAP far * sDestinationBitMap,
                BIT_MAP far * sSourceBitMap,
                BYTE far * XlateTable );
int FAR PASCAL MakeBitMapFromArray( BYTE huge * p,
                int iNumScanLines,
                int iScanLineWidth,
                BIT_MAP far * sBitMap );
int FAR PASCAL MakeCompressedBitMap( BIT_MAP far * sUnCompressedBmp,
                BIT_MAP far * sCompressedBmp );
HANDLE FAR PASCAL UnCompressBitMap( BIT_MAP far * sBitMap );
int FAR PASCAL MakeUnCompressedBitMap( BIT_MAP far * sCompressedBmp,
                BIT_MAP far * sUnCompressedBmp );
int FAR PASCAL UnCompressBitMapPair( BIT_MAP far * fpsBitMapA,
                BIT_MAP far * fpsBitMapB,
                BIT_MAP far * fpsTempBitMapA,
                BIT_MAP far * fpsTempBitMapB,
                BOOL far * bDeleteA,
                BOOL far * bDeleteB );
int FAR PASCAL PasteBitMapToBitMapUnCompressed( BIT_MAP far * SourceBitMap,
                BIT_MAP far * DestinationBitMap,
                POINT pt );
int FAR PASCAL PasteBitMapToBitMap( BIT_MAP far * SourceBitMap,
                BIT_MAP far * DestinationBitMap,
                POINT pt );
int FAR PASCAL PasteCursorToBitMapUnCompressed( BIT_MAP far * SourceBitMap,
                BYTE far * XlateTable,
                BIT_MAP far * DestinationBitMap,
                POINT pt );
int FAR PASCAL PasteCursorToBitMap( BIT_MAP far * SourceBitMap,
                BYTE far * XlateTable,
                BIT_MAP far * DestinationBitMap,
                POINT pt );
int FAR PASCAL UnCompressAreaOfBitMap( BIT_MAP far * SourceBitMap,
                BYTE huge * hpDestination,
                RECT rect );
int FAR PASCAL CutBitMapFromCompressedBitMap( BIT_MAP far * SourceBitMap,
                BIT_MAP far * DestinationBitMap,
                RECT rect );
int FAR PASCAL CutBitMapFromUncompressedBitMap( BIT_MAP far * SourceBitMap,
                BIT_MAP far * DestinationBitMap,
```

```
/* Appendix C:   GRPHDLL.C, GRPHDLL.H   Page 9 */
                              RECT rect );
int FAR PASCAL CutBitMapFromBitMap( BIT_MAP far * SourceBitMap,
                    BIT_MAP far * DestinationBitMap,
                    RECT rect,
                    BYTE byDestinationBmpType );
int FAR PASCAL FillRectOnBitMap( BIT_MAP far * fpsBitMap,
                    RECT rcTemp,
                    BYTE byColor );
int FAR PASCAL MakeSolidColorBitMap( BIT_MAP far * sBitMap,
                    int iNumScanLines,
                    int iScanLineWidth,
                    BYTE byColor,
                    BYTE byDestinationBmpType );
int FAR PASCAL AddColumnsToBitMap( BIT_MAP far * fpsBitMap,
                    int iCol,
                    int iNumCols );
int FAR PASCAL DeleteColumnsFromBitMap( BIT_MAP far * fpsBitMap,
                    int iCol,
                    int iNumCols );
int FAR PASCAL AddRowsToBitMap( BIT_MAP far * fpsBitMap,
                    int iRow,
                    int iNumRows );
int FAR PASCAL DeleteRowsFromBitMap( BIT_MAP far * fpsBitMap,
                    int iRow,
                    int iNumRows );
int FAR PASCAL MakeBitMapFromMonochromeBitMap( BIT_MAP far * fpSource,
                    BIT_MAP far * fpDestination,
                    BYTE byZeroColor,
                    BYTE byOneColor,
                    BYTE byDestinationBmpType );
int FAR PASCAL CompositeBitMapWithBitMapUnCompressed( BIT_MAP far *
SourceBitMap,
                                        BIT_MAP far * DestinationBitMap,
                                        POINT pt,
                                        BYTE byGlobTextColor,
                                        BYTE byGlobBackgroundColor );

// FROM grpaint.c void FAR PASCAL MakeGrphDspPens( void );  // obsolete
void FAR PASCAL ReleaseGrphDspPens( void );  // obsolete
void FAR PASCAL PaintScanLine( HDC hWindowDC, WORD wDestX, WORD wDestY,
WORD wLen,
                                        LPBIT_MAP sBitMap, WORD
```

/* Appendix C: GRPHDLL.C, GRPHDLL.H Page 10 */

```c
                  wSrcY, BYTE far *fpbyColorMap );
void FAR PASCAL PaintFilterScanLine( HDC hWindowDC, WORD wDestX, WORD
wDestY, WORD wLen,
                  LPBIT_MAP sBitMap, WORD wSrcY,
                  char far *acColorFilter, BYTE far *fpbyColorMap );
void FAR PASCAL xPaintScanLine( HDC hWindowDC,
                  WORD wDestX, WORD wDestY, WORD wLen,
                  LPBIT_MAP sBitMap, WORD wSrcY,
                  BYTE far * XlateTable );
void FAR PASCAL PaintMonoScanLine( HDC hWindowDC, WORD wDestX, WORD
wDestY, WORD wLen, LPBIT_MAP sBitMap, WORD wSrcY );
void FAR PASCAL xPaintMonoScanLine( HDC hWindowDC,
                  WORD wSrcY,
                  WORD wSrcX,
                  WORD wLen,
                  BIT_MAP far * sBitMap,
                  WORD wDestY,
                  WORD wDestX,
                  BOOL bWhiteOutLine,
                  HPEN hWhitePen,
                  DWORD dwBlackPixel );
void FAR PASCAL xDrawGrid( HDC hDC,
                  int iTop,
                  int iLeft,
                  int iNumRows,
                  int iNumCols,
                  BYTE byScale );
void FAR PASCAL xPaintUncompressedBitMapData( HDC hDC,
                  BIT_MAP far * sBitMap,
                  HPALETTE far *phPalette,
                  BYTE far *XlateTable,
                  int iTop,
                  int iLeft,
                  int iNumRows,
                  int iNumCols,
                  int iZoomFactor,
                  int iDestinationRow,
                  int iDestinationCol );
void FAR PASCAL xPaintCompressedBitMapData( HDC hDC,
                  BIT_MAP far * sBitMap,
                  HPALETTE far *phPalette,
                  BYTE far *XlateTable,
                  int iTop,
                  int iLeft,
```

/* Appendix C:   GRPHDLL.C, GRPHDLL.H   Page 11 */

```c
                            int iNumRows,
                            int iNumCols,
                            int iZoomFactor,
                            int iDestinationRow,
                            int iDestinationCol );
void FAR PASCAL xPaintMonoBitMapData( HDC hDC,
                            BIT_MAP far * sBitMap,
                            int iTop,
                            int iLeft,
                            int iNumRows,
                            int iNumCols,
                            int iZoomFactor,
                            int iDestinationRow,
                            int iDestinationCol,
                            COLORREF dwZeroBitColor,
                            COLORREF dwOneBitColor );

long FAR PASCAL GetPixelCount( BYTE bColor, UINT iCol, UINT iScanLine, UINT
iColWidth, UINT iScanLineHeight, LPBIT_MAP sBitMap );

// FROM bmpfiles.c

BOOL FAR PASCAL WriteBitMapHdr( int iFileHandle, BIT_MAP far * sBitMap );
BOOL FAR PASCAL ReadBitMapHdr( int iFileHandle, BIT_MAP far * sBitMap );
BOOL FAR PASCAL WriteBitMapData( int iFileHandle, BIT_MAP far * sBitMap );
DWORD FAR PASCAL ReadBitMapData( int iFileHandle, BIT_MAP far * sBitMap );
BOOL FAR PASCAL WriteBitMap( char far * szOutFile, BIT_MAP far * sBitMap );
BOOL FAR PASCAL ReadBitMap( char far * szInFile, BIT_MAP far * sBitMap );
BOOL FAR PASCAL MakeBitMapFromFile( char far *szInFile,
                BIT_MAP far *sBitMap ); // obsolete // FROM cardintf.c int FAR PASCAL GB_SetupMemorySelectors ( void );
void FAR PASCAL GB_LocalFreeSelector (WORD wSelector);
int FAR PASCAL FreeGBSelectors( void );
int FAR PASCAL ClearFrameBuff( void );
void FAR PASCAL EnableGBMemAccess( void );
void FAR PASCAL DisableGBMemAccess( void );
void FAR PASCAL SetGBFrameCounter( void );
BOOL FAR PASCAL CheckForCard( WORD );
WORD FAR PASCAL Convert2ScanLine( WORD wCol, WORD wLine, WORD wWidth,
LPBIT_MAP sBitMap );
BOOL FAR PASCAL MakeActBitMap( WORD wID, LPBIT_MAP sBitMap, int iXDim, int
```

/* Appendix C:   GRPHDLL.C, GRPHDLL.H   Page 12 */ iYDim, RECT rPad );
WORD FAR PASCAL GetNbrOfGraphicsCards( void );
WORD FAR PASCAL GetNextGraphicsCardSlot( WORD wSlot );

// FROM grphmisc.c void FAR PASCAL SetInvertInfo( int iLeft, int iTop, int iRight, int iBottom, WORD wMemType, BOOL bValidDataFlg );
INVERT_RGN far * FAR PASCAL GetInvertInfo( void );
BIT_MAP far * FAR PASCAL GetSearchFont( void );
BIT_MAP far * FAR PASCAL LoadFont( char far * fpcFontName );
BOOL FAR PASCAL UnloadFont( char far *fpcFontName );
char far * FAR PASCAL GetCurrentFont( void );
LPBIT_MAP FAR PASCAL LoadBitMapObject( LPSTR lpszObjName );
BOOL FAR PASCAL ReleaseBitMapObject( LPSTR lpszObjName );
int FAR PASCAL InvertMonoBitMapData( BIT_MAP far * fpsBitMap );

endif

/* Appendix D, GCC-8U1.pds    Page 1 */

; PALASM Design description

;-------------------------------- Declaration Segment ------------
TITLE    EISA/HOST MEMORY ADDRESS BUFFER
PATTERN  GCU01.PDS    Q0013-001
REVISION 1.00
AUTHOR   RICK NEWMAN
COMPANY  B-TREE VERIFICATION SYSTEMS
DATE     06/17/93   Copyright (c) B-Tree Verification Systems, Inc. 1993. All rights reserved.

CHIP    GCU01       MACH230

;-------------------------------- PIN Declarations --------------
```
PIN 65                    FCLK         COMB ; INPUT
PIN 62                    START        COMB ; INPUT
PIN 79                    PAC          COMB ; INPUT
PIN 78                    F_S          COMB ; INPUT
PIN 77                    R_C          COMB ; INPUT
PIN 37, 36, 35, 34        SBE[3..0]    COMB ; INPUT
PIN 80, 47, 39, 59        SA[21..18]   COMB ; INPUT
PIN 28, 70, 13, 10        SA[17..14]   COMB ; INPUT
PIN 72, 69, 81, 46        SA[13..10]   COMB ; INPUT
PIN 38, 58, 29, 73        SA[9..6]     COMB ; INPUT
PIN 12,  8, 33, 31        SA[5..2]     COMB ; INPUT
PIN 23, 20, 76, 75        FCA[21..18]  COMB ; INPUT
PIN 50, 83, 48, 41        FCA[17..14]  COMB ; INPUT
PIN 49, 51,  9, 30        FCA[13..10]  COMB ; INPUT
PIN 56, 55,  4,  7        FCA[9..6]    COMB ; INPUT
PIN 52, 57, 71, 18        FCA[5..2]    COMB ; INPUT
NODE 119, 72, 56, 90      LSA[21..18]  LAT  ; BURIED
NODE 46, 107, 31, 14      LSA[17..14]  LAT  ; BURIED
NODE 111, 105, 117, 69    LSA[13..10]  LAT  ; BURIED
NODE 55, 89, 45, 113      LSA[9..6]    LAT  ; BURIED
NODE 33, 13               LSA[5..4]    LAT  ; BURIED
NODE 115, 70, 52, 86      PA[9..6]     REG  ; BURIED
NODE 42, 99, 27, 10       PA[5..2]     REG  ; BURIED
NODE 25, 23               PA[1..0]     REG  ; BURIED
PIN  5, 17,  3, 19        CH[3..0]     COMB ; OUTPUT
PIN 60, 27, 26, 25        LBE[3..0]    LAT  ; OUTPUT
PIN 68, 67                LSA[3..2]    LAT  ; OUTPUT
PIN 82, 45, 40, 61        MA[9..6]     COMB ; OUTPUT
PIN 24, 66, 14,  6        MA[5..2]     COMB ; OUTPUT
PIN 15, 16                MA[1..0]     COMB ; OUTPUT
```

/* Appendix D, GCC-8U1.pds    Page 2 */

;---------------------------------- Boolean Equation Segment ------
EQUATIONS
MINIMIZE_OFF

```
LSA[21..2].RSTF  = GND
LSA[21..2].SETF  = GND
/LSA[21..2].CLKF = START
LBE[3..0].RSTF   = GND
LBE[3..0].SETF   = GND
/LBE[3..0].CLKF  = START
PA[9..0].RSTF    = GND
PA[9..0].SETF    = GND
PA[9..0].CLKF    = FCLK

LSA[21..2] *= SA[21..2]

LBE[3..0]  *= SBE[3..0]

PA[9..0].T :=  FCA[21..12] * /PA[9..0] * /F_S * /PAC
            + /FCA[21..12] *  PA[9..0] * /F_S * /PAC
            +  LSA[21..12] * /PA[9..0] *  F_S * /PAC
            + /LSA[21..12] *  PA[9..0] *  F_S * /PAC

MA[9..0] = FCA[11..2]  * /F_S * /R_C
         + FCA[21..12] * /F_S *  R_C
         + LSA[11..2]  *  F_S * /R_C
         + LSA[21..12] *  F_S *  R_C

CH[3] =  PA[9] * /FCA[21]
      + /PA[9] *  FCA[21]
      +  PA[8] * /FCA[20]
      + /PA[8] *  FCA[20]
      +  PA[7] * /FCA[19]
      + /PA[7] *  FCA[19]
      +  PA[6] * /FCA[18]
      + /PA[6] *  FCA[18]
      +  PA[5] * /FCA[17]
      + /PA[5] *  FCA[17]
CH[2] =  PA[4] * /FCA[16]
      + /PA[4] *  FCA[16]
      +  PA[3] * /FCA[15]
      + /PA[3] *  FCA[15]
      +  PA[2] * /FCA[14]
      + /PA[2] *  FCA[14]
```

/* Appendix D, GCC-8U1.pds    Page 3 */

```
     + PA[1] * /FCA[13]
     + /PA[1] *  FCA[13]
     + PA[0] * /FCA[12]
     - /PA[0] *  FCA[12]
CH[1] = PA[9] * /LSA[21]
     + /PA[9] *  LSA[21]
     + PA[8] * /LSA[20]
     + /PA[8] *  LSA[20]
     + PA[7] * /LSA[19]
     + /PA[7] *  LSA[19]
     + PA[6] * /LSA[18]
     + /PA[6] *  LSA[18]
     + PA[5] * /LSA[17]
     + /PA[5] *  LSA[17]
CH[0] = PA[4] * /LSA[16]
     + /PA[4] *  LSA[16]
     + PA[3] * /LSA[15]
     + /PA[3] *  LSA[15]
     + PA[2] * /LSA[14]
     + /PA[2] *  LSA[14]
     + PA[1] * /LSA[13]
     + /PA[1] *  LSA[13]
     + PA[0] * /LSA[12]
     + /PA[0] *  LSA[12]

MINIMIZE_ON
;---------------------------------- Simulation Segment ------------
;SIMULATION
;------------------------------------------------------------------
```

/* Appendix D, GCC-8U4.pds Page 1 */

; PALASM Design description

;--------------------------------- Declaration Segment ------------
TITLE    EISA/HOST DRAM CONTROLLER
PATTERN  GCU04.PDS    Q0013-004
REVISION 1.01
AUTHOR   RICK MURPHY-NEWMAN
COMPANY  B-TREDE VERIFICATION SYSTEMS
DATE 09/10/93 Copyright (c) B-Tree Verification Systems, Inc. 1993. All rights reserved.

CHIP    GCU04    MACH210

;-------------------------------- PIN Declarations --------------
NODE 1                GLOBAL
PIN  10               RESDRV      COMB ; INPUT
PIN  35               FCLK        COMB ; INPUT
PIN  11               SMREQ       COMB ; INPUT
PIN  39               REFRESH     COMB ; INPUT
PIN  38               LWR         COMB ; INPUT
PIN  42, 40, 37, 13   LBE[3..0]   COMB ; INPUT
PIN  36, 30, 33, 32   CH[3..0]    COMB ; INPUT
PIN  41               EF[3]       COMB ; INPUT
NODE 7, 23, 5         ST[2..0]    REG  ; BURIED
NODE 49               _SMREQ      REG  ; BURIED
NODE 59               _RFREQ      REG  ; BURIED
NODE 55               _EF[3]      REG  ; BURIED
NODE 52               SM          REG  ; BURIED
NODE 61               RF          REG  ; BURIED
NODE 65               FR          REG  ; BURIED
NODE 27               RIP         REG  ; BURIED
PIN  21               RAS         REG  ; OUTPUT
PIN  9, 7, 4, 20      CAS[3..0]   REG  ; OUTPUT
PIN  25               PAC         REG  ; OUTPUT
PIN  14               F_S         REG  ; OUTPUT
PIN  24               R_C         REG  ; OUTPUT
PIN  6                FRD         REG  ; OUTPUT
PIN  19               DWE         REG  ; OUTPUT
PIN  26               DLE         REG  ; OUTPUT
PIN  15               FRAME       REG  ; OUTPUT
PIN  29, 28, 18       RDY[2..0]   REG  ; OUTPUT
PIN  43               GEXRDY      COMB ; OUTPUT
PIN  27               SH          COMB ; OUTPUT ;-------------------------------- Boolean Equation Segment ------

/* Appendix D, GCC-8U4.pds   Page 2 */

```
EQUATIONS
MINIMIZE_OFF

GLOBAL.RSTF    = RESDRV
ST[2..0].CLKF  = FCLK
RAS.CLKF       = FCLK
CAS[3..0].CLKF = FCLK
PAC.CLKF       = FCLK
F_S.CLKF       = FCLK
R_C.CLKF       = FCLK
DWE.CLKF       = FCLK
FRD.CLKF       = FCLK
DLE.CLKF       = FCLK
FRAME.CLKF     = FCLK
RDY[2..0].CLKF = FCLK
_SMREQ.CLKF    = FCLK
_RFREQ.CLKF    = FCLK
_EF[3].CLKF    = FCLK
SM.CLKF        = FCLK
RF.CLKF        = FCLK
FR.CLKF        = FCLK
RIP.CLKF       = FCLK

/_SMREQ := SMREQ
/_RFREQ := /REFRESH
_EF[3]  := EF[3]

/SM  := SM * /_SMREQ * RDY[1]
     + /SM * RDY[1]
/RF  := RF * /_RFREQ * RDY[2]
     + /RF * RDY[2]
 FR  := /FR * _EF[3] * RDY[0]
     +  FR * RDY[0]

ST[2] := ST[2] * /ST[0]
     + /ST[1] * /ST[0] * /RAS  * /RF
     +  ST[2] * /ST[1] * /RIP
     + /ST[2] *  ST[1] *  ST[0]
     + /ST[1] * /ST[0] * /RAS  *  FR  * CH[3]
     + /ST[1] * /ST[0] * /RAS  *  FR  * CH[2]
     + /ST[1] * /ST[0] * /RAS  * /FR  * CH[1] * /SM
     + /ST[1] * /ST[0] * /RAS  * /FR  * CH[0] * /SM

ST[1] := /ST[2] * /ST[1] * ST[0]
```

/* Appendix D, GCC-8U4.pds    Page 3 */

```
     + ST[1]  * /ST[0]
     + /ST[1] *  ST[0] * /RIP
     + /ST[2] * /ST[1] * /RAS   * FR
     + /ST[2] * /ST[1] * /RAS   * /SM
     + /ST[2] * /ST[1] * /RAS   * /RF
     + /ST[2] * /ST[1] *  FR    * /F_S  * RF
     + /ST[2] * /ST[1] * /FR    *  F_S  * RF   * /SM

ST[0] :=  ST[1] * /ST[0]
     +  ST[2] * /ST[0]
     + /ST[0] *  RAS   * /RF
     + /ST[0] *  RAS   *  FR   *  F_S
     + /ST[0] *  RAS   * /FR   * /F_S  * /SM
     + /ST[0] * /RAS   *  FR   * /CH[3] * /CH[2] * RF
     + /ST[0] * /RAS   * /FR   * /CH[1] * /CH[0] * RF * /SM

/F_S.T := /ST[2] * /ST[1] * /ST[0] * RF * /SM * /FR * /F_S
     + /ST[2] * /ST[1] * /ST[0] * RF *  FR *  F_S

/RAS.T := /ST[2] * /ST[1] * /ST[0] * /RAS * /RF
     + /ST[2] * /ST[1] * /ST[0] *  RAS * RF * /SM * /FR *  F_S
     + /ST[2] * /ST[1] * /ST[0] *  RAS * RF *  FR * /F_S
     + /ST[2] * /ST[1] * /ST[0] * /RAS * RF * /SM * /FR *  F_S * SH
     + /ST[2] * /ST[1] * /ST[0] * /RAS * RF *  FR * /F_S * CH[3]
     + /ST[2] * /ST[1] * /ST[0] * /RAS * RF *  FR * /F_S * CH[2]
     + /ST[2] * /ST[1] *  ST[0] *  RAS
     +  ST[2] * /ST[1] *  ST[0] * /RAS * /RIP

/R_C := /RAS

/CAS[3..0] := /ST[2] *  ST[1] *  ST[0] * /LBE[3..0] * RIP * F_S
     + /ST[2] *  ST[1] *  ST[0] *  FR * /F_S * /FRD
     + /ST[2] * /ST[1] * /ST[0] * /RF *  RAS
     + /ST[2] *  ST[1] *  ST[0] * /CAS[3..0]
     +  ST[2] *  ST[1] * /ST[0] * /CAS[3..0]

/DWE := /RAS *  RF * /SM *  LWR * RIP
     + /RAS *  SM *  FR * RIP
     + /RAS *  RF *  SM * /FR * /DWE * RIP

/FRD := /ST[2] * /ST[1] * /ST[0] * RF * FR * /RAS * /CH[3] * /CH[2]
     + /ST[2] *  ST[1] * /ST[0] * RF * FR
     + /ST[2] *  ST[1] *  ST[0] * /FRD
```

/* Appendix D, GCC-8U4.pds   Page 4 */

/PAC := /ST[2] * ST[1] * ST[0]

/FRAME := /ST[2] * ST[1] * ST[0] * FR * /F_S * /FRD

/DLE := /ST[2] * ST[1] * ST[0]
     + ST[2] * /ST[1] * /ST[0]

/RIP := RAS * /CAS[3] * /CAS[2] * /CAS[1] * /CAS[0]
     + /RIP * /RAS

/RDY[2] := RAS * /CAS[3] * /CAS[2] * /CAS[1] * /CAS[0]
        + /RDY[2] * /_RFREQ

/RDY[1] := ST[2] * /ST[1] * /ST[0] * /SM * F_S * RIP
        + /RDY[1] * /_SMREQ

/RDY[0] := /ST[2] * ST[1] * ST[0] * FR * /F_S * RIP

/SH = /CH[1] * /CH[0]

/GEXRDY = /RDY[1] * SMREQ

MINIMIZE_ON
;---------------------------------- Simulation Segment ------------
;SIMULATION
;------------------------------------------------------------------

/* Appendix D, GCC-8U5.pds  Page 1 */

; PALASM Design description

;-------------------------------- Declaration Segment ------------
TITLE    EISA/HOST DATA BUFFER CONTROL
PATTERN  GCU05.PDS       Q0013-005
REVISION 1.01
AUTHOR   RICK NEWMAN
COMPANY  B-TREE VERIFICATION SYSTEMS
DATE     09/10/93   Copyright (c) B-Tree Verification Systems, Inc. 1993. All rights reserved.

CHIP     GCU05        MACH110

;-------------------------------- PIN Declarations --------------
PIN 31              SMREQ      COMB ; INPUT
PIN 30              FC_CE      COMB ; INPUT
PIN 29              HV_CE      COMB ; INPUT
PIN 28              SIOCE      COMB ; INPUT
PIN 35              CAPTURE    COMB ; INPUT
PIN 13              LWR        COMB ; INPUT
PIN 25              CMD        COMB ; INPUT
PIN 33, 32, 11, 10  LBE[3..0]  COMB ; INPUT
PIN 43, 42, 41, 40  EF[3..0]   COMB ; INPUT
PIN 39, 38, 37, 36  FF[3..0]   COMB ; INPUT
PIN 5, 4, 3, 2      SDOE[3..0]   COMB ; OUTPUT
PIN 17, 16, 15, 14  SDMDOE[3..0] COMB ; OUTPUT
PIN 9, 8, 7, 6      SDXDOE[3..0] COMB ; OUTPUT
PIN 21              EMPTY      COMB ; OUTPUT
PIN 24              FULL       COMB ; OUTPUT ;-------------------------------- Boolean Equation Segment ------
EQUATIONS
MINIMIZE_OFF

EMPTY = EF[3] + EF[2] + EF[1] + EF[0]

FULL  = /FF[3] + /FF[2] + /FF[1] + /FF[0]

/SDOE[3..0]  = /LBE[3..0] * SMREQ * /LWR * /CMD
             + /LBE[3..0] * /FC_CE * /LWR * /CMD
             + /LBE[3..0] * /HV_CE * /LWR * /CMD
             + /LBE[3..0] * /SIOCE * /LWR * /CMD

/SDXDOE[3..0] = /LBE[3..0] * /FC_CE * LWR
              + /LBE[3..0] * /HV_CE * LWR

/* Appendix D, GCC-8U5.pds   Page 2 */

+ /LBE[3..0] * /SIOCE * LWR

/SDMDOE[3..0] = /LBE[3..0] * SMREQ * LWR * /CAPTURE

MINIMIZE_ON
;---------------------------------- Simulation Segment ------------
;SIMULATION
;------------------------------------------------------------------

/* Appendix D, GCC-8U7.pds    Page 1 */

; PALASM Design description
;!!!THIS FILE MUST BE UPDATED FOR EACH PCB!!!
;-------------------------------- Declaration Segment ------------
TITLE    EISA DECODE I/O PORT
PATTERN  GCU07.PDS     Q0013-007
REVISION 1.01
AUTHOR   RICK MURPHY-NEWMAN
COMPANY  B-TREE VERIFICATION SYSTEMS
DATE     09/10/93  Copyright (c) B-Tree Verification Systems, Inc. 1993.  All rights reserved.

CHIP    GCU07       MACH230

;-------------------------------- PIN Declarations --------------
NODE 1              GLOBAL
PIN  20             RESDRV      COMB ; INPUT
PIN  65             START       COMB ; INPUT
PIN  62             CMD         COMB ; INPUT
PIN  23             REFRESH     COMB ; INPUT
PIN  54             SWR         COMB ; INPUT
PIN  55             SMIO        COMB ; INPUT
PIN  70             AEN         COMB ; INPUT
PIN  10, 77, 28, 31   SBE[3..0]   COMB ; INPUT
PIN  33, 34, 35, 36   SA[31..28]  COMB ; INPUT
PIN  49, 50, 51, 52   SA[27..24]  COMB ; INPUT
PIN  29, 30           SA[9..8]    COMB ; INPUT
PIN  78, 75, 83, 41   SA[5..2]    COMB ; INPUT
PIN  8              EMPTY       COMB ; INPUT
PIN  76             FULL        COMB ; INPUT
PIN  7              CAPTURE     COMB ; INPUT
PIN  9              POK         COMB ; INPUT
NODE 94             LCAP        LAT  ; INPUT
NODE 96             LREF        LAT  ; INPUT
NODE 64             PG16MH      COMB ; BURIED
NODE 80             PG16ML      COMB ; BURIED
NODE 16, 14, 12, 10   PG[7..4]    REG  ; BURIED
NODE 122, 124, 126, 128  PG[3..0]   REG  ; BURIED
NODE 46             ENABLE      REG  ; BURIED
NODE 107            LEN         LAT  ; BURIED
NODE 17, 51, 33, 49   LBE[3..0]   LAT  ; INPUT
NODE 65, 55, 61, 59   LA[31..28]  LAT  ; INPUT
NODE 75, 77, 73, 81   LA[27..24]  LAT  ; INPUT
NODE 31, 29           LA[9..8]    LAT  ; INPUT
NODE 113, 111, 42, 44  LA[5..2]   LAT  ; INPUT
PIN  6, 5, 4, 3       SD[31..28]  COMB ; I/O /* Appendix D, GCC-8U7.pds   Page 2 */

```
PIN  82, 81, 80, 79    SD[27..24]    COMB ; I/O
PIN  37, 38, 39, 40    SD[23..20]    COMB ; I/O
PIN  45, 46, 47, 48    SD[19..16]    COMB ; I/O
PIN  16, 17, 18, 19    SD[15..12]    COMB ; I/O
PIN  69, 68, 67, 66    SD[11..8]     COMB ; I/O
PIN  24, 25, 26, 27    SD[7..4]      COMB ; I/O
PIN  61, 60, 59, 58    SD[3..0]      COMB ; I/O
PIN  57                LMIO          LAT  ; OUTPUT
PIN  56                LWR           LAT  ; OUTPUT
PIN  73                RESET         REG  ; OUTPUT
PIN  72                SMREQ         COMB ; OUTPUT
PIN  12                SIOCE         COMB ; OUTPUT
PIN  13                HV_CE         COMB ; OUTPUT
PIN  14                FC_CE         COMB ; OUTPUT
PIN  15                TRIGR         COMB ; OUTPUT
PIN  71                GEX32         COMB ; OUTPUT

;--------------------------------- Boolean Equation Segment ------
EQUATIONS
MINIMIZE_OFF GLOBAL.RSTF      = RESDRV
SD[31..24].TRST  = /SIOCE * /LWR * /LBE[3]
SD[23..16].TRST  = /SIOCE * /LWR * /LBE[2]
SD[15..8].TRST   = /SIOCE * /LWR * /LBE[1]
SD[7..0].TRST    = /SIOCE * /LWR * /LBE[0]
PG[7..0].CLKF    = CMD
RESET.CLKF       = CMD
ENABLE.CLKF      = CMD
/LWR.CLKF        = START
/LMIO.CLKF       = START
/LCAP.CLKF       = START
/LREF.CLKF       = START
/LEN.CLKF        = START
/LBE[3..0].CLKF  = START
/LA[31..28].CLKF = START
/LA[27..24].CLKF = START
/LA[9..8].CLKF   = START
/LA[5..2].CLKF   = START PG[7..0].T :=  PG[7..0] * /SD[31..24]
           * /SIOCE * /LBE[3] * LWR * /LA[3] * LA[2]
         + /PG[7..0] * SD[31..24]
           * /SIOCE * /LBE[3] * LWR * /LA[3] * LA[2]
```

/* Appendix D, GCC-8U7.pds   Page 3 */

```
ENABLE.T := ENABLE * /SD[7] * /SIOCE * /LBE[0] * LWR * /LA[3] * LA[2]
         + /ENABLE * SD[7]  * /SIOCE * /LBE[0] * LWR * /LA[3] * LA[2]

RESET.T := RESET * /SD[8] * /SIOCE * /LBE[1] * LWR * /LA[3] * LA[2]
        + /RESET * SD[8]  * /SIOCE * /LBE[1] * LWR * /LA[3] * LA[2]

CASE (LA[3..2])
BEGIN
;EISA I/O VALUES DWORD THREE (READ ONLY)
;CURRENT DATE -> 08/11/1993
;SD[31..24] = MM  BYTE 3 EIGHT DIGIT BCD
;SD[23..16] = DD  BYTE 2 DATE CODE
;SD[15..8]  = YY  BYTE 1 TO BE UPDATED
;SD[7..0]   = YY  BYTE 0 FOR EACH BOARD
 3: BEGIN SD[31..28] = 0
        SD[27..24] = 8
        SD[23..20] = 1
        SD[19..16] = 1
        SD[15..12] = 1
        SD[11..8]  = 9
        SD[7..4]   = 9
        SD[3..0]   = 3
    END
;EISA I/O VALUES DWORD TWO (READ ONLY)
;CURRENT SERIAL NUMBER -> 00001008
;SD[31..24] = 00  BYTE 3 EIGHT DIGIT BCD
;SD[23..16] = 00  BYTE 2 SERIAL NUMBER
;SD[15..8]  = 00  BYTE 1 TO BE UPDATED
;SD[7..0]   = 02  BYTE 0 FOR EACH BOARD
 2: BEGIN SD[31..28] = 0
        SD[27..24] = 0
        SD[23..20] = 0
        SD[19..16] = 0
        SD[15..12] = 1
        SD[11..8]  = 0
        SD[7..4]   = 0
        SD[3..0]   = 8
    END
;EISA I/O VALUES DWORD ONE (READ-WRITE)
;SD[31..24] = PG[7..0]  BYTE 3 PAGE MAP REGISTER
;SD[23..16] = FFFFEEEE  BYTE 2 FIFO FLAG STATUS
;SD[15..8]  = CCCC000R  BYTE 1 RESET CONTROL REGISTER
;SD[7..0]   = E00000P0  BYTE 0 ENABLE/STATUS CONTROL REGISTER
 1: BEGIN SD[31..28] = PG[7..4]
```

```
/* Appendix D, GCC-8U7.pds   Page 4 */
        SD[27..24] = PG[3..0]
        SD[23..20] = FULL
        SD[19..16] = EMPTY
        SD[15..12] = LCAP
        SD[11..9]  = 0
        SD[8]      = RESET
        SD[7]      = ENABLE
        SD[6..2]   = 0
        SD[1]      = POK
        SD[0]      = 0
    END
;EISA I/O VALUES DWORD ZERO (READ ONLY)
;SD[31..24] = 01  BYTE 3 REVISION NUMBER
;SD[23..16] = 60  BYTE 2 PRODUCT NUMBER
;SD[15..8]  = D3  BYTE 1 MANUFACTURER CODE
;SD[7..0]   = 1E  BYTE 0 MANUFACTURER CODE "GVS"
0: BEGIN SD[31..28] = #H0
        SD[27..24] = #H1
        SD[23..20] = #H6
        SD[19..16] = #H0
        SD[15..12] = #HD
        SD[11..8]  = #H3
        SD[7..4]   = #H1
        SD[3..0]   = #HE
    END
END LWR       *= SWR
LMIO      *= SMIO
LCAP      *= CAPTURE
LREF      *= REFRESH
LEN       *= AEN
LBE[3..0] *= SBE[3..0]
LA[31..28] *= SA[31..28]
LA[27..24] *= SA[27..24]
LA[9..8]   *= SA[9..8]
LA[5..2]   *= SA[5..2]

PG16MH = /LA[31] * /PG[7]
       +  LA[31] *  PG[7]
       + /LA[30] * /PG[6]
       +  LA[30] *  PG[6]
       + /LA[29] * /PG[5]
       +  LA[29] *  PG[5]
```

/* Appendix D, GCC-8U7.pds   Page 5 */
```
         + /LA[28] * /PG[4]
         +  LA[28] *  PG[4]
PG16ML = /LA[27] * /PG[3]
         +  LA[27] *  PG[3]
         + /LA[26] * /PG[2]
         +  LA[26] *  PG[2]
         + /LA[25] * /PG[1]
         +  LA[25] *  PG[1]
         + /LA[24] * /PG[0]
         +  LA[24] *  PG[0]

SMREQ = /PG16MH * /PG16ML *  LMIO * ENABLE * LREF * /LCAP * /CMD

/SIOCE = /LA[9] * /LA[8] * /LA[5] * /LA[4] * /LMIO * /LEN * LREF * /CMD

/HV_CE = /LA[9] * /LA[8] * /LA[5] *  LA[4] * /LMIO * /LEN * LREF * /CMD

/FC_CE = /LA[9] * /LA[8] *  LA[5] * /LA[4] * /LMIO * /LEN * LREF * /CMD

/TRIGR = /LA[9] * /LA[8] *  LA[5] *  LA[4] * /LMIO * /LEN * LREF * /CMD

GEX32 = /PG16MH * /PG16ML *  SMIO * ENABLE * LREF
         + /SA[9]  * /SA[8]  * /SMIO * /AEN    * LREF

MINIMIZE_ON
;--------------------------------- Simulation Segment ------------
;SIMULATION
;-----------------------------------------------------------------
```

/* Appendix D, GCC-8U8.pds   Page 1 */

; PALASM Design description

;-------------------------------- Declaration Segment ------------
TITLE    EISA/HOST MEMORY ADDRESS BUFFER
PATTERN  GCU08.PDS      Q0013-008
REVISION 1.00
AUTHOR   RICK NEWMAN
COMPANY  B-TREE VERIFICATION SYSTEMS
DATE     06/17/93 Copyright (c) B-Tree Verification Systems, Inc. 1993. All rights reserved.

CHIP    GCU08        MACH210

;-------------------------------- PIN Declarations ---------------
PIN 13              FCLK        COMB ; INPUT
PIN 11              FRAME       COMB ; INPUT
PIN 10              FC_CE       COMB ; INPUT
PIN 35              LWR         COMB ; INPUT
PIN 33, 32          LSA[3..2]   COMB ; INPUT
PIN 37, 36, 31, 30  SD[7..4]    COMB ; I/O
PIN 29, 28, 27, 26  SD[3..0]    COMB ; I/O
PIN 42, 43, 38, 41  FCA[21..18] REG ; BURIED
PIN 2, 3, 4, 5      FCA[17..14] REG ; BURIED
PIN 6, 7, 8, 9      FCA[13..10] REG ; BURIED
PIN 14, 15, 16, 17  FCA[9..6]   REG ; BURIED
PIN 18, 19, 20, 21  FCA[5..2]   REG ; BURIED
NODE 3, 33          FCY[1..0]   REG ; BURIED ;-------------------------------- Boolean Equation Segment ------
EQUATIONS
MINIMIZE_OFF SD[7..0].TRST    = /FC_CE * /LWR
FCY[1..0].RSTF   = GND
FCY[1..0].SETF   = GND
FCY[1..0].CLKF   = FCLK
FCA[21..2].RSTF  = GND
FCA[21..2].SETF  = GND
FCA[21..2].CLKF  = FCLK ;LOAD TERMS
FCA[21..20].T := /FC_CE *  LSA[3] * LSA[2] * LWR *  SD[1..0] * /FCA[21..20]
              + /FC_CE *  LSA[3] * LSA[2] * LWR * /SD[1..0] *  FCA[21..20]
FCA[11..10].T := /FC_CE * /LSA[3] * LSA[2] * LWR *  SD[1..0] * /FCA[11..10]
              + /FC_CE * /LSA[3] * LSA[2] * LWR * /SD[1..0] *  FCA[11..10]

/* Appendix D, GCC-8U8.pds  Page 2 */

```
FCA[19..12].T  := /FC_CE *  LSA[3] * /LSA[2] * LWR *  SD[7..0] * /FCA[19..12]
               +  /FC_CE *  LSA[3] * /LSA[2] * LWR * /SD[7..0] *  FCA[19..12]
FCA[9..2].T    := /FC_CE * /LSA[3] * /LSA[2] * LWR *  SD[7..0] * /FCA[9..2]
               +  /FC_CE * /LSA[3] * /LSA[2] * LWR * /SD[7..0] *  FCA[9..2]
FCA[2].T   := /FRAME
FCA[3].T   := /FRAME   * FCA[2]
FCA[4].T   := /FRAME   * FCA[2]  * FCA[3]
FCA[5].T   := /FRAME   * FCA[2]  * FCA[3]  * FCA[4]
FCA[6].T   := /FRAME   * FCA[2]  * FCA[3]  * FCA[4]  * FCA[5]
FCA[7].T   := /FRAME   * FCA[2]  * FCA[3]  * FCA[4]  * FCA[5]
            * FCA[6]
FCA[8].T   := /FRAME   * FCA[2]  * FCA[3]  * FCA[4]  * FCA[5]
            * FCA[6]  * FCA[7]
FCA[9].T   := /FRAME   * FCA[2]  * FCA[3]  * FCA[4]  * FCA[5]
            * FCA[6]  * FCA[7]  * FCA[8]
FCY[0]     := /FRAME   * /FCA[2] * FCA[3]  * FCA[4]  * FCA[5]
            * FCA[6]  * FCA[7]  * FCA[8]  * FCA[9]
            +  FCA[2]  * FCA[3]  * FCA[4]  * FCA[5]  * FCA[6]
            * FCA[7]  * FCA[8]  * FCA[9]  * /FC_CE  * LWR
            +  FCA[2]  * FCA[3]  * FCA[4]  * FCA[5]  * FCA[6]
            * FCA[7]  * FCA[8]  * FCA[9]  * FRAME   * FCY[0]
FCA[10].T  := /FRAME   * FCY[0]
FCA[11].T  := /FRAME   * FCY[0]  * FCA[10]
FCA[12].T  := /FRAME   * FCY[0]  * FCA[10] * FCA[11]
FCA[13].T  := /FRAME   * FCY[0]  * FCA[10] * FCA[11] * FCA[12]
FCA[14].T  := /FRAME   * FCY[0]  * FCA[10] * FCA[11] * FCA[12]
            * FCA[13]
FCA[15].T  := /FRAME   * FCY[0]  * FCA[10] * FCA[11] * FCA[12]
            * FCA[13] * FCA[14]
FCA[16].T  := /FRAME   * FCY[0]  * FCA[10] * FCA[11] * FCA[12]
            * FCA[13] * FCA[14] * FCA[15]
FCA[17].T  := /FRAME   * FCY[0]  * FCA[10] * FCA[11] * FCA[12]
            * FCA[13] * FCA[14] * FCA[15] * FCA[16]
FCY[1]     := /FRAME   * FCA[10] * FCA[11] * FCA[12] * FCA[13]
            * FCA[14] * FCA[15] * FCA[16] * FCA[17]
            +  FCA[10] * FCA[11] * FCA[12] * FCA[13] * FCA[14]
            * FCA[15] * FCA[16] * FCA[17] * /FC_CE  * LWR
            +  FCA[10] * FCA[11] * FCA[12] * FCA[13] * FCA[14]
            * FCA[15] * FCA[16] * FCA[17] * FRAME   * FCY[1]
FCA[18].T  := /FRAME   * FCY[0]  * FCY[1]
FCA[19].T  := /FRAME   * FCY[0]  * FCY[1]  * FCA[18]
FCA[20].T  := /FRAME   * FCY[0]  * FCY[1]  * FCA[18] * FCA[19]
FCA[21].T  := /FRAME   * FCY[0]  * FCY[1]  * FCA[18] * FCA[19] * FCA[20]
```

/* Appendix D, GCC-8U8.pds    Page 3 */

```
SD[1..0] = FCA[3..2]   * /LSA[3] * /LSA[2]
        + FCA[11..10] * /LSA[3] *  LSA[2]
        + FCA[13..12] *  LSA[3] * /LSA[2]
        + FCA[21..20] *  LSA[3] *  LSA[2]

SD[7..2] = FCA[9..4]   * /LSA[3] * /LSA[2]
        + FCA[19..14] *  LSA[3] * /LSA[2]
```

MINIMIZE_ON
;---------------------------------- Simulation Segment ------------
;SIMULATION
;-----------------------------------------------------------------

/* Appendix D, GCC-8U9.pds   Page 1 */

;PALASM Design Description

;--------------------------------- Declaration Segment -----------
TITLE    HORIZONTAL GC_COUNTER
PATTERN  GCU09.PDS      Q0013-009
REVISION 1.00
AUTHOR   RICK MURPHY-NEWMAN
COMPANY  BTREE VERIFICATION SYSTEMS INC.
DATE     06/11/93 Copyright (c) B-Tree Verification Systems, Inc. 1993. All rights reserved.

CHIP     GCU09          MACH210

;--------------------------------- PIN Declarations --------------
NODE 7,  5,  6,  4  QH[15..12]   REG  ; BURIED VERTICAL LINE COUNT
NODE 3,  2,  17, 16 QH[11..8]    REG  ; BURIED VERTICAL LINE COUNT
NODE 15, 14, 13, 12 QH[7..4]     REG  ; BURIED VERTICAL LINE COUNT
NODE 11, 10, 9,  8  QH[3..0]     REG  ; BURIED VERTICAL LINE COUNT
NODE 49             LOAD         REG  ; BURIED
NODE 51             BLOAD        REG  ; BURIED
PIN  10             RESET        COMB ; INPUT
PIN  35             PCLK         COMB ; INPUT
PIN  13             BLANK        COMB ; INPUT
PIN  3              HSYNC        COMB ; INPUT
PIN  8,  33         LBE[1..0]    COMB ; INPUT
PIN  32             LWR          COMB ; INPUT
PIN  11             HV_CE        COMB ; INPUT
PIN  17, 28, 39, 18 DH[15..12]   REG  ; OUTPUT
PIN  27, 43, 20, 26 DH[11..8]    REG  ; OUTPUT
PIN  36, 14, 25, 37 DH[7..4]     REG  ; OUTPUT
PIN  19, 24, 41, 21 DH[3..0]     REG  ; OUTPUT ;--------------------------------- Boolean Equation Segment ------
EQUATIONS
MINIMIZE_OFF QH[15..0].RSTF = /HSYNC
QH[15..0].CLKF = PCLK
LOAD.RSTF      = /RESET
LOAD.CLKF      = PCLK
BLOAD.RSTF     = /RESET
BLOAD.CLKF     = PCLK
DH[15..0].RSTF = /RESET
DH[15..0].CLKF = PCLK
DH[7..0].TRST  = /HV_CE * /LWR * /LBE[0]

/* Appendix D, GCC-8U9.pds   Page 2 */

```
DH[15..8].TRST = /HV_CE * /LWR * /LBE[1]

QH[0].T  := BLANK
QH[1].T  := BLANK
         * QH[0]
QH[2].T  := BLANK
         * QH[0] * QH[1]
QH[3].T  := BLANK
         * QH[0] * QH[1] * QH[2]
QH[4].T  := BLANK
         * QH[0] * QH[1] * QH[2] * QH[3]
QH[5].T  := BLANK
         * QH[0] * QH[1] * QH[2] * QH[3]
         * QH[4]
QH[6].T  := BLANK
         * QH[0] * QH[1] * QH[2] * QH[3]
         * QH[4] * QH[5]
QH[7].T  := BLANK
         * QH[0] * QH[1] * QH[2] * QH[3]
         * QH[4] * QH[5] * QH[6]
QH[8].T  := BLANK
         * QH[0] * QH[1] * QH[2] * QH[3]
         * QH[4] * QH[5] * QH[6] * QH[7]
QH[9].T  := BLANK
         * QH[0] * QH[1] * QH[2] * QH[3]
         * QH[4] * QH[5] * QH[6] * QH[7]
         * QH[8]
QH[10].T := BLANK
         * QH[0] * QH[1] * QH[2] * QH[3]
         * QH[4] * QH[5] * QH[6] * QH[7]
         * QH[8] * QH[9]
QH[11].T := BLANK
         * QH[0] * QH[1] * QH[2] * QH[3]
         * QH[4] * QH[5] * QH[6] * QH[7]
         * QH[8] * QH[9] * QH[10]
QH[12].T := BLANK
         * QH[0] * QH[1] * QH[2] * QH[3]
         * QH[4] * QH[5] * QH[6] * QH[7]
         * QH[8] * QH[9] * QH[10] * QH[11]
QH[13].T := BLANK
         * QH[0] * QH[1] * QH[2] * QH[3]
         * QH[4] * QH[5] * QH[6] * QH[7]
         * QH[8] * QH[9] * QH[10] * QH[11]
         * QH[12]
```

/* Appendix D, GCC-8U9.pds   Page 3 */

```
QH[14].T := BLANK
      * QH[0]  * QH[1]  * QH[2]  * QH[3]
      * QH[4]  * QH[5]  * QH[6]  * QH[7]
      * QH[8]  * QH[9]  * QH[10] * QH[11]
      * QH[12] * QH[13]
QH[15].T := BLANK
      * QH[0]  * QH[1]  * QH[2]  * QH[3]
      * QH[4]  * QH[5]  * QH[6]  * QH[7]
      * QH[8]  * QH[9]  * QH[10] * QH[11]
      * QH[12] * QH[13] * QH[14]

BLOAD := BLANK

/LOAD := /BLANK * BLOAD

DH[15..0] := /LOAD * QH[15..0]
      + LOAD * DH[15..0]

;--------------------------------- Simulation Segment ------------
;SIMULATION
;-----------------------------------------------------------------
```

/* Appendix D, GCC-8U10.pds    Page 1 */

;PALASM Design Description

;---------------------------------- Declaration Segment ------------
TITLE    VERTICAL GC_COUNTER
PATTERN  GCU10.PDS       Q0013-010
REVISION 1.01
AUTHOR   RICK MURPHY-NEWMAN
COMPANY  BTREE VERIFICATION SYSTEMS INC.
DATE 07/22/93 Copyright (c) B-Tree Verification Systems, Inc. 1993. All rights reserved.

CHIP    GCU10       MACH210

;---------------------------------- PIN Declarations --------------
NODE 7,  13, 12, 11  QV[15..12]   REG  ; BURIED VERTICAL LINE COUNT
NODE 10, 9,  8,  5   QV[11..8]    REG  ; BURIED VERTICAL LINE COUNT
NODE 6,  4,  3,  2   QV[7..4]     REG  ; BURIED VERTICAL LINE COUNT
NODE 17, 16, 15, 14  QV[3..0]     REG  ; BURIED VERTICAL LINE COUNT
NODE 49              LOAD         REG  ; BURIED
NODE 59              BLOAD        REG  ; BURIED
PIN 10               RESET        COMB ; INPUT
PIN 35               PCLK         COMB ; INPUT
PIN 39               BLANK        COMB ; INPUT
PIN 8                VSYNC        COMB ; INPUT
PIN 33, 32           LBE[3..2]    COMB ; INPUT
PIN 13               LWR          COMB ; INPUT
PIN 11               HV_CE        COMB ; INPUT
PIN 19, 27, 41, 17   DV[15..12]   REG  ; OUTPUT
PIN 25, 43, 18, 28   DV[11..8]    REG  ; OUTPUT
PIN 40, 20, 26, 42   DV[7..4]     REG  ; OUTPUT
PIN 14, 24, 36, 21   DV[3..0]     REG  ; OUTPUT ;---------------------------------- Boolean Equation Segment ------
EQUATIONS
MINIMIZE_OFF QV[15..0].RSTF = /LOAD
QV[15..0].CLKF = PCLK
LOAD.RSTF      = /RESET
LOAD.CLKF      = PCLK
BLOAD.RSTF     = /RESET
BLOAD.CLKF     = PCLK
DV[15..0].RSTF = /RESET
DV[15..0].CLKF = PCLK
DV[7..0].TRST  = /HV_CE * /LWR * /LBE[2]

/* Appendix D, GCC-8U10.pds   Page 2 */

DV[15..8].TRST = /HV_CE * /LWR * /LBE[3]

QV[0].T  := /BLOAD * BLANK
QV[1].T  := /BLOAD * BLANK
         * QV[0]
QV[2].T  := /BLOAD * BLANK
         * QV[0]  * QV[1]
QV[3].T  := /BLOAD * BLANK
         * QV[0]  * QV[1]  * QV[2]
QV[4].T  := /BLOAD * BLANK
         * QV[0]  * QV[1]  * QV[2]  * QV[3]
QV[5].T  := /BLOAD * BLANK
         * QV[0]  * QV[1]  * QV[2]  * QV[3]
         * QV[4]
QV[6].T  := /BLOAD * BLANK
         * QV[0]  * QV[1]  * QV[2]  * QV[3]
         * QV[4]  * QV[5]
QV[7].T  := /BLOAD * BLANK
         * QV[0]  * QV[1]  * QV[2]  * QV[3]
         * QV[4]  * QV[5]  * QV[6]
QV[8].T  := /BLOAD * BLANK
         * QV[0]  * QV[1]  * QV[2]  * QV[3]
         * QV[4]  * QV[5]  * QV[6]  * QV[7]
QV[9].T  := /BLOAD * BLANK
         * QV[0]  * QV[1]  * QV[2]  * QV[3]
         * QV[4]  * QV[5]  * QV[6]  * QV[7]
         * QV[8]
QV[10].T := /BLOAD * BLANK
         * QV[0]  * QV[1]  * QV[2]  * QV[3]
         * QV[4]  * QV[5]  * QV[6]  * QV[7]
         * QV[8]  * QV[9]
QV[11].T := /BLOAD * BLANK
         * QV[0]  * QV[1]  * QV[2]  * QV[3]
         * QV[4]  * QV[5]  * QV[6]  * QV[7]
         * QV[8]  * QV[9]  * QV[10]
QV[12].T := /BLOAD * BLANK
         * QV[0]  * QV[1]  * QV[2]  * QV[3]
         * QV[4]  * QV[5]  * QV[6]  * QV[7]
         * QV[8]  * QV[9]  * QV[10] * QV[11]
QV[13].T := /BLOAD * BLANK
         * QV[0]  * QV[1]  * QV[2]  * QV[3]
         * QV[4]  * QV[5]  * QV[6]  * QV[7]
         * QV[8]  * QV[9]  * QV[10] * QV[11]
         * QV[12]

/* Appendix D, GCC-8U10.pds   Page 3 */

```
QV[14].T := /BLOAD * BLANK
        * QV[0]  * QV[1]  * QV[2]  * QV[3]
        * QV[4]  * QV[5]  * QV[6]  * QV[7]
        * QV[8]  * QV[9]  * QV[10] * QV[11]
        * QV[12] * QV[13]
QV[15].T := /BLOAD * BLANK
        * QV[0]  * QV[1]  * QV[2]  * QV[3]
        * QV[4]  * QV[5]  * QV[6]  * QV[7]
        * QV[8]  * QV[9]  * QV[10] * QV[11]
        * QV[12] * QV[13] * QV[14]

BLOAD := BLANK

LOAD := VSYNC

DV[15..0] := /VSYNC *  LOAD * QV[15..0]
          +  VSYNC * /LOAD * DV[15..0]
          +  VSYNC *  LOAD * DV[15..0]
          + /VSYNC * /LOAD * DV[15..0]

;---------------------------------- Simulation Segment ------------
;SIMULATION
;------------------------------------------------------------------
```

What is claimed is:

1. A test system for non-invasively testing a microcomputer system having one or more input stimulus signals and a display screen, the test system comprising:

a electronic probe which generates digital drive data representative of an electronic signal which drives the display screen;

a signal converter coupled to the electronic probe, which converts the digital drive data into pixel data, wherein each of the pixel data comprise a value representing an optical attribute for at least one pixel of the display screen; and a frame storage coupled to the signal converter for storing the pixel data, wherein the signal converter samples a plurality of pixel values within each of a plurality of frames of the digital drive data and at least one of the plurality of pixel values sampled from a first one of the plurality of frames is combined with a corresponding one of the plurality of pixel values sampled from a second one of the plurality of frames to generate a combined pixel value, and the combined pixel value is saved in the frame storage.

2. The test system according to claim 1, further wherein the pixel data comprises a value representing a color for at least one pixel of the display screen.

3. The test system according to claim 1, further wherein the pixel data comprises a value representing an intensity for at least one pixel of the display screen.

4. The test system according to claim 1, wherein the signal converter samples the digital drive data at a plurality of points in time in order to derive the pixel data for one combined pixel value.

5. A test system for non-invasively testing a microcomputer system having one or more input stimulus signals and a display screen, the test system comprising:

a electronic probe which generates digital drive data representative of an electronic signal which drives the display screen;

a signal converter coupled to the electronic probe, which converts the digital drive data into pixel data, wherein each of the pixel data comprise a value representing an optical attribute for at least one pixel of the display screen; and a frame storage coupled to the signal converter for storing the pixel data, wherein the signal converter includes a bit-masked change filter.

6. A test system for non-invasively testing a microcomputer system having one or more input stimulus signals and a display screen, the test system comprising:

a electronic probe which generates digital drive data representative of an electronic signal which drives the display screen;

a signal converter coupled to the electronic probe, which converts the digital drive data into pixel data, wherein each of the pixel data comprise a value representing an optical attribute for at least one pixel of the display screen; and a frame storage coupled to the signal converter for storing the pixel data, wherein the pixel data is organized in the frame storage as a structure, the structure comprising:

a pointer to an array of scan lines and pixels within scan lines;

the array of scan lines and pixels within scan lines; and parameters which characterize the data in the array.

7. A test system for non-invasively testing a microcomputer system having one or more input stimulus signals and a display screen, the test system comprising:

a electronic probe which generates digital drive data representative of an electronic signal which drives the display screen;

a signal converter coupled to the electronic probe, which converts the digital drive data into pixel data, wherein each of the pixel data comprise a value representing an optical attribute for at least one pixel of the display screen; and a frame storage coupled to the signal converter for storing the pixel data, wherein the signal converter samples a plurality of scan lines within a frame of the digital drive data and wherein at least one of the plurality of scan lines sampled is discarded and at least one other of the plurality of scan lines sampled is saved in the frame storage.

8. A test system for non-invasively testing a microcomputer system having one or more input stimulus signals and a display screen, the test system comprising:

a electronic probe which generates digital drive data representative of an electronic signal which drives the display screen;

a signal converter coupled to the electronic probe, which converts the digital drive data into pixel data, wherein each of the pixel data comprise a value representing an optical attribute for at least one pixel of the display screen; and a frame storage coupled to the signal converter for storing the pixel data, wherein the signal converter is coupled to a program means for converting the pixel data into bit-map data in a bit map, and wherein the program means adds a value of at least one of the plurality of pixel values sampled from a first one of the plurality of frames with a corresponding one of the plurality of pixel values sampled from a second one of the plurality of frames to generate a combined pixel value, and the combined pixel value is saved in the bit map.

9. The test system according to claim 8, wherein the bit map is organized as a structure, the structure comprising:

a pointer to a bit-map array of scan lines and pixels within scan lines; and parameters which characterize the data in the array.

10. A method for non-invasively testing a microcomputer system having one or more input stimulus signals and an display screen, the method comprising the steps of:

generating digital drive data representative of an electronic signal which drives the display screen;

converting the digital drive data into pixel data, wherein each of the pixel data comprise a value representing an attribute for at least one pixel of the display; and storing the pixel data, wherein the step of converting comprises the steps of:

retrieving a plurality of pixel values within each of a plurality of frames of the digital drive data;

combining at least one of the plurality of pixel values sampled from a first one of the plurality of frames with a corresponding one of the plurality of pixel values sampled from a second one of the plurality of frames in order to generate a combined pixel value; and saving the combined pixel value.

11. The method according to claim 10, further wherein the pixel data comprises a value representing a color for at least one pixel of the display screen.

12. The method according to claim 10, further wherein the pixel data comprises a value representing an intensity for at least one pixel of the display screen.

13. The method according to claim 10, wherein the step of converting comprises the step of sampling the digital drive data at a plurality of points in time in order to derive the pixel data for one combined pixel value.

14. The method according to claim 10, wherein the step of converting includes the steps of:

combining the saved pixel data into bit-map data in a bit map, and wherein the step of combining includes the step of adding a value of at least one of the plurality of pixel values sampled from a first one of the plurality of frames with a corresponding one of the plurality of pixel values sampled from a second one of the plurality of frames to generate a combined pixel value; and saving the combined pixel value in the bit map.

15. The method according to claim 14, wherein the bit map is organized as a structure, the structure comprising:

a pointer to a bit-map array of scan lines and pixels within scan lines;

the array of scan lines and pixels within scan lines; and parameters which characterize the data in the array.

16. The method according to claim 10, further comprising the steps of:

coupling an analog test signal to an analog interface;

converting the analog test signal into a digital electronic signal that drives the display screen; and testing, with a computer, the stored subset of the pixel data.

17. The method according to claim 16, further wherein the pixel data comprises a value representing a color for at least one pixel of the display screen.

18. The method according to claim 16, further wherein the pixel data comprises a value representing an intensity for at least one pixel of the display screen.

19. A method for non-invasively testing a microcomputer system having one or more input stimulus signals and an display screen, the method comprising the steps of:

generating digital drive data representative of an electronic signal which drives the display screen;

converting the digital drive data into pixel data, wherein each of the pixel data comprise a value representing an attribute for at least one pixel of the display; and storing the pixel data, wherein the step of converting includes the step of using a bit-masked change filter.

20. A method for non-invasively testing a microcomputer system having one or more input stimulus signals and an display screen, the method comprising the steps of:

generating digital drive data representative of an electronic signal which drives the display screen;

converting the digital drive data into pixel data, wherein each of the pixel data comprise a value representing an attribute for at least one pixel of the display; and storing the pixel data, wherein the pixel data is organized as a structure, the structure comprising:

a pointer to an array of scan lines and pixels within scan lines;

the array of scan lines and pixels within scan lines; and parameters which characterize the data in the array.

21. A method for non-invasively testing a microcomputer system having one or more input stimulus signals and an display screen, the method comprising the steps of:

generating digital drive data representative of an electronic signal which drives the display screen;

converting the digital drive data into pixel data, wherein each of the pixel data comprise a value representing an attribute for at least one pixel of the display; and storing the pixel data, wherein the step of converting includes the step of:

sampling a plurality of scan lines within a frame of the digital drive data and wherein at least one of the plurality of scan lines sampled is discarded and at least one other of the plurality of scan lines sampled is saved.

* * * * *